US007039572B1

(12) United States Patent
Narahara et al.

(10) Patent No.: US 7,039,572 B1
(45) Date of Patent: May 2, 2006

(54) METHOD OF ANALYZING ELECTROMAGNETIC INTERFERENCE

(75) Inventors: Hidetoshi Narahara, Osaka (JP); Seijirou Kojima, Kyoto (JP); Hiroyuki Tsujikawa, Shiga (JP); Kenji Shimazaki, Hyogo (JP); Kasumi Hamaguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 525 days.

(21) Appl. No.: 09/612,582

(22) Filed: Jul. 7, 2000

(30) Foreign Application Priority Data

Jul. 9, 1999 (JP) .................................. 11-196190

(51) Int. Cl.
    G06F 9/455 (2006.01)
(52) U.S. Cl. ............................................ 703/14; 716/6
(58) Field of Classification Search ................ 703/14, 703/15, 16, 17, 19; 716/2, 4, 6; 702/75, 702/183, 70, 65; 324/750; 327/158, 170; 706/14; 360/78, 77, 75; 326/27
    See application file for complete search history.

(56) References Cited

U.S. PATENT DOCUMENTS

| | | | | | |
|---|---|---|---|---|---|
| 5,117,377 | A | | 5/1992 | Finman | 703/2 |
| 5,317,207 | A | * | 5/1994 | Mortensen | 326/26 |
| 5,479,440 | A | | 12/1995 | Esfahani | 375/346 |
| 5,617,325 | A | * | 4/1997 | Schaefer | 716/6 |
| 5,835,380 | A | * | 11/1998 | Roethig | 716/2 |
| 5,841,672 | A | * | 11/1998 | Spyrou et al. | 716/6 |
| 5,852,445 | A | * | 12/1998 | Yoshikawa et al. | 345/440 |
| 5,959,481 | A | * | 9/1999 | Donnelly et al. | 327/170 |
| 6,151,967 | A | * | 11/2000 | McIntosh et al. | 73/514.32 |
| 6,154,710 | A | * | 11/2000 | Kobayashi et al. | 702/65 |
| 6,212,665 | B1 | * | 4/2001 | Zarkesh et al. | 716/4 |
| 6,237,126 | B1 | * | 5/2001 | Bonitz | 716/4 |
| 6,242,951 | B1 | * | 6/2001 | Nakata et al. | 326/98 |
| 6,253,354 | B1 | * | 6/2001 | Kuwano et al. | 716/4 |
| 6,278,964 | B1 | * | 8/2001 | Fang et al. | 703/19 |
| 6,304,998 | B1 | * | 10/2001 | Kamiya et al. | 716/4 |
| 6,687,205 | B1 | * | 2/2004 | Huber | 369/47.19 |
| 6,754,598 | B1 | * | 6/2004 | Shimazaki et al. | 702/70 |
| 6,782,347 | B1 | * | 8/2004 | Hirano et al. | 702/183 |
| 6,810,340 | B1 | * | 10/2004 | Shimazaki et al. | 702/65 |
| 6,876,210 | B1 | * | 4/2005 | Shimazaki et al. | 324/750 |
| 6,959,250 | B1 | * | 10/2005 | Shimazaki et al. | 702/75 |
| 2004/0117169 | A1 | * | 6/2004 | Acar et al. | 703/15 |
| 2004/0232962 | A1 | * | 11/2004 | Gomm et al. | 327/158 |

FOREIGN PATENT DOCUMENTS

JP          10-143553          5/1998

(Continued)

OTHER PUBLICATIONS

Analog Integrated Circuits and signal Processing, 14, pp. 113-129 (1997), di/dt Noise in CMOS Integrated Circuits, Patrik Larsson.

(Continued)

*Primary Examiner*—Paul L. Rodriguez
*Assistant Examiner*—K Thangavelu
(74) *Attorney, Agent, or Firm*—Pearne & Gordon LLP

(57) ABSTRACT

In a gate-level logic simulation, a change in electric current is calculated from event information 5 output from a logic simulator 4 through use of a current waveform calculation section 7. The thus-calculated change in current is subjected to FFT processing through use of an FFT processing section 9, thereby determining a frequency characteristic of EMI and enabling EMI analysis.

2 Claims, 94 Drawing Sheets

FOREIGN PATENT DOCUMENTS

JP   11-120214   4/1999

OTHER PUBLICATIONS

EMI-Noise Analysis under ASIC Design Environment, Sachio Hayashi & Masaaki Yamada, DA Development Dept., Semiconductor DA & Test Engineering Center, Toshiba Corporation, pp. 16-21.

IEEE Transactions on Components, Packaging, and Manufacturing Technology—Part B. vol. 21, No. 3, Aug. 1998, Interconnect and Circuit Modeling Techniques for Full-Chip Power Supply Noise Analysis, Howard H. Chen and J. Scott Neely, pp. 209-215.

Power Supply Noise Analysis Methodology for Deep-Submicron VLSI Chip Design, Howard H. Chen and David D. LingDAC97, Anaheim, California, (c)1997, pp. 1-6.

* cited by examiner

BLOCK DIAGRAM SHOWING OVERALL FLOW OF PROCESSING OF
EMI ANALYSIS METHOD ACCORDING TO THE PRESENT INVENTION

BLOCK DIAGRAM SHOWING A CURRENT WAVEFORM CALCULATION SECTION (FIRST EMBODIMENT)

CALCULATION RESULT OF INSTANTANEOUSLY-CHANGING ELECTRIC CURRENT

FLOWCHART FOR AVERAGING CURRENT WAVEFORM

CALCULATION RESULT OF CURRENT WAVEFORM (FIRST EMBODIMENT)

AT T = 5

RESULT OF FFT ANALYSIS

RECTANGULAR WAVEFORM MODEL (SECOND EMBODIMENT)

W IS CONSTANT

FLOWCHART OF FIRST RECTANGULAR WAVEFORM SHAPING OPERATION

CALCULATION RESULT OF CURRENT WAVEFORM (SECOND EMBODIMENT)

AT W = 5

RECTANGULAR WAVEFORM MODEL (THIRD EMBODIMENT)

$i = W \times h = \dfrac{h^2}{K}$ $h = \sqrt{(i \times K)}$ $h/w = K = \text{CONSTANT}$

BLOCK DIAGRAM SHOWING A CURRENT WAVEFORM CALCULATION SECTION (THIRD EMBODIMENT)

CALCULATION RESULT OF CURRENT WAVEFORM (THIRD EMBODIMENT)

AT K = 4

RECTANGULAR WAVEFORM MODEL
(FOURTH, FIFTH AND SIXTH EMBODIMENTS)

BLOCK DIAGRAM SHOWING A CURRENT WAVEFORM CALCULATION SECTION (FOURTH EMBODIMENT)

CALCULATION RESULT OF CURRENT WAVEFORM (FOURTH EMBODIMENT)

i-s-h TABLE

IN THE CASE OF i = 70, s = 1 s1 = 0, s2 = 2, i1 = 50, i2 = 100
h (s1, i1) = 5, h (s1, i2) = 14
h (s2, i1) = 6, h (s2, i2) = 20

$$h(s, i) = \left(\frac{h(s1, i1)(s2-s)}{(s2-s1)} + \frac{h(s2, i1)(s-s1)}{(s2-s1)}\right)\left(\frac{i2-i}{i2-i1}\right)$$
$$+ \left(\frac{h(s1, i2)(s2-s)}{(s2-s1)} + \frac{h(s2, i2)(s-s1)}{(s2-s1)}\right)\left(\frac{i-i1}{i2-i1}\right)$$

h (1, 70) = 10.1

BLOCK DIAGRAM SHOWING A CURRENT WAVEFORM CALCULATION SECTION (FIFTH EMBODIMENT)

FLOWCHART OF FOURTH RECTANGULAR WAVEFORM SHAPING OPERATION

CALCULATION RESULT OF CURRENT WAVEFORM (FIFTH EMBODIMENT)

i-c-h TABLE

| c \ i | 0 | 50 | 100 |
|---|---|---|---|
| 0 | 0 | 5 | 20 |
| 20 | 0 | 8 | 25 |

IN THE CASE OF i = 70, c = 10

$c1 = 0, c2 = 20, i1 = 50, i2 = 100$
$h(c1, i1) = 5, h(c1, i2) = 20$
$h(c2, i1) = 8, h(c2, i2) = 25$ $$h(c, i) = \left( \frac{h(c1, i1)(c2 - c)}{(c2 - c1)} + \frac{h(c2, i1)(c - c1)}{(c2 - c1)} \right) \left( \frac{i2 - i}{i2 - i1} \right)$$

$$+ \left( \frac{h(c1, i2)(c2 - c)}{(c2 - c1)} + \frac{h(c2, i2)(c - c1)}{(c2 - c1)} \right) \left( \frac{i - i1}{i2 - i1} \right)$$

$h(10, 70) = 12.9$

BLOCK DIAGRAM SHOWING A CURRENT WAVEFORM
CALCULATION SECTION (SIXTH EMBODIMENT)

FLOWCHART OF FIFTH RECTANGULAR WAVEFORM SHAPING OPERATION

CALCULATION RESULT OF CURRENT WAVEFORM (SIXTH EMBODIMENT)

TRIANGULAR WAVEFORM MODEL (TENTH EMBODIMENT)

$$y = -\frac{2 \times h}{W} x + h$$

W IS CONSTANT

BLOCK DIAGRAM SHOWING A CURRENT WAVEFORM CALCULATION SECTION (TENTH EMBODIMENT)

FLOWCHART OF FIFTH TRIANGULAR WAVEFORM SHAPING OPERATION

CALCULATION RESULT OF CURRENT WAVEFORM (TENTH EMBODIMENT)

AT W = 5

MULTI-ORDER-FUNCTION MODEL (ELEVENTH EMBODIMENT)

W IS CONSTANT
$y = a(x - W)^2 (x + W)^2$
$a = \dfrac{15}{16 \times W^5} i$

IN THE CASE OF
W = 2.5, i = 100
a = 0.96
h = 37.5

IN THE CASE OF
W = 2.5, i = 50
a = 0.48
h = 18.75

BLOCK DIAGRAM SHOWING A CURRENT WAVEFORM CALCULATION SECTION (ELEVENTH EMBODIMENT)

FLOWCHART OF MULTI-ORDER-FUNCTION WAVEFORM SHAPING OPERATION

CALCULATION RESULT OF CURRENT WAVEFORM (ELEVENTH EMBODIMENT)

AT W = 2.5

GAUSSIAN FUNCTION MODEL (TWELFTH AND TWENTY-FIFTH EMBODIMENTS)

$$y = h \times e^{-\left(\frac{x}{w}\right)^2}$$

i-h TABLE

IN THE CASE OF i = 50, 100
(i1, h1) = (50, 5)
(i2, h2) = (100, 20)

$$h(i) = \frac{h2 - h1}{i2 - i1}(i - i1) + h1$$

h (50) = 10
h (100) = 40 i-w TABLE

IN THE CASE OF i = 50, 100
(i1, w1) = (20, 1)
(i2, w2) = (100, 1.5)

$$w(i) = \frac{w2 - w1}{i2 - i1}(i - i1) + w1$$

w (50) = 1.3
w (100) = 1.5

BLOCK DIAGRAM SHOWING A CURRENT WAVEFORM CALCULATION SECTION (TWELFTH EMBODIMENT)

CALCULATION RESULT OF CURRENT WAVEFORM (TWELFTH EMBODIMENT)

BLOCK DIAGRAM SHOWING A CURRENT WAVEFORM CALCULATION SECTION (FOURTEENTH EMBODIMENT)

FLOWCHART OF SIXTH RECTANGULAR WAVEFORM SHAPING OPERATION s-h TABLE

BLOCK DIAGRAM SHOWING A CURRENT WAVEFORM CALCULATION SECTION (FIFTEENTH EMBODIMENT)

FLOWCHART OF SEVENTH RECTANGULAR WAVEFORM SHAPING OPERATION

BLOCK DIAGRAM SHOWING A CURRENT WAVEFORM CALCULATION SECTION (SIXTEENTH EMBODIMENT)

FLOWCHART OF EIGHTH RECTANGULAR WAVEFORM SHAPING

- 1150 — READ c-h TABLE
- 1151 — READ CAPACITANCE DATA
- 1152 — PERFORM RECTANGULAR WAVEFORM SHAPING LOOP
- 1153 — EXTRACT $(c_1, h_1), (c_2, h_2)$
- 1154 — $h = \dfrac{h_2 - h_1}{c_2 - c_1}(c - c_1) + h_1$
- 1155 — $w = i/h$
- 1156 — $x = -W/2 \rightarrow W/2$
- 1157 — $I(t + x) = I(t + x) + h$
- $x = x + \Delta t$

FIG. 75

NANDNOR

| CHANGED PINS 9301 | TIME 9302 | TOTAL CURRENT 9303 | PEAK CURRENT 9304 | |
|---|---|---|---|---|
| A | 1ns | 1mA | 0.5mA | ~9305 |
| A | 2ns | 3mA | 1.5mA | |
| B | 1ns | 1mA | 0.5mA | ~9306 |
| B | 2ns | 3mA | 1.5mA | |
| C | 1ns | 3mA | 1.5mA | ~9307 |

FIG. 87

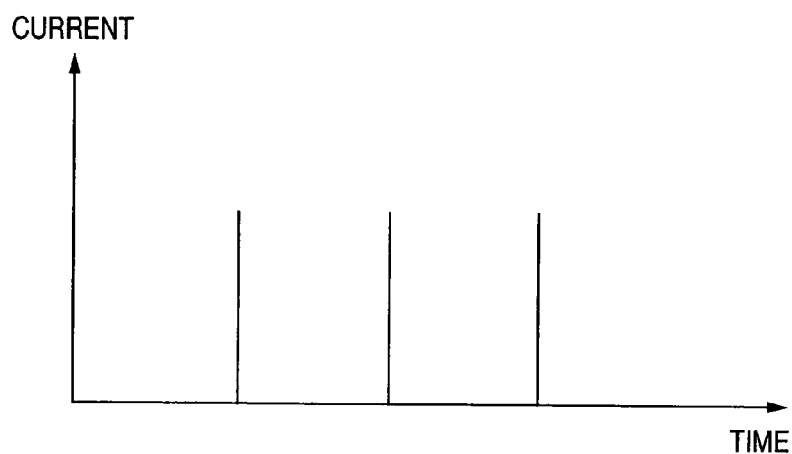

FIG. 88

| NAND, Y-TERMINAL | | 10601 |
|---|---|---|
| A = 1, B = 0 → | TOTAL CURRENT AT LOGIC VALUE OF 1 | 3mA |
| A = 1, B = 0 → | PEAK CURRENT AT LOGIC VALUE OF 1 | 1mA |
| A = 1, B = 1 → | TOTAL CURRENT AT LOGIC VALUE OF 0 | 3mA |
| A = 1, B = 1 → | PEAK CURRENT AT LOGIC VALUE OF 0 | 1mA |
| B = 1, A = 0 → | TOTAL CURRENT AT LOGIC VALUE OF 1 | 3mA |
| B = 1, A = 0 → | PEAK CURRENT AT LOGIC VALUE OF 1 | 1mA |
| B = 1, A = 1 → | TOTAL CURRENT AT LOGIC VALUE OF 0 | 3mA |
| B = 1, A = 1 → | PEAK CURRENT AT LOGIC VALUE OF 0 | 1mA |
| A = 0 → 1, B = 0 → 1 | TOTAL CURRENT AT LOGIC VALUE OF 1 | 4mA |
| A = 0 → 1, B = 0 → 1 | PEAK CURRENT AT LOGIC VALUE OF 1 | 1.5mA |
| A = 1 → 0, B = 1 → 0 | TOTAL CURRENT AT LOGIC VALUE OF 0 | 4mA |
| A = 1 → 0, B = 1 → 0 | PEAK CURRENT AT LOGIC VALUE OF 0 | 1.5mA |

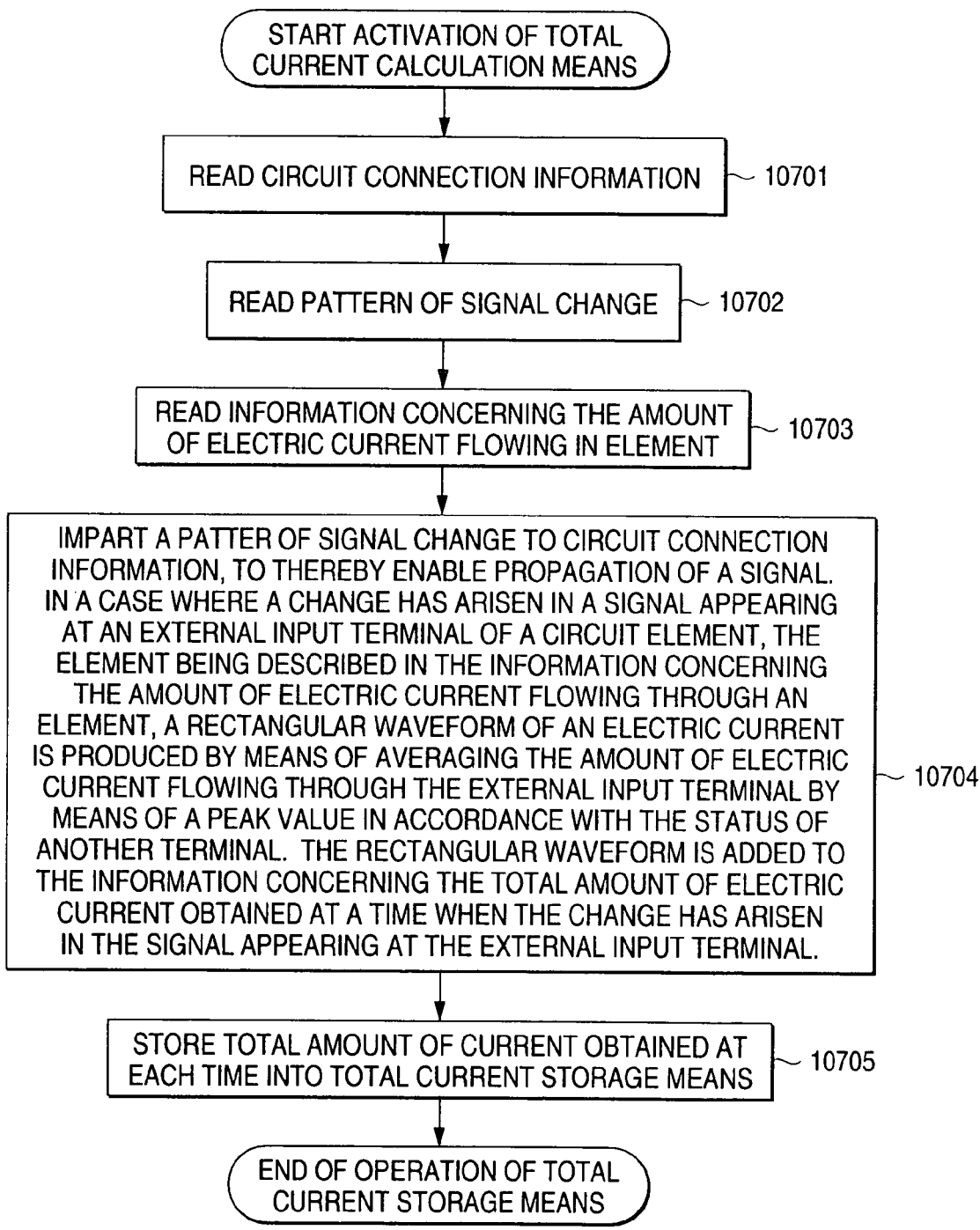

BLOCK DIAGRAM SHOWING A CURRENT WAVEFORM
CALCULATION SECTION (TWENTY-THIRD EMBODIMENT)

BLOCK DIAGRAM SHOWING A CURRENT WAVEFORM CALCULATION SECTION (TWENTY-FOURTH EMBODIMENT)

FLOWCHART OF MULTI-ORDER-FUNCTION WAVEFORM SHAPING

- READ PEAK CURRENT LIBRARY — 1170
- PERFORM MULTI-ORDER-FUNCTION WAVEFORM SHAPING LOOP — 1171
- EXTRACT HEIGHT (= h) OF TRIANGULAR WAVEFORM OF OBJECT INSTANCE FROM PEAK CURRENT LIBRARY — 1172
- $w = \dfrac{15\,i}{16h}$ — 1173
- $x = -w \rightarrow w$ — 1174
- $a = \dfrac{15}{16 \times w^5}\,i$ $I(t+x) = I(t+x) + a(x-w)^2(x+w)^2$ — 1175
- $x = x + \Delta t$ BLOCK DIAGRAM SHOWING A CURRENT WAVEFORM
CALCULATION SECTION (TWENTY-FIFTH EMBODIMENT)

FIG. 105

FLIP-FLOP FF/Q
- TOTAL FEEDTHROUGH CURRENT — 3mA
- PEAK VALUE OF FEEDTHROUGH CURRENT — 1mA
- TOTAL CHARGE CURRENT — 4mA
- PEAK VALUE OF CHARGE CURRENT — 2mA

FLIP-FLOP FF/CK
- TOTAL FEEDTHROUGH CURRENT — 2mA
- PEAK VALUE OF FEEDTHROUGH CURRENT — 1mA
- TOTAL CHARGE CURRENT — 0mA
- PEAK VALUE OF CHARGE CURRENT — 0mA

BUFFER BUF/Y
- TOTAL FEEDTHROUGH CURRENT — 2mA
- PEAK VALUE OF FEEDTHROUGH CURRENT — 1mA
- TOTAL CHARGE CURRENT — 0mA
- PEAK VALUE OF CHARGE CURRENT — 0mA

FIG. 110
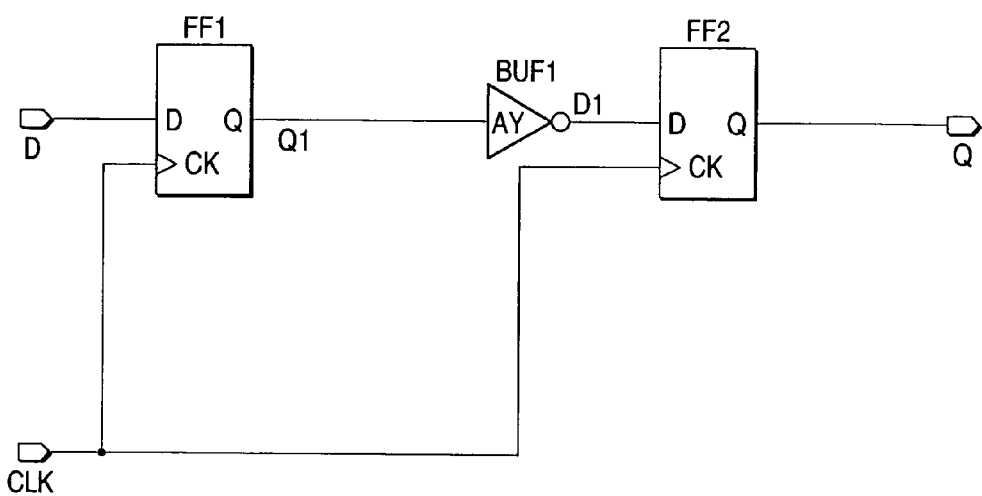
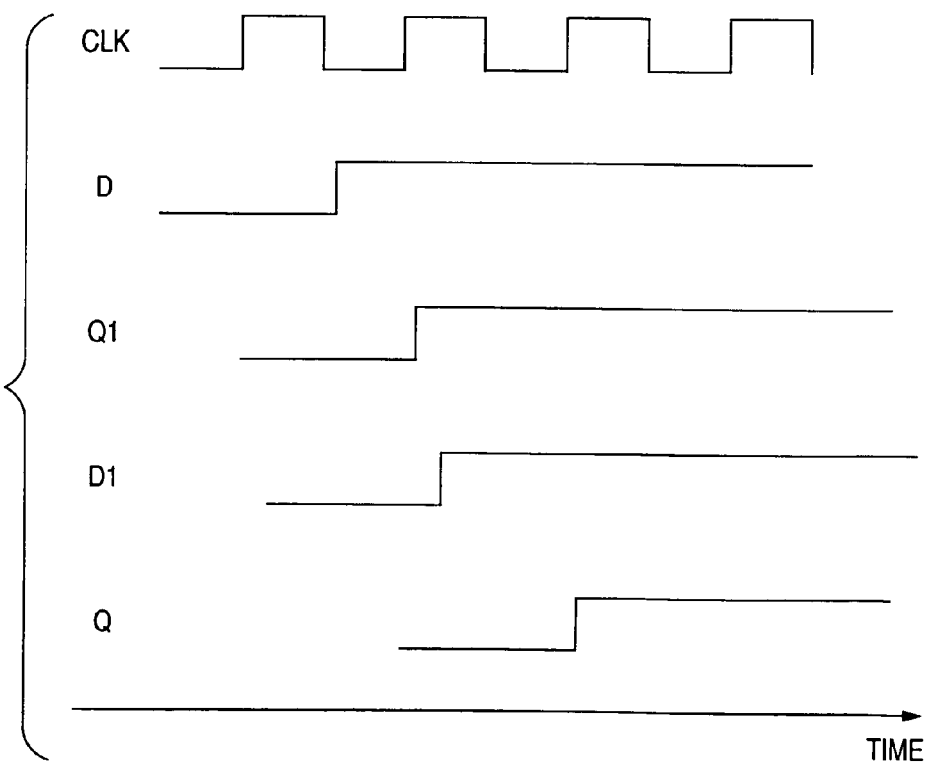
FIG. 111

\* FALL-DEPENDENT COEFFICIENT = 2 - RISE-DEPENDENT COEFFICIENT

METHOD OF ANALYZING ELECTROMAGNETIC INTERFERENCE

BACKGROUND OF THE INVENTION

1. Field of the Invention

The present invention relates to a method of analyzing electromagnetic interference (EMI), and more particularly, to a method of analyzing electromagnetic interference arising in a large-scale, high-speed LSI (large-scale integrated circuit) by means of high-speed, highly-accurate logic simulation.

2. Desaription of the Related Art

As is often the case, in the field of computers, LSIs find a broadening range of applications, from communications devices, such as cellular phones, to general household products, toys, and automobiles. Electromagnetic interference arising in such a product induces radio interference noise to arise in a receiver, such as a TV set or a radio, or faulty operations of another system. In order to prevent this problem, the entirety of a product is shielded, or filters are provided in a product. With a view towards preventing an increase in the number of components and cost and difficulty in preventing occurrence of electromagnetic interference in a product, strong demand exists for suppression of noise in an LSI alone.

Under such a situation, an LSI is ranked as a key device for any product which contains an LSI. Demand exists for an larger-scale, high-speed LSI for ensuring competitiveness of a product. In a situation in which the cycle of product development becomes shorter, design-automation of an LSI is indispensable for satisfying the demand. There is growing necessity for adopting synchronous circuit as a condition for introducing a state-of-the-art design-automation method. In a case where all circuits of a large-scale, high-speed LSI operate synchronously with a reference clock signal, instantaneously-changing current becomes very large, which induces an increase in electromagnetic interference.

The present invention relates to a simulation method which enables evaluation of EMI indispensable for reducing electromagnetic interference while maintaining a tendency toward a larger-scale, higher-speed LSI.

Noise imposed on another device by an LSI is roughly classified into two types; radiation noise, and conduction noise. Radiation noise emanated directly from an LSI includes noise emitted from internal wires of an LSI. However, internal wires do not act as an antenna of large size. As a matter of course, it is considered that the noise emitted directly from an LSI will pose a problem in the future, in association with an improvement in the operation frequency of an LSI. However, as of now, the noise emitted from the inside of an LSI is considered trivial.

In contrast, conduction noise affects another device mounted on a printed board by way of direct interconnections, such as internal wires of an LSI, lead frames, or wiring patterns provided on a printed wiring board. Noise is emitted from such interconnections while the interconnections are taken as the source of origination or as an antenna. The antenna constituted of the interconnections is much larger than that constituted by internal wires of an LSI and is a dominant element in terms of electromagnetic emission.

A power line and a signal line can act as paths along which conduction noise developing in an LSI travels. In consideration of an electromagnetic field in the vicinity of an LSI, noise which results from variation in an electric current of a power source being emitted from a power line serving as an antenna is considered to be dominant. There may be a case where a ringing overshoot stemming from variation in a signal poses a problem. However, there more frequently arises a case where variation in an internal power level of an LSI propagates as a signal waveform, to thereby present a problem. Noise emitted from a power line or a signal line is considered to have a strong correlation with variation in the electric current of a power source (hereinafter referred to as a "source current").

A source current of a CMOS circuit will now be described by reference to a simple inverter circuit. In a case where variation arises in a voltage applied to an inverter circuit, there flows a load capacitance charge/discharge current, which is the primary source current of the CMOS circuit. In addition, a short circuit current flows together with the load capacitance charge/discharge current. In design of such a CMOS circuit, all circuits of an LSI are synchronized in accordance with constraints on the use of a design-automation tool. As a result of all circuits being synchronized, all circuits of the LSI operate simultaneously, and a peak current arises in a power source in synchronism with a reference clock signal. Further, in order to increase operating speed, or shorten a cycle, of the LSI, the capacitance of a transistor is increased so as to enable a charging/discharging operation to be completed within a short period of time. Eventually, a peak current increases. As a matter of course, the total source current of an LSI is increased even when the scale of an LSI is increased. Thus, the peak current of the power source is increased, thereby inducing occurrence of an abrupt change in a source current. Such an abrupt change induces an increase in higher harmonic components, thereby resulting in an increase in electromagnetic interference.

Highly-precise simulation of change in a source current, which may be said to primarily account for electromagnetic interference, is considered to be effective in evaluation of electromagnetic interference arising in an LSI.

A current simulation method for effecting transistor-level current analysis, as will be described below, has conventionally been employed.

FIG. 116 is a block diagram showing the flow of processing operations pertaining to a conventional EMI analysis method. According to this method, on the basis of layout information pertaining to an LSI to be analyzed through use of a method of analyzing an electric current of a transistor, there is performed processing pertaining to a layout parameter extraction (hereinafter referred to simply as an "LPE") step O3. Subsequently, there is performed processing pertaining to a circuit simulation step O6 for effecting simulation of a circuit on the basis of a switch-level netlist; a source-of-current modeling step O8; a source line LPE step O10; a transient analysis simulation step O12; and a FFT step O14.

Processing pertaining to each of the foregoing processing steps will now be described by reference to FIG. 116.

First, there are input data O1 pertaining to the layout of a semiconductor integrated circuit (hereinafter referred to simply as "layout data O1"), which circuit is to be subjected to EMI analysis; parameters of elements, such as transistor elements or various parasitic wiring elements (e.g., resistors and capacitors); and an LPE rule O2 for defining a form in which extracted layout parameters are to be output. In step O3, parameters of the respective elements included in the layout data O1 are calculated in accordance with the LPE rule O2, to thereby prepare a netlist O4. In step O3, parameters of parasitic elements of a power source (and the ground) are not extracted.

In step O6 are input the netlist O4 prepared in step O3 and a test pattern O5 for replicating a desired logic operation in a circuit serving as an object of analysis. There are calculated a load capacitance charge/discharge current and a short circuit current, both responding to the operating state of an internal circuit, wherewith information O7 about the waveform of an electric current of each transistor (hereinafter referred to simply as "current waveform information O7") is produced. The first operation of the processing pertaining to step O6 is effected on the assumption that the potential of a power source (and that of ground) is a variation-free, ideal potential.

In step O8, the current waveform information pieces O7 concerning the respective transistors prepared in step O6 are entered. Each of the thus-entered current waveform information O7 pieces is modeled into a mode which can be applied to subsequent step O12, wherewith information O9 concerning a source-of-current element model (hereinafter referred to simply as "source-of-current element model information O9") is prepared. According to a common method, in order to alleviate the load associated with processing pertaining to step O12 and subsequent steps, each functional circuit block consisting of a plurality of transistors is modeled as a source-of-current element.

Processing pertaining to step O10 differs from processing pertaining to step O3, only in that parameters of parasitic elements of a power source and parameters of those of parasitic elements of ground wiring (e.g., resistors, decoupling capacitance, and like elements) are extracted and subjected to EMI analysis in lieu of extracted parameters of transistor elements and extracted parameters of various parasitic wiring elements. Hence, repeated explanation of processing pertaining to step O10 is omitted. In step O10, a power source (and ground) wiring netlist O11 is prepared.

In step O12, there are entered the source-of-current element model information O9 prepared in step O8, the power source (and ground) wiring netlist O11 prepared in step O10, and an impedance O16 (including, resistance, capacitance, and inductance) of a wire or lead frame. Through analysis of these input data carried out by a transient analysis simulator typified by SPICE, variation in the line voltage of a circuit to be analyzed is calculated, wherewith a line voltage drop result O17 is prepared.

Subsequently, processing pertaining to step O6 is performed again. In contrast with the first operation of the processing pertaining to step O6 having been effected on the assumption that the potential of the power source (and the ground) is a variation-free, ideal potential, the line voltage drop result O16 prepared in step O12 is entered, and the current waveform information pieces O7 concerning the respective transistors are prepared again in consideration of the line voltage drop. Similarly, processing pertaining to steps O8 and O12 is performed again.

Processing pertaining to steps O6, O8, and O12 is effected several times in a looped manner, wherewith there is produced a current waveform result O13 which duplicates variation in a line voltage with high precision.

In step O14, the current waveform result O13 prepared in step O12 is entered and subjected to fast Fourier transformation (hereinafter abbreviated FFT), to thereby enable frequency spectrum analysis. There is obtained an EMI analysis result O15.

In the conventional example, the precision of verification varies greatly according to combination of processing pertaining to the LPE step O3, processing pertaining to the source line LPE step O10, and processing pertaining to the source-of-current modeling step O8. However, a certain level of accuracy of analysis can be expected. A transient analysis simulator typified by SPICE is used for transistor-level analysis of an electric current. Hence, a limitation is imposed on the level of a circuit to be analyzed, and an enormous amount of processing time is required. The level of a semiconductor integrated circuit has increased recently, and establishment of an EMI analysis method which enables high-speed analysis of an electric current on a larger scale than a transistor level by dealing with the analysis in abstract more than a transistor level dealing is desired.

A gate-level current analysis method (hereinafter referred to as a "gate-level power consumption analysis method") has conventionally been proposed as a current analysis method which can be made faster. This gate-level current analysis method is used for analyzing power consumption.

The gate-level power consumption analysis method for estimating power consumption on a gate level comprises the following steps: namely, a step of preparing beforehand a library from the total amount of electric current required per change when a logic signal appearing at an output port of a circuit element is changed from a logic value of 0 to 1 or from a logic value of 1 to 0; and a step of adding, to a total amount of current of the entire circuit at each time, a total amount of electric current required per change when a logic signal appearing at an output port of an instance in a circuit, the circuit being an object of estimation of power consumption, is changed from a logic value of 0 to 1 or a logic value of 1 to 0, to thereby estimate the total power consumed by the overall circuit (i.e., a value obtained by means of multiplying the total amount of current by an external voltage). FIG. 109 shows the configuration of an example system for effecting the conventional, popular gate-level power consumption analysis method. The gate-level power consumption analysis system shown in the drawing is operated through use of an amount-of-current analyzer comprising circuit connection information storage means 1001; signal pattern storage means 1002; means 1003 for storing the amount of electric current flowing through an element (hereinafter referred to simply as "element current storage means 1003"); total-amount-of-current storage means 1004; and total-amount-of-current calculation means 1005.

Individual elements constituting the gate-level current analysis system shown in FIG. 109 will now be described. Procedures for calculating the amount of current shown in FIG. 113 will be described, by reference to the gate-level circuit connection information shown in FIG. 110, a pattern of signal change arising at each terminal shown in FIG. 111, and the amount of current flowing through respective elements shown in FIG. 112.

The circuit connection information storage means 1001 stores circuit connection information concerning connection of circuits which are objects of analysis. Circuit connection information, such as that shown in FIG. 110, is stored in the circuit connection information storage means 1001 in advance. The circuit connection information is generally called a netlist.

The circuit connection information comprises an external input port D, an external clock signal input port CLK, an external output port Q, flip-flops FF1 and FF2, a buffer element BUF1, and wires D1 and Q1 for interconnecting elements. Each of the flip-flops FF1 and FF2 comprises a data input pin D, a clock signal input pin CK, and a data output pin Q. A logic value appearing at the data input pin D immediately before arrival of a leading edge of a clock signal input to the clock input pin CK is transmitted to the data output pin Q.

The buffer element BUF1 has a data input pin A and a data output pin Y. A logic value appearing at the data input pin A is output to the data output pin Y.

The above elements have a lag, such as an intra-element lag, and permit propagation of a signal with a time lag of 1 ns. The external input port D is connected directly to the input pin D of the flip-flop FF1. The external clock input port CLK is a terminal for receiving variation in a clock signal from the outside and is connected directly to the input pin CK of the flip-flop FF1 and to the input pin CK of the flip-flop FF2. The external output port Q is connected directly to the output pin Q of the flip-flop FF2 and outputs a signal value of the flip-flop FF2. A wire D1 interconnects the output pin Y of the buffer BUF1 and the input pin D of the flip-flop FF2. A wire Q1 interconnects the output pin Q of the flip-flop FF1 and the input pin A of the buffer BUF1.

The signal pattern storage means 1002 stores a pattern of signal change applied to information concerning connections of a circuit to be analyzed. As shown in FIG. 111, a pattern of change in a signal input to the input port CLK and a pattern of change in a signal input to the input port D shown in FIG. 110 are stored in the signal pattern storage means 1002 in advance. The horizontal axis in FIG. 111 represents the time at which change arises in a signal pattern. Upon each change, the signal pattern is changed between a logic value of 0 and a logic value of 1.

The element current storage means 1003 stores information concerning the amount of electric current flowing through an element; that is, information concerning the total amount of electric current flowing when single change arises in an external terminal of each element. Information concerning the amount of electric current flowing through an element, such as that shown in FIG. 112, is stored beforehand in the element current storage means 1003. Reference numeral 1301 designates the amount of electric current flowing through a flip-flop FF when change arises in a signal input to the clock signal input terminal CK of the flip-flop FF. Reference numeral 1302 designates the amount of electric current flowing through the flip-flop FF when change arises in a signal output from the output terminal of the flip-flop FF. Reference numeral 1303 designates the amount of electric current flowing through the buffer BUF when change arises in a signal output from the output terminal Y of the buffer BUF.

The total-amount-of-current calculation means 1005 is given a flowchart such as that shown in FIG. 114.

In step 1501, the circuit connection information which is stored in the circuit connection information storage means 1001 and is shown in FIG. 110 is read. In step 1502, a signal pattern stored in the signal pattern storage means 1002 and shown in FIG. 111 is read. In step 1503, information concerning the amount of electric current (hereinafter referred to simply as "element current information") stored in the element current storage means 1003 and shown in FIG. 112 is read.

In step 1504, the signal pattern shown in FIG. 111 is delivered to the circuit connection information shown in FIG. 110, to thereby enable propagation of a signal. When change arises in a signal appearing at the external terminal of a circuit element written in the element current information, the amount of electric current flowing through the external terminal is added to the information concerning the total amount of electric current at each time. A signal propagation method used herein is identical with a signal propagation method employed in a timing simulator. More specifically, the method is to calculate, in time sequence, change arising in a real circuit in accordance with a given signal pattern by means of tracking circuits which are affected by the signal pattern. The signal propagation method employed in a timing simulator is generally embodied in the form of a plurality of commercial tools. Hence, detailed description of the signal propagation method is omitted. FIG. 112 shows change in a logic value of a signal appearing at each pin, which has been caused as a result of propagation of the signal pattern in each step.

FIG. 112 shows change in a logic value in the same form as that in which the signal pattern is shown in FIG. 111. After completion of propagation of the signal, in step 1505 the information concerning the total mount of electric current calculated at respective times shown in FIG. 113 is stored in the total-amount-of-current storage means 1004. The total-amount-of-current storage means 1004 stores the information concerning the total amount of electric current detected at respective times according to the foregoing procedures, in the form shown in FIG. 113.

In a case where information concerning the total amount of electric current is calculated in greater detail, a load dependence coefficient of a current which is dependent on an output load capacitance (or on a charge current) and the total amount of electric current which is not dependent on an output load capacitance (or on a short circuit current) are stored in an element current storage section. Thereafter, information concerning the capacitance of each wiring (i.e., capacitance information) is read, the sum of the load-independent current and the product of the capacitance information and the load dependence coefficient is taken as the total amount of electric current. As described above, according to the conventional gate-level power consumption calculation method shown in FIG. 110, the amount of electric current flowing upon a single change arising in a signal appearing at an input or output pin is taken as a unit or as flowing momentarily. In other words, the conventional method determines only the total amount of electric current. In terms of power consumption, the accuracy of the thus-calculated total amount of current is sufficient. However, EMI analysis requires information concerning chronological change in electric current, and the total amount of electric current is not sufficient in terms of EMI analysis.

The conventional example using the transistor-level current analysis method can be expected to yield a certain level of accuracy. However, a transient analysis simulator typified by SPICE is used for transistor-level current analysis. A limitation is imposed on the level of a circuit to be analyzed, and an enormous amount of processing time is required. The scale of a semiconductor integrated circuit has increased recently, and establishment of an EMI analysis method which enables high-speed analysis of an electric current at a larger level than a transistor level is desired.

In the conventional example using the gate-level current analysis method, high-speed analyses of a current is feasible. However, only the total amount of electric current is determined. The gate-level current analysis method is sufficient in terms of power consumption but in insufficient in terms of EMI analysis.

SUMMARY OF THE INVENTION

The present invention has been conceived to solve the drawbacks of the conventional methods and is aimed at providing a method for enabling valuation of electromagnetic interference in LSI through simulation within a realistic period of time.

To this end, an EMI analysis method according to the present invention is characterized by means of adding a function of highly precisely analyzing a change in power current to a high-speed gate-level simulation.

The present invention provides an electromagnetic interference analysis method for analyzing the amount of electromagnetic interference arising in an LSI by means of performing a logic simulation, the method comprising:

an instantaneous current calculation step of calculating the amount of instantaneous electric current from event information, the information being produced when a change arises in a signal and including the instance name of each cell in which the change has arisen, the name of the signal, a time at which the change has arisen, and transition information;

a modeling step of modeling the instantaneous electric current according to a predetermined rule; and an FFT processing step of subjecting to fast Fourier processing (hereinafter referred to as "FFT processing") the information concerning a change in electric current, the information being calculated through a modeling step. Here, the amount of instantaneous current means the amount of electric current induced by an event. The amount of electric current flowing through a cell when a change arises in an output of the cell as an event is taken as the amount of instantaneous electric current.

Preferably, the modeling step includes an averaging step of averaging the instantaneous current over a certain discrete width, and the FFT processing step includes a step of subjecting to FFT processing information concerning a change in current, the information being produced by the averaging step.

Preferably, the modeling step includes a step of calculating the instantaneous electric current from information for each event, and a polygonal waveform modeling step of modeling the instantaneous current as a polygonal waveform, to thereby subject to FFT processing the information concerning a change in electric current calculated in the polygonal waveform modeling step.

Preferably, the modeling step includes a rectangular waveform modeling step of modeling the instantaneous current as a rectangular waveform whose height is calculated for information for each event such that the area of the rectangular waveform becomes equal to the amount of electric current of each event, and the FFT processing step includes a step of subjecting to FFT processing information concerning a change in current, the information being calculated in the rectangular waveform modeling step.

Preferably, the modeling step includes a geometrically-similar rectangular waveform modeling step of modeling the instantaneous current as a geometrically-similar rectangular waveform whose height and width are calculated such that the area of the rectangular waveform becomes equal to the amount of electric current of each event, and the FFT processing step includes a step of subjecting to FFT processing information concerning a change in current, the information being calculated in the geometrically-similar rectangular waveform modeling step.

Preferably, the modeling step includes a rectangular waveform modeling step of calculating the instantaneous electric current for information for each event, and a step of modeling the instantaneous current as a rectangular waveform through use of the amount of electric current and a table representing the relationship between the width and height of a rectangular waveform, to thereby subject to FFT processing the information concerning a change in electric current calculated in the rectangular waveform modeling step.

Preferably, the modeling step includes a step of calculating the instantaneous electric current from information for each event, and a polygonal waveform modeling step of modeling the instantaneous current as a rectangular waveform through use of a slew in an input waveform and a table representing the relationship between the width and height of a rectangular waveform, to thereby subject to FFT processing the information concerning a change in electric current calculated in the rectangular waveform modeling step.

Preferably, the modeling step includes a step of calculating the instantaneous electric current for information for each event, and a rectangular waveform modeling step of modeling the instantaneous current as a rectangular waveform through use of an output load capacitance and a table representing the relationship between the width and height of a rectangular waveform, to thereby subject to FFT processing the information concerning a change in electric current calculated in the rectangular waveform modeling step.

Preferably, the modeling step includes a step of calculating a drop in voltage from the amount of electric current flowing in each cell and the resistance of a power line and correcting the amount of instantaneous electric current of each cell for each event, on the basis of the relationship between the drop in voltage and the amount of instantaneous electric current.

Preferably, the modeling step includes a step of calculating a drop in voltage from the amount of electric current flowing in each cell, the resistance of a power line, and the capacitance of an on-chip capacitor, and correcting the amount of instantaneous electric current of each cell for each event, on the basis of the relationship between the drop in voltage and the amount of instantaneous electric current.

Preferably, the modeling step includes a step of transiently-analyzing a power RC of each cell and a cell power source, accurately calculating a drop in voltage, and a correction step of correcting the amount of instantaneous electric current of each cell for each event, on the basis of the relationship between the drop in voltage and the amount of instantaneous electric current.

Preferably, the modeling step includes a triangular waveform modeling step of modeling the instantaneous current as a triangular waveform which has a given width and whose height is calculated for information for each event such that the amount of instantaneous electric current becomes equal to the area of the triangular waveform, and the FFT processing step includes a step of subjecting to FFT processing information concerning a change in current, the information being calculated in the triangular waveform modeling step.

Preferably, the modeling step includes a multi-order-function waveform modeling step of modeling the instantaneous current as a multi-order-function waveform, and the FFT processing step includes a step of subjecting to FFT processing information concerning a change in current, the information being calculated in the multi-order-function waveform modeling step.

Preferably, the modeling step includes a exponential function waveform modeling step of modeling the instantaneous current as an exponential-function waveform, and the FFT processing step includes a step of subjecting to FFT processing information concerning a change in current, the information being calculated in the exponential-function waveform modeling step.

Preferably, the modeling step includes a step of modeling the amount of instantaneous electric current while separating the same into a short circuit electric current component and a charge current component.

Preferably, the modeling step includes a calculation step of calculating the height of a rectangular waveform from a library in which peak currents of cells are characterized according to the type of cell, and a rectangular waveform modeling step of modeling the amount of instantaneous electric current as a rectangular waveform, the peak current calculated in the calculation step being taken as the height of the rectangular waveform and the area of the rectangular waveform being equal to the amount of electric current of each event, and the FFT processing step includes a step of subjecting to FFT processing information concerning a change in current, the information being calculated in the rectangular waveform modeling step.

Preferably, the calculation step includes a step of calculating a peak current for each cell from information concerning a slew in the cell, by reference to a library in which the relationship between a slew in input waveform and a peak current is characterized in the form of a table according to the type of cell.

Preferably, the calculation step includes a step of calculating a peak current for each cell from information concerning a load capacitance of a cell, by reference to a library in which the relationship between a load capacitance and a peak current is characterized in the form of a table according to the type of cell.

Preferably, the calculation step includes a step of setting a plurality of peak currents for a composite cell and calculating the heights of a plurality of rectangular waveforms through use of a characterized library, and the rectangular waveform modeling step corresponds to a step of modeling the amount of electric current into a plurality of rectangular waveforms.

Preferably, the calculation step includes a step of setting a plurality of peak currents for each of the rise and fall of a flip-flop (FF) cell and calculating the heights of a plurality of rectangular waveforms through use of a characterized library, and the rectangular waveform modeling step corresponds to a step of modeling the amount of electric current into a plurality of rectangular waveforms.

Preferably, the calculation step includes a step of calculating the height of a rectangular waveform through use of a library in which peak currents are characterized, in consideration of the state of an input signal.

Preferably, the modeling step includes
a step of calculating a drop in voltage from the amount of electric current determined according to the type of cell and from the resistance of a power line; and
a correction step of characterizing, for each cell, the relationship between a drop in voltage and the amount of instantaneous electric current in the form of a table, to thereby correct the amount of instantaneous electric current for each event of the cell.

Preferably, the modeling step includes
a step of calculating a drop in voltage from the amount of electric current determined according to the type of cell, the resistance of a power line, and the capacitance of an on-chip capacitor; and
a correction step of characterizing, for each cell, the relationship between a drop in voltage and the amount of instantaneous electric current in the form of a table, to thereby correct the amount of instantaneous electric current for each event of the cell.

Preferably, the correction step includes a step of iterating several times calculation of a drop in voltage and correction of a current waveform.

Preferably, the electromagnetic interference analysis method as defined in any one of the claims, wherein the analysis method calculation step includes a step of modeling the amount of instantaneous electric current while separating the same into a short circuit electric current component and a charge current component.

Preferably, the modeling step includes a triangular waveform modeling step of modeling the instantaneous current as a triangular waveform whose width is calculated for each event information in consideration of slew information (i.e., an output slew) for an output terminal of a cell to each event information such that the area of the triangular waveform becomes equal to the amount of electric current of each event, the height of the triangular waveform being calculated on the basis of the width, and the FFT processing step includes a step of subjecting to FFT processing information concerning a change in current, the information being calculated in the triangular waveform modeling step.

Preferably, the modeling step includes
a triangular height calculation step of calculating the height of a triangular waveform such that the area of the triangular waveform becomes equal to the amount of electric current of each event, by means of multiplying the amount of instantaneous electric current by a coefficient corresponding to the state of an event of a cell, in consideration of whether the event of the cell is in a rising state or a falling state.

Preferably, the modeling step includes
a step of calculating the amount of instantaneous electric current for each event information in the case of a composite cell; and
a triangular waveform modeling step of modeling the amount of instantaneous electric current as a plurality of triangular waveforms which are equal in number to the stages provided in the composite cell, through use of a table representing the relationship between the width and height of a triangular waveform; and
the FFT processing step includes a step of subjecting to FFT processing information concerning a change in current, the information being calculated in the triangular waveform modeling step.

Further, the present invention provides an electromagnetic interference analysis system for analyzing the amount of electromagnetic interference arising in an LSI by means of performing a logic simulation, the system comprising:
a logic simulator;
computation means which is connected to the logic simulator and calculates the amount of instantaneous electric current from event information, the information being produced when a change arises in a signal and including the instance name of each cell in which the change has arisen, the name of the signal, a time at which the change has arisen, and transition information;
modeling means for modeling the instantaneous electric current according to a predetermined rule; and
fast Fourier (FFT) conversion means for subjecting to fast Fourier processing the information concerning a change in electric current, the information being calculated through a modeling step, thereby analyzing the amount of electromagnetic interference arising in an LSI on the basis of a signal output from the FFT conversion means.

BRIEF DESCRIPTION OF THE DRAWINGS

FIG. 75 is a graph showing example data stored in element current storage means according to the seventeenth embodiment;

FIG. 87 is a graph showing example data stored in conventional total current storage means according to the nineteenth embodiment;

FIG. 88 is a graph showing example data stored in element current storage means according to the nineteenth embodiment;

FIG. 89 is a flowchart showing processing operations of the total current calculation means according to the nineteenth embodiment;

FIG. 105 is a graph showing example data stored in element current storage means according to the twenty-sixth embodiment;

FIG. 110 is an illustration showing example data stored in circuit connection information storage means employed in an example conventional EMI analysis method and in a twenty-sixth embodiment;

FIG. 111 is a graph showing example data stored in a pattern-of-signal-change storage means employed in an example conventional EMI analysis method and in the twenty-sixth embodiment;

FIG. 120 shows a triangular waveform model according to the present invention (a twenty-eighth embodiment);

FIG. 121 is a block diagram showing calculation of a current waveform (according to the twenty-eighth embodiment);

FIG. 122 shows a triangular waveform model according to the present invention (a twenty-ninth embodiment); and FIG. 123 is a block diagram showing calculation of a current waveform (according to the twenty-ninth embodiment).

DESCRIPTION OF THE PREFERRED EMBODIMENTS

First Embodiment

An electromagnetic interference (EMI) analysis method according to a first embodiment of the present invention will be described hereinbelow. The EMI analysis method is characterized by calculating a current waveform.

The method comprises the steps of:
extracting event information on a per-cell basis from a logic simulator;
calculating from the event information a momentarily-changing current of each cell;
averaging the instantaneously-changing current by means of dividing by a certain duration of time, to thereby calculate a more realistic change in current; and
subjecting the calculation result of a current waveform to fast Fourier transformation (FFT), to thereby determine a frequency characteristic of electromagnetic interference (EMI) emitted from a circuit of interest, to thereby effect EMI analysis.

Figure 1:
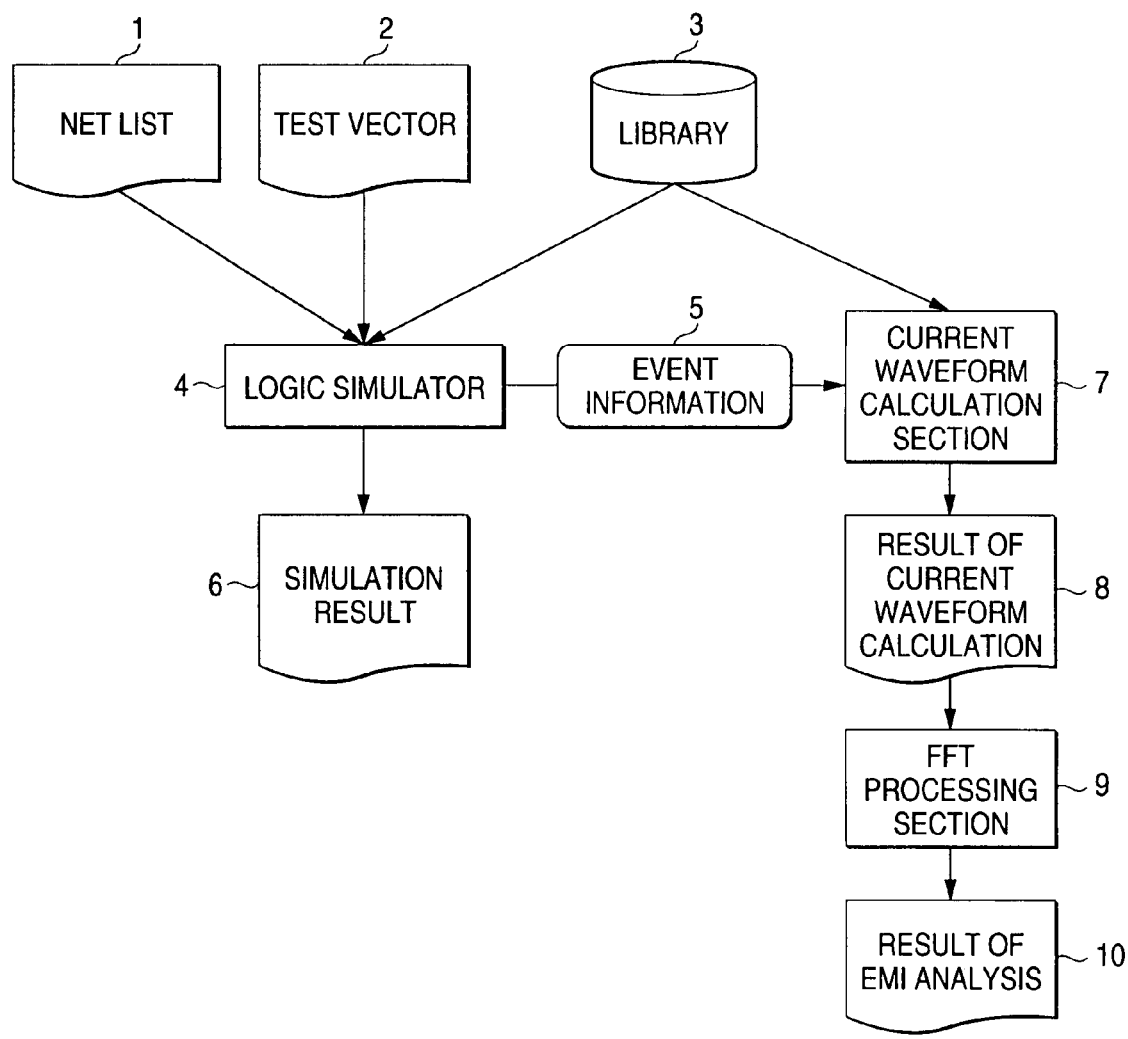
FIG. 1 is a block diagram showing the overall flow of processing pertaining to an EMI analysis method according to a first embodiment of the present invention.

FIG. 1 is a block diagram showing the overall flow of processing pertaining to the EMI analysis method of the first embodiment. In the drawing, there are described a netlist 1 representing data pertaining to a circuit to be subjected to EMI analysis; a test vector 2 for activating the netlist 1; a library 3 having described therein information concerning individual cells constituting the netlist 1; a logic simulator 4 for performing a simulation on the basis of the information from the library 3; and a current waveform calculation section 7 for calculating a current waveform from event information 5, the information having been calculated on a per-cell basis by means of the logic simulator 4. An FFT processing section 9 performs an FFT processing operation on the basis of a current waveform calculation result 8 calculated by the current waveform calculation section 7, to thereby calculate an EMI component. Accordingly, there is obtained an EMI analysis result 10 of the circuit of interest. Thus, the EMI analysis method is characterized by use of the current waveform calculation section 7. The logic of a cell, delay information concerning the cell, and momentary-current-value information concerning the cell are described in the library 3 according to the types of individual cells. Every time an event arises, the logic simulator 4 outputs the event information 5. The term "event" used herein designates occurrence of any change in a signal within the logic simulator 4. The event information 5 contains the instance name of an object of EMI analysis which accounts for outputting of the event information 5, the name of a signal in which change has arisen, the time at which the change has arisen, and information concerning transition of the signal. The expression "instance name" corresponds to a proper name assigned to each of the cells constituting the netlist 1. Reference numeral 6 designates a simulation result output from the logic simulator 4.

Figure 2:
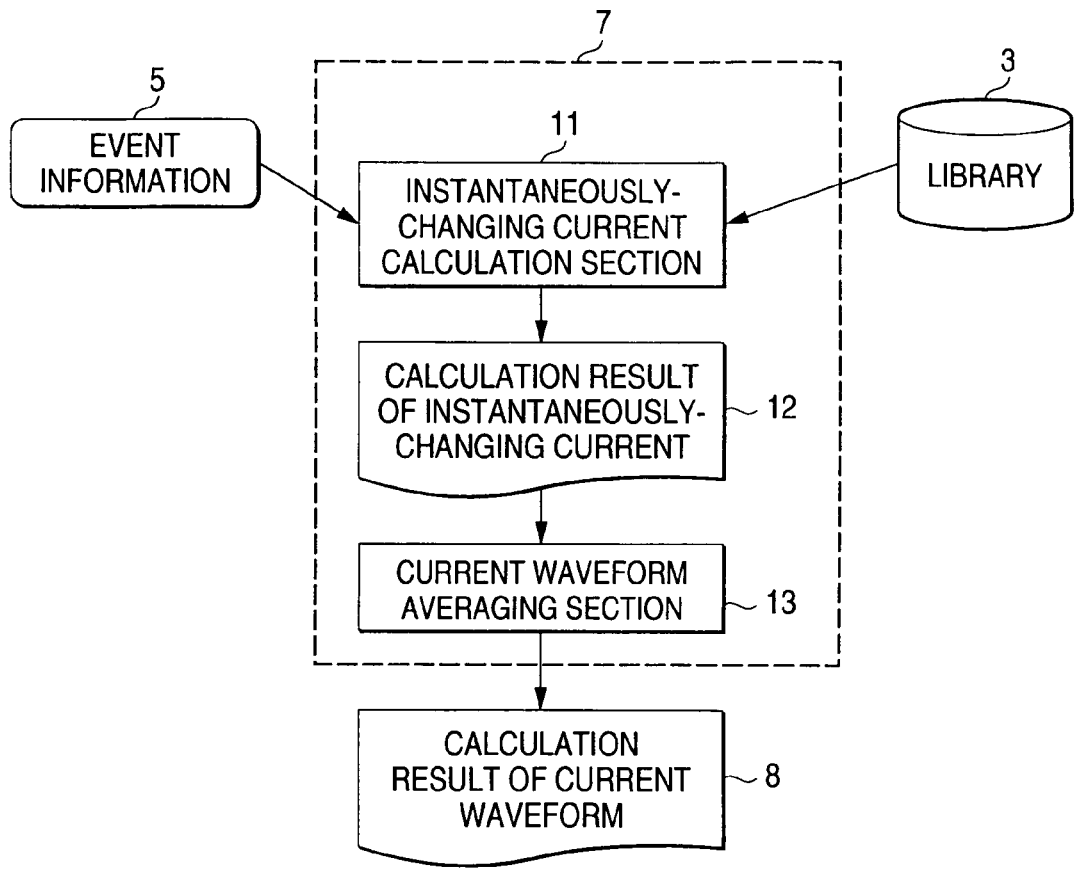
FIG. 2 is a block diagram showing a current waveform calculation section according to the first embodiment.
Figure 3:
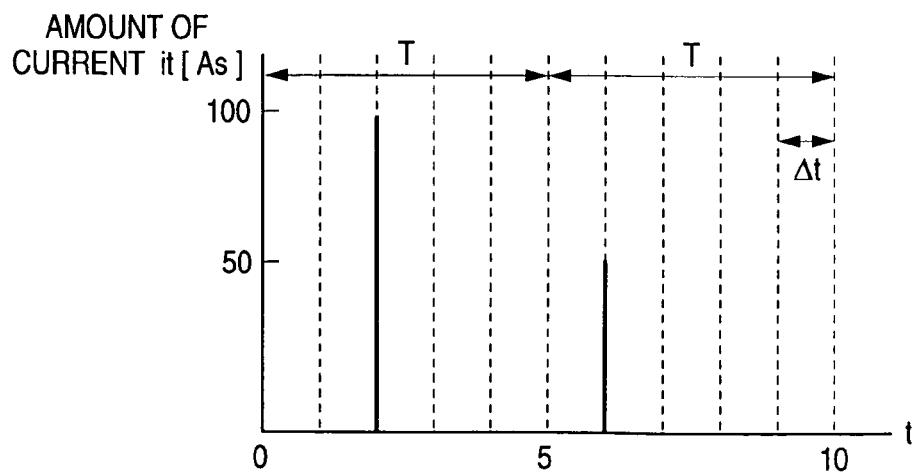
FIG. 3 is a graph showing a calculation result of an instantaneous current.

As can be seen from a detail block diagram shown in FIG. 2, the current waveform calculation section 7 comprises an instantaneously-changing current calculation section 11 and calculates an instantaneously-changing current from information concerning an instantaneously-changing current of an instance calculated by the instantaneously-changing current calculation section 11, the instance serving as an object of EMI analysis. On the basis of a calculation result 12 of an instantaneously-changing current (hereinafter referred to as an "instantaneously-changing current calculation result 12"), the current waveform calculation section 7 averages a current waveform by means of dividing an instantaneously-changing current by a predetermined duration of time. The instantaneously-changing current calculation section 11 calculates a momentary change in the current of each cell from the event information 5 concerning each cell, the information being output from the logic simulator 4. Calculation of momentary change in current is technically analogous to calculation of power consumption through a conventional logic simulation. Upon receipt of the event information 5 output from the logic simulator 4, the instantaneously-changing current calculation section 11 extracts, from the library 3, information concerning an instantaneously-changing current of an instance, the instance being an object of EMI analysis, to thereby calculate an instantaneously-changing current. Reference numeral 12 designates an instantaneously-changing current calculation result determined by the instantaneously-changing current calculation section 11. FIG. 3 is a plot showing an example instantaneously-changing current calculation result 12. In the drawing, the vertical axis represents the amount of current "it" (As), and the horizontal axis represents time "t." Reference symbol T designates a duration of time for averaging a current waveform by means of dividing an instantaneously-changing current by a certain duration of time and corresponds to a predetermined constant. At designates a minimum time unit to be used for analysis and differs from the minimum unit time of the logic simulator 4. Reference symbol "t" denotes a current processing time and corresponds to a simulation time of the logic simulator 4. Reference symbol "it" denotes the value of an instantaneously-changing current. As can be seen from FIG. 3, according to the instantaneously-changing current calculation result, the waveform of an electric current assumes a δ function. Therefore, an EMI component cannot be analyzed through an FFT operation. In order to enable analysis of an EMI component through FFT, a current waveform averaging section 13 averages the instantaneously-changing current calculation result 12 by means of dividing by a certain duration of time.

Figure 4:
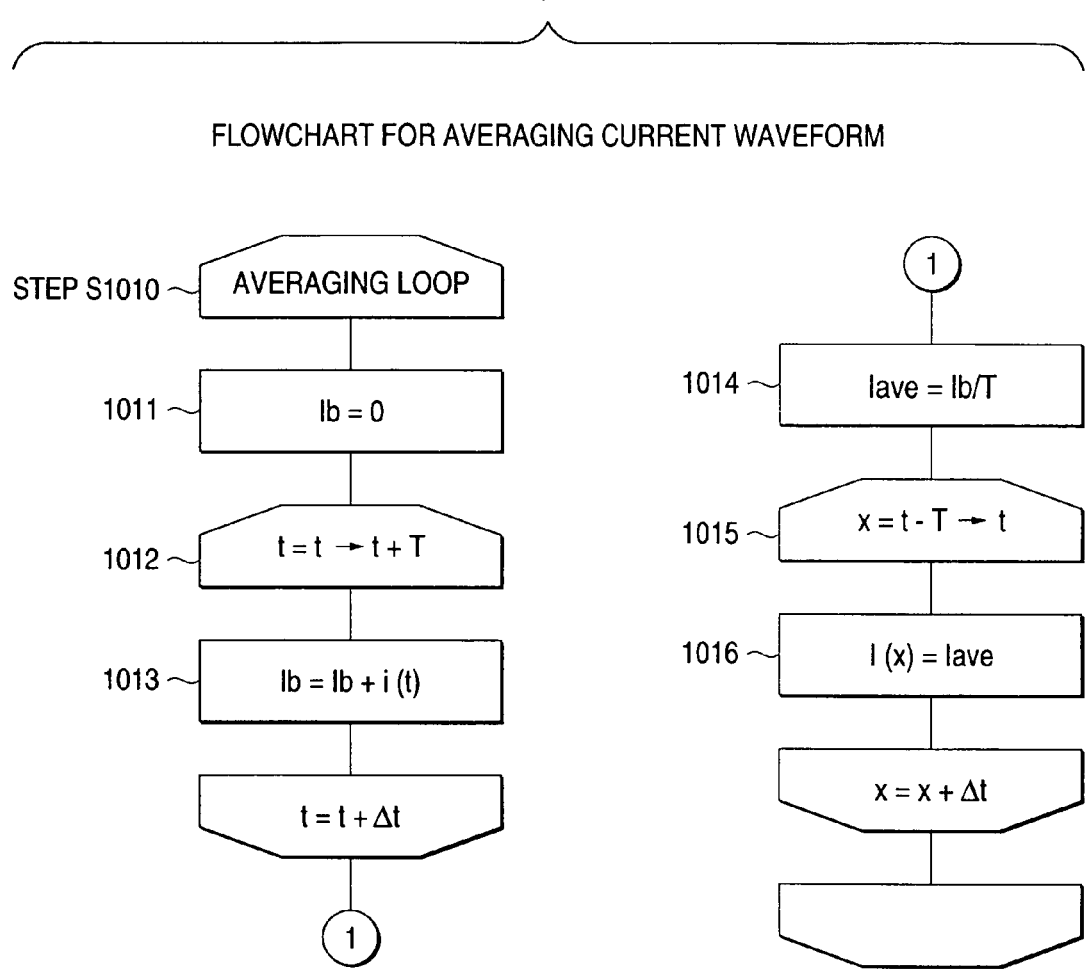
FIG. 4 is a flowchart showing processing for averaging a current waveform.

FIG. 4 shows a flowchart of steps relating to averaging of a current waveform. The following processing operations are repeated until an averaging operation is completed; namely, until "t" exceeds an end time of simulation (step 1010). First, a current buffer "Ib" for averaging purpose is set to 0 (step 1011). Next, i(t) is added to "Ib" until the current time "t" becomes "t+T" (steps 1012 and 1013). Here, i(t) denotes an instantaneously-changing current at time "t" (step 1014). Next, $I_{ave}$ is assigned to I(x) until a variable "x" shifts from −T to "t," thereby adding Δt to the variable "x" (steps 1015 and 1016). Here, I(x) denotes a current at time "x."

Figure 5:
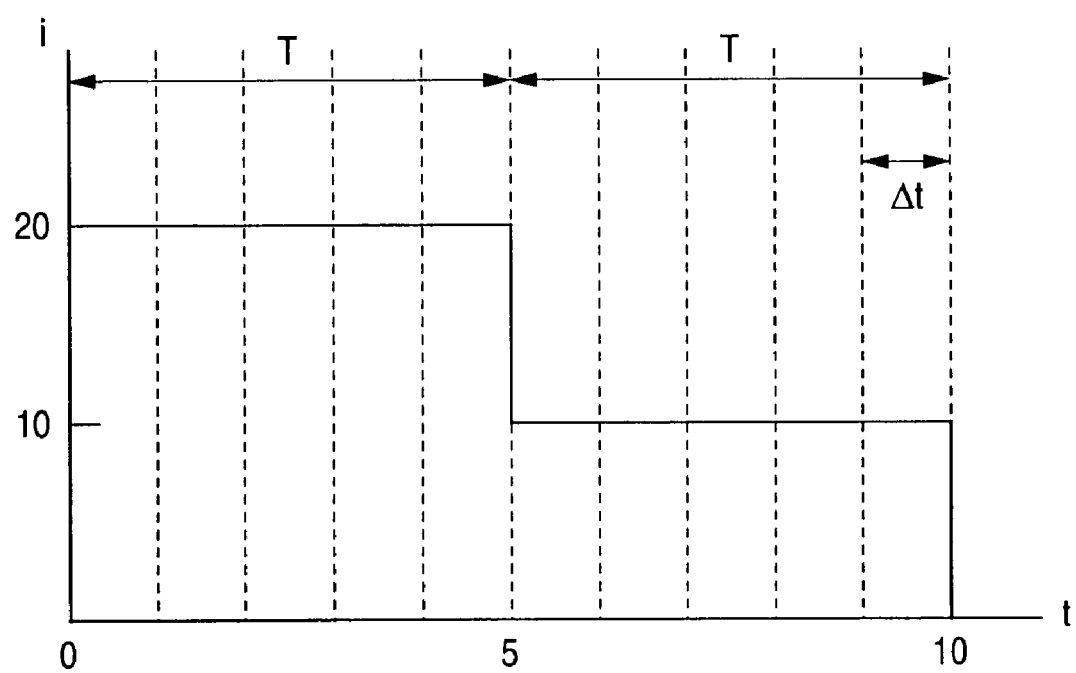
FIG. 5 is a graph showing a calculation result of a current waveform (according to the first embodiment)
Figure 6:
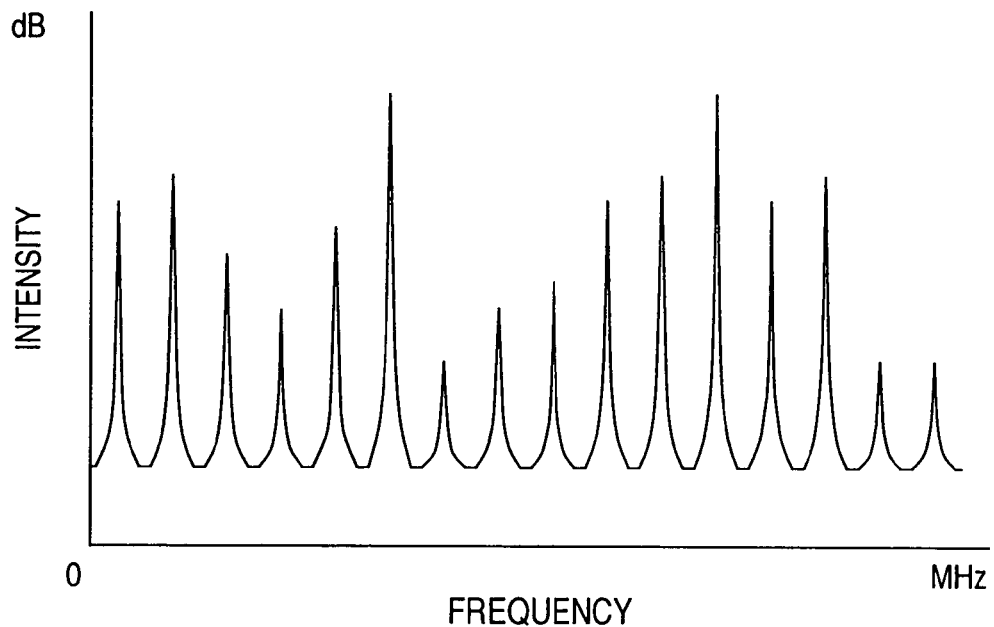
FIG. 6 is a graph showing a result of an FFT operation.

The current waveform calculation result 8 can be determined by means of the flowchart of averaging operations. FIG. 5 shows a current waveform calculation result 8 obtained at time T=5 provided in the instantaneously-changing current calculation result 8 shown in FIG. 3. The FFT processing section 9 subjects the thus-calculated waveform to an FFT processing operation, thereby determining the frequency characteristic of an EMI component. In this way, there can be obtained a result 10 of EMI analysis (hereinafter referred to as an "EMI analysis result 10"). FIG. 6 shows a sample of the EMI analysis result 10. From the EMI analysis result 10, the frequency characteristic of an EMI component arising in the circuit of interest can be determined, and the designer of the circuit can study a method of addressing EMI.

The EMI analysis method of the present embodiment models a current waveform by means of an averaging operation and subjecting the thus-modeled waveform to an FFT operation, to thereby enable highly-precise analysis of EMI. Further, the EMI analysis method of the present embodiment can analyze an EMI component of a circuit within a shorter period of time than can a transistor-level EMI analysis method.

Second Embodiment

An electromagnetic interference (EMI) analysis method according to a second embodiment of the present invention will be described hereinbelow. The EMI analysis method comprises the steps of:
 calculating a momentarily-changing current of each cell from the event information 5 output from the logic simulator 4;
 modeling the thus-calculated momentarily-changing current a rectangular waveform having a certain duration of time, the peak value of the waveform having been calculated such that an instantaneously-changing current coincides with the area of the rectangular waveform. Accordingly, a more realistic change in current is calculated, and the calculation result of a current waveform is subjected to FFT operation, wherewith a frequency characteristic of an EMI component arising in a circuit of interest is determined and EMI analysis is effected.

Figure 7:
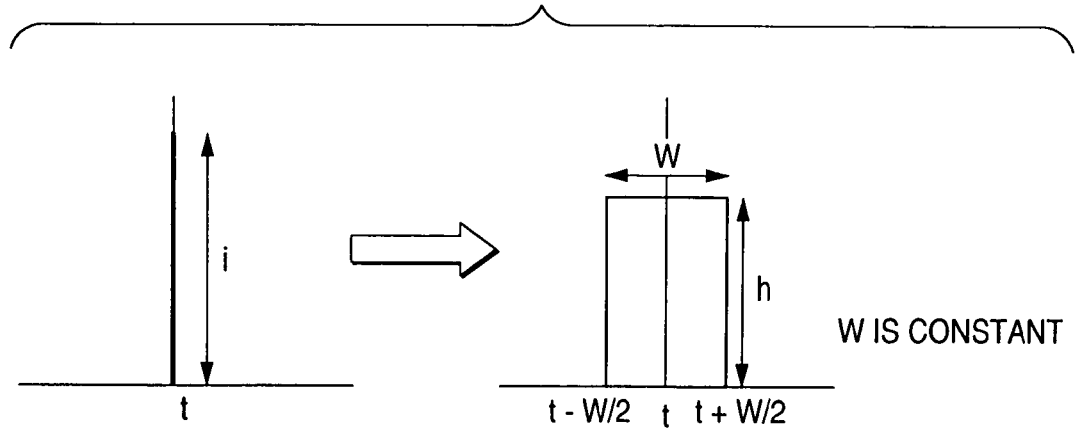
FIG. 7 shows a rectangular waveform model (according to a second embodiment of the present invention)

FIG. 7 shows an instantaneously-changing current value and a modeled rectangular waveform according to the second embodiment. In the drawing, "i" represents an instantaneously-changing current value, and "t" denotes a current processing time. Reference symbol "W" denotes the width of a modeled rectangular waveform. The width of a rectangular waveforms corresponds to a predetermined constant. Further, reference symbol "h" denotes the height of a rectangular waveform, which is to be calculated from "i" and "W."

The overall flow of processing pertaining to the EMI analysis method of the present embodiment is represented by the same block diagram as that employed in the first embodiment (see FIG. 1).

Figure 8:
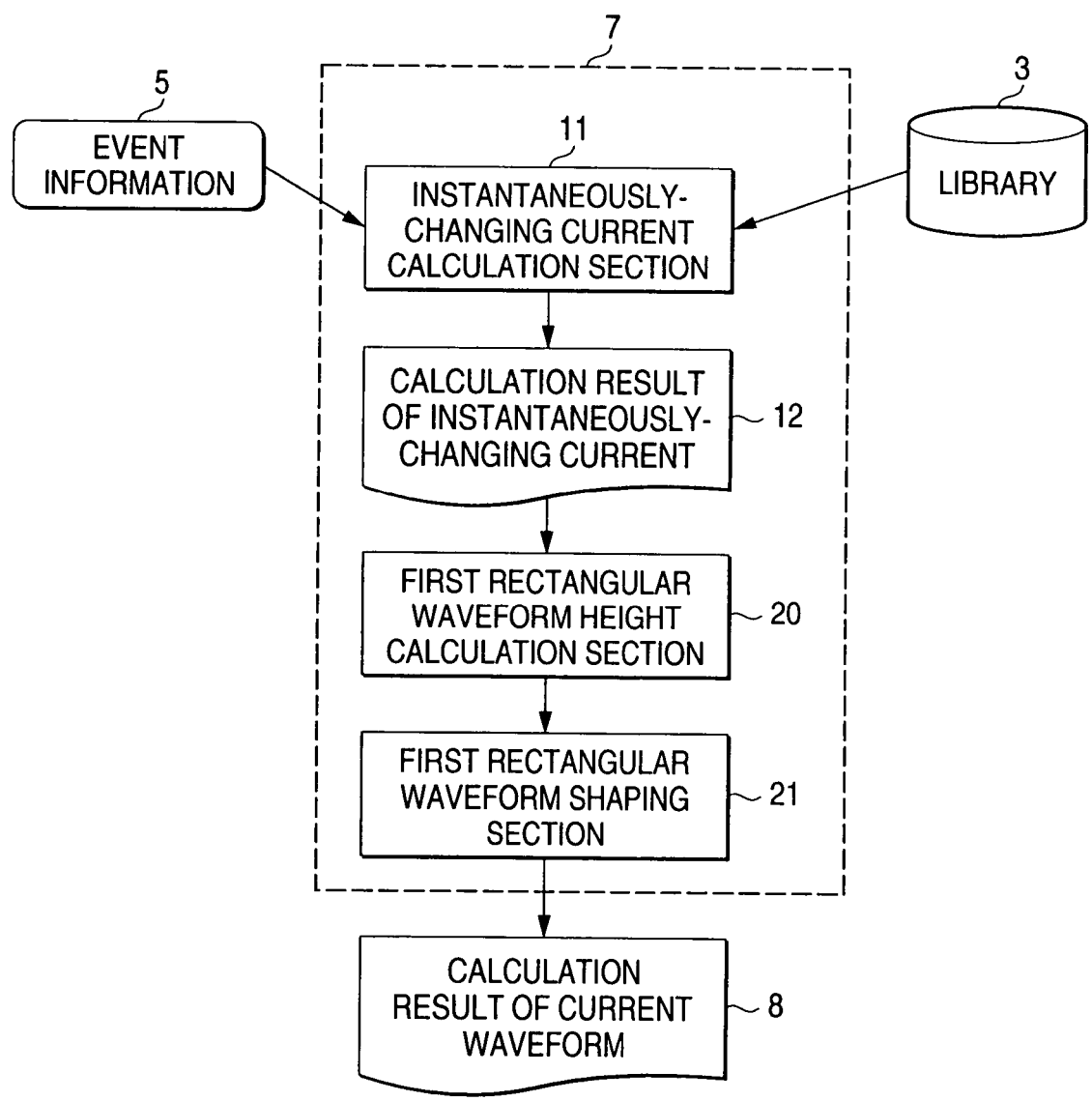
FIG. 8 is a block diagram showing calculation of a current waveform (according to the second embodiment)

FIG. 8 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with that of the current wave calculation operation of the first embodiment. The EMI analysis method according to the present embodiment comprises a first rectangular waveform height calculation section 20 for calculating the height of a rectangular waveform such that the area of a rectangular waveform serving as a model of the waveform of the instantaneously-changing current coincides with the instantaneously-changing current value; and a first rectangular waveform-shaping section 21 for modeling the instantaneously-changing current calculation result 12 as a rectangular waveform having a certain duration of time, thereby calculating the waveform of an electric current.

Figure 9:
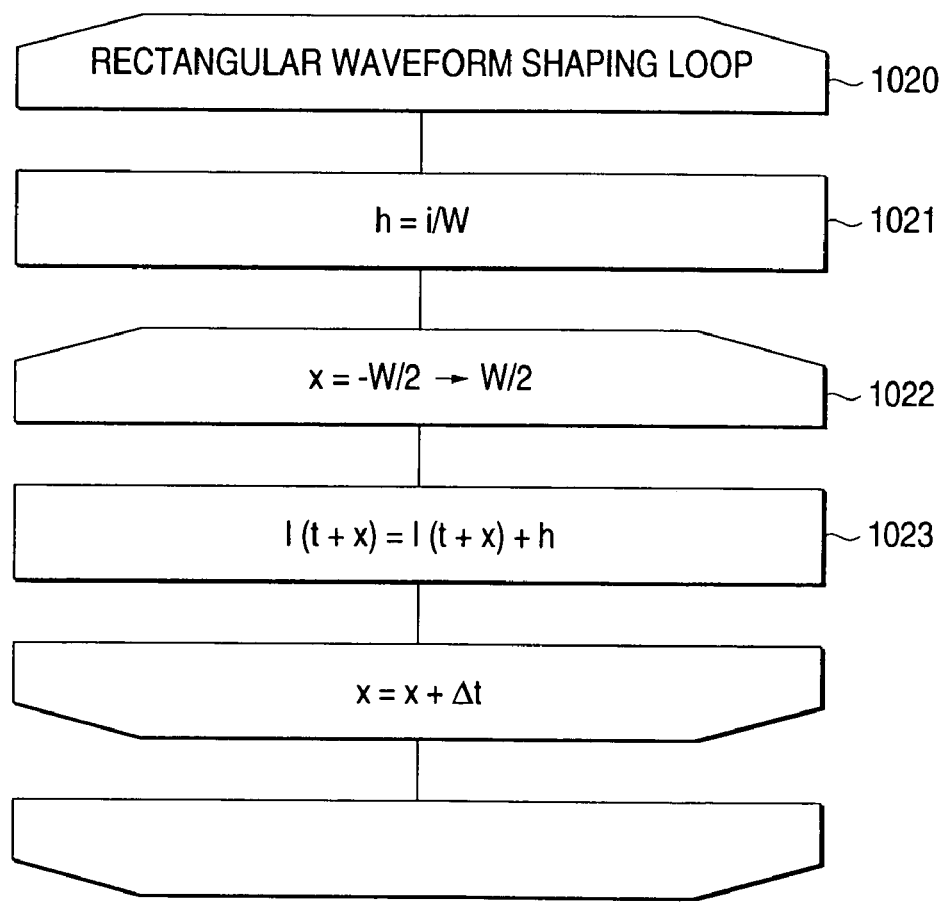
FIG. 9 is a flowchart showing a first rectangular waveform-shaping operation.

FIG. 9 shows a flow of rectangular waveform-shaping operations including an operation for calculating the height of a rectangular waveform. The following operation is repeated on a per-event basis until a current wave calculation operation is completed (step 1020). The area of a rectangular waveform is defined as "W×h" and assumes a value of "i." The height "h" of the rectangular waveform is calculated as i/W (step 1021). Symbol "i" denotes an instantaneously-changing current value concerning a cell of an event, the event being an object of EMI analysis. This processing corresponds to processing pertaining to the first rectangular waveform height calculation section 20. Next, "h" is added to I(t+x) until a variable "x" changes from −W/2 to W/2, and Δt is added to "x" (steps 1022 and 1023). I(t+x) corresponds to the value of electric current flowing through all the cells at time t+x. This processing corresponds to processing pertaining to the first rectangular waveform-shaping section 21.

Figure 10:
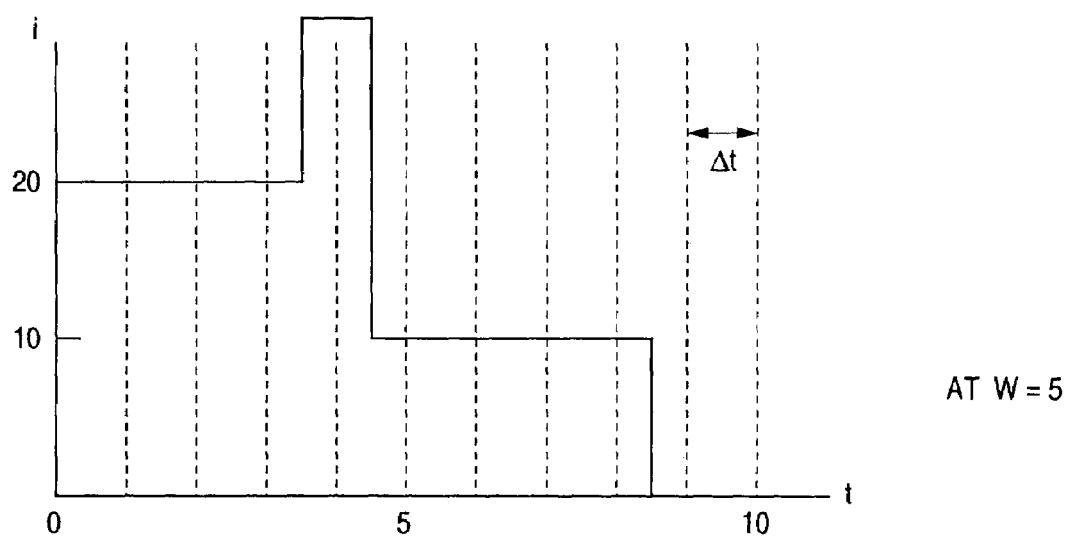
FIG. 10 is a graph showing a calculation result of a current waveform (according to the second embodiment)

The current wave calculation result 8 can be obtained by means of the flow of a rectangular waveform height calculation operation and a rectangular waveform-shaping operation. FIG. 10 shows an example current wave calculation result 8 at W=5 in the instantaneously-changing current calculation result shown in FIG. 3. The FFT processing section 9 subjects the waveform to an FFT operation, to thereby determine the frequency characteristic of an EMI component. As a result, there can be obtained an EMI analysis result 10.

According to the EMI analysis method of the present embodiment, the waveform of a current is modeled as a rectangular waveform, and the thus-modeled rectangular waveform is subjected to an FFT operation, thereby enabling more accurate analysis of EMI. The EMI analysis method according to the present embodiment enables processing within a more shorter period of time than does the transistor-level EMI analysis method.

Third Embodiment

An EMI analysis method according to a third embodiment of the present invention will now be described. Under the EMI analysis method according to the present embodiment, a momentarily-changing current of each cell is calculated from event information concerning to each cell, the information being output from a logic simulator. The momentarily-changing current is modeled as a rectangular waveform, wherein a ratio of a duration of time to a peak value is made constant such that an instantaneously-changing current value becomes equal to the area of the rectangular waveform. As a result, there is calculated a more realistic change in current, and the result of calculation of a current waveform is subjected to an FFT operation, to thereby determine the frequency characteristic of an EMI component of a circuit of interest and enable EMI analysis. The EMI analysis method will now be described.

Figure 11:
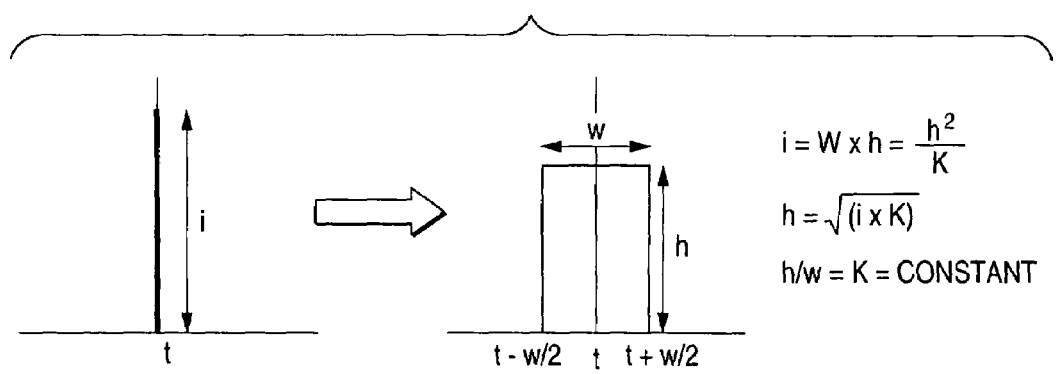
FIG. 11 shows a rectangular waveform model (according to a third embodiment of the present invention)

FIG. 11 shows a momentary current value and a modeled rectangular waveform according to the third embodiment. Reference symbol "i" denotes an instantaneously-changing current value, and "t" denotes a current processing time. Reference symbol "K" denotes a ratio of a peak value of a rectangular waveform to a duration of time. In the present embodiment, the ratio is expressed as "peak-value/width." The peak-value/width ratio is constant, and an appropriate value has been determined beforehand as the value of the peak-value/width ratio. Reference symbol "h" denotes the height of a rectangular waveform, and the height "h" is determined from the value of "i" and the value of "K." Further, reference symbol "w" denotes the width of a rectangular waveform, and the width "w" of a rectangular waveform is calculated from the value of "h," which has been calculated previously, and the value of "i."

The overall flow of processing pertaining to the EMI analysis method of the present embodiment is represented by the same block diagram as that employed in the first embodiment (see FIG. 1).

Figure 12:
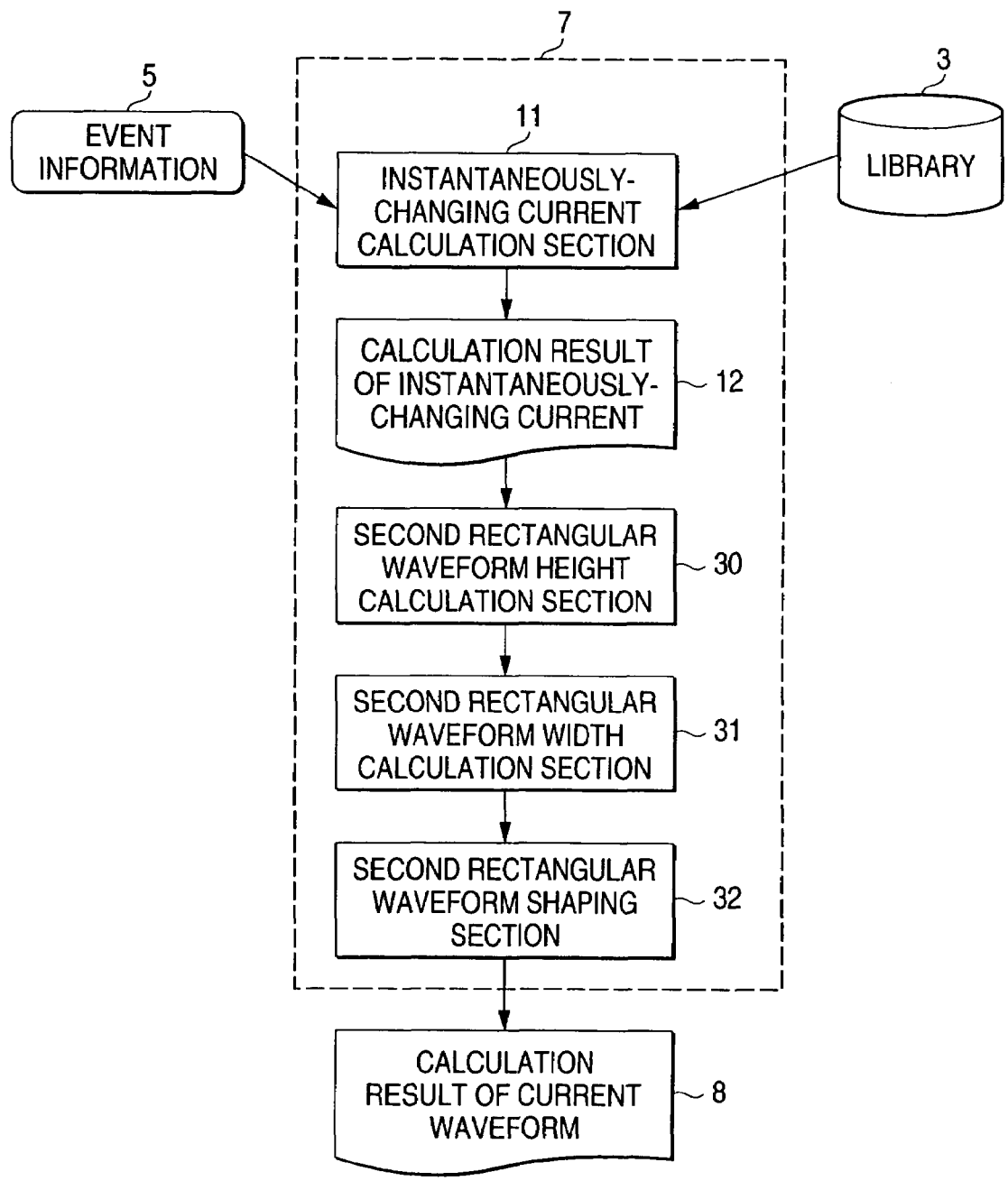
FIG. 12 is a block diagram showing calculation of a current waveform (according to the third embodiment)

FIG. 12 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, processing has been identical with the current wave calculation operation of the first embodiment.

Reference numeral 30 designates a second rectangular waveform height calculation section for calculating the height of a rectangular waveform such that a ratio of a peak value of a rectangular waveform to be modeled to a duration of time is constant and such that the area of a rectangular waveform becomes equal to an instantaneously-changing current value. Reference numeral 31 designates a second rectangular waveform width calculation section for calculating the width of a rectangular waveform such that a ratio of a peak value of a rectangular waveform serving as a model of the waveform of the instantaneously-changing current to a duration of time is constant and such that the area of a rectangular waveform becomes equal to an instantaneously-changing current value. Reference numeral 32 designates a second rectangular waveform-shaping section for modeling the instantaneously-changing current calculation result 12 as a rectangular waveform having a constant peak-value/width ratio.

Figure 13:
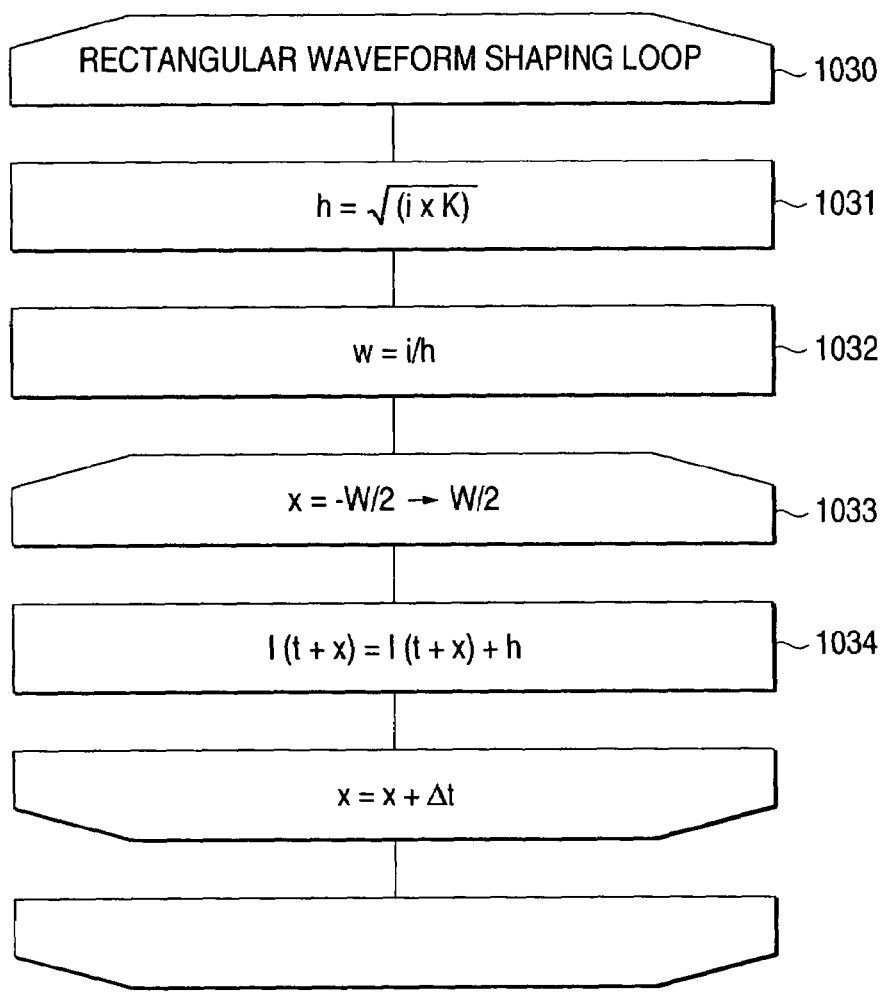
FIG. 13 is a flowchart showing a second rectangular waveform-shaping operation.

FIG. 13 shows the flowchart of processing pertaining to the second rectangular waveform-shaping section, including processing pertaining to the second rectangular waveform height calculation section and processing pertaining to the second rectangular waveform width calculation section. The following processing is iterated on a per-event basis until calculation of a current waveform is completed (step 1030). The height of a rectangular waveform is expressed by Eq. 1 provided below, from the area of a rectangular waveform and "K=h/w."

$$h = \sqrt{(i \times K)} \qquad (1)$$

The height "h" of a rectangular waveform is calculated through use of Eq.1 (step 1031). Reference symbol "i" denotes the value of an instantaneously-changing current of a cell of an event, the event being an object of EMI analysis. Reference symbol "K" denotes a ratio of a peak value of a rectangular waveform to the width of the same and assumes a predetermined constant. This processing corresponds to processing pertaining to the second rectangular waveform height calculation section 30. The area of a rectangular waveform is defined by "w×h." The width "w" of a rectangular waveform is calculated on the basis of "w=i/h" (1032). Reference symbol "h" denotes the height "h" of a rectangular waveform calculated through processing pertaining to step 1031. This processing corresponds to processing pertaining to the second rectangular waveform width calculation section 31. Next, "h" is added to I(t+x) until a variable "x" changes from −W/2 to W/2, and Δt is added to "x" (steps 1033 and 1034). I(t+x) corresponds to the value of electric current flowing through all the cells at time t+x. This processing corresponds to processing pertaining to the second rectangular waveform-shaping section 32.

Figure 14:
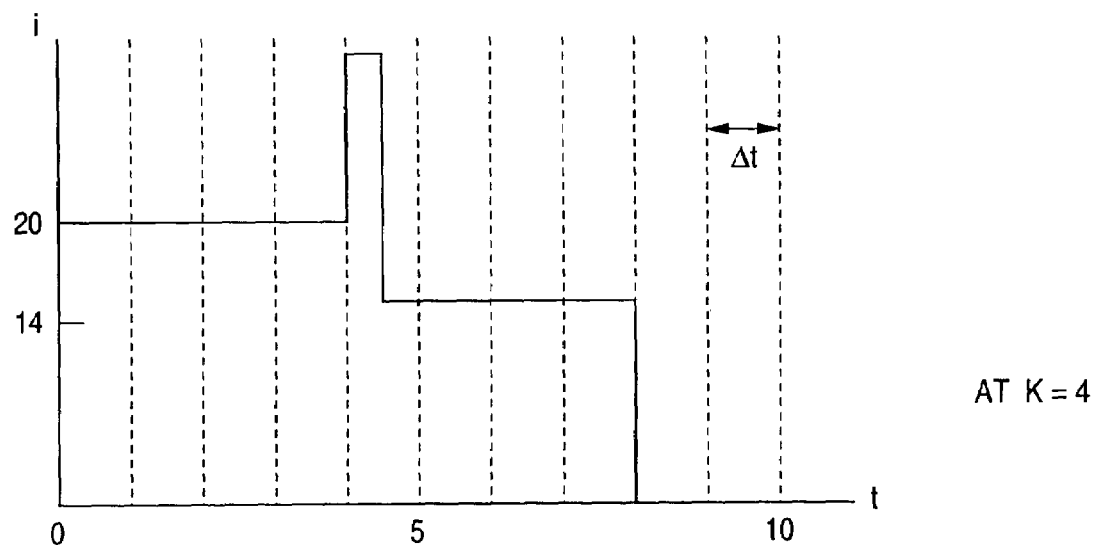
FIG. 14 is a graph showing a calculation result of a current waveform (according to the third embodiment)

The current wave calculation result 8 can be obtained by means of the flow of a rectangular waveform height calculation operation, a rectangular waveform width calculation operation, and a rectangular waveform-shaping operation. FIG. 14 shows an example current wave calculation result 8 in the instantaneously-changing current calculation result shown in FIG. 3. The FFT processing section 9 subjects the waveform to an FFT operation, to thereby determine the frequency characteristic of an EMI component. As a result, there can be obtained an EMI analysis result 10.

According to the EMI analysis method of the present embodiment, the waveform of a current is modeled as a rectangular waveform having a constant peak-value/width ratio, and the thus-modeled rectangular waveform is subjected to an FFT operation, thereby enabling more accurate analysis of EMI. In an LSI circuit involving flow of a large amount of electric current, flow of an electric current consumes a long time. The EMI analysis method according to the present embodiment enables realization of a more realistic model and hence enables more accurate processing. Further, the EMI analysis method enables EMI analysis within a much shorter period of time than the transistor-level EMI analysis method.

Fourth Embodiment

A fourth embodiment of the present invention will now be described. The present embodiment describes a method of analyzing EMI by the steps of:
calculating an instantaneously-changing current of each current from event information concerning each cell, the information being output from a logic simulator;
modeling the instantaneously-changing current as a rectangular waveform whose area becomes equal to the instantaneously-changing current, through use of a global table representing the relationship between an instantaneously-changing current and the height of a rectangular waveform, to thereby calculate a more realistic change in current; and
subjecting a calculation result of the current waveform to an FFT operation, to thereby determine the frequency characteristic of an EMI component of a circuit of interest. The global table signifies a table which is generally prepared without regard to the type of a cell.

Figure 15:
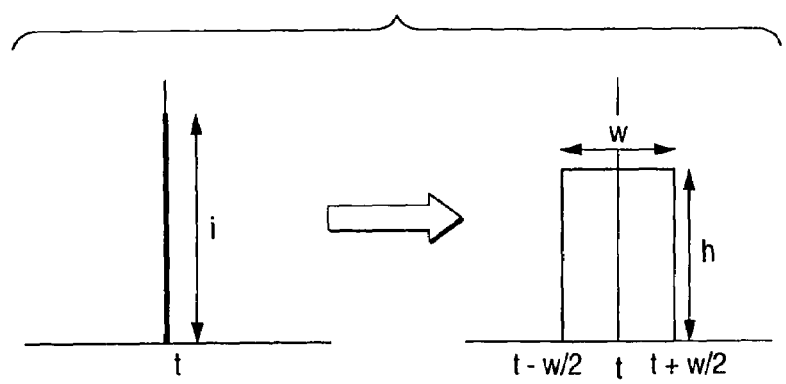
FIG. 15 shows a rectangular waveform model (according to fourth, fifth, and sixth embodiments of the present invention)

FIG. 15 shows an instantaneously-changing current value and a modeled rectangular waveform according to the present embodiment. Reference symbol "i" denotes an instantaneously-changing current; "t" denotes a current processing time; and "h" denotes the height of a rectangular waveform serving as a model of the waveform of the instantaneously-changing current. The height of a rectangular waveform is calculated, through use of a global table representing the relationship between an instantaneously-changing current value and the height of a rectangular waveform. Reference symbol "w" denotes the width of a rectangular waveform, and the width "w" of a rectangular waveform is calculated from the value of "h," which has been calculated previously, and the value of "i."

Figure 16:
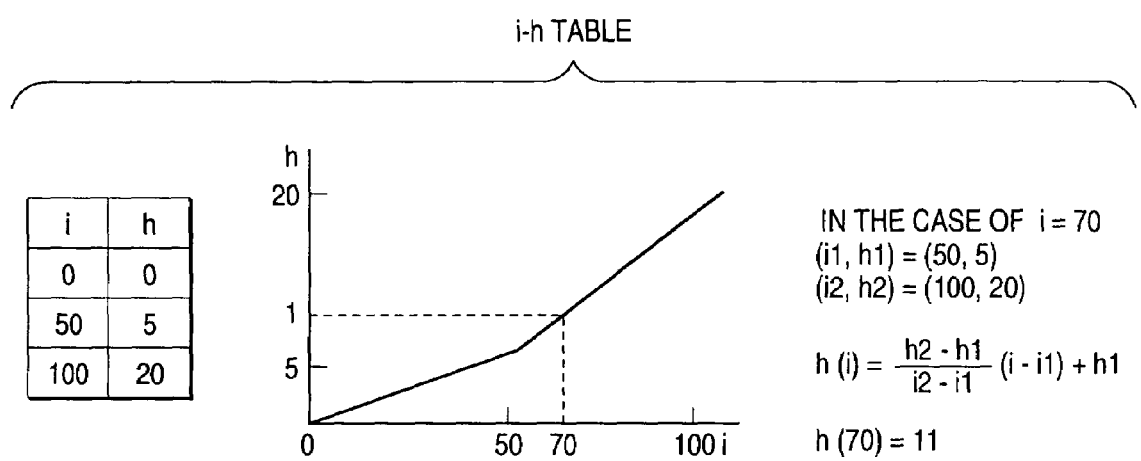
FIG. 16 shows an i-h table.

FIG. 16 is a graph showing an example global i-h table representing the relationship between an instantaneously-changing current value and the height of a rectangular waveform. The table shows the value of "h" at each of certain points "i." The table indicates that "h" assumes a value of 0 at i=0, a value of 5 at i=50, and a value of 20 at i=100. In reality, the value of "i" changes continuously, and hence the table is expressed as a graph plotting points provided in the table. The value of "h" [i.e., h(i)] at a certain value of "i" is expressed by Eq.2 provided below, through linear interpolation of the values of two points closest to "i" provided in the i-h table: one point has lower values (i1, h1), and the other point has higher values (i2, h2).

$$h = \frac{h2 - h1}{i2 - i1}(i - i1) + h1 \qquad (2)$$

The overall flow of processing pertaining to the EMI analysis method of the present embodiment is represented by the same block diagram as that employed in the first embodiment (see FIG. 1).

Figure 17:
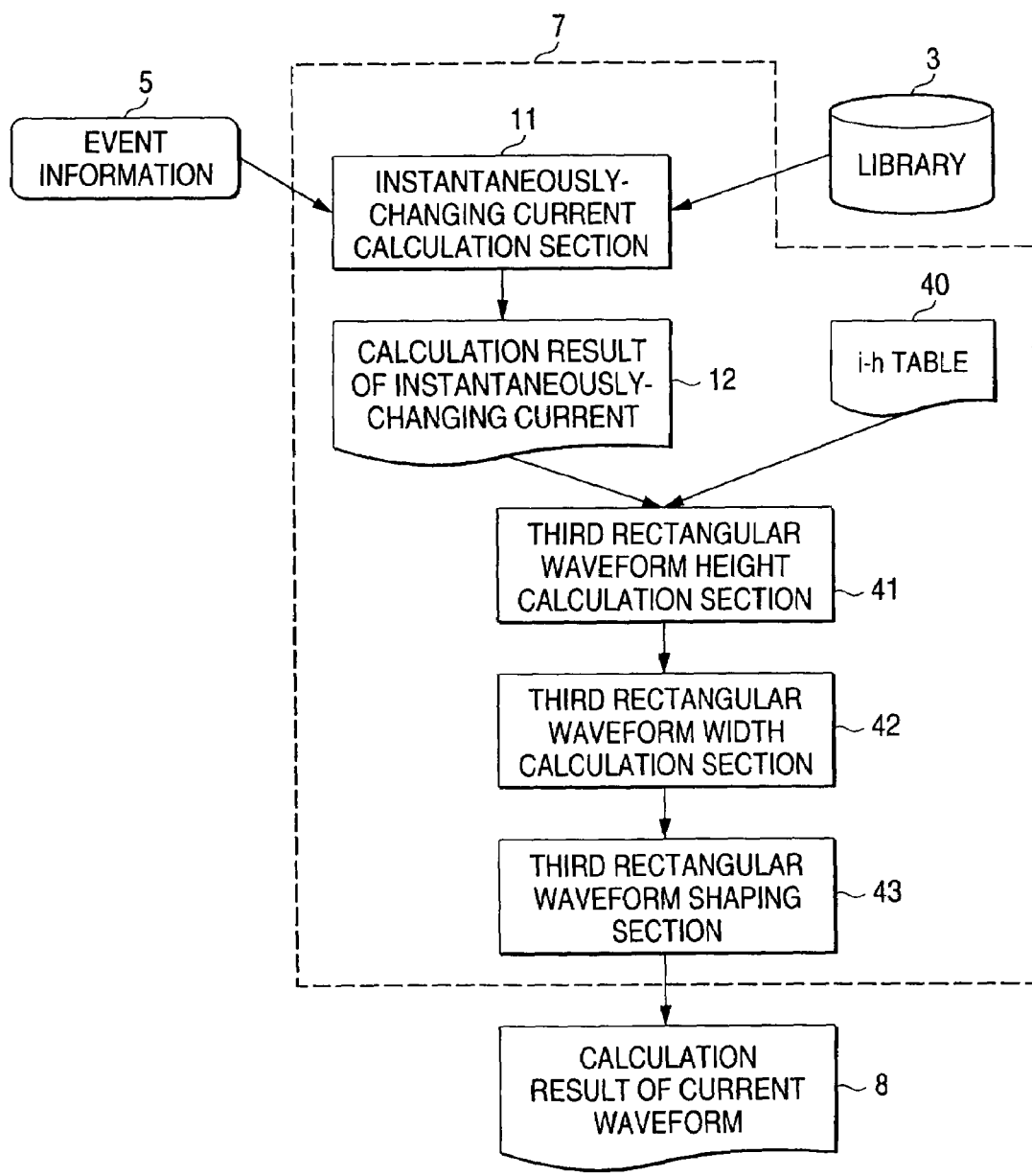
FIG. 17 is a block diagram showing calculation of a current waveform (according to a fourth embodiment of the present invention)

FIG. 17 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment.

In the present embodiment, an i-h table 40 has described therein the previously-described global table representing the relationship between an instantaneously-changing current value and the height of a rectangular waveform (see FIG. 16). A third rectangular waveform height calculation section 41 calculates a peak value of a rectangular waveform serving as a model of an instantaneously-changing current, from an instantaneously-changing current value and the i-h table 40. A third rectangular waveform width calculation section 42 calculates the width of a rectangular waveform from a peak value of a rectangular waveform calculated by the third rectangular waveform height calculation section 41, and the instantaneously-changing current value. A third rectangular waveform-shaping section 43 models the instantaneously-changing current calculation result 12 as a rectangular waveform, the height of the rectangular waveform corresponding to the peak value of the rectangular waveform calculated by the third rectangular waveform height calculation section 41, and the width of the rectangular waveform corresponding to the width calculated by the third rectangular waveform width calculation section 42.

Figure 18:
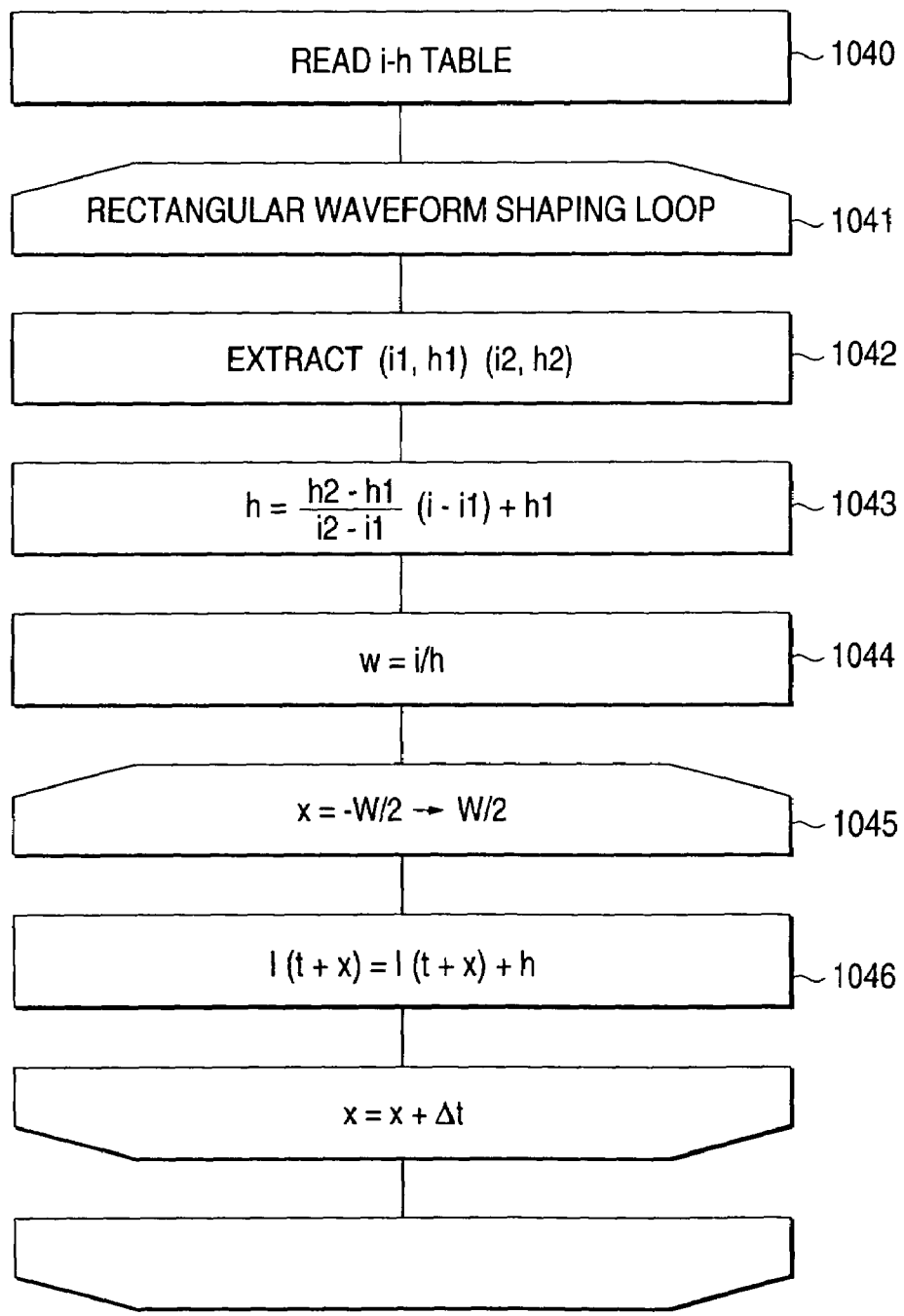
FIG. 18 is a flowchart showing a third rectangular waveform-shaping operation.

FIG. 18 is a flowchart showing processing pertaining to the third rectangular waveform-shaping section 43, including processing pertaining to the rectangular waveform height calculation section 41 and processing pertaining to the rectangular waveform width calculation section 42. First, the i-h table 40 is read (step 1040). Next, the subsequent processing operations are iterated on a per-event basis until the current waveform calculation operation is completed (step 1041). Two points closest to "i," (i1, h1) and (i2, h2), are extracted from the i-h table 40. Reference symbol "i" is the value of an instantaneously-changing current of a cell of an event, the event being an object of EMI analysis. In the table shown in FIG. 16, the two points closest to i=70 are (i1, h1)=(50, 5) and (i2, h2)=(100, 20) (step 1042).

The height "h" of a rectangular waveform is calculated according to Eq.2 (step 1043). In connection with the table shown in FIG. 16, in the case where i=70, h(70)=11. This processing; i.e., processing pertaining to steps 1042 and 1043, corresponds to processing pertaining to the third rectangular waveform height calculation section 41. The area of a rectangular waveform is defined as "w×h." The width "w" of a rectangular waveform is calculated from w=i/h (step 1044). Reference symbol "i" denotes the value of an instantaneously-changing current of a cell of an event, the event being an object of EMI analysis. Reference symbol "h" denotes the height of a rectangular waveform calculated by the third rectangular waveform height calculation section 41. In the table shown in FIG. 16, when i=70, w=6.3. This processing corresponds to processing pertaining to the third rectangular waveform width calculation section 42. Next, "h" is added to I(t+x) until variable "x" changes from −W/2 to W/2, and Δt is added to variable "x" (steps 1045 and 1046). I(t+x) denotes electric currents flowing through all the cells at time "t+x." This processing corresponds to processing pertaining to the third rectangular waveform-shaping section 43.

Figure 19:
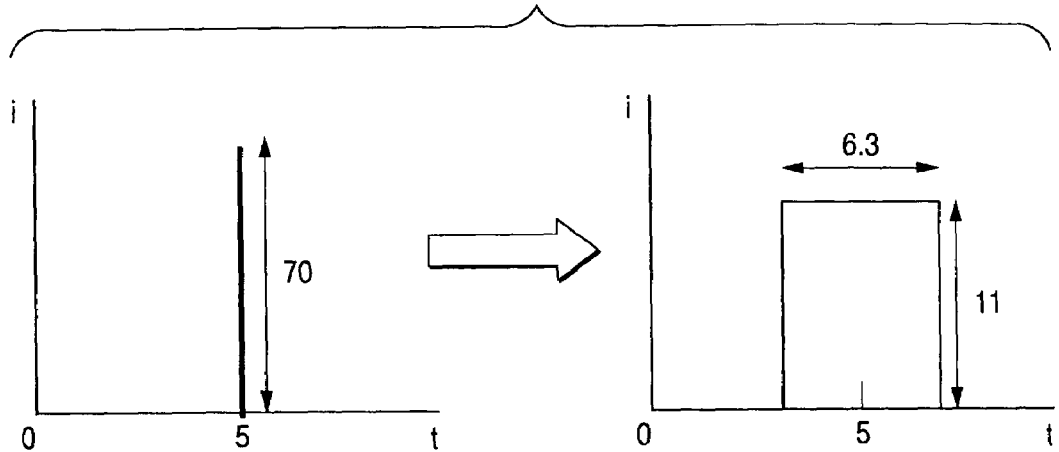
FIG. 19 is a graph showing a calculation result of a current waveform (according to the fourth embodiment)

The current waveform calculation result 8 can be determined by means of the flow of a rectangular waveform height calculation operation, a rectangular waveform width calculation operation, and a rectangular waveform-shaping operation. FIG. 19 shows an example current waveform calculation result 8 obtained in a case where the table shown in FIG. 16 is used as the i-h table 40 and where the instantaneously-changing current value is 70. The rectangular waveform shown in FIG. 19 is subjected to an FFT operation by the FFT processing section 9, to thereby determine the frequency characteristic of an EMI component. Thus, there can be obtained an EMI analysis result 10.

Fifth Embodiment

An EMI analysis method according to a fifth embodiment of the present invention will now be described. The present embodiment describes the EMI analysis method comprising the steps of:

calculating an instantaneously-changing current of each cell from event information concerning each cell, the event information being output from a logic simulator;

modeling the instantaneously-changing current into a rectangular waveform whose area becomes equal to the instantaneously-changing current, through use of a global table representing the relationship among a slew in an input waveform, an instantaneously-changing current value, and the height of a rectangular waveform, to thereby calculate a change in current in consideration of the more-realistic slew in an input waveform; and subjecting the result of calculation of the current waveform to an FFT operation, thereby determining the frequency characteristic of an EMI component arising in a circuit of interest.

Figure 20:
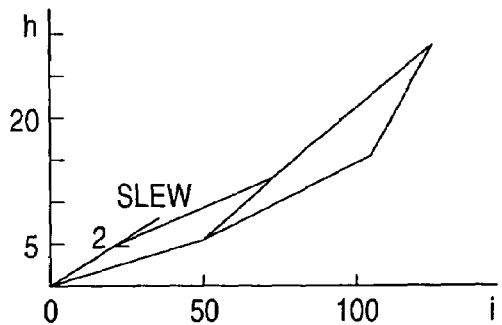
FIG. 20 shows an i-s-h table.

The relationship between the instantaneously-changing current value and a modeled rectangular waveform according to the present embodiment is the same as in the case of the rectangular waveform model according to the fourth embodiment (shown in FIG. 15), except that "w" and "h" are calculated in consideration of the influence of slew in an input waveform. FIG. 20 shows an example global i-s-h table representing the relationship among an instantaneously-changing current value, the slew in an input waveform, and the height of a rectangular waveform, and a graph plotting the i-s-h table. The table shows the value of "h" at a certain point (i, s), where "s" denotes the slew (or slew) of an input waveform. In connection with this table, "h" assumes a value of 0 at i=0 and s=0; a value of 5 at i=50 and s=0; a value of 14 at i=100 and s=0; a value of 0 at i=0 and s=2; a value of 6 at i=50 and s=2; and a value of 20 at i=100 and s=2. In reality, the value of "i" and the value of "s" change continuously, and hence the table is represented by a three-dimensional graph plotting points appearing in the table. The value of h(s,i) at a certain value of "s" and a certain value of "i" is expressed by Eq.3 provided below, through use of four points in combination, the four points comprising a combination of a low value (i1) and a high value (i2) closest to "i" within the i-s-h table and a low value (s1) and a high value (s2) closest to "s"; namely, h(s1, i1), h(s1, i2), h(s2, i1), and h(s2, i2).

$$h(s, i) = \left[ \frac{h(s1, i1)(s2-s)}{(s2-s1)} + \frac{h(s2, i1)(s-s1)}{(s2-s1)} \right] \left( \frac{i2-i}{i2-i1} \right) + \left[ \frac{h(s1, i2)(s2-s)}{(s2-s1)} + \frac{h(s2, i2)(s-s1)}{(s2-s1)} \right] \left( \frac{i-i1}{i2-i1} \right) \quad (3)$$

The overall flow of processing pertaining to the EMI analysis method of the present embodiment is represented by the same block diagram as that employed in the first embodiment (see FIG. 1).

Figure 21:
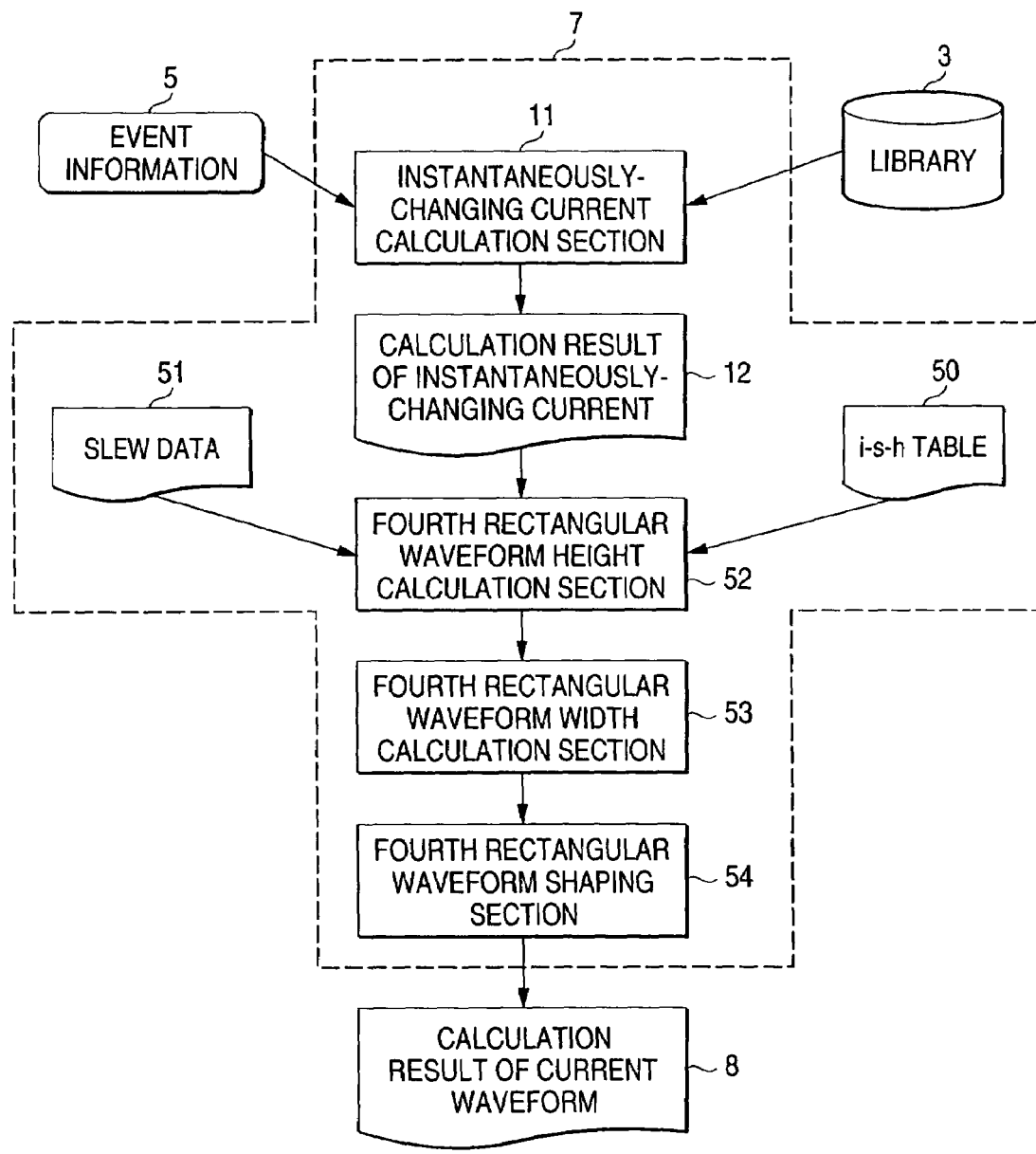
FIG. 21 is a block diagram showing calculation of a current waveform (according to a fifth embodiment of the present invention)

FIG. 21 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a 6 function. Therefore, an EMI component cannot be analyzed through an FFT operation. Thus far, the processing has been identical with the current wave calculation operation of the first embodiment.

The i-s-h table 50 employed in the present embodiment is the above-described global table representing the relationship among an instantaneously-changing current value, the slew in an input waveform, and the height of a rectangular waveform (FIG. 20). A fourth rectangular waveform height calculation section 52 calculates a peak value of a rectangular waveform serving as a model of an instantaneously-changing current, from an instantaneously-changing current value of an instance serving as an object of EMI analysis, the slew in an input waveform, and the i-s-h table 50, all of which are read from Slew data 51. The Slew data 51 are provided in the netlist 1 and describe information concerning the slew in a waveform input to each instance. Reference numeral 53 designates a fourth rectangular waveform width calculation section for calculating the width of a rectangular waveform, through use of the peak value calculated by the fourth rectangular waveform height calculation section 52 and the instantaneously-changing current value such that the area of the rectangular waveform becomes equal to the instantaneously-changing current value. Reference numeral 54 designates a fourth rectangular waveform-shaping section for modeling the instantaneously-changing current calculation result 12 as a rectangular waveform, the height of the rectangular waveform corresponding to the peak value calculated by the fourth rectangular waveform height calculation section 52, and the width of the rectangular waveform corresponding to the width calculated by the fourth rectangular waveform width calculation section 53.

Figure 22:
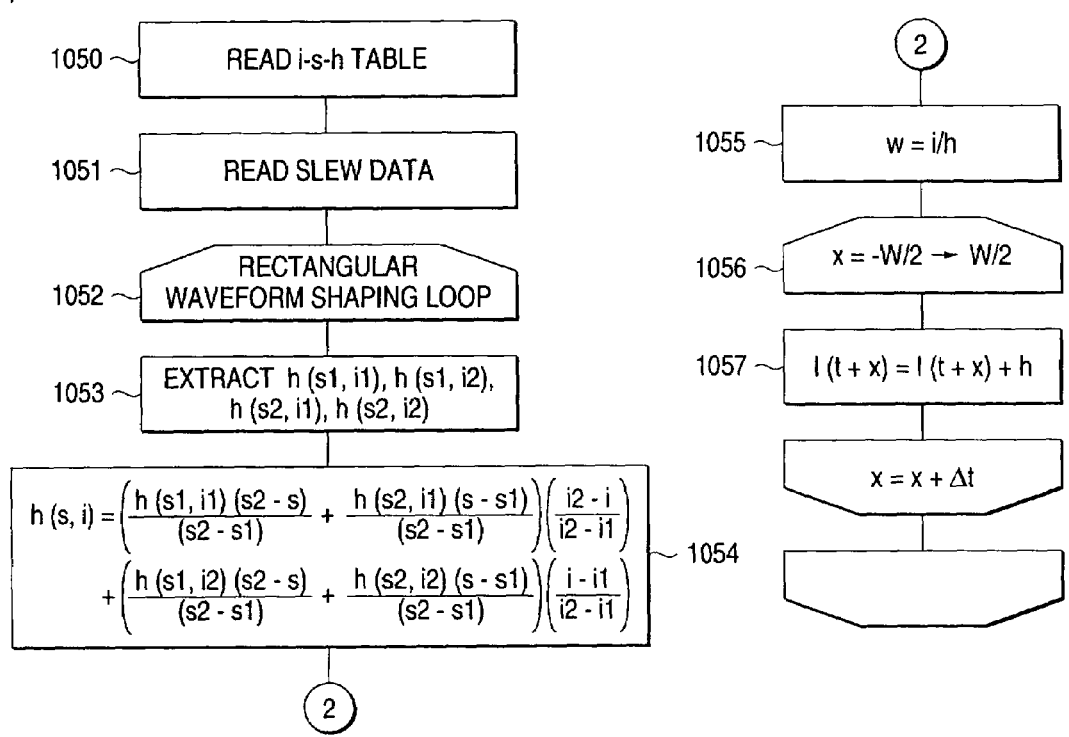
FIG. 22 is a flowchart showing a fourth rectangular waveform-shaping operation.

FIG. 22 shows the flowchart of processing pertaining to the fourth rectangular waveform-shaping section 54, including processing pertaining to the rectangular waveform height calculation section 52 and processing pertaining to the rectangular waveform width calculation section 53. First, the i-s-h table 50 is read (step 1050), and the Slew data 51 are read (step 1051). The processing provided below is iterated on a per-event basis until calculation of a current waveform is completed (step 1052). From the i-s-h table 50, there are extracted four points which are combinations of a low value closest to "i," a high value closest to "i," a low value closest to "s," and a high value closest to "s"; for example, h(s1, i1), h(s1, i2), h(s2, i1), and h(s2, i2). Here, reference symbol "i" denotes the value of an instantaneously-changing current of a cell of an event, the event being an object of EMI analysis. Further, reference symbol "s" denotes the slew in an input waveform pertaining to the cell. The four points are extracted on the basis of the name of the instance to be processed and the Slew data 51.

In connection with the table shown in FIG. 20, in the case of i=70 and s=1, there are extracted four values; h(0, 50)=5, h(0, 100)=14, h(2, 50)=6, and h(2, 100)=20 (step 1053). The height "h" of the rectangular waveform is calculated by Eq.3 (step 1054). In connection with the table shown in FIG. 20, in the case where i=70 and s=1, h(1, 70)=10.1. Processing pertaining to steps 1053 and 1054 correspond to processing pertaining to the fourth rectangular waveform height calculation section 52.

The area of the rectangular waveform is defined by "w×h." The duration (w) of a rectangular waveform is calculated on the basis of w=i/h (step 1055). Here, "i" denotes the value of an instantaneously-changing current of a cell of an event, the event being an object of EMI analysis, and "h" denotes the height of a rectangular waveform calculated by the fourth rectangular waveform height calculation section 52.

In connection with the table shown in FIG. 20, in the case of i=70 and s=1, w=6.9. This processing corresponds to processing pertaining to the fourth rectangular waveform width calculation section 53. Next, "h" is added to I(t+x) until variable "x" changes from −W/2 to W/2, and ∆t is added to "x" (steps 1056 and 1057). Here, I(t+x) represents total current flowing through all the cells at time "t+x." This processing corresponds to processing pertaining to the fourth rectangular waveform-shaping section 54.

Figure 23:
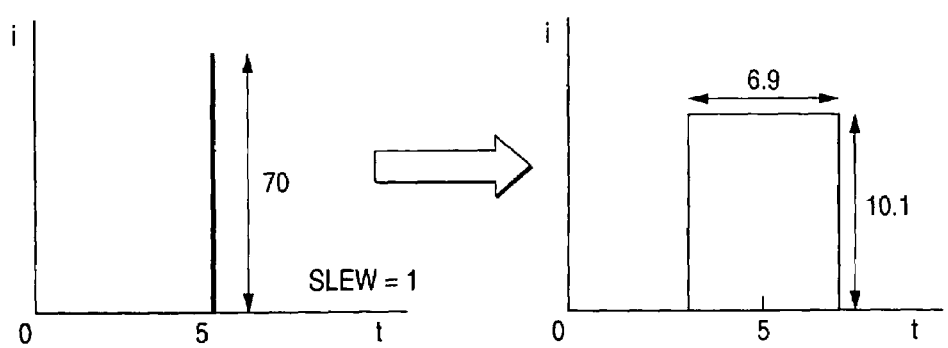
FIG. 23 is a graph showing a calculation result of a current waveform (according to the fifth embodiment)

The current waveform calculation result 8 can be determined by means of the flow of a rectangular waveform height calculation operation, a rectangular waveform width calculation operation, and a rectangular waveform-shaping operation. FIG. 23 shows an example current waveform calculation result 8 obtained in a case where the i-s-h table 50 corresponds to the table shown in FIG. 20, the instantaneously-changing current value is 70, and the slew in an input waveform assumes a value of 1. The rectangular waveform is subjected to an FFT operation by the FFT processing section 9, to thereby determine the frequency characteristic of an EMI component. Thus, there can be obtained an EMI analysis result 10.

Sixth Embodiment

An EMI analysis method according to a sixth embodiment of the present invention will now be described. The present embodiment describes the EMI analysis method comprising the steps of:

calculating an instantaneously-changing current of each cell from event information concerning each cell, the event information being output from a logic simulator;

modeling the instantaneously-changing current as a rectangular waveform whose area becomes equal to the instantaneously-changing current, through use of a global table representing the relationship among an output load capacitance, an instantaneously-changing current value, and the height of a rectangular waveform, to thereby calculate a change in current in consideration of the more-realistic output load capacitance; and subjecting the result of calculation of the current waveform to an FFT operation, thereby determining the frequency characteristic of an EMI component arising in a circuit of interest.

Figure 24:
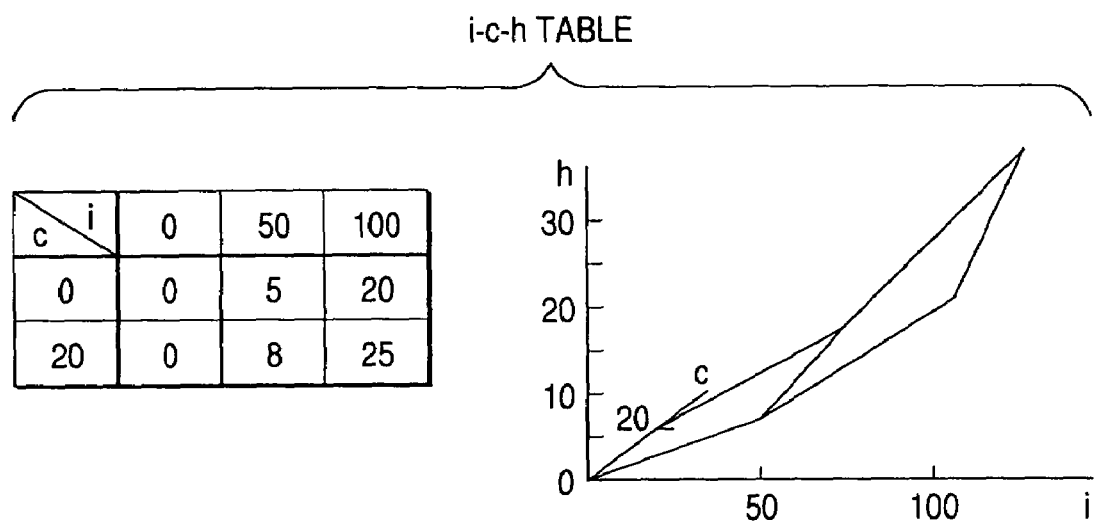
FIG. 24 shows an i-c-h table.

The relationship between the instantaneously-changing current value and a modeled rectangular waveform according to the present embodiment is the same as in the case of the rectangular waveform model according to the fourth embodiment (shown in FIG. 15), except that "w" and "h" are calculated in consideration of the influence of slew in an input waveform. FIG. 24 shows an example global i-c-h table representing the relationship among an instantaneously-changing current value, an output load capacitance, and the height of a rectangular waveform, and a graph plotting the i-c-h table. The table shows the value of "h" at a certain point (i, c), where "c" denotes an output load capacitance. In connection with this table, "h" assumes a value of 0 at i=0 and c=0; a value of 5 at i=50 and c=0; a value of 20 at i=100 and c=0; a value of 0 at i=0 and c=20; a value of 8 at i=50 and c=20; and a value of 25 at i=100 and c=20. In reality, the value of "i" and the value of "c" change continuously, and hence the table is represented by a three-dimensional graph plotting points appearing in the table. The value of h(c,i) at a certain value of "c" and a certain value of "i" is expressed by Eq.4 provided below, through use of four points in combination, the four points comprising a combination of a low value (i1) and a high value (i2) closest to "i" within the i-c-h table and a low value (c1) and a high value (c2) closest to "c"; namely, h(c1, i1), h(c1, i2), h(c2, i1), and h(c2, i2).

$$y = -\frac{2 \times h}{W} x + h \quad (4)$$

The overall flow of processing pertaining to the EMI analysis method of the present embodiment is represented by the same block diagram as that employed in the first embodiment (see FIG. 1).

Figure 25:
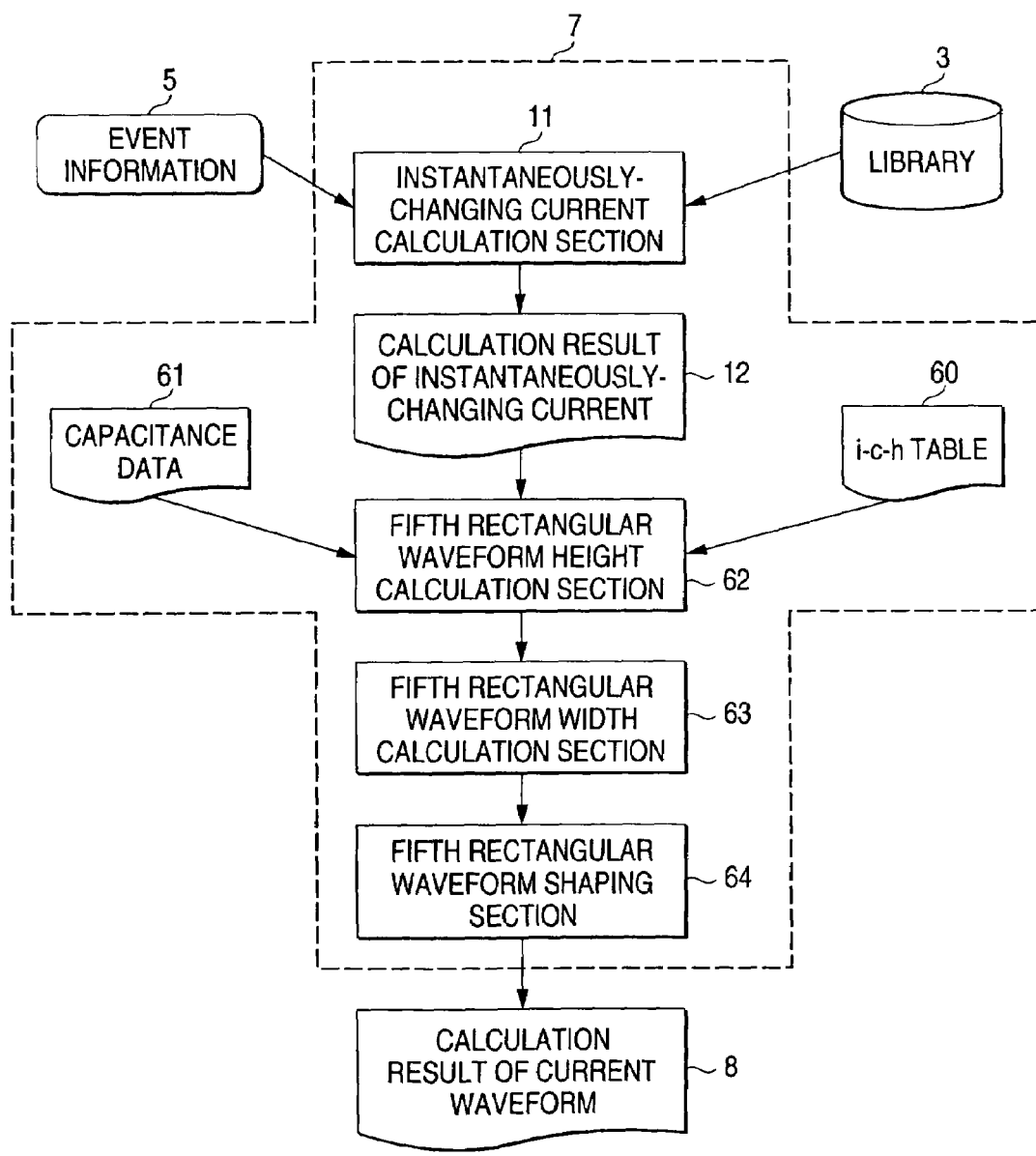
FIG. 25 is a block diagram showing calculation of a current waveform (according to a sixth embodiment of the present invention)

FIG. 25 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment.

The i-c-h table 60 employed in the present embodiment is the above-described global table representing the relationship between an instantaneously-changing current value and the height of a rectangular waveform (FIG. 24). Reference numeral 62 designates a fifth rectangular waveform height calculation section which calculates a peak value of a rectangular waveform serving as a model of an instantaneously-changing current, from an instantaneously-changing current value of an instance serving as an object of EMI analysis and an output load capacitance. Reference numeral 63 designates a fifth rectangular waveform width calculation section for calculating the width of a rectangular waveform, through use of the peak value calculated by the fifth rectangular waveform height calculation section 62 and the instantaneously-changing current value and such that the area of the rectangular waveform becomes equal to the instantaneously-changing current value. Reference numeral 64 designates a fifth rectangular waveform-shaping section for modeling the instantaneously-changing current calculation result 12 as a rectangular waveform, the height of the rectangular waveform corresponding to the peak value calculated by the fifth rectangular waveform height calculation section 62, and the width of the rectangular waveform corresponding to the width calculated by the fifth rectangular waveform width calculation section 63.

Figure 26:
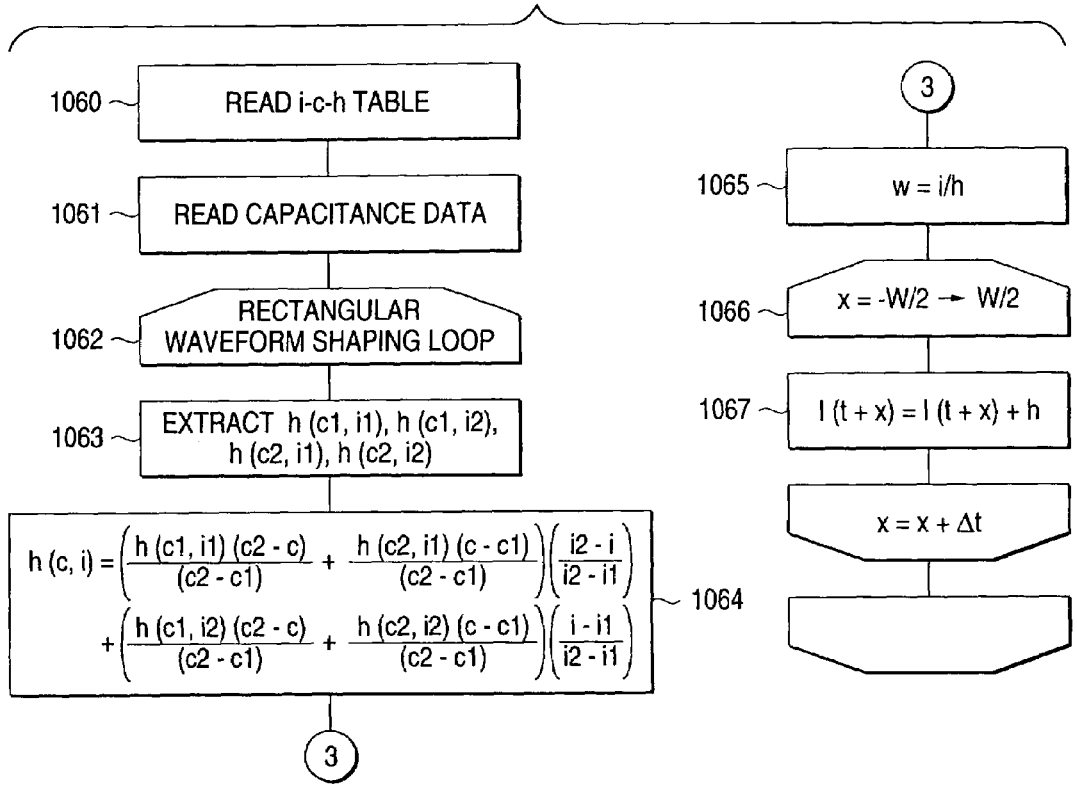
FIG. 26 is a flowchart showing a fifth rectangular waveform-shaping operation.

FIG. 26 shows the flowchart of processing pertaining to the fifth rectangular waveform-shaping section 64, including processing pertaining to the rectangular waveform height calculation section 62 and processing pertaining to the rectangular waveform width calculation section 63. First, the i-c-h table 60 is read (step 1060), and capacitance data 61 are read (step 1061). The processing provided below is iterated on a per-event basis until calculation of a current waveform is completed (step 1062). From the i-c-h table 60, there are extracted four points which are combinations of a low value closest to "i," a high value closest to "i," a low value closest to "c," and a high value closest to "c"; for example, h(c1, i1), h(c1, i2), h(c2, i1), and h(c2, i2). Here, reference symbol "i" denotes the value of an instantaneously-changing current of a cell of an event, the event being an object of EMI analysis. Further, reference symbol "c" denotes an output load capacitance pertaining to a cell of an event, the event being an object of EMI analysis. The four points are extracted on the basis of the name of instance to be processed and the capacitance data 61.

In connection with the table shown in FIG. 24, in the case where i=70 and c=10, there are extracted four values; h(0, 50)=5, h(0, 100)=20, h(20, 50)=8, and h(20, 100)=25 (step 1063). The height "h" of the rectangular waveform is calculated by Eq.3 (step 1064). In connection with the table shown in FIG. 24, in the case where i=70 and c=10, h(10, 70)=12.9. Processing pertaining to steps 1063 and 1064 corresponds to processing pertaining to the fifth rectangular waveform height calculation section 62. The area of the rectangular waveform is defined by "w×h." The duration (w) of a rectangular waveform is calculated on the basis of w=i/h (step 1065). Here, "i" denotes the value of an instantaneously-changing current of a cell of an event, the event being an object of EMI analysis, and "h" denotes the height of a rectangular waveform calculated by the fifth rectangular waveform height calculation section 62.

In connection with the table shown in FIG. 24, in the case where i=70 and c=10, w=5.4. This processing corresponds to processing pertaining to the fifth rectangular waveform width calculation section 53. Next, "h" is added to I(t+x) until variable "x" changes from −W/2 to W/2, and Δt is added to "x" (steps 1066 and 1067). Here, I(t+x) represents total current flowing through all the cells at time "t+x." This processing corresponds to processing pertaining to the fifth rectangular waveform-shaping section 64.

Figure 27:
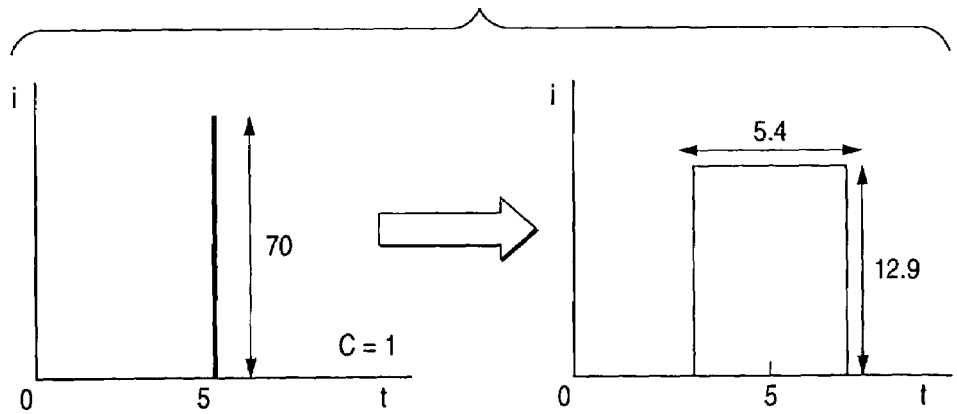
FIG. 27 is a graph showing a calculation result of a current waveform (according to the sixth embodiment)

The current waveform calculation result 8 can be determined by means of the flow of a rectangular waveform height calculation operation, a rectangular waveform width calculation operation, and a rectangular waveform-shaping operation. FIG. 27 shows an example current waveform calculation result 8 obtained in a case where the i-c-h table 60 corresponds to the table shown in FIG. 24, the instantaneously-changing current value is 70, and an output load capacitance assumes a value of 10. The rectangular waveform is subjected to an FFT operation by the FFT processing section 9, to thereby determine the frequency characteristic of an EMI component. Thus, there can be obtained an EMI analysis result 10.

The EMI analysis method of the present embodiment forms a rectangular waveform model from a global table defining the relationship between an output load capacitance, an instantaneously-changing current value, and the height of a rectangular waveform, thereby enabling preparation of a more realistic model and more accurate processing.

Seventh Embodiment

Figure 28:
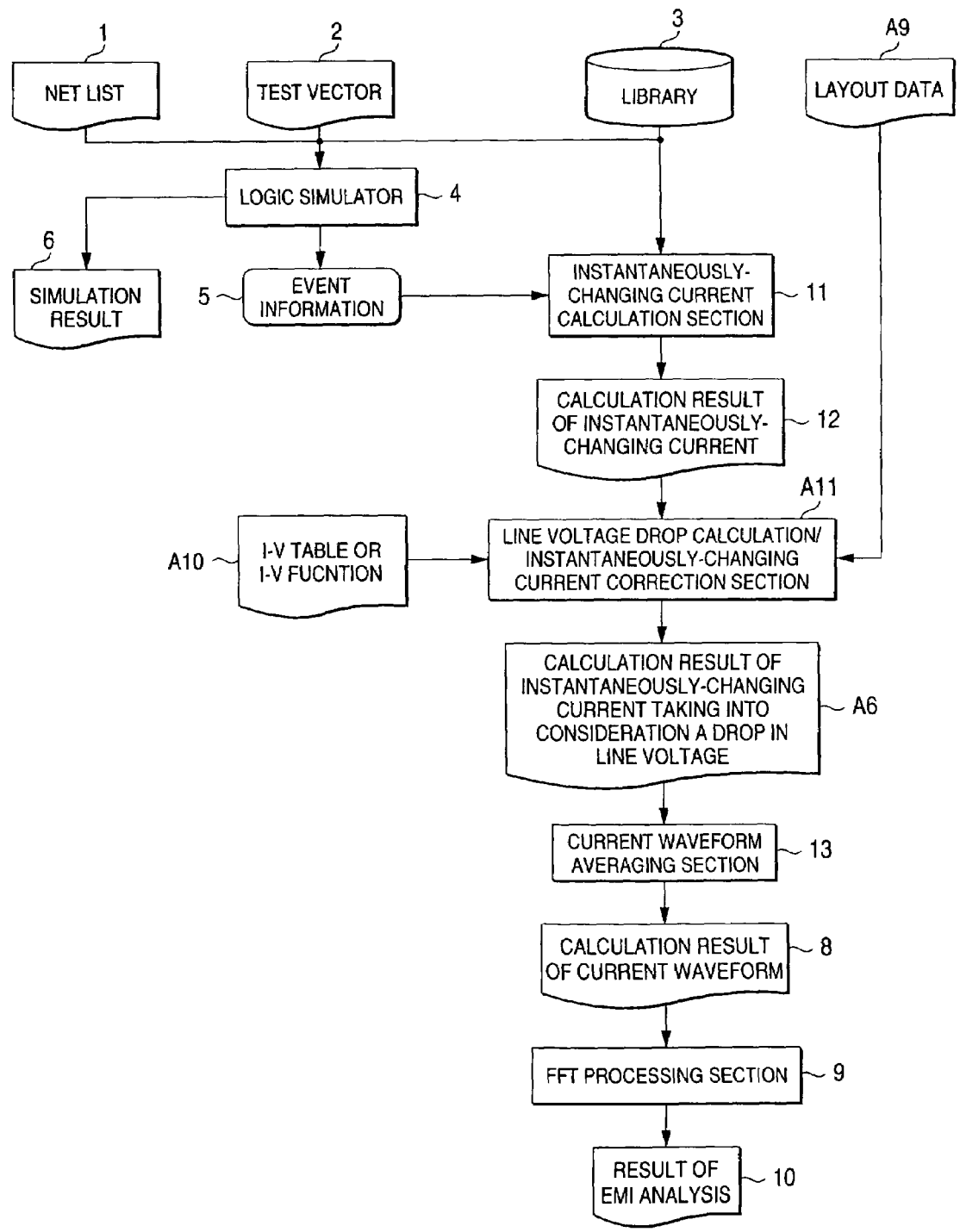
FIG. 28 is a flowchart for describing an EMI analysis method according to a seventh embodiment of the present invention.

An EMI analysis method according to a seventh embodiment of the present invention will now be described. FIG. 28 is a block diagram showing the overall flowchart of the EMI analysis method according to the present embodiment. The EMI analysis method according to the present embodiment is identical with the EMI analysis method according to the first embodiment described in connection with FIG. 1, except for addition of data A9 and A10, a voltage drop calculation/instantaneously-changing current correction section A11, and an instantaneously-changing current calculation result A6 output in step A11. Those portions of the EMI analysis method according to the present embodiment which are identical with those of the EMI analysis method according to the first embodiment are assigned the same reference numerals, and their repeated explanations are omitted. A9 designates data concerning the layout of a semiconductor integrated circuit which is an object of EMI analysis. A10 designates an I-V table file (or an I-V function) representing the relationship between the amount of electric current and the degree of a drop in line voltage. A11 designates a section of calculating a drop in line voltage and correcting the result of an instantaneously-changing current calculated in step 11 (hereinafter referred to as a "voltage drop calculation/instantaneously-changing current correction section"). A6 designates the result of an instantaneously-changing current being calculated by the voltage drop calculation/instantaneously-changing current correction section A11 in consideration of a drop in line voltage.

Figure 29:
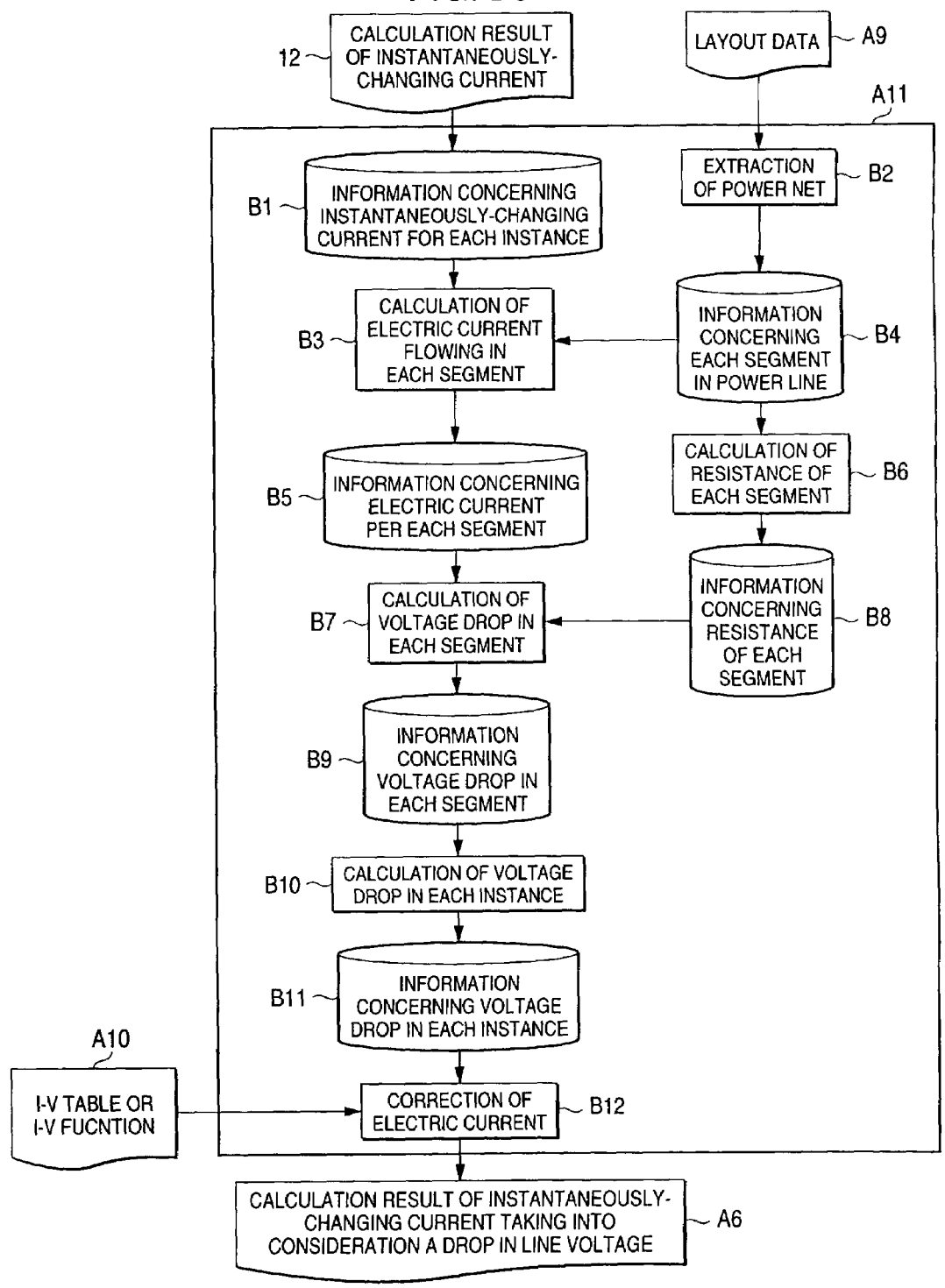
FIG. 29 is a flowchart for describing the flow of processing operations of a line voltage drop calculation/instantaneous current correction section according to the seventh embodiment.

FIG. 29 is a block diagram showing the flow of processing of the voltage drop calculation/instantaneously-changing current correction section A11 according to the seventh embodiment of the present invention. The function of the voltage drop calculation/instantaneously-changing current correction section A11 will now be described by reference to FIG. 29. Since data 12 have already been described in detail in connection with the first embodiment, the same reference numeral is assigned to the data 12, and repeated explanation is omitted. The voltage drop calculation/instantaneously-changing current correction section A11 comprises a power net extraction section B2, a section B6 for calculating the resistance of each segment (hereinafter referred to as a "segment resistance calculation section B6"), a section B3 for calculating an electric current flowing through each segment (hereinafter referred to as a "segment current calculation section B3"), a section B7 for calculating a drop in line voltage of each segment (hereinafter referred to as a "segment voltage drop calculation section B7"), a section B10 for calculating a drop in line voltage for each instance (hereinafter referred to as an "instance voltage drop calculation section B10"), and a current correction section B12.

These steps will now be described. In step B2, layout data A9 are entered, and the geometry of a power line is determined in consideration of information concerning electrical interconnections. On the basis of the thus-determined geometry of a power line, nodes, change in line width, bends/turns, and switching to another interconnection are identified, and the power line is branched in accordance with identification results, thereby forming segment information B4 pertaining to respective segments of the power line. The thus-constructed database for the segment information B4 includes the length and width of a line in each segment.

Figure 30:
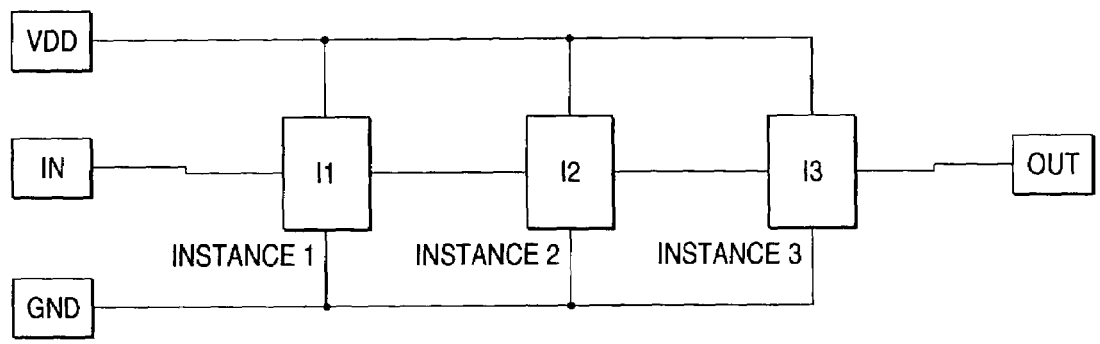
FIG. 30 is a schematic representation showing layout data which are entered into the line voltage drop calculation/instantaneous current correction section according to the seventh embodiment.
Figure 31:
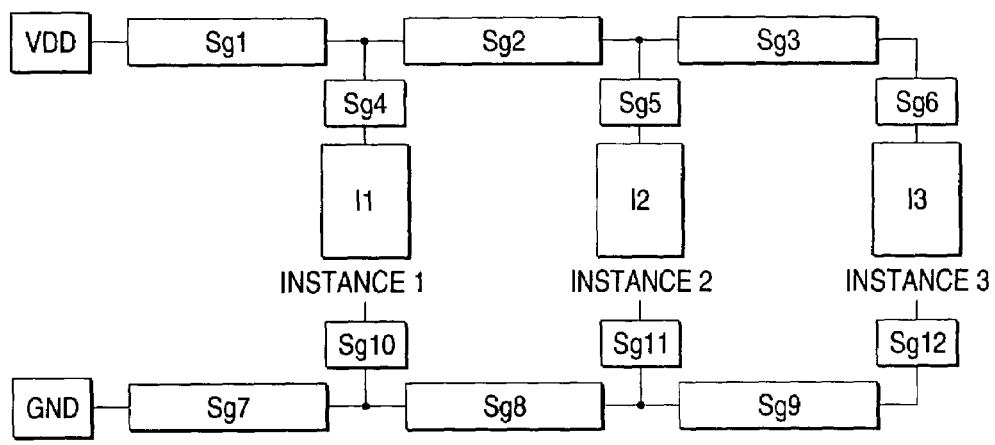
FIG. 31 is a schematic representation showing information about segments in a power line, which information is produced in the line voltage drop calculation/instantaneous current correction section according to the seventh embodiment.

FIG. 30 is a schematic illustration showing the layout data A9 which is input to be entered in step B2. FIG. 31 is a schematic illustration showing for the data base the segment information B4 produced in step B2. Segments 1 through 12 formed as a result of branching of an interconnection are represented by Sg1 through Sg12. The segment information B4 concerning respective segments of the power line, the information being produced in step B2, is entered in step B6, and resistance information B8 concerning the resistance of a line in each segment is produced from information concerning the length and width of a line in each segment and a predetermined resistance parameter assigned to each interconnection layer.

Figure 32:
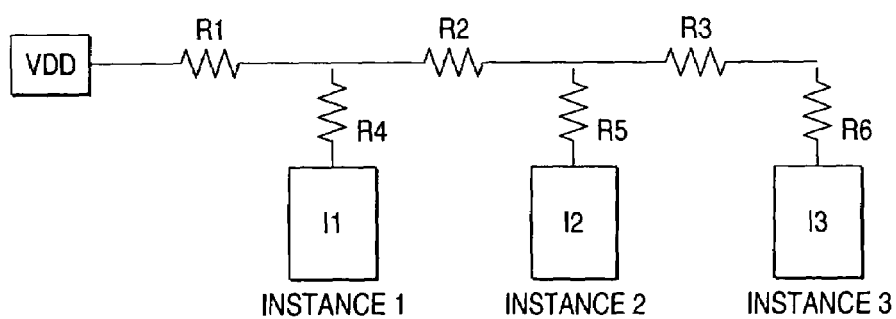
FIG. 32 is a schematic representation showing information about the resistance of each of segments, which information is produced in the line voltage drop calculation/instantaneous current correction section according to the seventh embodiment.

FIG. 32 is a schematic representation showing a data base for the resistance information B8 produced in step B6. In this drawing, the resistance of segment Sg1 of a power line (VDD) is indicated by R1; the resistance of segment Sg2 of the power line is indicated by R2; the resistance of segment Sg3 of the power line is indicated by R3; the resistance of segment Sg4 of the power line is indicated by R4; the resistance of segment Sg5 of the power line is indicated by R5; and the resistance of segment Sg6 of the power line is indicated by R6. In step B3, there are entered information B1 concerning an instantaneously-changing current of each instance produced on the basis of the instantaneously-changing current calculation result 12 (hereinafter referred to simply as "instantaneously-changing current information B1") and the segment information B4 concerning the respective segments of a power line produced in step B2. The electric current of each instance is distributed into current components which flow through the respective segments of the power line. The current components of each instance, which components have been distributed into the respective segments of the power line, are summed, to thereby produce current information B5 for each segment.

Figure 33:
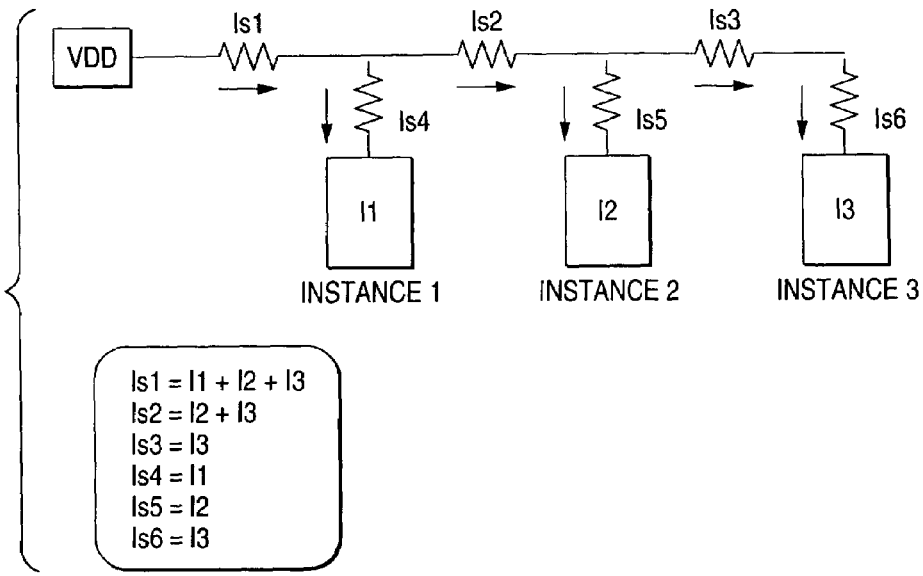
FIG. 33 is a schematic representation showing information about an electric current flowing in each of segments, which information is produced in the line voltage drop calculation/instantaneous current correction section according to the seventh embodiment.

FIG. 33 is a schematic representation showing the data base for the current information B5 produced in step B3. In the drawing, electric currents flowing through instances 1 through 3 are indicated by I1 through I3, and electrical currents flowing through segments Sg1 through Sg6 are indicated by Is1 through Is6. In this case, Is1=I1+I2+I3, Is2=I2+I3, Is3=I43, Is4=I1, Is5=I2, and Is6=I3. In step B7, there are entered the current information B5 prepared each of the segments in step B3 and the resistance information B8 prepared for each of the segments in step B6. Information B9 concerning a drop in line voltage in each segment (hereinafter referred to simply as "voltage drop information B9") is prepared according to Ohm's low.

Figure 34:
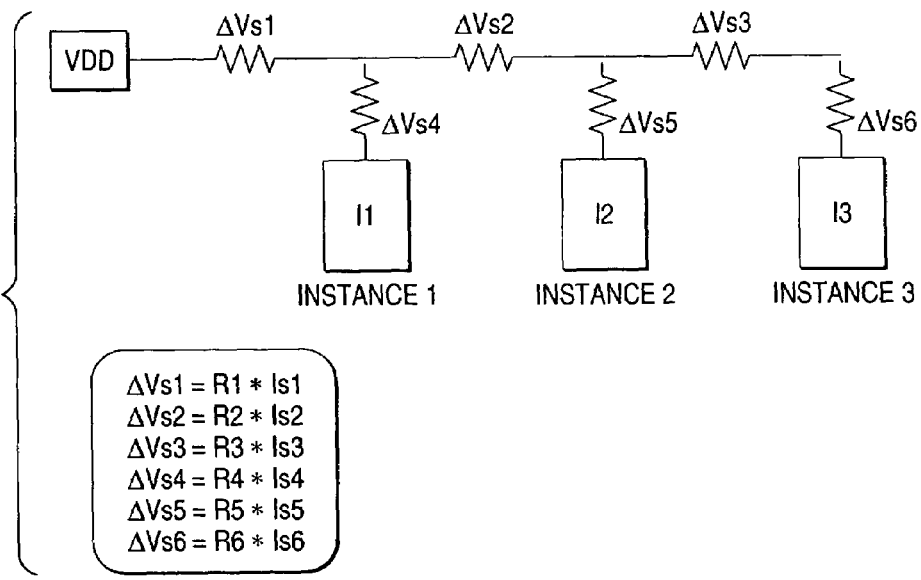
FIG. 34 is a schematic representation showing information about a drop in the voltage of each of segments, which information is produced in the line voltage drop calculation/instantaneous current correction section according to the seventh embodiment.

FIG. 34 is a schematic representation showing the data base for the voltage drop information B9 prepared in step B7. In the drawing, voltage drops in respective segments Sg1 through Sg6 are indicated by $\Delta Vs1$ through $\Delta Vs6$. In this case, $\Delta Vs1=R1\times Is1$; $\Delta Vs2=R2\times Is2$; $\Delta Vs3=R3\times Is3$; $\Delta Vs4=R4\times Is4$; $\Delta Vs5=R5\times Is5$; and $\Delta Vs6=R6\times Is6$. In step B10, there is entered the voltage drop information B9 prepared for each of the segments in step B7. Voltage drops in respective segments of a current flow path of each instance are summed, to thereby produce voltage drop information B11 for each instance.

Figure 35:
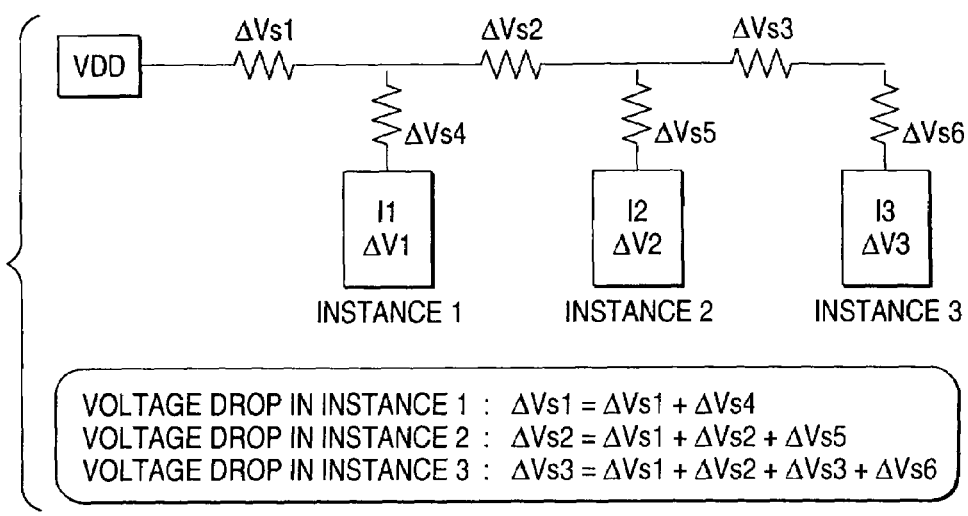
FIG. 35 is a schematic representation showing information about a drop in the voltage of each instance, which information is produced in the line voltage drop calculation/instantaneous current correction section according to the seventh embodiment.

FIG. 35 is a schematic representation showing the data base for the voltage drop information B11 prepared in step B10. In the drawing, voltage drops arising in instances 1 through 3 are indicated by $\Delta V1$ through $\Delta V3$. In this case, $\Delta V1=\Delta Vs1+\Delta Vs4$; $\Delta V2=\Delta Vs1+\Delta Vs2+\Delta Vs5$; and $\Delta V3=\Delta Vs1+\Delta Vs2+\Delta Vs3+\Delta Vs6$. Here, $\Delta V1$ is expressed as $\Delta V1=R1\times(I1+I2+I3)+R4\times I1$; $\Delta V2$ is expressed as $\Delta V2=R1\times(I1+I2+I3)+R2\times(I2+I3)+R5\times I2$; and $\Delta V3$ is expressed as $\Delta V3=R1\times(I1+I2+I3)+R2\times(I2+I3)+R3\times I3+R6\times I3$.

In step B12, there are entered the voltage drop information B11 prepared for each instance in step B10 and an I-V table file A10 (or an I-V function) representing the relationship between the amount of electric current and the degree of drop in line voltage, wherewith the instantaneously-changing current calculation result 12 is corrected. As a result, there is produced an instantaneously-changing current calculation result A6 for each instance, the calculation result taking into consideration a drop in line voltage which is dependent on the resistance of a power line.

As mentioned above, the EMI analysis method according to the seventh embodiment takes into consideration a drop in line voltage which is dependent on the resistance of a power line, to thereby correct the instantaneously-changing current calculation result 12 obtained in the first embodiment in consideration of a physical phenomena, such as fluctuations in a line voltage of a real semiconductor integrated circuit. Therefore, the EMI analysis method of the present embodiment can produce a more accurate model of a current waveform, thereby reducing undesired higher harmonic components included in the frequency characteristic of a circuit to be analyzed, the characteristic being determined by means of subjecting the current waveform to FFT processing.

Although the seventh embodiment has referred to the first embodiment, similar results are yielded even when the technical concept of the present embodiment is applied to any of the second through sixth embodiments.

Eighth Embodiment

Figure 36:
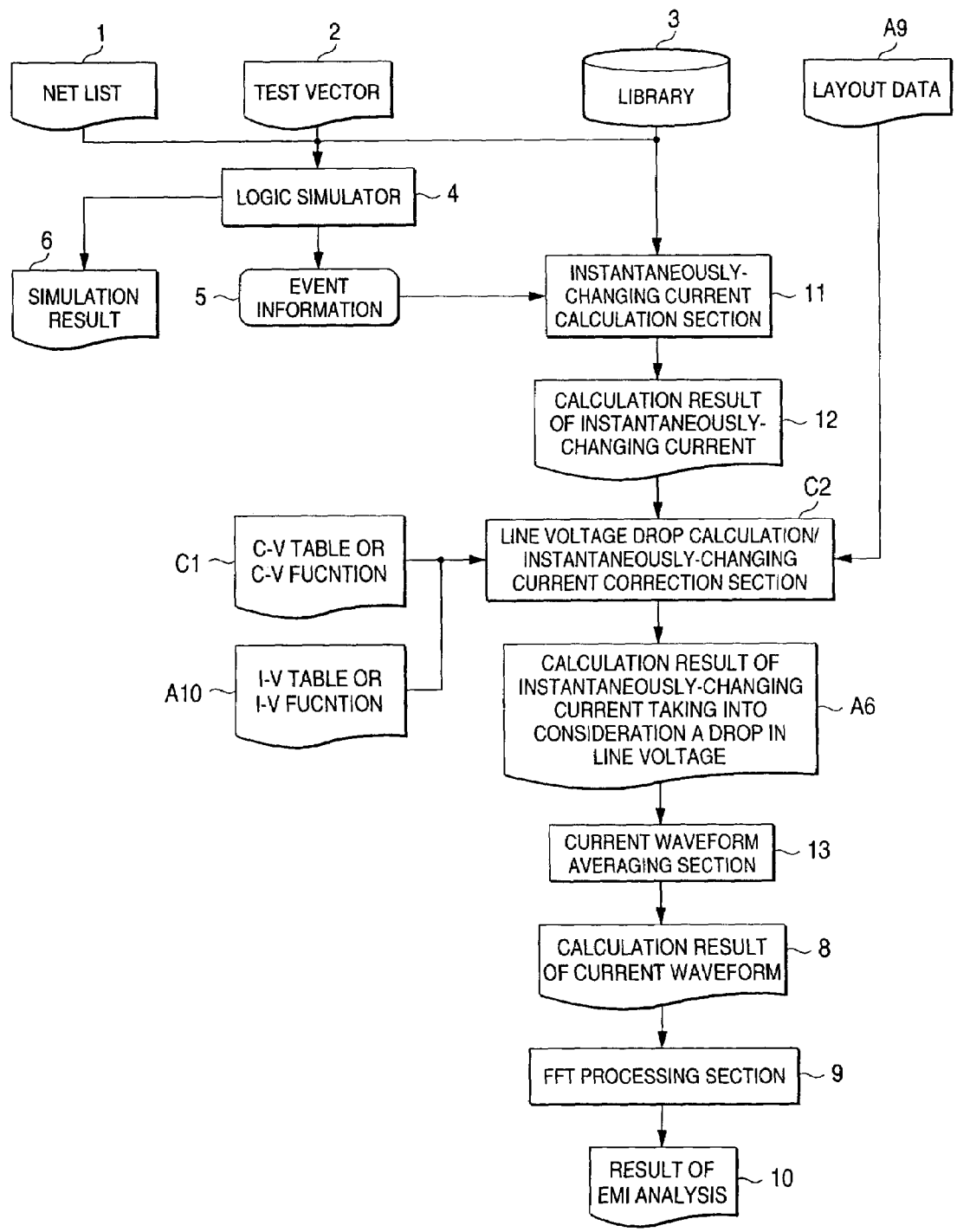
FIG. 36 is a flowchart for describing an EMI analysis method according to an eighth embodiment of the present invention.

An EMI analysis method according to an eighth embodiment of the present invention will now be described. FIG. 36 is a block diagram showing the overall flowchart of the EMI analysis method according to the present embodiment. The EMI analysis method according to the present embodiment is identical with the EMI analysis method according to the seventh embodiment described in connection with FIG. 28, except for addition of data C1 and replacement of the voltage drop calculation/instantaneously-changing current correction section A11 by a voltage drop calculation/instantaneously-changing current correction section C2. Those portions of the EMI analysis method according to the present embodiment which are identical with those of the EMI analysis method according to the first embodiment are assigned the same reference numerals, and their repeated explanations are omitted.

Figure 37:
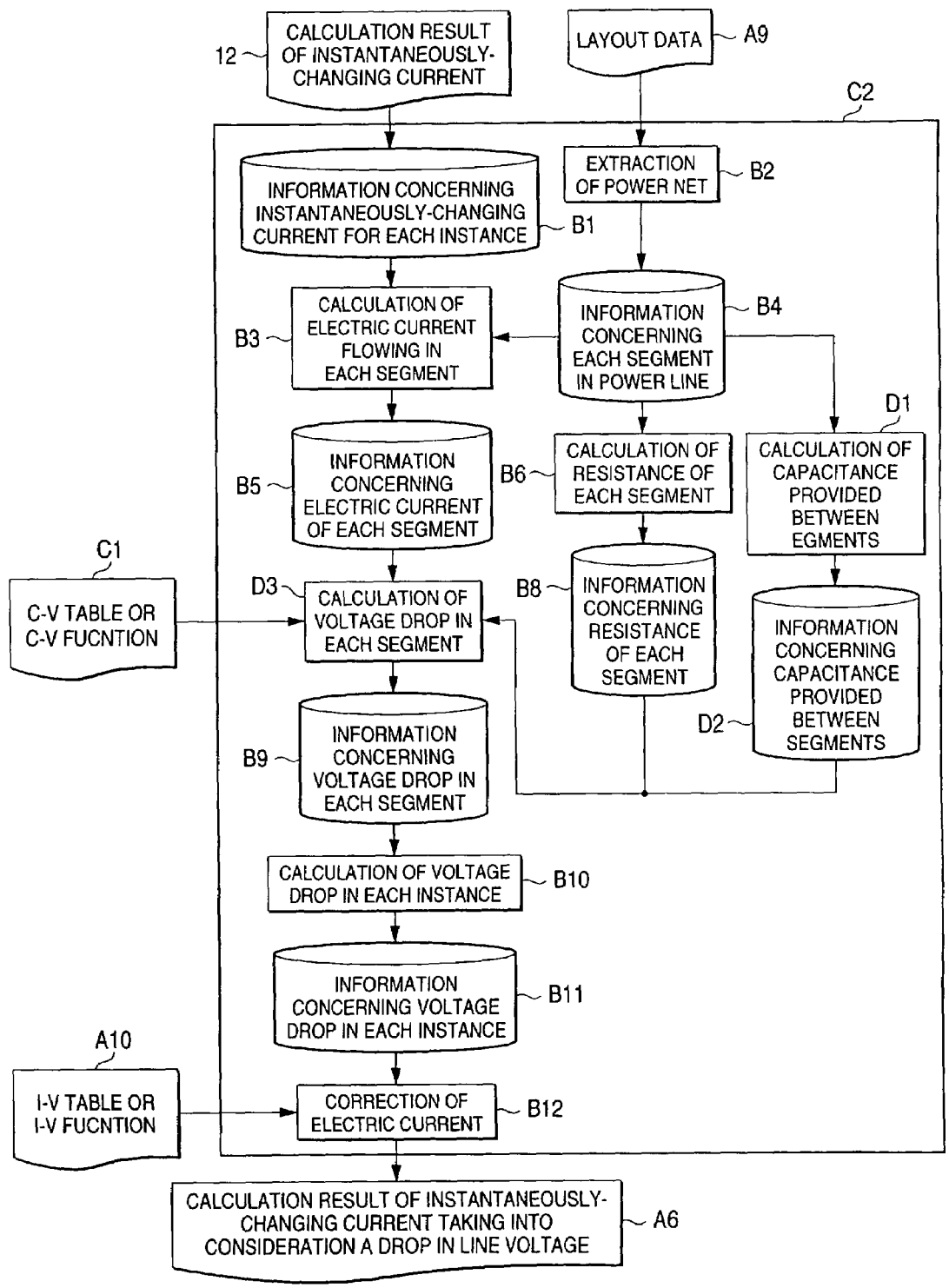
FIG. 37 is a flowchart for describing the flow of processing operations of a line voltage drop calculation/instantaneous current correction section according to the eighth embodiment.

C1 designates a C-V table file (or a C-V function) representing the relationship between decoupling capacitance existing between a power and the ground and the degree of a drop in line voltage. C2 designates a section for calculating a drop in line voltage and correcting the result of an instantaneously-changing current being calculated in step 11 (hereinafter referred to as a "voltage drop calculation/instantaneously-changing current correction section"). FIG. 37 is a block diagram showing the flow of processing of the voltage drop calculation/instantaneously-changing current correction section C2 according to the eighth embodiment of the present invention. The function of the voltage drop calculation/instantaneously-changing current correction section C2 will now be described by reference to the accompanying drawings. Those portions of the EMI analysis method according to the present embodiment which are identical with those of the EMI analysis method according to the seventh embodiment are assigned the same reference numerals, and their repeated explanations are omitted. Since the data 12 have already been described in detail in connection with the first embodiment, the same reference numeral is assigned to the data 12, and its repeated explanation is omitted.

The voltage drop calculation/instantaneously-changing current correction section C2 is configured such that a section D1 for calculating the capacitance of each segment in a power-to-ground line (hereinafter referred to simply as a "capacitance calculation section D1") is added to the voltage drop calculation/instantaneously-changing current correction section A11, and the segment voltage drop calculation section B7 is changed to D3. Those sections and their corresponding steps will now be described. In step D1, there is entered the segment information B4 concerning a power line prepared in step B2 in the seventh embodiment. Information D2 concerning the capacitance of each segment in the power-to-ground line is formed from the information concerning the area of an overlap existing between the segments in the power-to-ground line, the information being included in the segment information B4, as well as from a predetermined capacitance parameter assigned to each interconnection layer.

Figure 38:
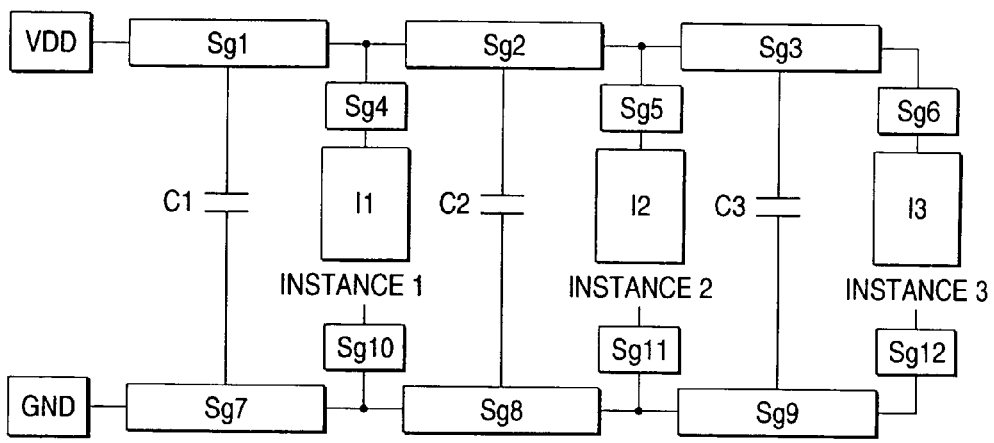
FIG. 38 is a schematic representation showing information about a capacitor provided between segments, which information is produced in the line voltage drop calculation/instantaneous current correction section according to the eighth embodiment.

FIG. 38 is a schematic illustration showing the data base for the capacitance information D2 prepared in step D1. In the drawing, a capacitor provided between segments Sg1 and Sg7 is indicated by C1; a capacitor provided between segments Sg2 and Sg8 is indicated by C2; and a capacitor provided between segments Sg3 and Sg9 is indicated by C3. In step D3, there are entered the current information B5 prepared for each segment in step B3 in the seventh embodiment, the resistance information B8 prepared for each segment in step B6 in the seventh embodiment, the C-V table file C1 (or C-V function) representing the relationship between the decoupling capacitance existing between the power and the ground and the degree of drop in line voltage, and the capacitance information D2 prepared in step D1 with regard to the capacitance of each of the segments in the power-to-ground line. Those information pieces are corrected according to Ohm's law and the C-V table, to thereby produce the voltage drop information B9 for each segment so as to reflect decoupling capacitance as well as the resistance of a power line.

Figure 39:
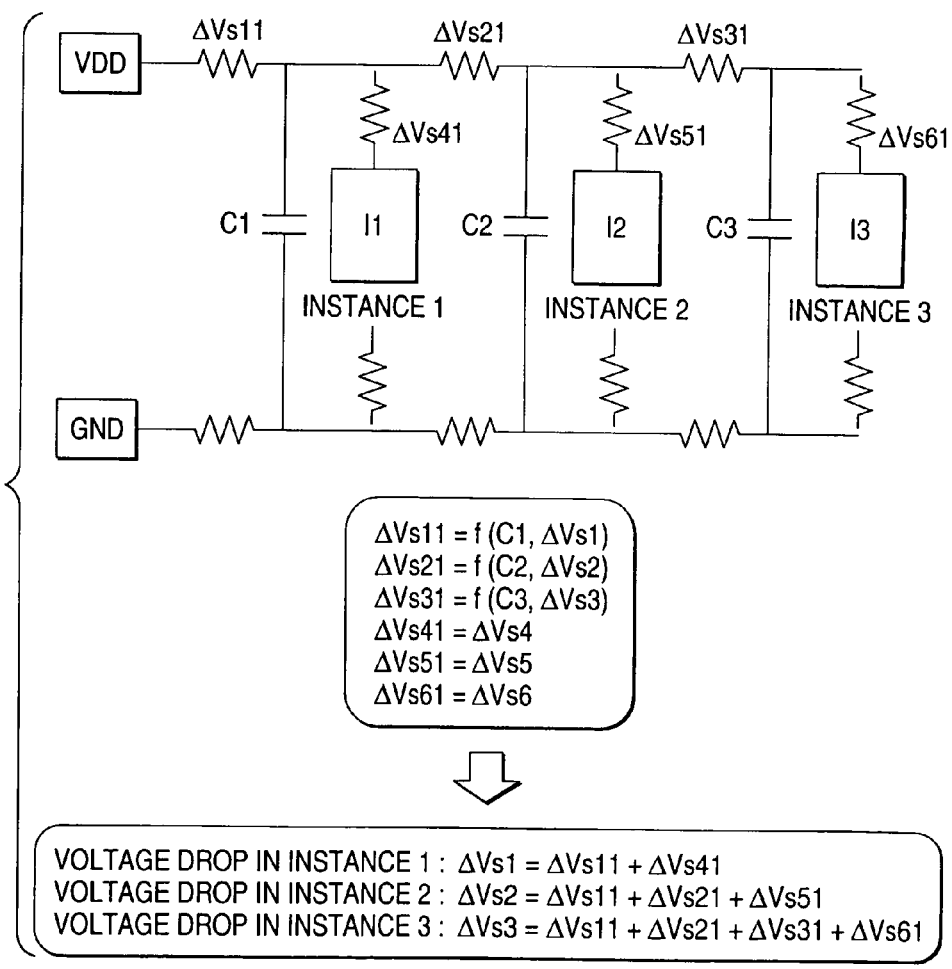
FIG. 39 is a schematic representation showing information about a drop in voltage of each of segments, which information is produced in the line voltage drop calculation/instantaneous current correction section according to the eighth embodiment.

FIG. 39 is a schematic illustration showing the voltage drop information B9 prepared in step D3. In the drawing, a voltage drop arising in segment Sg1 is indicated by $\Delta Vs11$; a voltage drop arising in segment Sg2 is indicated by $\Delta Vs21$; a voltage drop arising in segment Sg3 is indicated by $\Delta Vs31$; a voltage drop arising in segment Sg4 is indicated by $\Delta Vs41$; a voltage drop arising in segment Sg5 is indicated by $\Delta Vs51$; and a voltage drop arising in segment Sg is indicated by $\Delta Vs61$. In this case, there are obtained $\Delta Vs11=f(C1, \Delta Vs1)$, $\Delta Vs21=f(C2, \Delta Vs2)$, $\Delta Vs31=f(C3, \Delta Vs3)$, $\Delta Vs41=\Delta Vs4$, $\Delta Vs51=\Delta Vs5$, and $\Delta Vs61=\Delta Vs6$.

As has been described, the EMI analysis method according to the eighth embodiment newly adopts correction of a current value in response to fluctuations in a line voltage, which would be induced by decoupling capacitance existing between the power and the ground, in addition to correction of the current value in consideration of a drop in the line voltage, which would be induced by the resistance of a power line. The instantaneously-changing current result 12 obtained for each instance in the first embodiment can be corrected in consideration of physical phenomena, such as fluctuations in a line voltage of a real semiconductor integrated circuit, thereby enabling realization of more accurate modeling of a current waveform. Therefore, the EMI analysis method of the present embodiment can produce a more accurate model of current waveform, thereby reducing undesired higher harmonic components included in the frequency characteristic of a circuit to be analyzed, the characteristic being determined by means of subjecting the current waveform to FFT processing.

Although the eighth embodiment has referred to the first embodiment, similar results are yielded even when the technical concept of the present embodiment is applied to any of the second through sixth embodiments.

Ninth Embodiment

Figure 40:
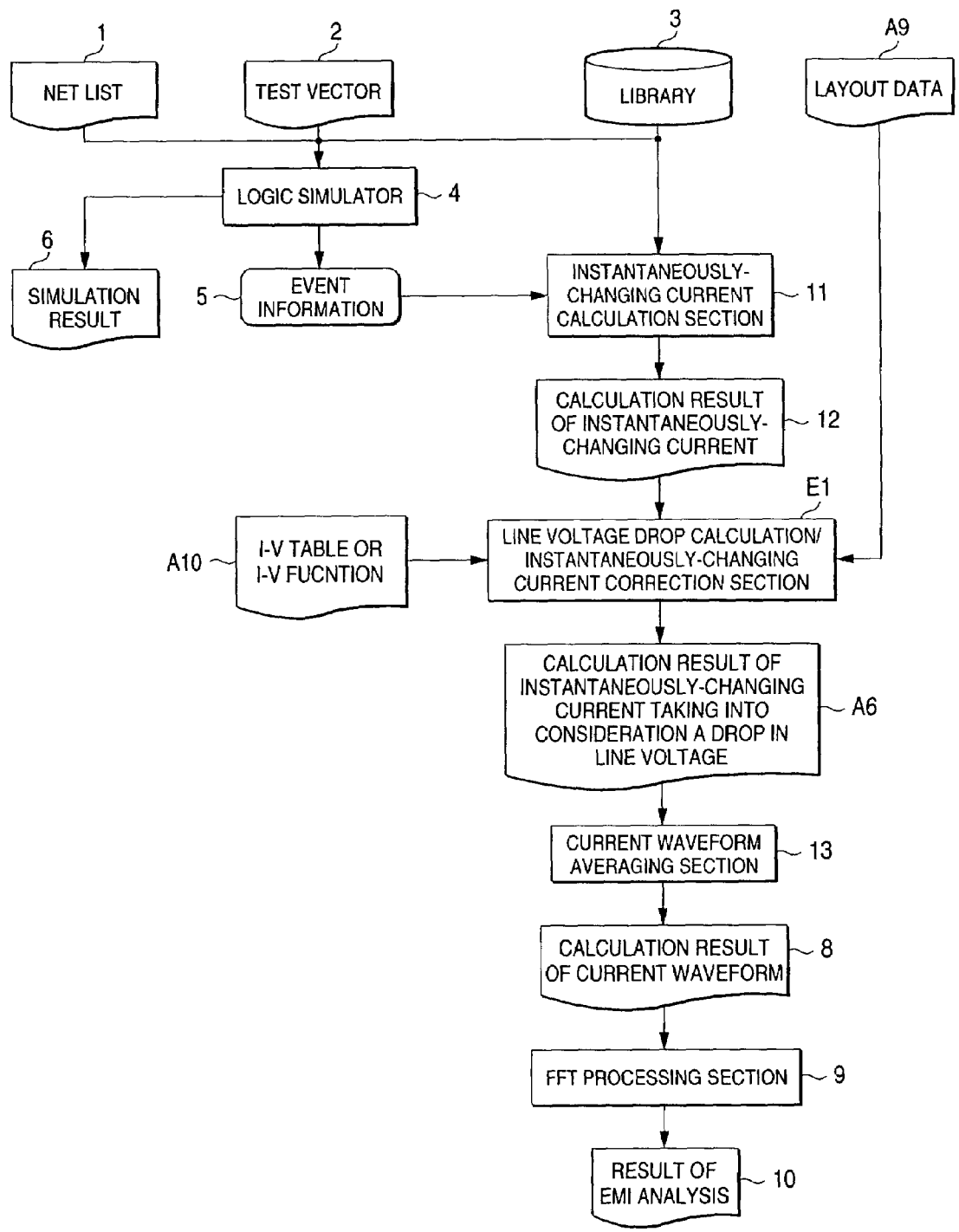
FIG. 40 is a flowchart for describing an EMI analysis method according to a ninth embodiment of the present invention.

An EMI analysis method according to a ninth embodiment of the present invention will now be described. FIG. 40 is a block diagram showing the overall flowchart of the EMI analysis method according to the present embodiment. The EMI analysis method according to the present embodiment is identical with the EMI analysis method according to the seventh embodiment described in connection with FIG. 28, except that the voltage drop calculation/instantaneously-changing current correction section A11 is replaced by a voltage drop calculation/instantaneously-changing current correction section E1. Those portions of the EMI analysis method according to the present embodiment which are identical with those of the EMI analysis method according to the first embodiment are assigned the same reference numerals, and their repeated explanations are omitted. E1 designates a section for calculating a drop in line voltage and correcting the result of an instantaneously-changing current calculation performed in step 11 (hereinafter referred to as a "voltage drop calculation/instantaneously-changing current correction section").

Figure 41:
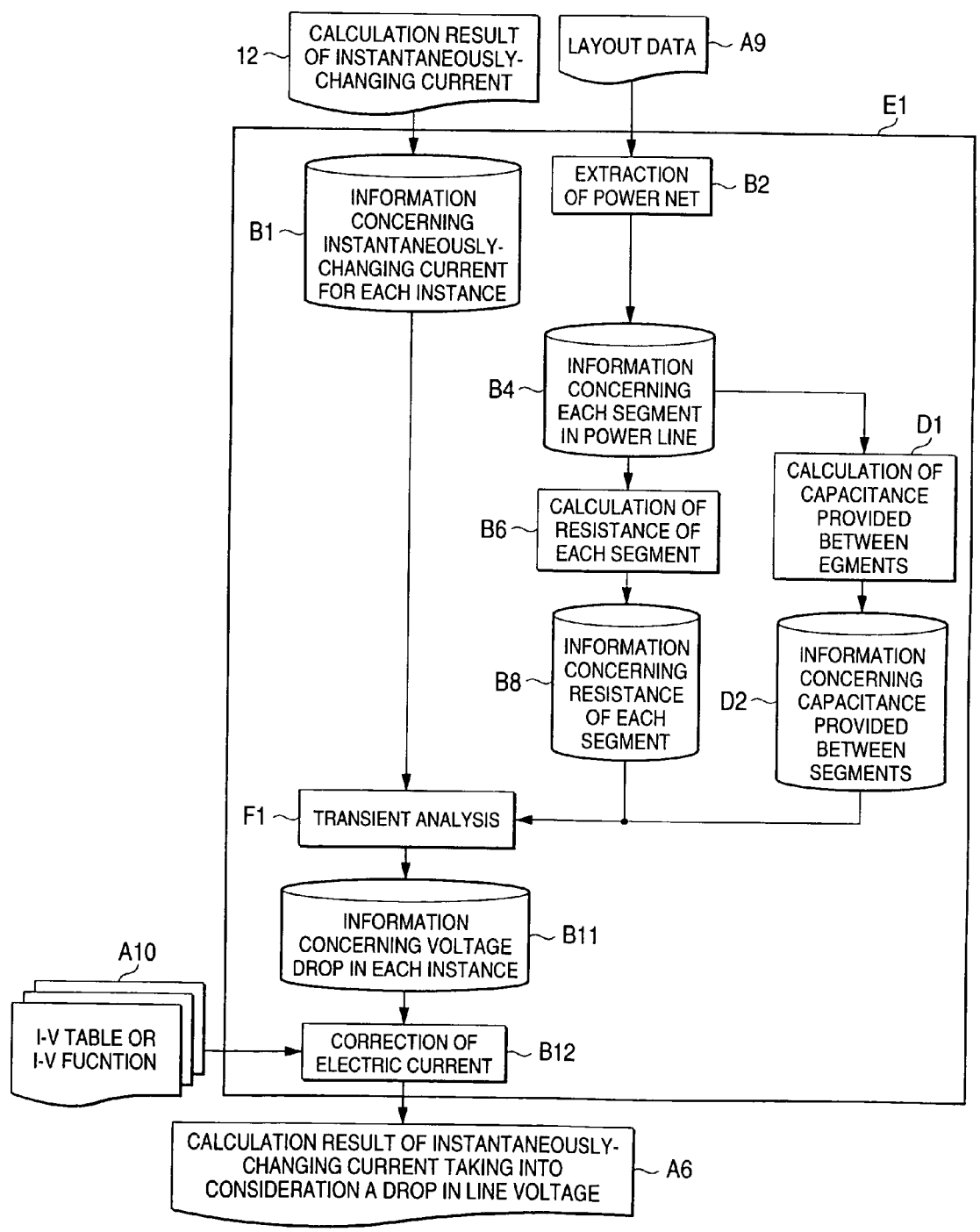
FIG. 41 a flowchart for describing the flow of processing operations of a line voltage drop calculation/instantaneous current correction section according to a ninth embodiment of the present invention.

FIG. 41 is a block diagram showing the flow of processing of the voltage drop calculation/instantaneously-changing current correction section E1 according to the ninth embodiment of the present invention. The function of the voltage drop calculation/instantaneously-changing current correction section E1 will now be described by reference to the accompanying drawings. Those portions of the EMI analysis method according to the present embodiment which are identical with those of the EMI analysis methods according to the seventh and eighth embodiments are assigned the same reference numerals, and their repeated explanations are omitted.

Since the data 12 have already been described in detail in connection with the first embodiment, the same reference numeral is assigned to the data 12, and repeated explanation is omitted. The voltage drop calculation/instantaneously-changing current correction section E1 is configured by means of removing, from the voltage drop calculation/instantaneously-changing current correction section C2 employed in the eighth embodiment, the segment current calculation section B3 for calculating an electric current flowing through each segment, the voltage drop calculation section D3 for calculating a drop in the voltage of each segment, and the instance voltage drop calculation section B10 for calculating a drop in the voltage of each instance; and newly adding a transient analysis section F1 to the same.

These sections and their corresponding steps will now be described. In step F1, there are entered the instantaneously-changing current information B1 prepared for each instance from the instantaneously-changing current calculation result 12 in step 11, the resistance information B8 prepared for each segment in step B6 in the eighth embodiment, and the capacitance information D2 concerning a capacitor provided between segments prepared in step D1 in the eight embodiment. Through a simulation performed by a transient analysis simulator typified by SPICE, there is produced voltage drop information B11 concerning a voltage drop of each instance.

As has been described, under the EMI analysis method according to the ninth embodiment, the resistance of a power line and fluctuations in a line voltage, which would be induced by decoupling capacitance existing between the power line and ground, are determined through use of a transient analysis simulator. Physical phenomena, such as fluctuations in a line voltage of a real semiconductor integrated circuit, can be faithfully reflected n the instantaneously-changing current result 12 obtained for each instance in the first embodiment. Therefore, the EMI analysis method of the present embodiment enables materialization of highly-accurate EMI analysis as described in the background art. Further, there can be realized high-speed EMI analysis which can be applied to a large-level circuit.

Although the ninth embodiment has referred to the first embodiment, similar results are yielded even when the technical idea of the present embodiment is applied to any of the second through sixth embodiments.

Tenth Embodiment

An EMI analysis method according to a tenth embodiment of the present invention will now be described. In the second through ninth embodiments, an instantaneously-changing current of each cell is calculated from event information concerning each cell, the information being output from a logic simulator, and the thus-calculated instantaneously-changing current is modeled as a rectangular waveform, thereby determining change in electric current. However, so long as the waveform of an instantaneous electric current is modeled as a triangular wave, a more realistic change in electric current can be determined. By way of example, there will now be described an EMI analysis method comprising the steps of:

calculating a peak value such that an instantaneously-changing electric current becomes equal to the area of a triangular wave;

modeling an instantaneously-changing electric current as a triangular wave having the peak value and a certain width, to thereby calculate a more realistic change in electric current; and subjecting the result of calculation of an electric waveform to FFT processing, thereby determining the frequency characteristic of an EMI component of a circuit of interest.

Figure 42:
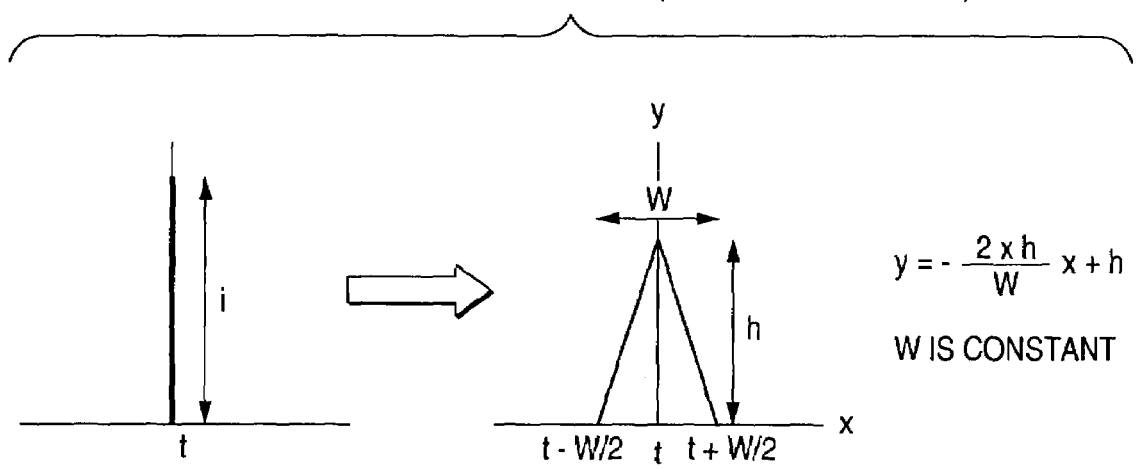
FIG. 42 shows a triangular waveform model (according to a tenth embodiment of the present invention)

FIG. 42 shows an instantaneous electric current and a modeled triangular wave according to the present embodiment. In the drawing, "i" denotes an instantaneously-changing current; and "t" denotes a current processing time. Further, "W" denotes the width of a triangular wave serving as a model of an instantaneously-changing current and corresponds to a constant. An appropriate value has been determined as a constant beforehand. Reference symbol "h" denotes the height of a triangular wave and is calculated on the basis of "i" and "W." An electric current at time t+x is expressed by Eq.5 provided below.

$$h(c, i) = \left[ \frac{h(c1, i1)(c2 - c)}{(c2 - c1)} + \frac{h(c2, i1)(c - c1)}{(c2 - c1)} \right] \left( \frac{i2 - i}{i2 - i1} \right) + \quad (5)$$

-continued $$\left[\frac{h(c1, i2)(c2 - c)}{(c2 - c1)} + \frac{h(c2, i2)(c - c1)}{(c2 - c1)}\right]\left(\frac{i - i1}{i2 - i1}\right)$$

Further, an electric current at time t−x is also expressed by Eq.5.

The overall flow of processing of the EMI analysis method according to the present embodiment is represented by the same block diagram as that employed in the first embodiment (see FIG. 1).

Figure 43:
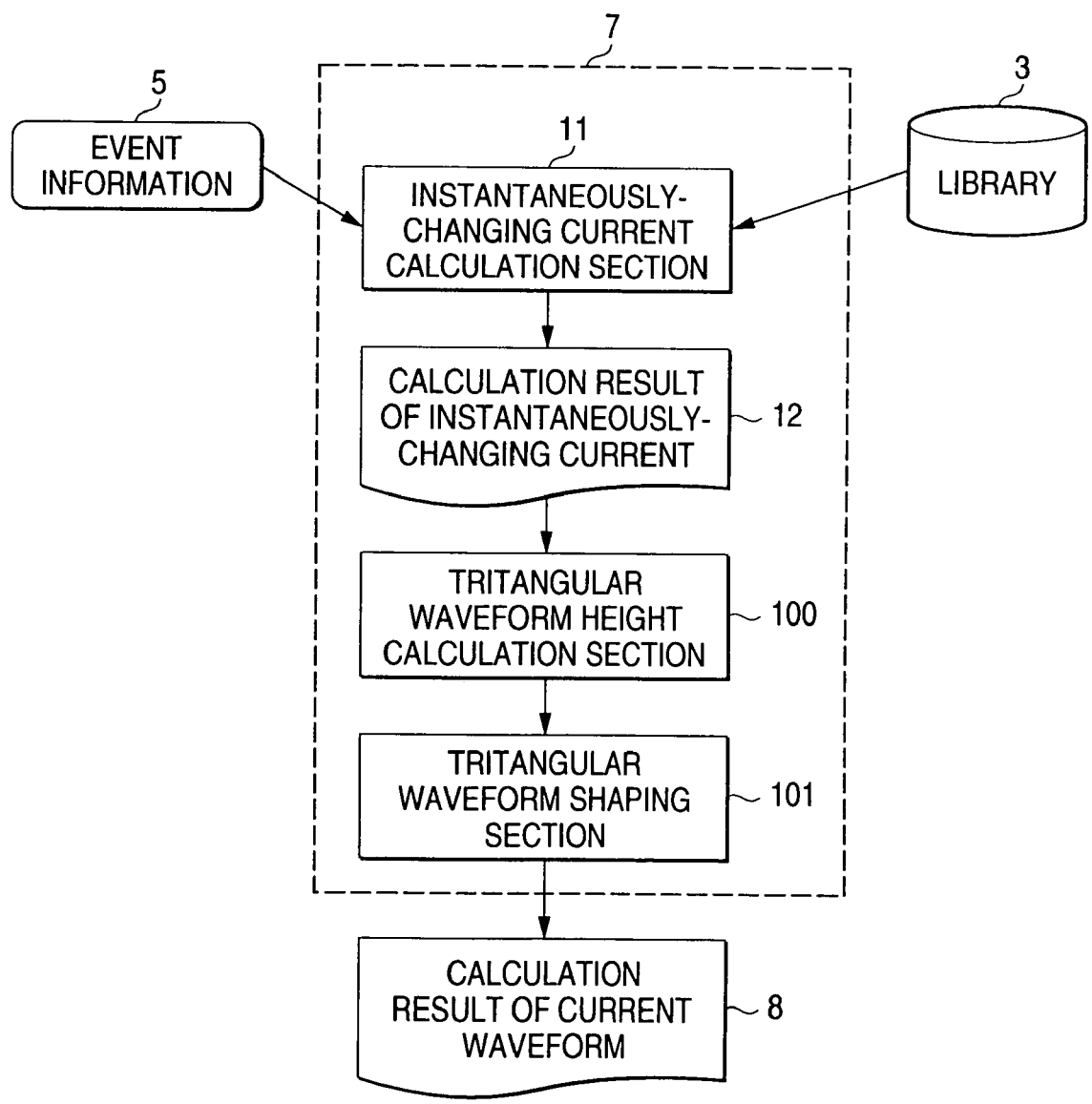
FIG. 43 is a block diagram showing a current waveform calculation section (according to a tenth embodiment of the present invention)

FIG. 43 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment. Reference numeral 100 denotes a triangular waveform height calculation section for calculating the height of a triangular wave such that the area of a triangular wave serving as a model of an instantaneously-changing current becomes equal to an instantaneously-changing current. Reference numeral 101 denotes a triangular-waveform-shaping section for modeling the instantaneously-changing current result 12 into a triangular wave having a constant width.

Figure 44:
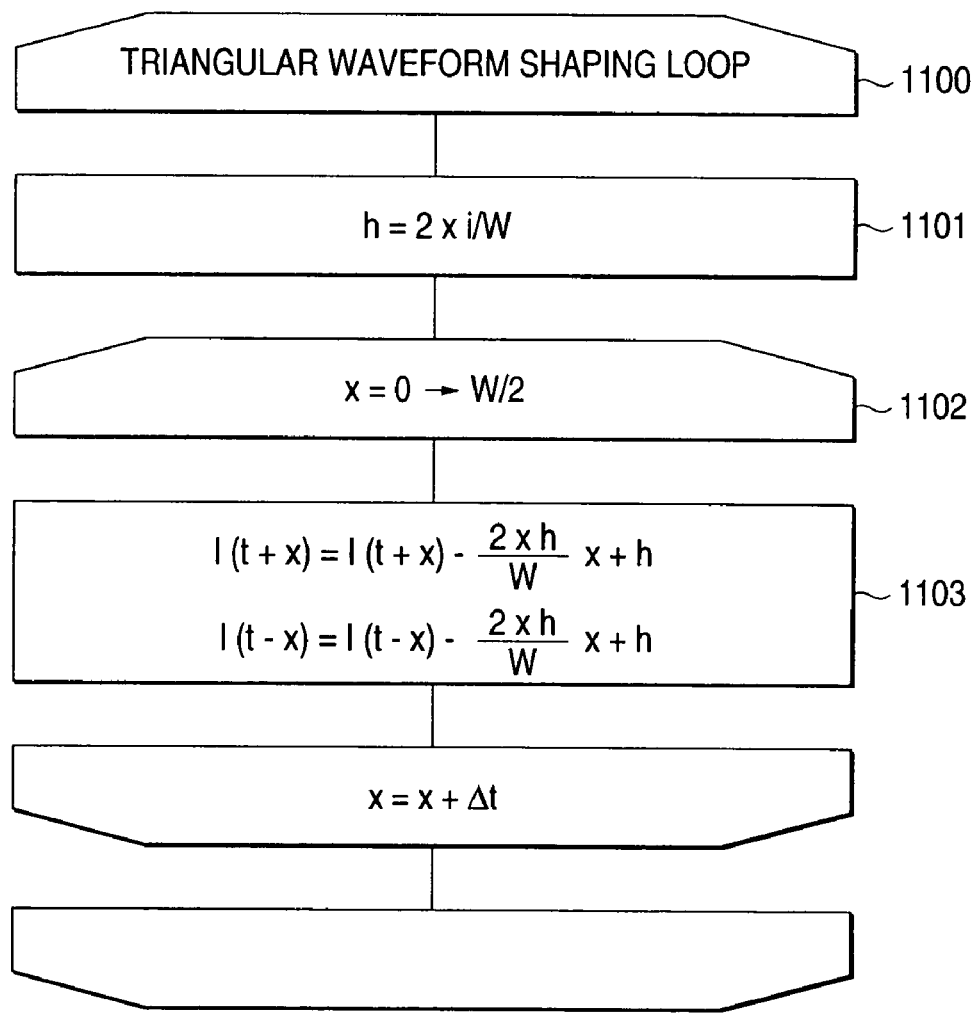
FIG. 44 is a flowchart of a triangular waveform-shaping operation (according to the tenth embodiment)

FIG. 44 is a flowchart of processing pertaining to the triangular-waveform-shaping section 101, including processing pertaining to the triangular waveform height calculation section 100. The following processing is iterated on a per-event basis until calculation of a current waveform is completed (step 1100). The area of a triangular wave is W×h/2 and assumes a value of an instantaneously-changing current "i." The height "h" of a triangular wave is calculated from 2×i/W (step 1101). Reference symbol "i" denotes an instantaneously-changing current of a cell of an event, the event being an object of EMI analysis. This processing corresponds to processing pertaining to the triangular waveform height calculation section 100. Until variable "x" changes from 0 to W/2, h(c, i) expressed by Eq.5 is added to I(t+x) and I(t−x). Further, Δt is added to variable "x" (steps 1102 and 1103). Here, I(t+x) denotes total electric current flowing through all the cells at time t+x, and I(t−x) denotes total electric current flowing through all the cells at time t−x. This processing corresponds to processing pertaining to the triangular-waveform-shaping section 101.

Figure 45:
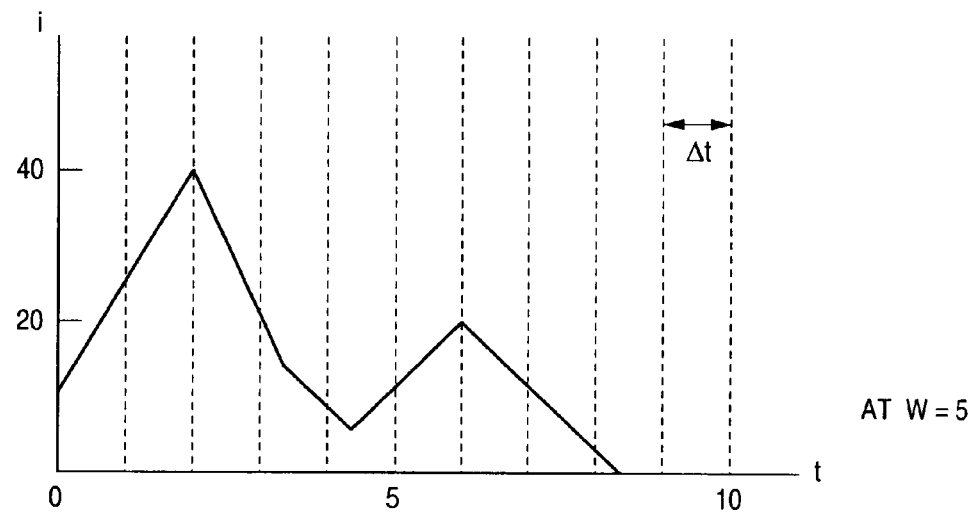
FIG. 45 is a graph showing a calculation result of a current waveform (according to the tenth embodiment)

The current wave calculation result 8 can be obtained by means of the flow of a triangular waveform height calculation operation and a triangular-waveform-shaping operation. FIG. 45 shows an example current wave calculation result 8 at time W=5 in the instantaneously-changing current calculation result shown in FIG. 3. The FFT processing section 9 subjects the waveform to an FFT operation, to thereby determine the frequency characteristic of an EMI component. As a result, there can be obtained an EMI analysis result 10.

Eleventh Embodiment

An EMI analysis method according to an eleventh embodiment of the present invention will now be described. In the second through ninth embodiments, an instantaneously-changing current of each cell is calculated from event information concerning each cell, the information being output from a logic simulator, and the thus-calculated instantaneously-changing current is modeled as a rectangular waveform, thereby determining change in electric current. However, so long as the waveform of an instantaneous electric current is modeled as a multi-order-function wave, a more realistic change in electric current can be determined. By way of example, there will now be described an EMI analysis method comprising the steps of:

calculating a peak value such that an instantaneously-changing electric current becomes equal to the area of a triangular wave;

modeling an instantaneously-changing electric current as a multi-order-function having the peak value and a given width, to thereby calculate a more realistic change in electric current; and subjecting the result of calculation of an electric waveform to FFT processing, thereby determining the frequency characteristic of an EMI component of a circuit of interest.

Figure 46:
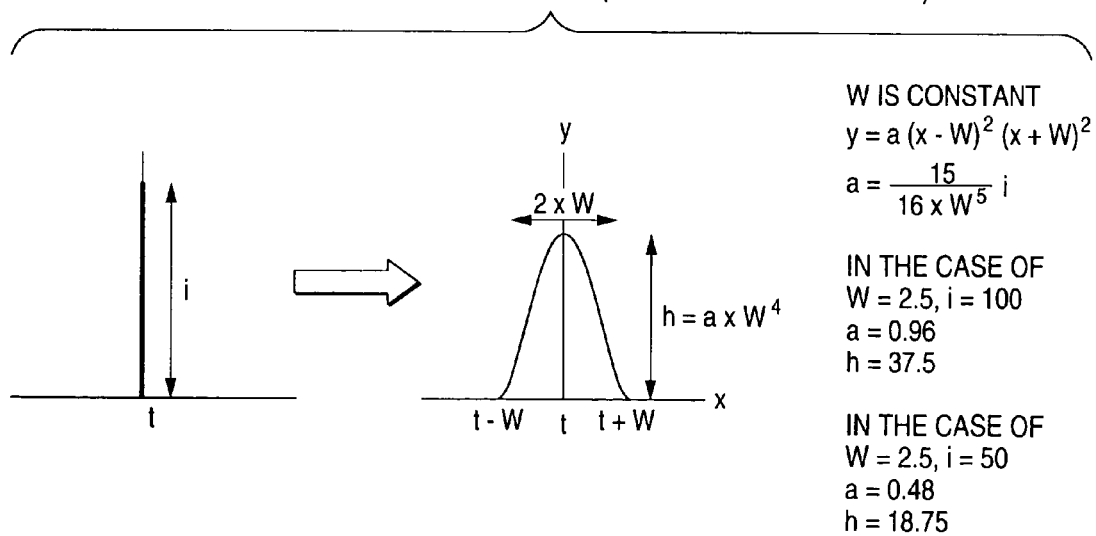
FIG. 46 is a multi-order-function model (according to an eleventh embodiment of the present invention)

FIG. 46 shows an instantaneous electric current and a modeled multi-order-function according to the present embodiment. In the drawing, "i" denotes an instantaneously-changing current; and "t" denotes a current processing time. Further, "W" denotes the width of a multi-order-function wave serving as a model of an instantaneously-changing current and corresponds to a constant. An appropriate value has been determined beforehand as a constant. Reference symbol "h" denotes the height of a multi-order-function wave and is calculated on the basis of "i" and "W." A multi-order-function wave serving as a model in the present embodiment is expressed by Eq.6 provided below.

$$y = a(x - W)^2(x + W)^2 \qquad (6).$$

The width of a multi-order-function wave model is taken as "2×W."

According to Eq.6, the height "h" of a multi-order-function wave model is determined when x=0 and is expressed by Eq.7 provided below.

$$h = a \times W^4 \qquad (7).$$

The area of the multi-order-function wave model is expressed by Eq.8 provided below.

$$S = \frac{16}{15} a \times W^5. \qquad (8)$$

Since the thus-defined area becomes equal to the instantaneously-changing current value "i," "a" is expressed though use of "W" and "i" as Eq. 9 provided below.

$$a = \frac{15}{16 \times W^5} i. \quad (9)$$

As a result of calculation of "a" through use of Eq. 9, the height "h" of a multi-order-function wave serving as a model is determined. Let W=2.5 and i=100, then a=0.96 is derived from Eq.9. Eq.7 consequently gives h=37.5. Further, let W=2.5 and i=50, then a=0.48 is derived from Eq.9. Eq.7 consequently gives h=18.75.

The overall flow of processing of the EMI analysis method according to the present embodiment is represented by the same block diagram as that employed in the first embodiment (see FIG. 1).

Figure 47:
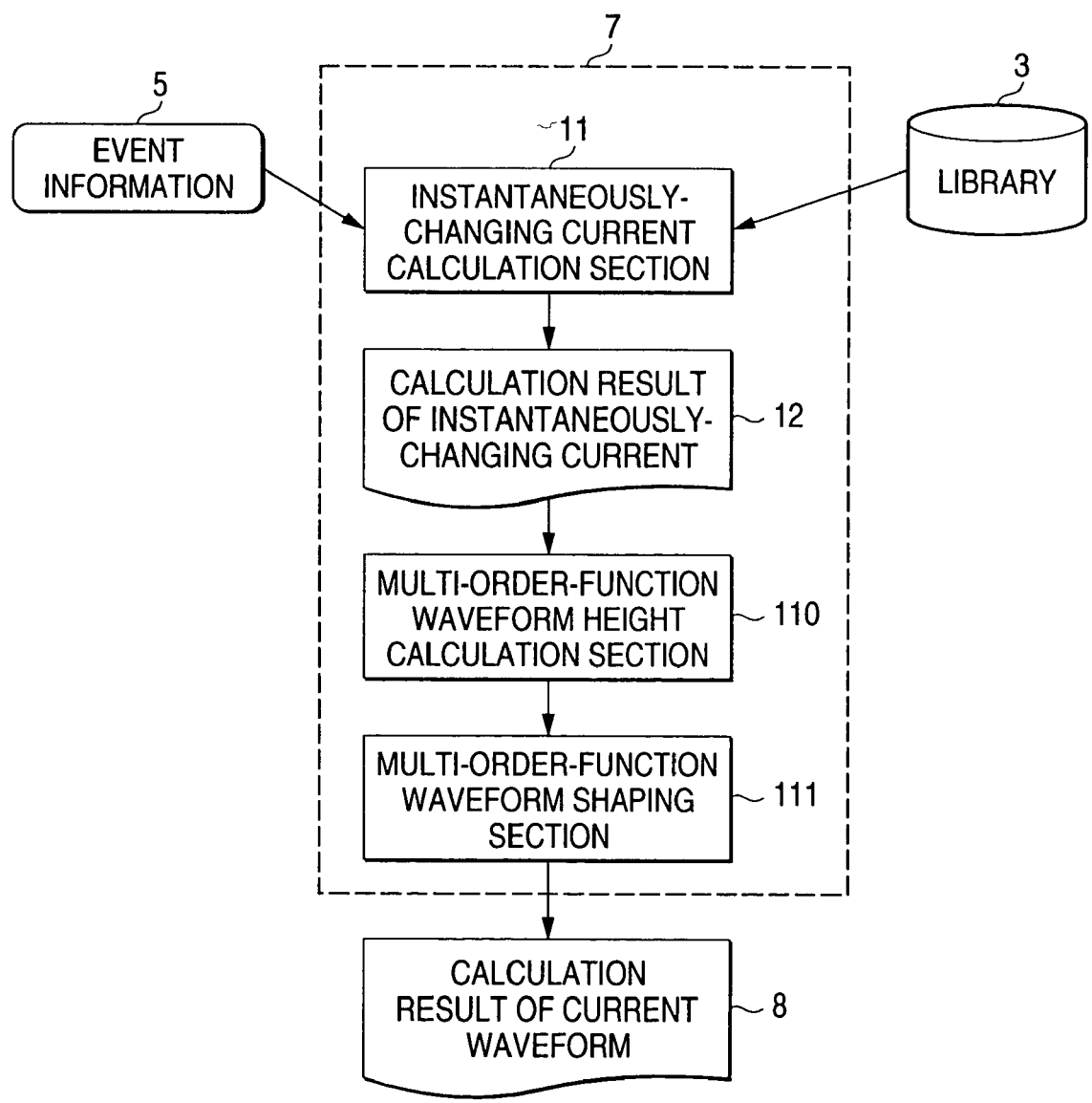
FIG. 47 is a block diagram showing a current waveform calculation section (according to a tenth embodiment of the present invention)

FIG. 47 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11.

FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment.

Reference numeral 110 denotes a multi-order-function waveform height calculation section for calculating the height of a multi-order-function wave such that the area of a multi-order-function wave serving as a model of an instantaneously-changing current becomes equal to an instantaneously-changing current. Reference numeral 111 denotes a multi-order-function waveform-shaping section for modeling the instantaneously-changing current result 12 as a multi-order-function wave having a constant width.

Figure 48:
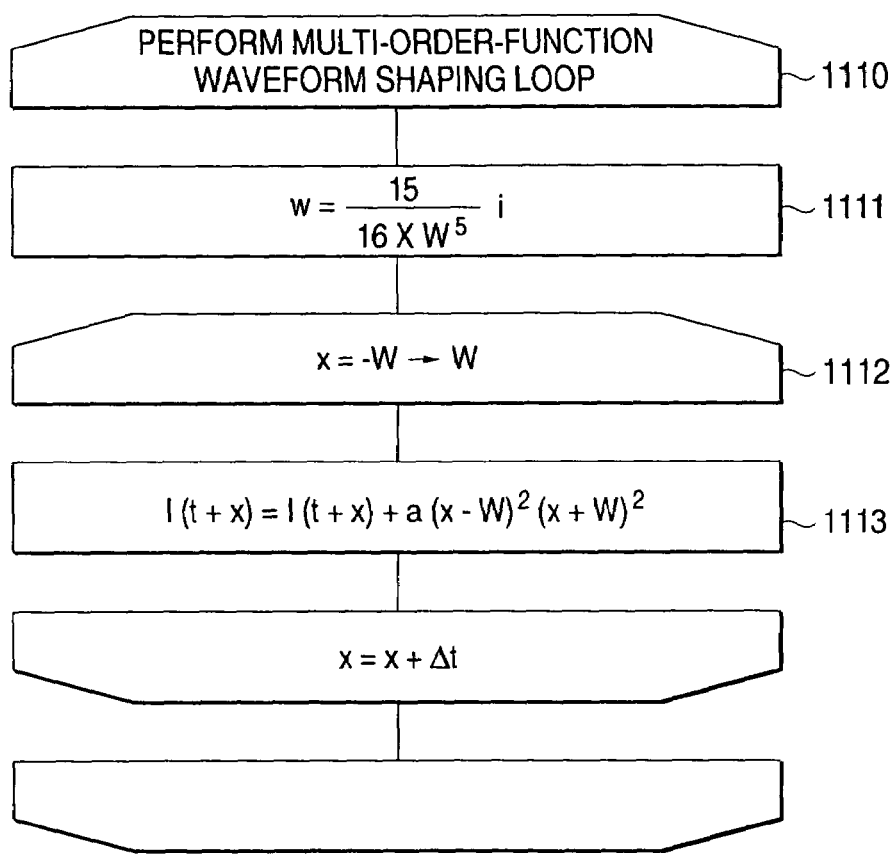
FIG. 48 is a flowchart of a multi-order-function waveform-shaping operation.

FIG. 48 is a flowchart of processing pertaining to the triangular-waveform-shaping section 101, including processing pertaining to the triangular waveform height calculation section 100. The following processing is iterated on a per-event basis until calculation of a current waveform is completed (step 1110). A peak-value-dependent coefficient "a" of a multi-order-function is calculated from Eq.9 (step 1111). Reference symbol "i" denotes an instantaneously-changing current of a cell of an event, the event being an object of EMI analysis, and "W" is a constant which is dependent on the width of a wave. This processing corresponds to processing pertaining to the multi-order-function waveform height calculation section 110.

Until variable "x" changes from −W to W, multi-order-function "y" expressed by Eq. 6 is added to I(t+x). Further, Δt is added to variable "x" (steps 1112 and 1113). Here, I(t+x) denotes total electric current flowing through all the cells at time t+x. This processing corresponds to processing pertaining to the multi-order-function waveform-shaping section 111.

Figure 49:
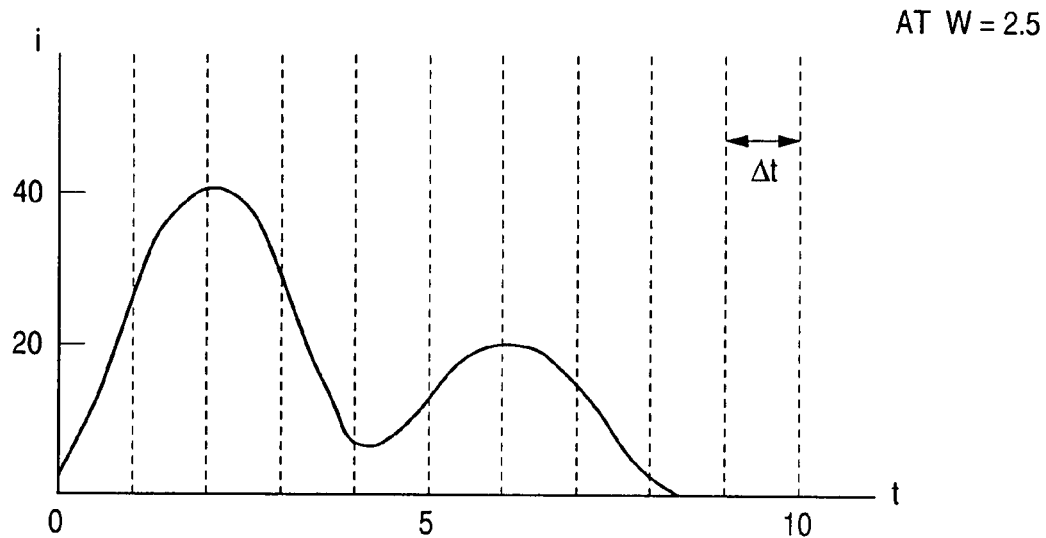
FIG. 49 is a graph showing a calculation result of a current waveform (according to an eleventh embodiment of the present invention)

The current wave calculation result 8 can be obtained by means of the flow of a multi-order-function waveform height calculation operation and a multi-order-function waveform-shaping operation. FIG. 49 shows an example current wave calculation result 8 at time W=2.5 in the instantaneously-changing current calculation result shown in FIG. 3. The FFT processing section 9 subjects the waveform to an FFT operation, to thereby determine the frequency characteristic of an EMI component. As a result, there can be obtained an EMI analysis result 10.

Twelfth Embodiment

An EMI analysis method according to a twelfth embodiment of the present invention will now be described. In the second through ninth embodiments, an instantaneously-changing current of each cell is calculated from event information concerning each cell, the information being output from a logic simulator, and the thus-calculated instantaneously-changing current is modeled as a rectangular waveform, thereby determining change in electric current. However, so long as the waveform of an instantaneous electric current is modeled as a Gauss function wave, a more realistic change in electric current can be determined.

By way of example, there will now be described an EMI analysis method comprising the steps of:

calculating the height and width of a Gauss function wave through use of a global table representing the relationship between an instantaneously-changing electric current and a Gauss function serving as a model, and another table representing the relationship between the instantaneously-changing current and the duration of the Gauss function wave;

modeling the instantaneously-changing electric current as a Gauss function wave, to thereby calculate a more realistic change in electric current; and subjecting the result of calculation of an electric waveform to FFT processing, thereby determining the frequency characteristic of an EMI component of a circuit of interest.

Figure 50:
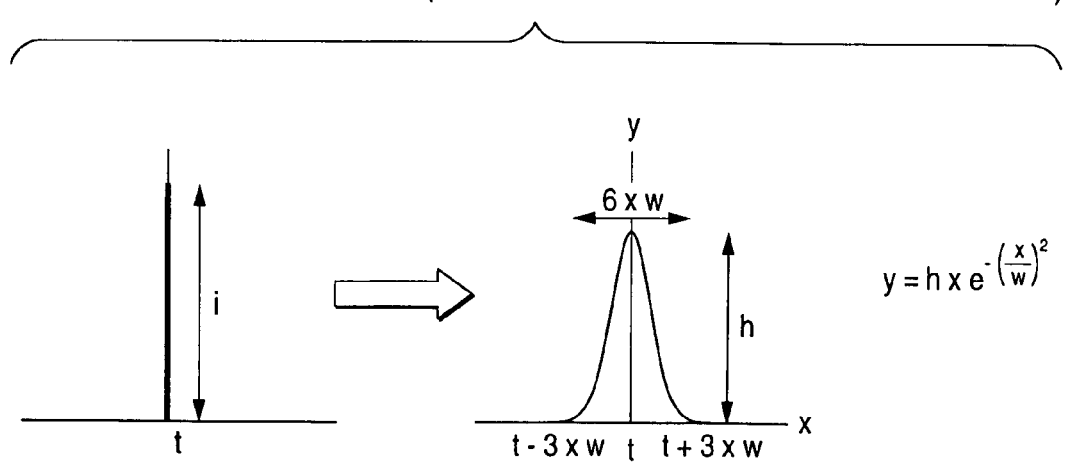
FIG. 50 is a schematic representation showing a Gaussian model (according to twelfth and twenty-fifth embodiments of the present invention)

FIG. 50 shows an instantaneous electric current and a modeled Gauss function according to the present embodiment. In the drawing, "i" denotes an instantaneously-changing current; "t" denotes a current processing time; and "h" denotes the height of a Gauss function wave serving as a model and calculated from a global table representing the relationship between an instantaneously-changing current and the height of a Gauss function serving as a model.

Figure 51:
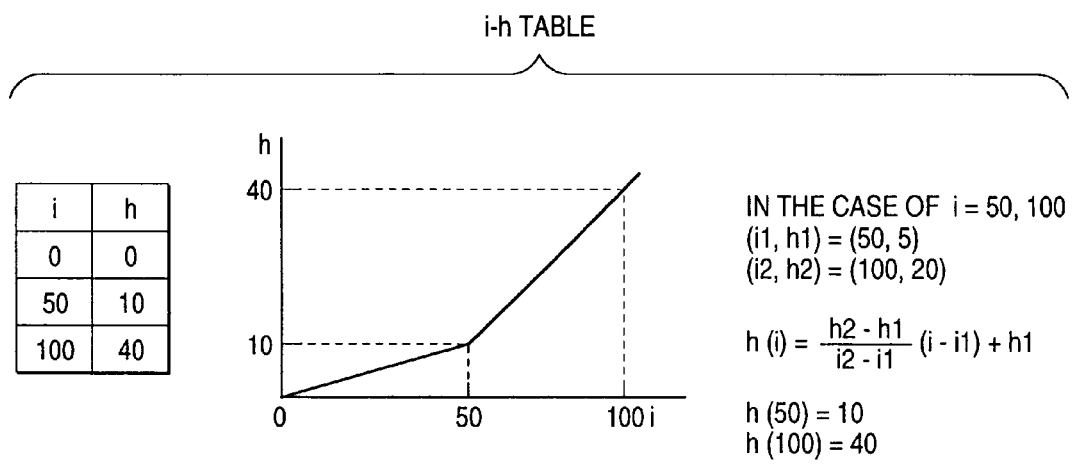
FIG. 51 is an i-h table.

FIG. 51 is a graph showing an example global i-h table representing the relationship between an instantaneously-changing current value and the height of a Gauss function waveform. The table shows the value of "h" at each of certain points "i." The table indicates that "h" assumes a value of 0 at i=0, a value of 10 at i=50, and a value of 40 at i=100. In reality, the value of "i" changes continuously, and hence the table is expressed as a graph plotting points provided in the table. The value of "h" [i.e., h (i)] at a certain value of "i" is expressed by Eq.2 provided below, through linear interpolation of the values of two points closest to "i" provided in the i-h table: one point has lower values (i1, h1), and the other point has higher values (i2, h2). Here, "w" designates the width of a Gauss function serving as a model, and the width "w" of a Gauss function is calculated through use of a global table representing the relationship between an instantaneously-changing current and the width of a Gauss function serving as a model.

Figure 52:
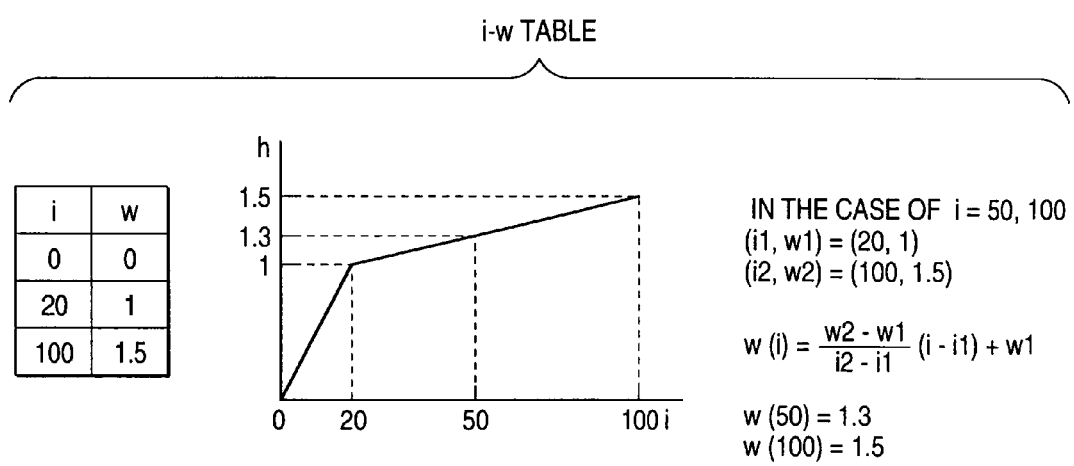
FIG. 52 is an i-w table.

FIG. 52 is a graph showing an example global i-w table representing the relationship between an instantaneously-changing current value and the width "w" of a rectangular waveform. The table shows the value of "w" at each of certain points "i." The table indicates that "w" assumes a value of 0 at i=0, a value of 1 at i=20, and a value of 1.5 at i=100. In reality, the value of "i" changes continuously, and hence the table is expressed as a graph plotting points provided in the table.

The value of "w" [i.e., w(i)] at a certain value of "i" is expressed by Eq.10 provided below, through linear interpolation of the values of two points closest to "i" provided in the i-w table: one point has lower values (i1, w1), and the other point has higher values (i2, w2).

$$w(i) = \frac{w2 - w1}{i2 - i1}(i - i1) + w1 \qquad (10)$$

In the present embodiment, the Gauss function serving as a model is expressed by Eq.10. This function is called a Gaussian function. Let x=0, Eq.10 provides "h," which represents the height of a Gaussian function wave. From Eq.10, let x=3×W, there is derived a value of 0.0001×h (i.e., 0.01% of the height of a Gaussian function wave). This value is taken as a limit on the width of a Gaussian function serving as a model, and the width of the Gaussian function is taken as "6×w."

The overall flow of processing of the EMI analysis method according to the present embodiment is represented by the same block diagram as that employed in the first embodiment (see FIG. 1).

Figure 53:
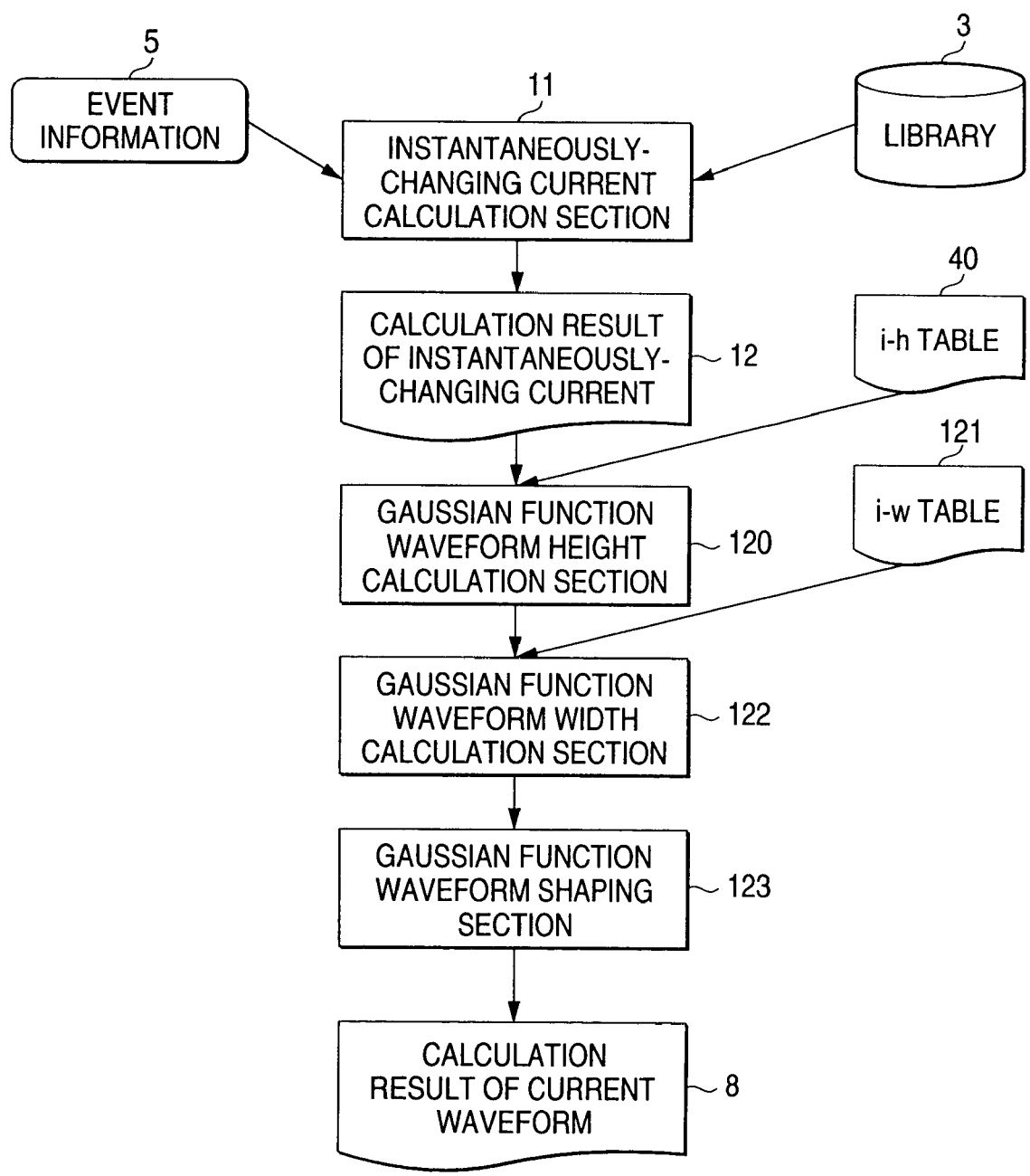
FIG. 53 is a block diagram showing a current waveform calculation section (according to a twelfth embodiment of the present invention)

FIG. 53 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11.

FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment. Reference numeral 40 designates a global i-h table representing the relationship between an instantaneously-changing current value and the height of a Gaussian function wave (see FIG. 51). Reference numeral 120 designates a Gaussian function waveform height calculation section for calculating, from an instantaneously-changing current value and the table i-h 40, a peak value of a Gaussian function serving as a model.

Reference numeral 121 designates a global i-w table representing the relationship between an instantaneously-changing current value and the width of a Gaussian function wave (see FIG. 52). Reference numeral 122 designates a Gaussian function waveform width calculation section for calculating the width of a Gaussian function wave from the instantaneously-changing current value and the i-w table 121. Reference numeral 123 denotes a Gaussian function waveform-shaping section for modeling the instantaneously-changing current result 12 as a Gaussian function wave having a peak value calculated by the Gaussian function waveform height calculation section 120 and a width calculated by the Gaussian function waveform width calculation section 122.

Figure 54:
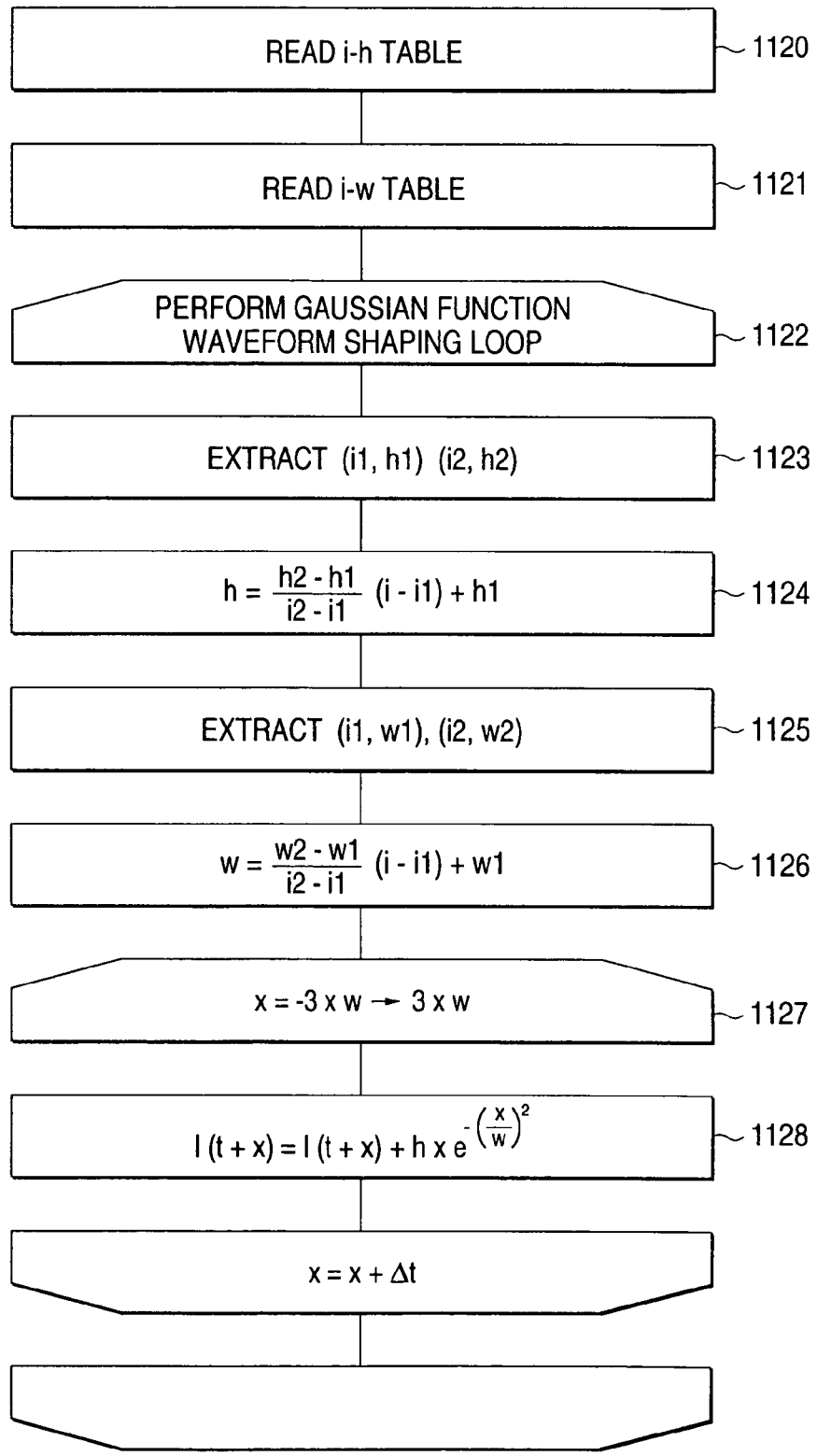
FIG. 54 is a flowchart of a Gaussian function waveform-shaping operation.

FIG. 54 shows the flowchart of processing pertaining to the Gaussian function waveform-shaping section 123, including processing pertaining to the Gaussian function waveform height calculation section 120 and processing pertaining to the Gaussian function waveform width calculation section 122. First, the i-h table 40 is read (step 1120), and the i-w table 121 is read (step 1121). The processing provided below is iterated on a per-event basis until calculation of a current waveform is completed (step 1122). There are extracted two points closest to "i" provided in the i-h table 40: one point has lower values (i1, h1), and the other point has higher values (i2, h2) (step 1123). Here, reference symbol "i" denotes the value of an instantaneously-changing current of a cell of an event, the event being an object of EMI analysis.

In connection with the table shown in FIG. 51, in the case of i=50, there are obtained (i1, h1)=(0, 0) and (i2, h2)=(50, 5). In the case of i=100, there are obtained (i1, h1)=(50, 5) and (i2, h2)=(100, 20). From Eq. 2, there is calculated the height "h" of the Gaussian function wave (step 1124). In connection with the table shown in FIG. 51, in the case of i=50, there is obtained h(50)=10. In the case of i=100, there is obtained h(100)=40. This processing corresponding to processing pertaining to the Gaussian function waveform height calculation section 120.

There are extracted two points closest to "i" provided in the i-w table 121: one point has lower values (i1, w1), and the other point has higher values (i2, w2) (step 1125). Here, reference symbol "ii" denotes the value of an instantaneously-changing current of a cell of an event, the event being an object of EMI analysis. In connection with the table shown in FIG. 52, in the case of i=50, there are obtained (i1, w1)=(0, 0) and (i2, w2)=(20, 1). In the case of i=100, there are obtained (i1, w1)=(20, 1) and (i2, w2)=(100, 1.5).

Eq. 10 provides the width "w" of the Gaussian function wave (step 1126). In connection with the table shown in FIG. 52, in the case of i=50, there is obtained w(50)=1.3. In the case of i=100, there is obtained w(100)=1.5. The processing pertaining to steps 1125 and 1126 corresponds to processing pertaining to the Gaussian function waveform width calculation section 122.

A function expressed by Eq.11 provided below is added to I(t+x) until variable "x" changes from −3×W to 3×W, and Δt is added to "x" (steps 1127 and 1128).

$$y = h \times e^{-\left(\frac{x}{w}\right)^2}. \qquad (11)$$

Here, I(t+x) represents total current flowing through all the cells at time "t+x." This processing corresponds to processing pertaining to the Gaussian function waveform-shaping section 123.

Figure 55:
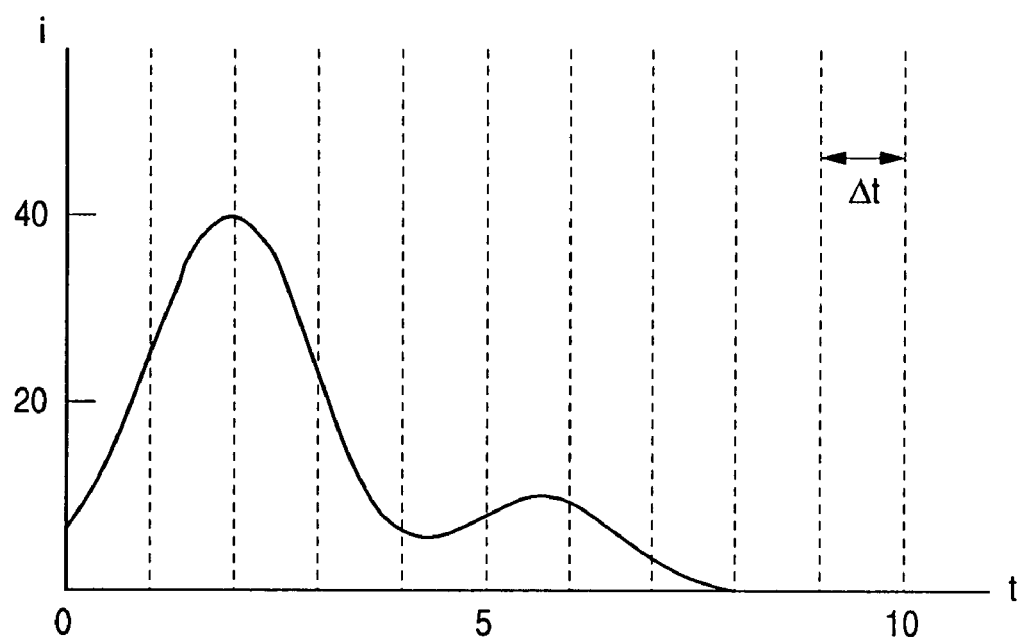
FIG. 55 is a graph showing a calculation result of a current waveform (according to a twelfth embodiment of the present invention)

The current wave calculation result 8 can be obtained by means of the flow of a Gaussian function waveform height calculation operation, a Gaussian function waveform width calculation operation, and a Gaussian function waveform-shaping operation. FIG. 55 shows an example current waveform calculation result 8 as the result of calculation of an instantaneously-changing current shown in FIG. 3, the calculation result being obtained in a case where the table shown in FIG. 51 is used as the i-h table 40 and the table shown in FIG. 52 is used as the i-w table 121. The current wave calculation result 8 is subjected to an FFT operation by the FFT processing section 9, to thereby determine the frequency characteristic of an EMI component. Thus, there can be obtained an EMI analysis result 10.

Thirteenth Embodiment

An electromagnetic interference (EMI) analysis method according to a thirteenth embodiment of the present invention will now be described. The EMI analysis method according to the present embodiment is characterized by modeling an instantaneously-changing current while information concerning estimation of a current waveform (hereinafter referred to simply as "current waveform estimation information") is separated into an element dependent on a short circuit current (also called "short circuit-current-dependent element") and another element dependent on a charge current (also called "charge-current-dependent element"). The expression "short circuit current" used herein means an electric current which flows from the source terminal to the drain terminal in each of a p-channel MOS transistor (hereinafter abbreviated "p-MOS transistor") and an n-channel MOS transistor (hereinafter abbreviated "n-MOS transistor") in a case where the p-MOS and n-MOS transistors are instantaneously and simultaneously brought into an active state as a result of a change arising in a signal appearing at the gate terminal of a CMOS transistor constituting a circuit element. The expression "charge current" means an electric current which flows when electric charge is stored in or discharged from an output load capacitor of a circuit element. A short circuit current arises substantially simultaneous with occurrence of a change in an input signal, and a charge current flows together with a change in an output signal at a slight time lag from the time when change has arisen in an input signal. Accordingly, estimation of a more accurate current waveform becomes feasible by means of separate handling of the short circuit-current-dependent element of the current waveform estimation information and the charge-current-dependent element.

Figure 56:
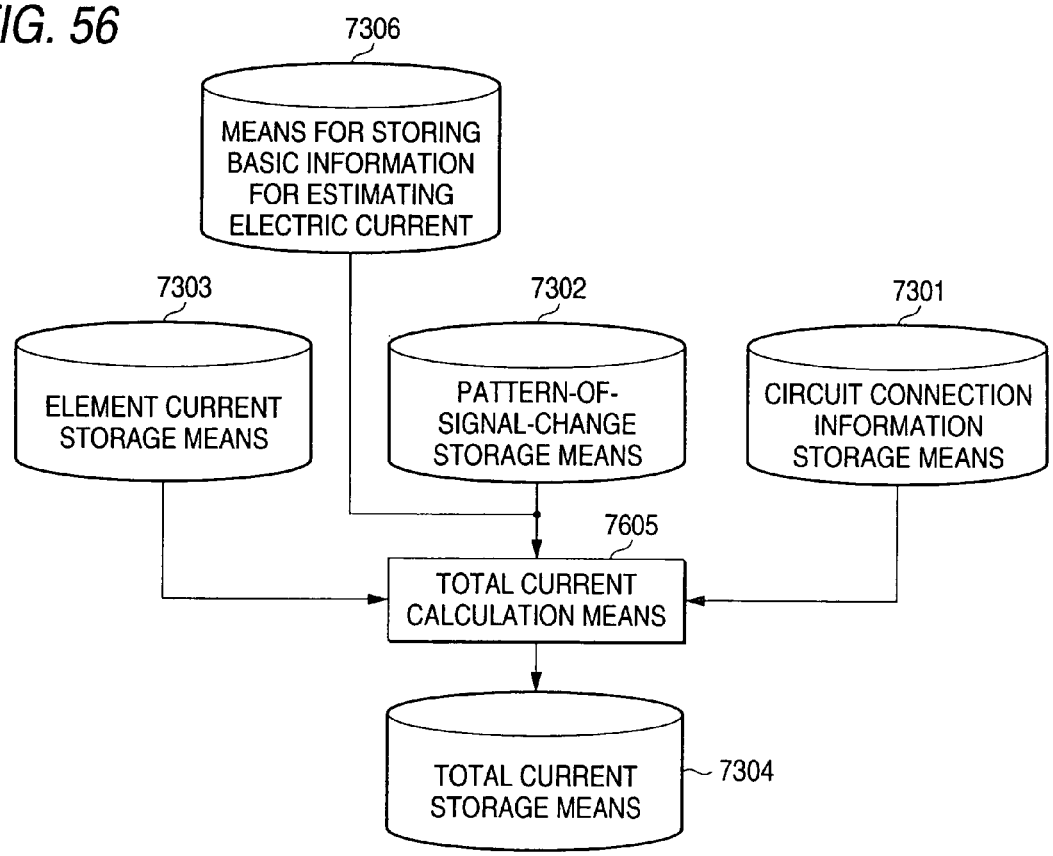
FIG. 56 is a block diagram showing the configuration of a system for effecting an EMI analysis method according to a thirteenth embodiment of the present invention.

FIG. 56 shows the configuration of the EMI analysis method according to the present embodiment using a technique of averaging a short circuit current and a charge current by means of dividing by a discrete width.

A system used with the EMI analysis method shown in FIG. 56 has means for analyzing the amount of current (hereinafter referred to as "amount-of-current analysis means"), the amount-of-current analysis means comprising circuit-connection information storage means 7301 for storing information concerning circuit interconnections; pattern-of-signal-change storage means 7302 for storing a pattern of signal change; element-current storage means 7303 for storing the amount of electric current flowing through an element; basic-information-for-estimating-current storage means 7306 for storing basic information concerning estimation of an electric current; total-amount-of-current storage means 7304 for storing the total amount of current flowing through an element; and total-amount-of-current calculation means 7305 for calculating the total amount of electric current.

These means constituting the EMI analysis method shown in FIG. 56 will now be described. There will now be described procedures for calculating the total amount of electric current shown in FIG. 58 from circuit connection information shown in FIG. 110, a pattern of signal change shown in FIG. 111, and basic information concerning estimation of an electric current shown in FIG. 59. The amount-of-current analysis means comprising circuit-connection information storage means 7301 is identical with the circuit connection information storage means 1001 described in connection with the background art, and the pattern-of-signal-change storage means 7302 is identical with the signal pattern storage means 1002 described in connection with the background art. Hence, their repeated explanations are omitted for brevity.

Figure 57:
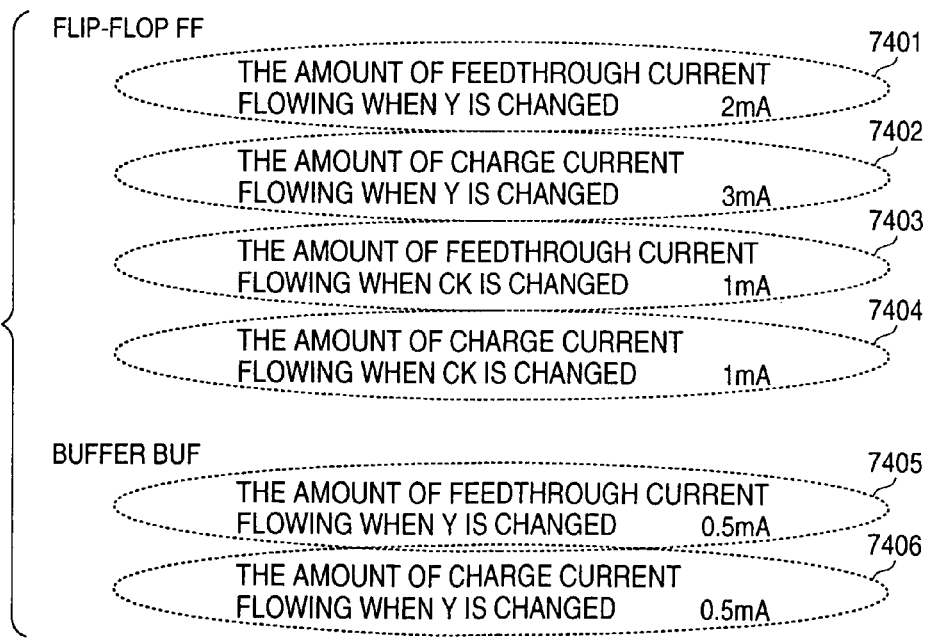
FIG. 57 is an illustration showing example data stored in means for storing basic information to be used for estimating an electric current according to the thirteenth embodiment.

The element-current storage means 7303 stores information concerning the amount of electric current flowing through an element; that is, information concerning the total amount of electric current flowing when single change arises in an external terminal of each element, while the information is divided into a short circuit current component and a charge current component. The information concerning the amount of electric current flowing through an element, such as that shown in FIG. 57, has been stored in the element-current storage means 7303 beforehand. Reference numeral 7401 denotes the amount of short circuit current which flows when a change arises in a signal appearing at a clock input terminal CK of a flip-flop FF. Reference numeral 7402 denotes the amount of charge current which flows when a change arises in a signal appearing at a clock input terminal CK of the flip-flop FF. Reference numeral 7403 denotes the amount of short circuit current which flows when a change arises in a signal appearing at an output terminal Q of the flip-flop FF. Reference numeral 7404 denotes the amount of charge current which flows when a change arises in a signal appearing at the output terminal Q of the flip-flop FF. Reference numeral 7405 denotes the amount of short circuit current which flows when a change arises in a signal appearing at an output terminal Y of a buffer BUF. Reference numeral 7406 denotes the amount of charge current which flows when a change arises in a signal appearing at the output terminal Y of the buffer BUF. The basic-information-for-estimating-current storage means 7306 stores the discrete width of a short circuit current and the discrete width of a charge current in the form shown in FIG. 59. The basic information concerning estimation of an electric current has a discrete width to be used for averaging the total amount of electric current which flows in response to occurrence of a change in a signal, as in the case of the information employed in the first embodiment. However, in contrast with the information employed in the first embodiment, the basic information concerning estimation of an electric current comprises two pieces of information: that is, information 7601 concerning the discrete width of a short circuit current, and information 7602 concerning the discrete width of a charge current. Information 7601 represents the discrete width of a short circuit current, and information 7602 represents the discrete width of a charge current.

Figure 60:
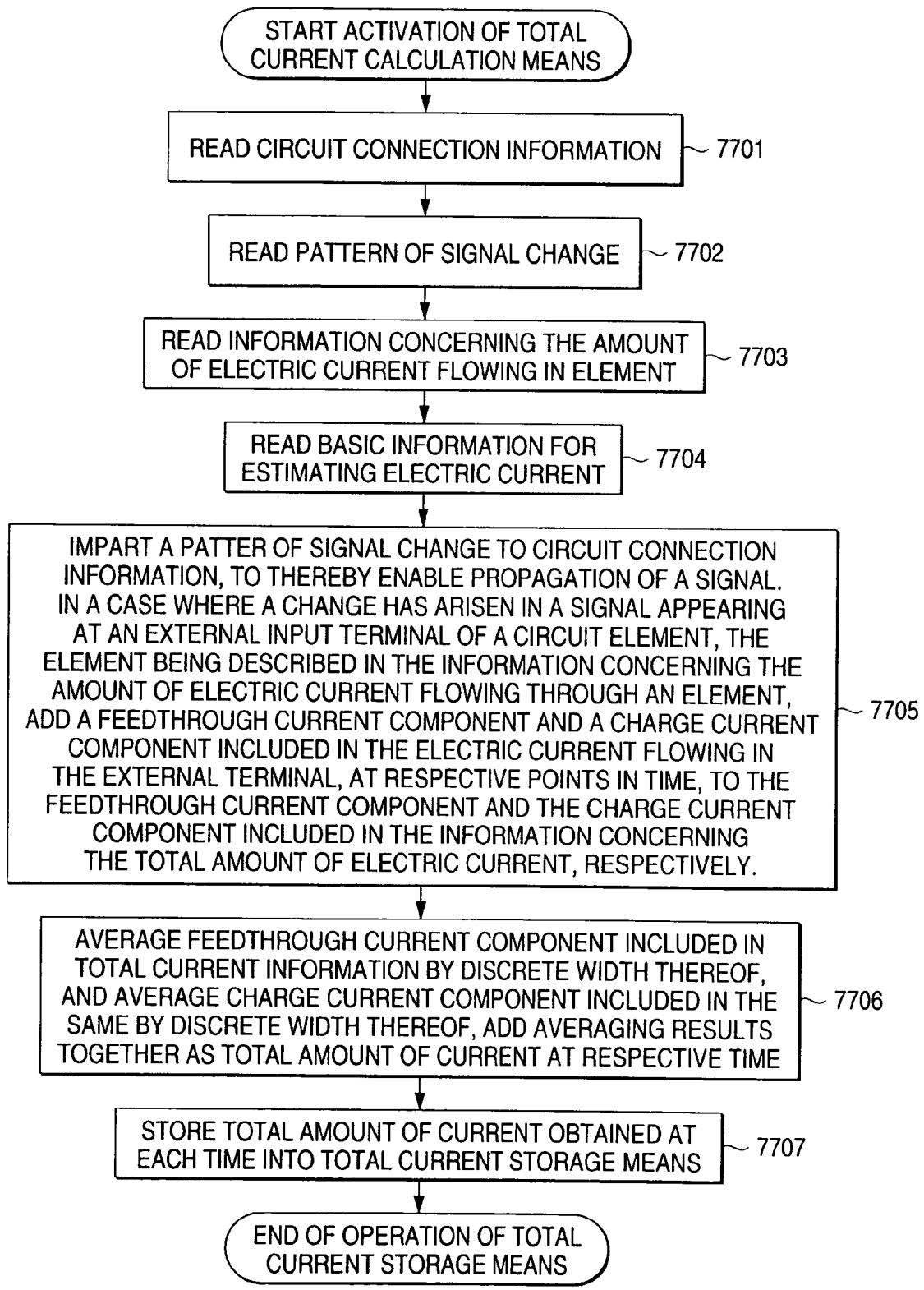
FIG. 60 is a flowchart showing processing operations of the total current calculation means according to the thirteenth embodiment.

The total-amount-of-current calculation means 7305 operates according to a flowchart such as that shown in FIG. 60. In contrast with the conventional method, the flowchart shown in FIG. 60 of the EMI analysis method of the present embodiment is additionally provided with a processing operation for averaging the calculated short circuit current by means of dividing by the discrete width thereof and averaging the calculated charge current by means of dividing by the discrete width thereof (step 7706). In step 7701, there is read the circuit connection information, which is shown in FIG. 110 and is stored in the circuit-connection information storage means 7301. In step 7702, there is read the pattern of a change in a signal, the pattern being stored in the pattern-of-signal-change storage means 7302. In step 7703, there is read information concerning the amount of electric current flowing through an element, the information being stored in the element-current storage means 7303 and shown in FIG. 57.

Figure 59:
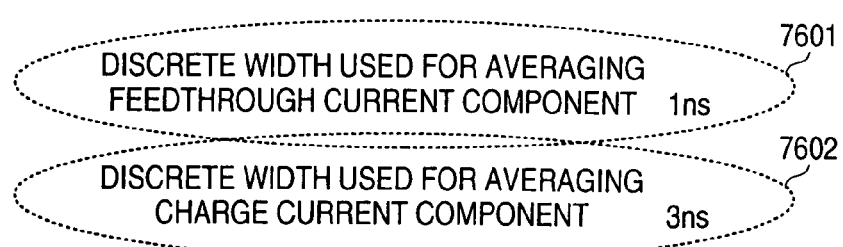
FIG. 59 is a graph showing example data stored in element current storage means according to the thirteenth embodiment.

In step 7704, there is read the information concerning estimation of a current, the information being stored in the basic-information-for-estimating-current storage means 7306 and shown in FIG. 59. In step 7705, the pattern of a change in a signal shown in FIG. 111 is imparted to the circuit connection information shown in FIG. 110, to thereby enable propagation of a signal. In a case where a change arises in a signal appearing at an external terminal of a circuit element, the element being described in the information concerning the amount of electric current flowing through an element, a short circuit current component and a charge current component included in the electric current flowing through the external terminal are added, at respective points in time, to the short circuit current component and the charge current component included in the information concerning the total amount of electric current (simply called as "total current information"), respectively.

Figure 58:
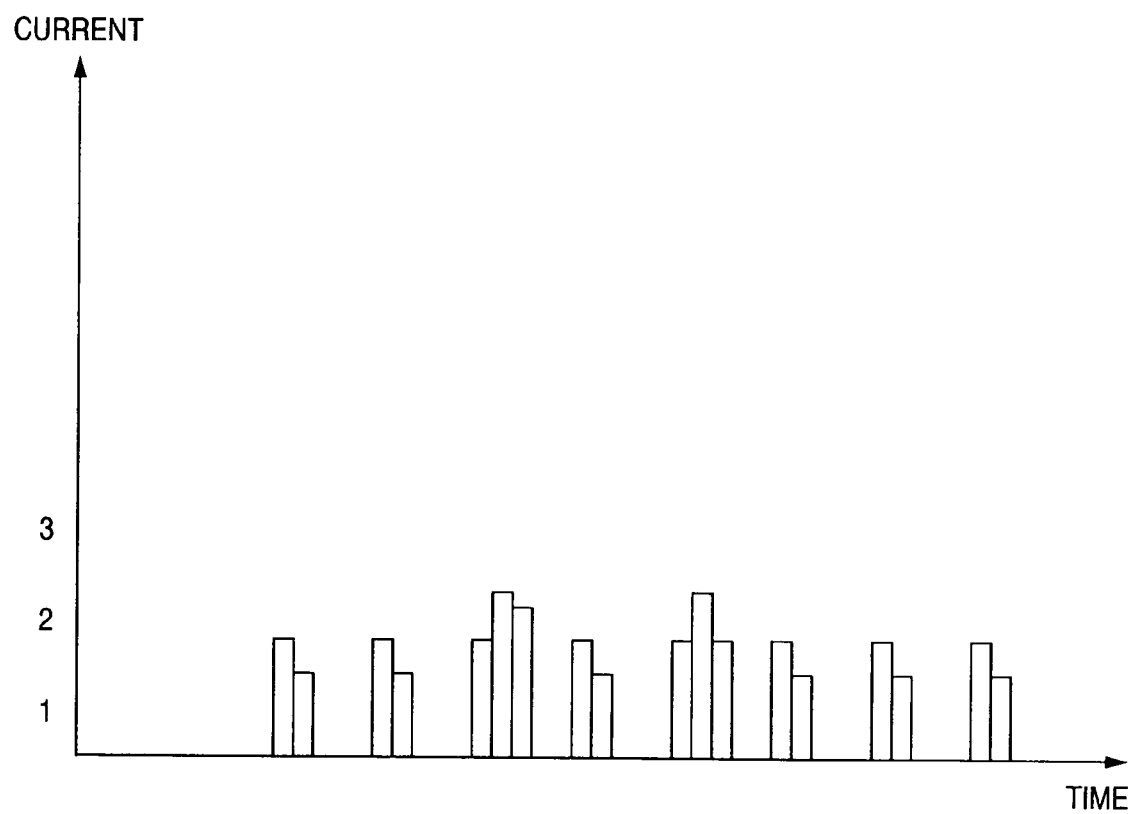
FIG. 58 is a graph showing example data stored in total current storage means according to the thirteenth embodiment.

In step 7706, the result of an electric current being averaged by means of dividing by the discrete width stored in the information concerning estimation of a current shown in FIG. 59 is added to the short circuit current component included in the total current information. The result of an electric current being averaged by means of dividing by the discrete width stored in the information concerning estimation of a current shown in FIG. 59 is added to the charge current component included in the total current information. In step 7707, after propagation of a signal, information concerning the total amount of electric current calculated at each points in time shown in FIG. 58 is stored in the total-amount-of-current storage means 7304. As a result, there is obtained a current waveform, such as that shown in FIG. 58, which is more realistic than the current waveform obtained by the conventional method shown in FIG. 14.

Fourteenth Embodiment

An EMI analysis method according to a fourteenth embodiment of the present invention will now be described. The present embodiment describes an EMI analysis method comprising the steps of:

characterizing a peak current of a cell according to the type of cell and the amount of instantaneously-changing current of each event, to thereby calculate an instantaneously-changing current of each cell from event information, the information being output from a logic simulator;

modeling the instantaneously-changing current as a rectangular waveform whose width is calculated such that a peak value corresponds to the peak current of the rectangular waveform and such that the instantaneously-changing current becomes equal to the area of the rectangular waveform, to thereby calculate a more realistic change in an electric current; and subjecting the result of calculation of a current waveform to FFT processing, to thereby determine the frequency characteristic of an EMI component arising in a circuit of interest.

FIG. 15 shows an instantaneously changing current and a modeled rectangular waveform according to the present embodiment. Here, "i" denotes an instantaneously-changing current, and "t" denotes a current processing time.

The overall flow of processing of the EMI analysis method according to the present embodiment is represented by the same block diagram as that employed in the first embodiment (see FIG. 1).

Figure 61:
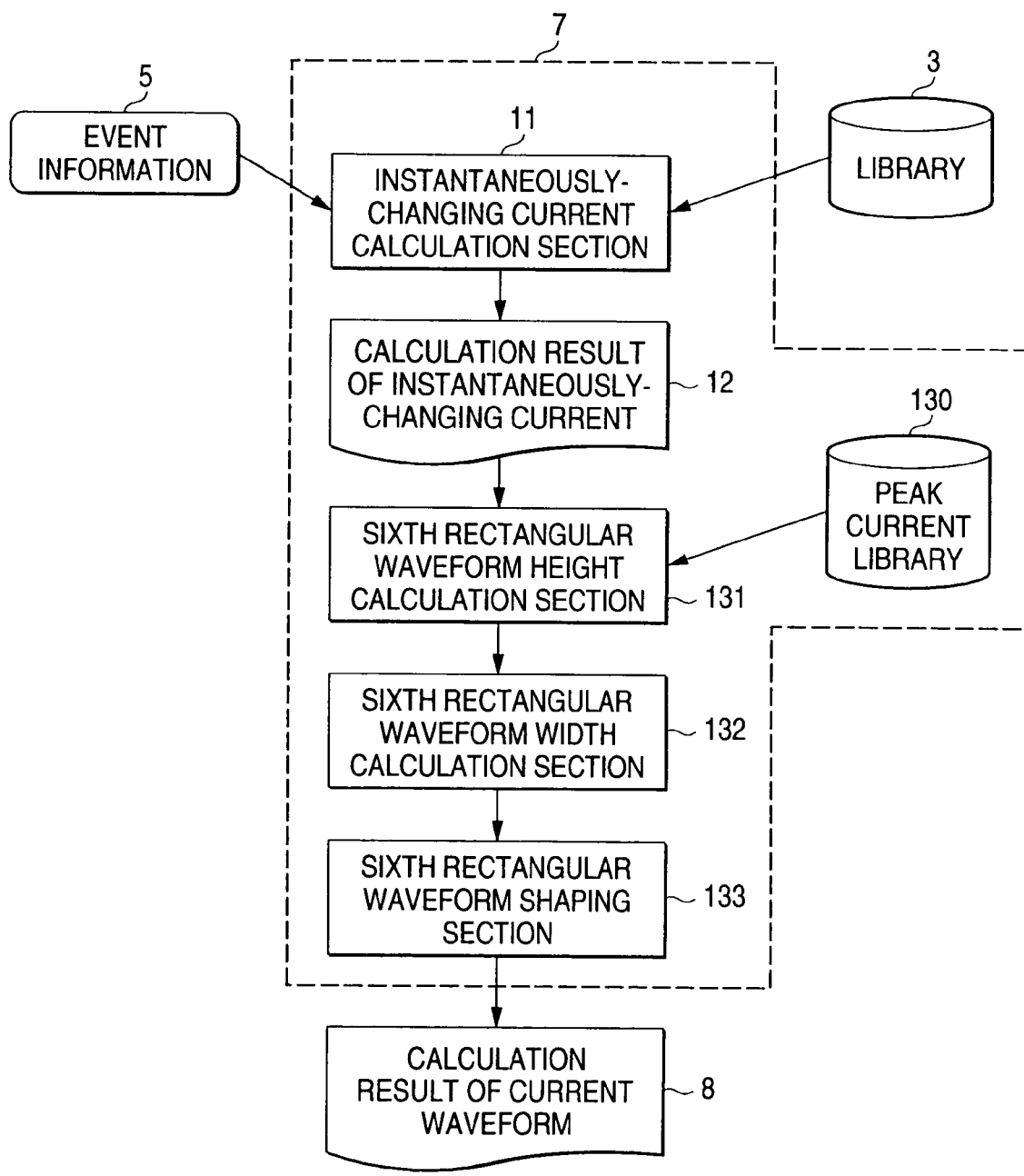
FIG. 61 is a block diagram showing a current waveform calculation section (according to a fourteenth embodiment of the present invention)

FIG. 61 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment.

Reference numeral 130 denotes a peak current library. A peak current of each cell is characterized according to the type of cell, and the thus-characterized value is stored in the peak current library 130. Reference numeral 131 designates a sixth rectangular waveform height calculation section for extracting, from the peak current library 130, a peak value of a rectangular waveform serving as a model. Reference numeral 132 designates a sixth rectangular waveform width calculation section for calculating the width of a rectangular waveform, from the peak value extracted by the sixth rectangular waveform height calculation section 131 and the instantaneously-changing current value, such that the instantaneously-changing current becomes equal to the area of the rectangular waveform. Reference numeral 133 denotes a sixth rectangular waveform-shaping section for modeling the instantaneously-changing current calculation result 12 as a rectangular waveform, the height of the rectangular waveform corresponding to the peak value extracted by the sixth rectangular waveform height calculation section 131, and the width of the rectangular waveform corresponding to the width calculated by the sixth rectangular waveform width calculation section 132.

Figure 62:
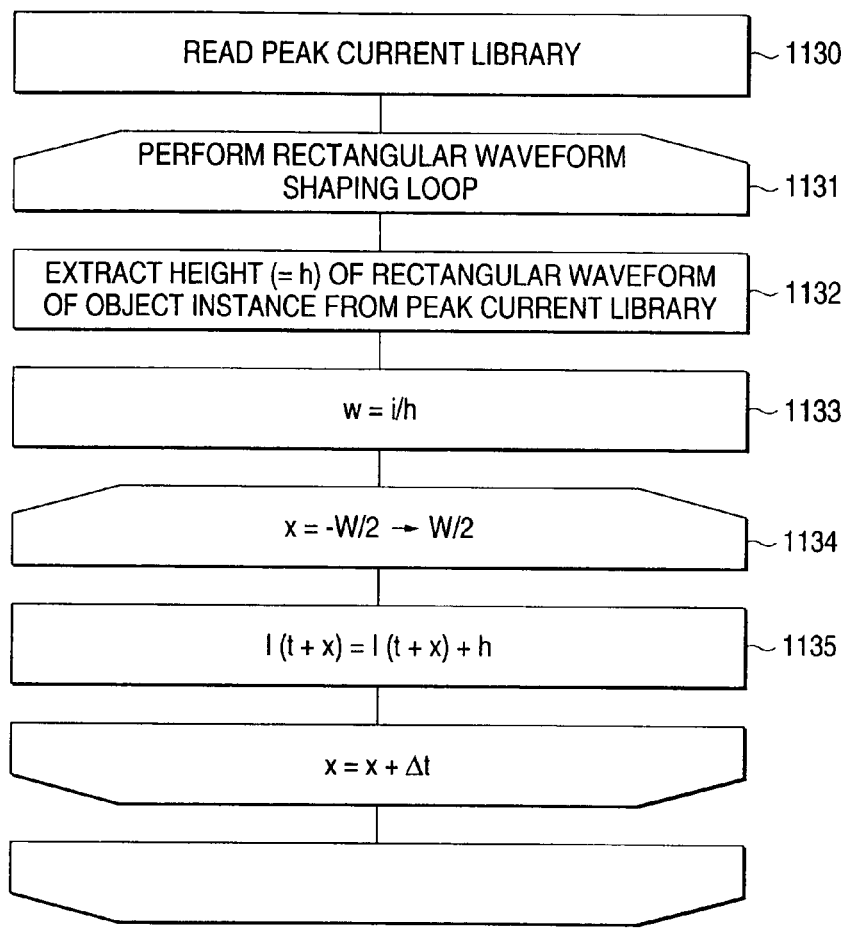
FIG. 62 is a flowchart of a sixth rectangular waveform-shaping operation.

FIG. 62 shows the flowchart of processing pertaining to the sixth rectangular waveform-shaping section 133, including processing pertaining to the sixth rectangular waveform height calculation section 131 and processing pertaining to the sixth rectangular waveform width calculation section 132. First, the peak current library 130 is read (step 1130). The following processing is iterated on a per-event basis until calculation of a current waveform is completed (step 1130). A peak current of an instance which is an object of EMI analysis is extracted from the peak current library 130, and the peak current is taken as the height "h" of a rectangular waveform (step 1132). This processing corresponds to processing pertaining to the sixth rectangular waveform height calculation section 131.

The area of the rectangular waveform is defined by "w×h." The width "w" of a rectangular waveform is calculated on the basis of "w=i/h" (step 1133). Reference symbol "i" denotes an instantaneously-changing current of a cell of an instance, the instance being an object of EMI analysis. Reference symbol "h" denotes the height "h" of a rectangular waveform calculated through processing pertaining to the sixth rectangular waveform height calculation section 131. This processing corresponds to processing pertaining to the sixth rectangular wave form width calculation section 132. Next, "h" is added to I(t+x) until a variable "x" changes from −W/2 to W/2, and Δt is added to "x" (steps 1134 and 1135). I(t+x) corresponds to total electric current flowing through all the cells at time t+x. This processing corresponds to processing pertaining to the sixth rectangular waveform-shaping section 133.

The current wave calculation result 8 can be obtained by means of the flow of a rectangular waveform height calculation operation, a rectangular waveform width calculation operation, and a rectangular waveform-shaping operation. The FFT processing section 9 subjects the current waveform calculation result 8 to an FFT operation, to thereby determine the frequency characteristic of an EMI component. As a result, there can be obtained an EMI analysis result 10.

Fifteenth Embodiment

An EMI analysis method according to a fifteenth embodiment of the present invention will now be described. The present embodiment describes an EMI analysis method comprising the steps of:

characterizing the relationship between a slew in a waveform input to each cell and a peak current of the cell, according to the type of cell, and the amount of instantaneously-changing current for each event, to thereby calculate an instantaneously-changing current of each cell from event information concerning each cell, the information being output from a logic simulator;

modeling the instantaneously-changing current as a rectangular waveform whose width is calculated such that a peak current taking into consideration a slew in the waveform input to the cell corresponds to a peak current of the waveform and such that the instantaneously-changing current becomes equal to the area of the rectangular waveform, to thereby calculate a more realistic change in an electric current; and subjecting the result of calculation of a current waveform to FFT processing, to thereby determine the frequency characteristic of an EMI component arising in a circuit of interest.

FIG. 15 shows an instantaneously changing current and a modeled rectangular waveform according to the present embodiment. Here, "i" denotes an instantaneously-changing current, and "t" denotes a current processing time. Further, "h" denotes the height of a rectangular waveform. The height "h" of a rectangular waveform is calculated from a library which characterizes the relationship between a slew in the waveform input to each cell and the height of a rectangular waveform. Reference symbol "w" denotes the width of a rectangular waveform, and the width "w" of a rectangular waveform is calculated from the height "h" calculated previously and the instantaneously-changing current "i." The library characterizing the relationship between a slew in an input waveform and the height of a rectangular waveform is prepared according to the type of cell in the form of an s-h table.

Figure 63:
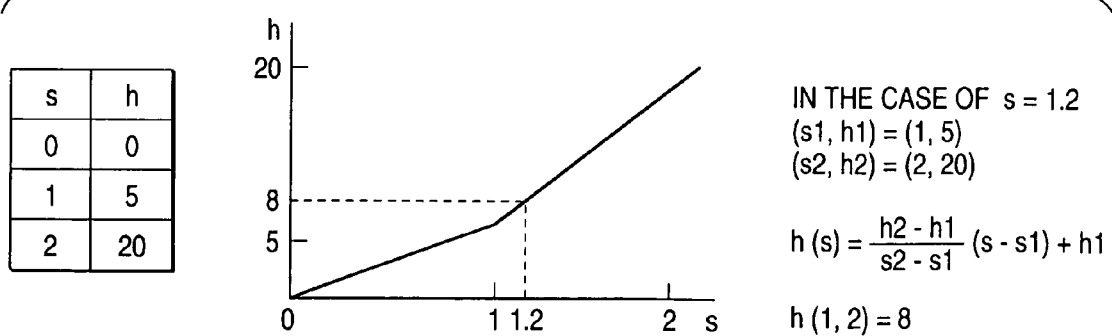
FIG. 63 shows an s-h table.

FIG. 63 shows an example s-h table and a graph plotting the table. Here, "s" denotes a slew in a waveform input to an instance which is an object of EMI analysis. The table shows the value of "h" at each of certain points "s." The table indicates that "h" assumes a value of 0 at s=0, a value of 5 at s=1, and a value of 20 at s=2. In reality, the value of "s" changes continuously, and hence the table is expressed as a graph plotting points provided in the table. The value of "h" [i.e., h(s)] at a certain value of "s" is expressed by Eq. 12 provided below, through linear interpolation of the values of two points closest to "s" provided in the s-h table: one point has lower values (s1, h1), and the other point has higher values (s2, h2).

$$h(s) = \frac{h2 - h1}{s2 - s1}(s - s1) + h1 \qquad (12)$$

The overall flow of processing pertaining to the EMI analysis method of the present embodiment is represented by the same block diagram as that employed in the first embodiment (see FIG. 1).

Figure 64:
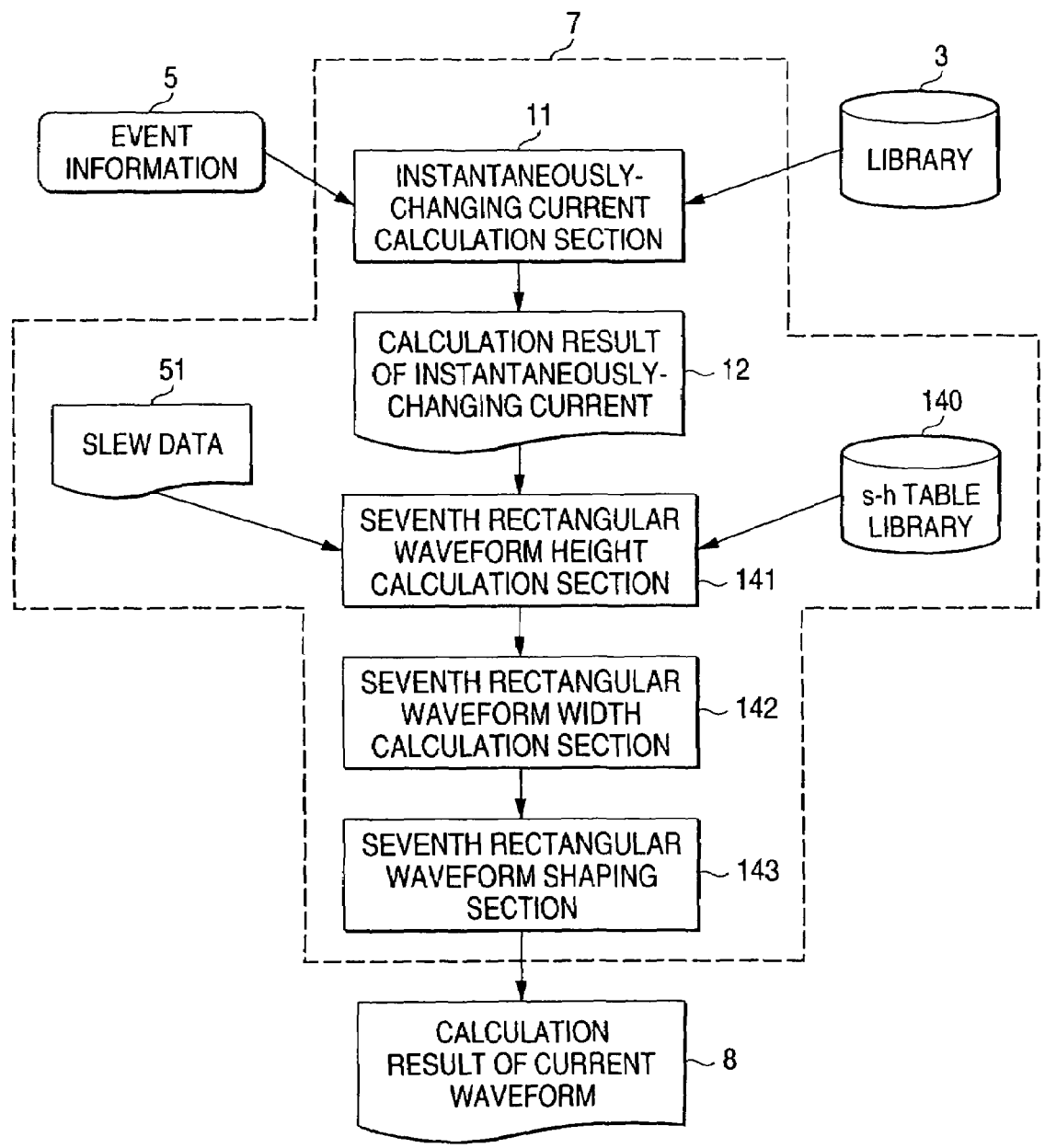
FIG. 64 is a block diagram showing a current waveform calculation section (according to a fifteenth embodiment of the present invention)

FIG. 64 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment.

In the present embodiment, an s-h table library 140 characterizes the relationship between a slew in a waveform input to each cell and the height of a rectangular waveform (see FIG. 63). Reference numeral 51 designates Slew data describing a slew in a waveform input to each instance. Reference numeral 141 designates a seventh rectangular waveform height calculation section for extracting a slew in a waveform input to each instance, the instance being an object of EMI analysis, from the Slew data 51, and calculating a peak value of a rectangular waveform serving as a model, from the s-h table library 140 and the thus-extracted slew. Reference numeral 142 designates a seventh rectangular waveform width calculation section for calculating the width of a rectangular waveform from the peak value calculated by the seventh rectangular waveform height calculation section 141 and from the instantaneously-changing current, such that the area of the rectangular waveform becomes equal to the instantaneously-changing electric current. A seventh rectangular waveform-shaping section 143 models the instantaneously-changing current calculation result 12 as a rectangular waveform, the height of the rectangular waveform corresponding to the peak value of the rectangular waveform calculated by the seventh rectangular waveform height calculation section 141, and the width of the rectangular waveform corresponding to the width calculated by the seventh rectangular waveform width calculation section 142.

Figure 65:
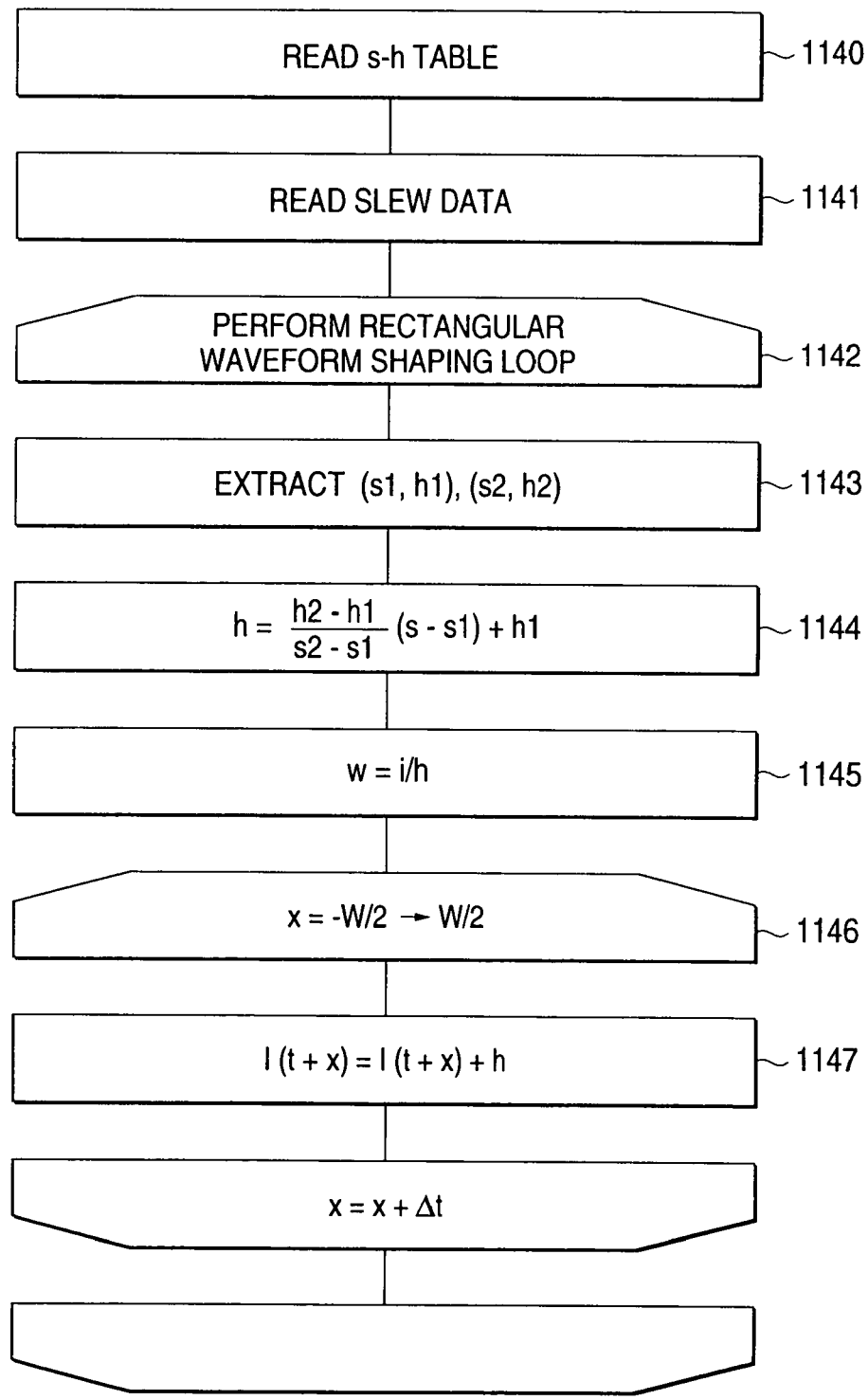
FIG. 65 is a flowchart of a seventh rectangular waveform-shaping operation.

FIG. 65 is a flowchart showing processing pertaining to the seventh rectangular waveform-shaping section 143, including processing pertaining to the seventh rectangular waveform height calculation section 141 and processing pertaining to the seventh rectangular waveform width calculation section 142. First, the s-h table library 140 is read (step 1140). The Slew data 51 are read (step 1141). Next, the subsequent processing operations are iterated on a per-event basis until the current waveform calculation operation is completed (step 1142). Two points closest to "s"; (s1, h1) and (s2, h2), are extracted from the s-h library table 140. Reference symbol "s" denotes a slew in an input waveform, the slew being extracted from the Slew data 51 concerning an instance which is an object of EMI analysis.

In connection with the table shown in FIG. 63, in the case where s=1.2, the two points closest to s=1.2 are (s1, h1)=(1, 5) and (s2, h2)=(2, 20) (step 1143). The height "h" of a rectangular waveform is calculated according to Eq. 1 (step 1144). In the table shown in FIG. 63, in the case where s=1.2, h(1.2)=8. This processing; i.e., processing pertaining to steps 1143 and 1144, corresponds to processing pertaining to the seventh rectangular waveform height calculation section 141.

The area of a rectangular waveform is defined as "w×h." The width "w" of a rectangular waveform is calculated from w=i/h (step 1145). Reference symbol "i" denotes the value of an instantaneously-changing current of a cell of an event, the event being an object of EMI analysis. Reference symbol "h" denotes the height of a rectangular waveform calculated by the seventh rectangular waveform height calculation section 141. This processing corresponds to processing pertaining to the seventh rectangular waveform width calculation section 142. Next, "h" is added to I(t+x) until variable "x" changes from −W/2 to W/2, and Δt is added to variable "x" (steps 1146 and 1147). I(t+x) denotes total electric current flowing through all the cells at time "t+x." This processing corresponds to processing pertaining to the seventh rectangular waveform-shaping section 143.

The current wave calculation result 8 can be obtained by means of the flow of a rectangular waveform height calculation operation, a rectangular waveform width calculation operation, and a rectangular waveform-shaping operation. The FFT processing section 9 subjects the current waveform calculation result 8 to an FFT operation, to thereby determine the frequency characteristic of an EMI component. As a result, there can be obtained an EMI analysis result 10.

Sixteenth Embodiment

An EMI analysis method according to a sixteenth embodiment of the present invention will now be described. The present embodiment describes an EMI analysis method comprising the steps of:

characterizing the relationship between an output load capacitance of each cell and a peak current of the cell, according to the type of cell, and the amount of instantaneously-changing current for each event, to thereby calculate an instantaneously-changing current of each cell from event information concerning each cell, the information being output from a logic simulator;

modeling the instantaneously-changing current as a rectangular waveform whose width is calculated such that a peak current taking into consideration of the output load capacitance of the cell corresponds to a peak current of the waveform and such that the instantaneously-changing current becomes equal to the area of the rectangular waveform, to thereby calculate a more realistic change in an electric current; and subjecting the result of calculation of a current waveform to FFT processing, to thereby determine the frequency characteristic of an EMI component arising in a circuit of interest.

FIG. 15 shows an instantaneously changing current and a modeled rectangular waveform according to the present embodiment. Here, "i" denotes an instantaneously-changing current, and "t" denotes a current processing time. Further, "h" denotes the height of a rectangular waveform. The height "h" of a rectangular waveform is calculated from a library which characterizes the relationship between the output load capacitance of each cell and the height of a rectangular waveform. Reference symbol "w" denotes the width of a rectangular waveform, and the width "w" of a rectangular waveform is calculated from the height "h" calculated previously and the instantaneously-changing current "i." The library characterizing the relationship between the output load capacitance and the height of a rectangular waveform is prepared according to the type of cell in the form of a c-h table.

Figure 66:
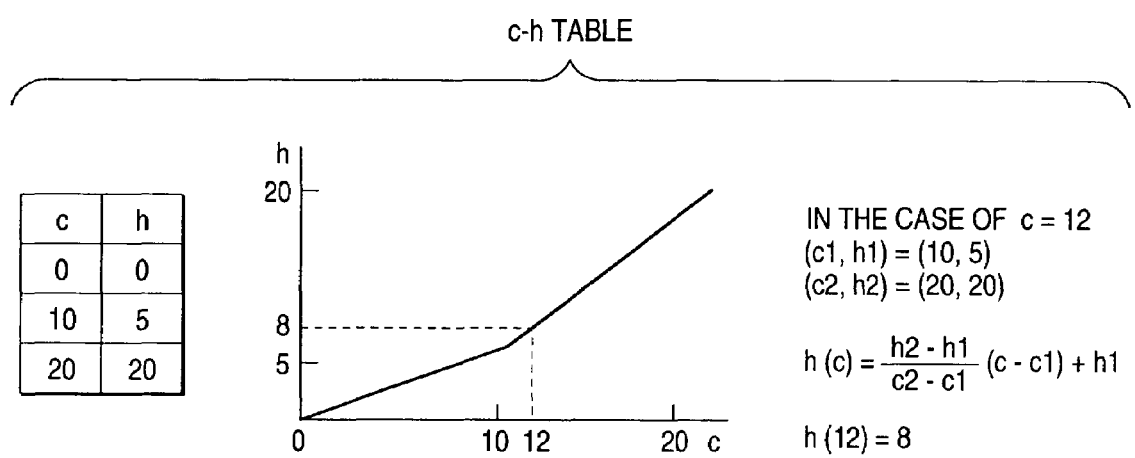
FIG. 66 shows a c-h table.

FIG. 66 shows an example c-h table and a graph plotting the table. Here, "s" denotes an output load capacitance of an instance which is an object of EMI analysis. The table shows the value of "h" at each of certain points "c." The table indicates that "h" assumes a value of 0 at c=0, a value of 5 at c=10, and a value of 20 at c=20. In reality, the value of "c" changes continuously, and hence the table is expressed as a graph plotting points provided in the table. The value of "h" [i.e., h(c)] at a certain value of "c" is expressed by Eq.13 provided below, through linear interpolation of the values of two points closest to "c" provided in the s-h table: one point has lower values (c1, h1), and the other point has higher values (c2, h2).

$$h(c) = \frac{h2 - h1}{c2 - c1}(c - c1) + h1 \qquad (13)$$

The overall flow of processing pertaining to the EMI analysis method of the present embodiment is represented by the same block diagram as that employed in the first embodiment (see FIG. 1).

Figure 67:
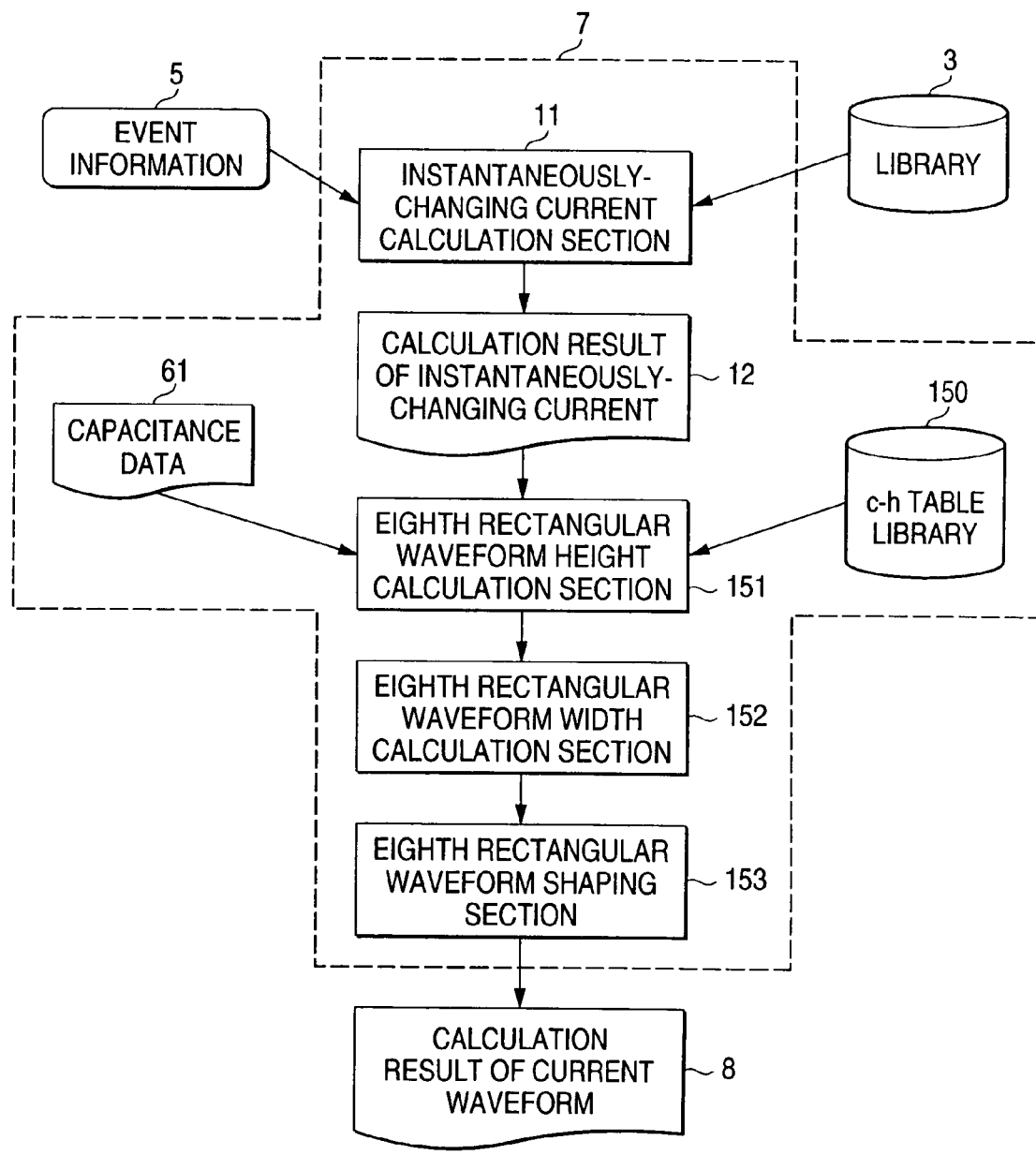
FIG. 67 is a block diagram showing a current waveform calculation section (according to a sixteenth embodiment of the present invention)

FIG. 67 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11.

FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment. Reference numeral 150 designates a table library. The c-h table library 150 is made up of a c-h table library (see FIG. 66) characterizing the relationship between the previously-described output load capacitance of each cell and the height of a rectangular waveform. Reference numeral 61 designates capacitance data describing an output load capacitance of each instance. Reference numeral 15; designates an eighth rectangular waveform height calculation section for extracting an output load capacitance of an instance, the instance being an object of EMI analysis, from the capacitance data 61 and calculating a peak value of a rectangular waveform serving as a model, from the c-h table library 150 and the thus-extracted output load capacitance. Reference numeral 152 designates an eighth rectangular waveform width calculation section for calculating the width of a rectangular waveform from the peak value calculated by the eighth rectangular waveform height calculation section 151 and from the instantaneously-changing current, such that the area of the rectangular waveform becomes equal to the instantaneously-changing electric current. An eighth rectangular waveform-shaping section 153 models the instantaneously-changing current calculation result 12 as a rectangular waveform, the height of the rectangular waveform corresponding to the peak value of the rectangular waveform calculated by the eighth rectangular waveform height calculation section 151, and the width of the rectangular waveform corresponding to the width calculated by the eighth rectangular waveform width calculation section 152.

Figure 68:
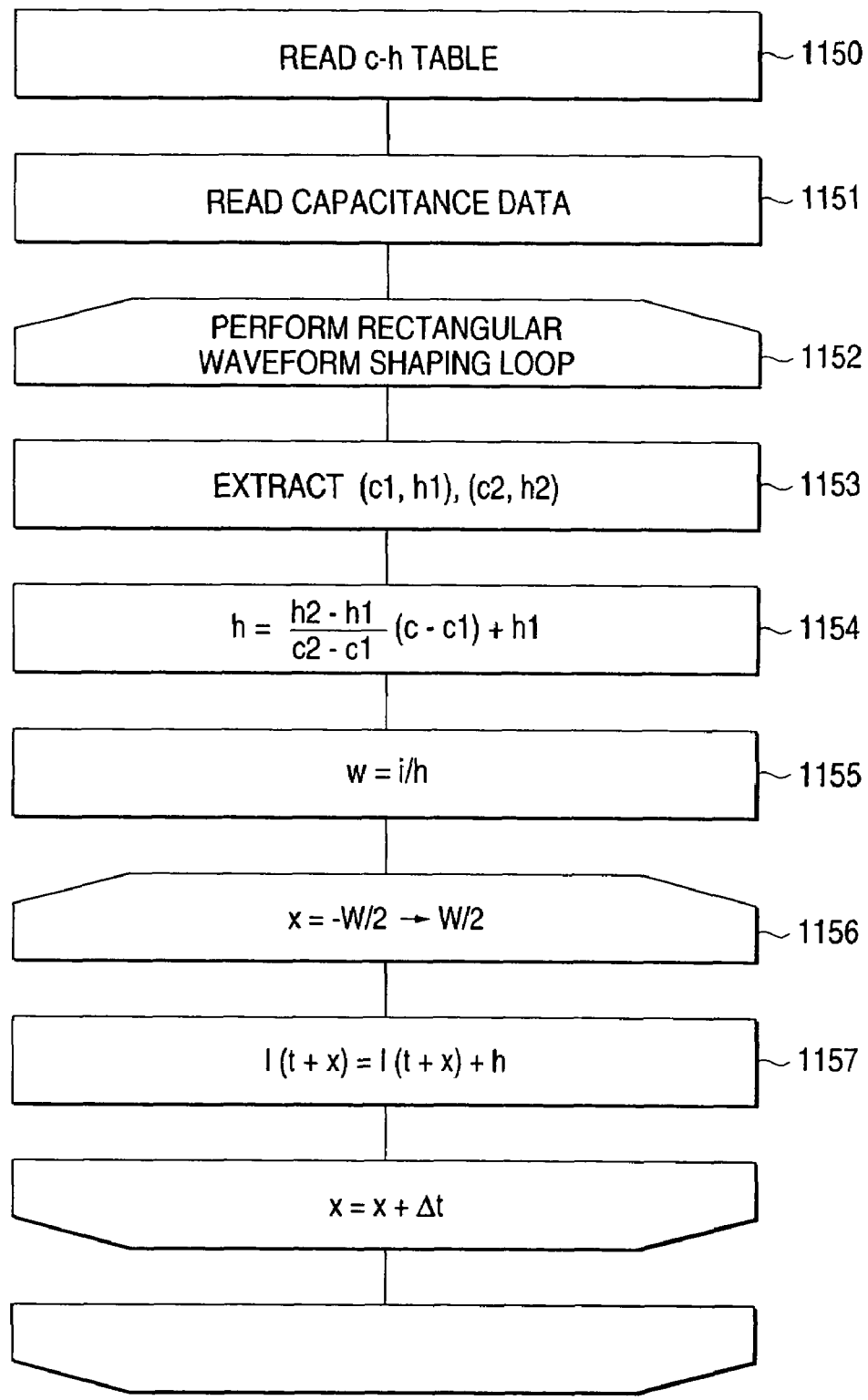
FIG. 68 is a flowchart of an eighth rectangular waveform-shaping operation.

FIG. 68 is a flowchart showing processing pertaining to the eighth rectangular waveform-shaping section 153, including processing pertaining to the eighth rectangular waveform height calculation section 151 and processing pertaining to the eighth rectangular waveform width calculation section 152. First, the c-h table library 150 is read (step 1150). The capacitance data 61 are read (step 1151).

Next, the subsequent processing operations are iterated on a per-event basis until the current waveform calculation operation is completed (step 1152). Two points closest to "c"; (c1, h1) and (c2, h2), are extracted from the c-h library table 150. Reference symbol "c" denotes a slew in an input waveform, the slew being extracted from the capacitance data 61 concerning an instance which is an object of EMI analysis.

In connection with the table shown in FIG. 66, in the case where c=12, the two points closest to c=12 are (c1, h1)=(1, 5) and (c2, h2)=(20, 20) (step 1153). The height "h" of a rectangular waveform is calculated according to Eq.12 (step 1154). In the table shown in FIG. 66, in the case where c=12, h(12)=8. This processing; i.e. processing pertaining to steps 1153 and 1154, corresponds to processing pertaining to the eighth rectangular waveform height calculation section 151.

This processing corresponds to processing pertaining to the eighth rectangular waveform width calculation section 152. Next, "h" is added to I(t+x) until variable "x" changes from −W/2 to W/2, and Δt is added to variable "x" (steps 1156 and 1157). I(t+x) denotes total electric current flowing through all the cells at time "t+x." This processing corresponds to processing pertaining to the eighth rectangular waveform-shaping section 153.

The current wave calculation result 8 can be obtained by means of the flow of a rectangular waveform height calculation operation, a rectangular waveform width calculation operation, and a rectangular waveform-shaping operation. The FFT processing section 9 subjects the current waveform calculation result 8 to an FFT operation, to thereby determine the frequency characteristic of an EMI component. As a result, there can be obtained an EMI analysis result 10.

Seventeenth Embodiment

An electromagnetic interference (EMI) analysis method according to a seventeenth embodiment of the present invention will now be described. Among operations related to EMI analysis, the present embodiment describes particularly extraction of a characteristic of EMI and calculation of the amount of an electric current, in the case where a circuit element is a composite cell formed by combination of a plurality of logic elements. In a composite cell, an electric current flows every time each of logic elements constituting the circuit element is activated. A logic element provided in a circuit element is activated with a time lag unique to the logic element.

Figure 69:
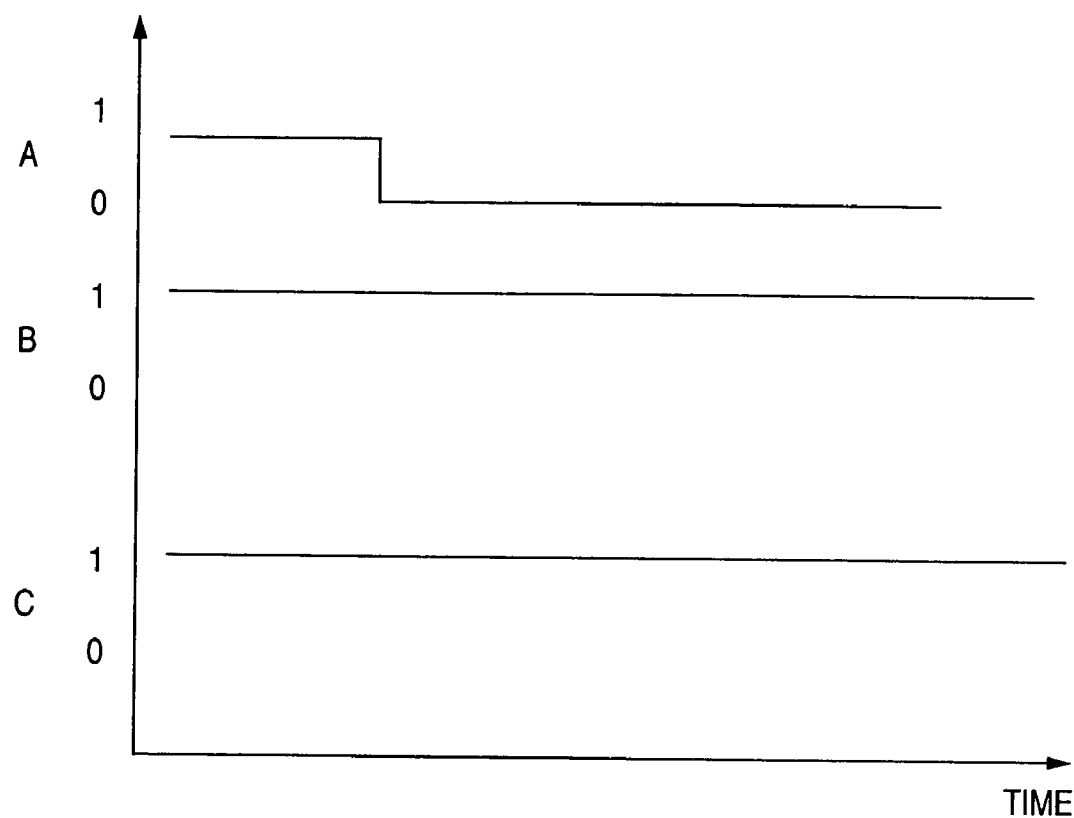
FIG. 69 is a graph showing example data stored in a pattern-of-signal-change storage means according to the seventeenth embodiment of the present invention.
Figure 70:
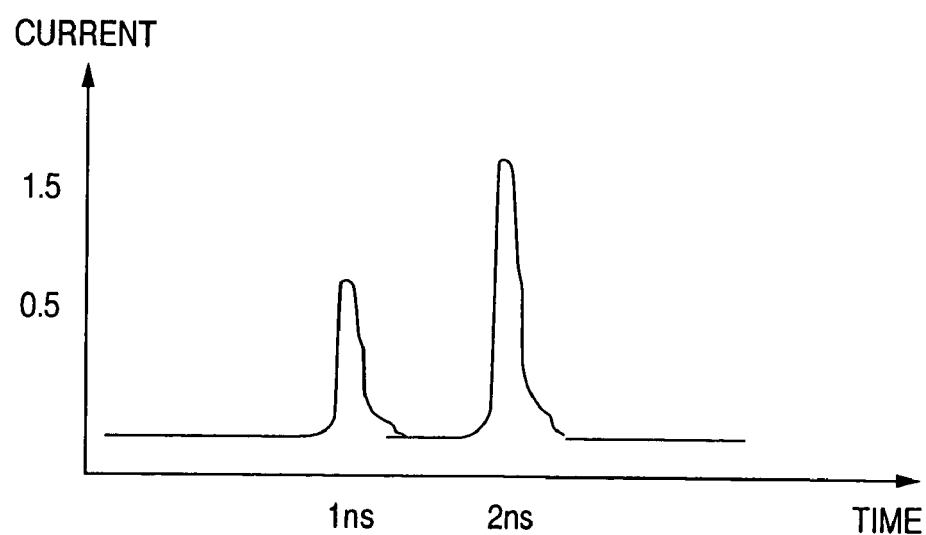
FIG. 70 is a graph showing an example current waveform arising in a real circuit according to the seventeenth embodiment.
Figure 108:
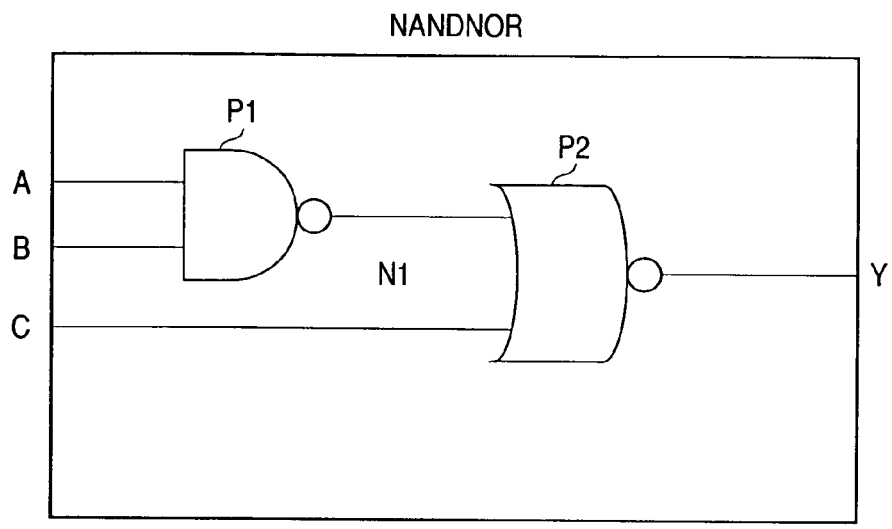
FIG. 108 is a diagram showing example data concerning internal connections stored in the circuit connection information storage means according to the seventeenth embodiment shown in FIG. 73.
Figure 109:
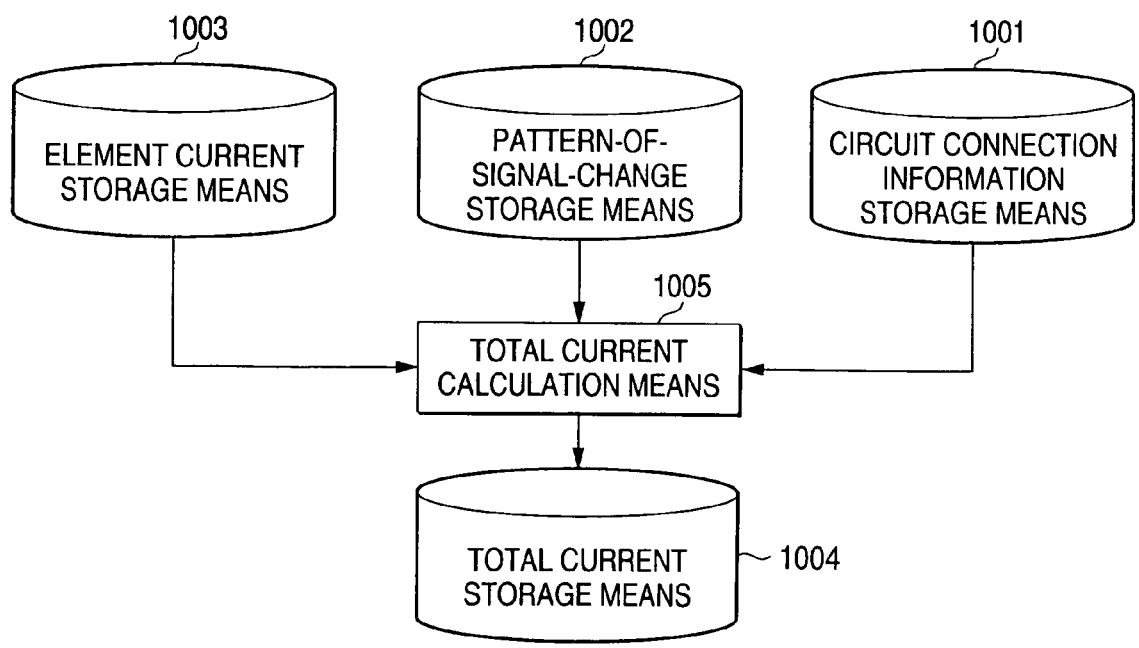
FIG. 109 is ab lock diagram showing the configuration of a system for effecting an EMI analysis method employed in an example conventional EMI analysis method.
Figure 112:
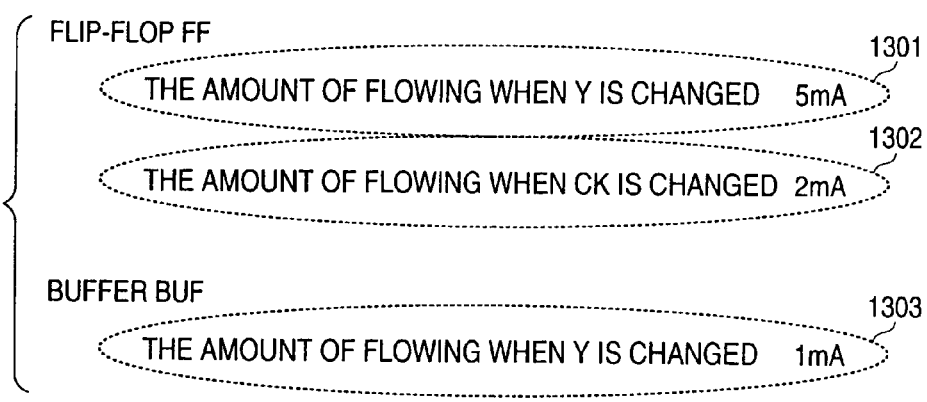
FIG. 112 is a graph showing example data stored in element current storage means employed in an example conventional EMI analysis method.
Figure 113:
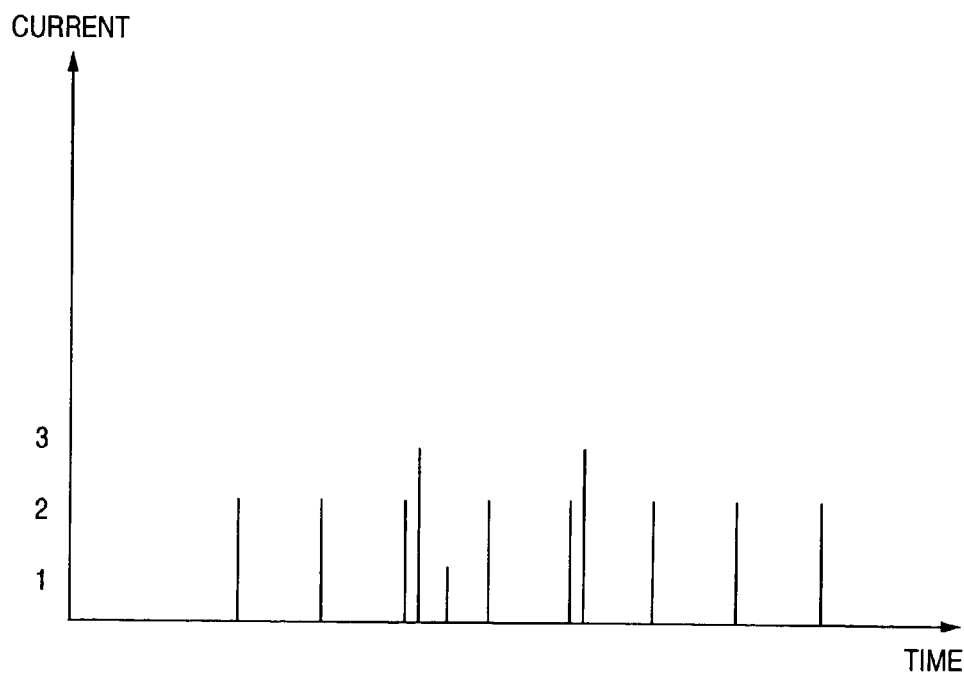
FIG. 113 is a graph showing example data stored in total current storage means employed in an example conventional EMI analysis method.

Specifically, when a change arises in an input to a circuit element, an electric current flows many times within the circuit element. In a circuit element including logic elements in combination as shown in FIG. 108, 1N1 is changed with a lag of a gate P1 provided in a cell (provided that the lag is ins) from the time changes have arisen in terminals A and B. Further, Y is changed with a lag of a gate P2 provided in the cell (provided that the lag is ins) from the time a change has arisen in 1N1. In a case where a pattern of signal change shown in FIG. 69 is imparted to the circuit element (cell), there arises a current waveform such as that shown in FIG. 70.

Figure 71:
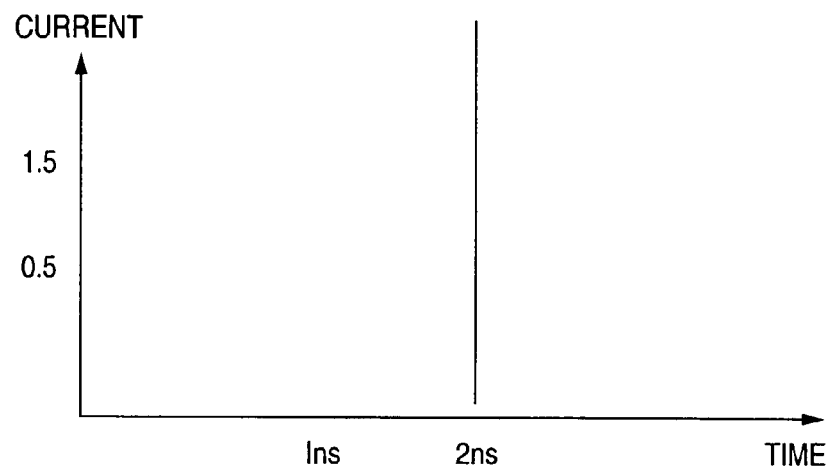
FIG. 71 is a graph showing example data stored in conventional total current storage means according to the thirteenth embodiment.

According to the conventional gate-level EMI analysis method, the total amount of electric current flowing through each circuit element is considered to be dissipated with an involved time lag until a signal appears at an output pin of the circuit element. For instance, in a case where a pattern of signal change shown in FIG. 69 is imparted to a circuit shown in FIG. 73, the circuit employing a circuit element shown in FIG. 108, there is output current information such as that shown in FIG. 71. In contrast, according to the EMI analysis method of the present embodiment, an electric current, which would arise when a change occurs in a signal appearing at an input pin of a composite cell serving as an object, is registered in a library, through use of a peak value of the electric current and a time lag based on a change in an input signal. A logic simulator estimates an electric current, on the basis of the assumption that a peak value of an electric current includes the previously-described time lag in accordance with a change in a signal appearing at an input pin of a composite cell.

Figure 72:
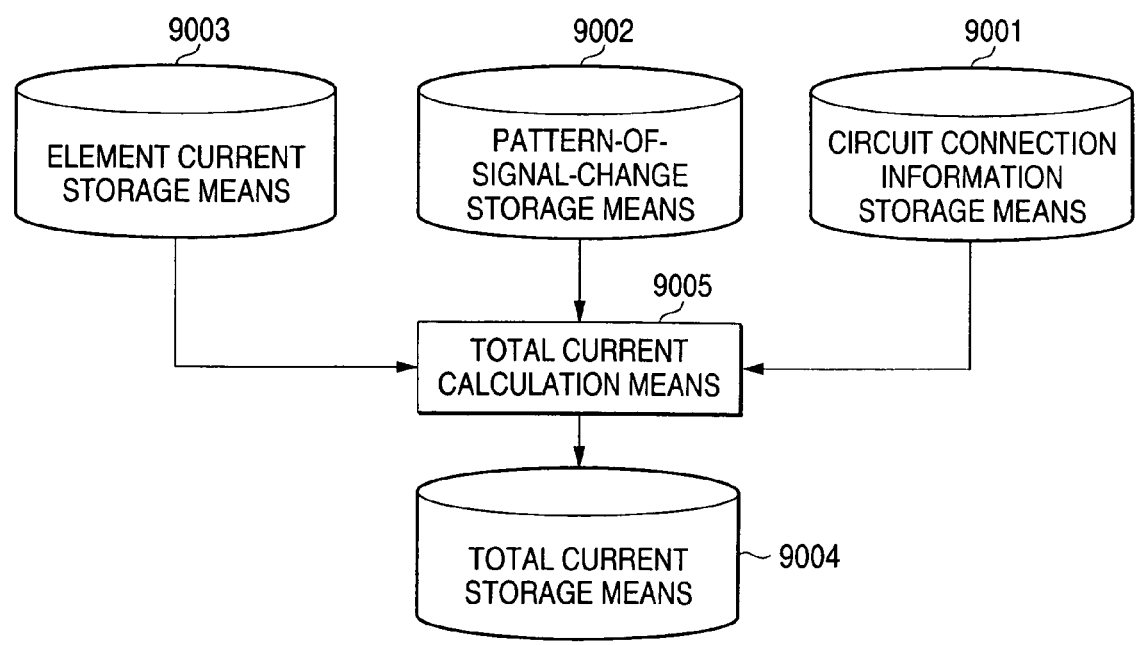
FIG. 72 is a block diagram showing the configuration of a system for effecting a gate-level EMI analysis method according to the seventeenth embodiment and an eighteenth embodiment of the present invention.

FIG. 72 shows the configuration of an EMI analysis method using the value of a peak current and the amount of electric current.

A system to be used with the EMI analysis method shown in FIG. 72 comprises circuit connection information storage means 9001; pattern-of-signal-change storage means 9002; element current storage means 9003 for storing the amount of electric current flowing in a circuit element; total current storage means 9004 for storing a total amount of electric current flowing through the circuit element; and total current calculation means 9005 for calculating the total amount of electric current flowing through a circuit element.

Next will be described individual elements constituting the EMI analysis method shown in FIG. 72 and procedures for calculating the total amount of electric current shown in FIG. 74, from the circuit connection information shown in FIG. 73, the pattern of signal change shown in FIG. 69, and the amount of electric current flowing through a circuit element shown in FIG. 74.

The circuit connection information storage means 9001 stores information concerning the connection of a circuit to be analyzed, in the same manner as described in connection with the background art. Circuit connection information, such as that shown in FIG. 73, is stored in advance in the circuit connection information storage means 9001. The pattern-of-signal-change storage 9002 stores the pattern of signal change to be applied to the circuit connection information, as in the case of a conventional pattern of signal change described in connection with the background art. As shown in FIG. 69, a pattern of change in a signal input to an input port CK and a pattern of change in a signal input to an input port D, such as those shown in FIG. 73, are stored in the pattern-of-signal-change storage 9002 beforehand.

The element current storage means 9003 stores, for each circuit element and in a form such as that shown in FIG. 75, pins 9301 in which electric current arises in an element after a change has arisen in an external input terminal of each element, time intervals 9302 (i.e., the time which elapses after a change has arisen in an external input terminal), total electric current 9303, and peak values 9304. Reference numeral 9305 designates flow of an electric current in an ANDOR circuit shown in FIG. 108; specifically, a total amount of 1 mA including a peak current of 0.5 mA flows into the circuit element after lapse of 1 ns from when input A has arisen. After lapse of 2 ns from when the input A has changed, a total mount of 3 mA including a peak value of 1.5 mH flows into the circuit element. Reference numeral 9306 designates flow of an electric current in a circuit element shown in FIG. 108; namely, a total amount of 1 mA including a peak current of 0.5 mA flows after lapse of 1 ns from when input B has changed. Further, after lapse of 2 ns from when the input B has changed, an electric current of 3 ma including a peak value of 1.5 ma flows into the circuit. Reference numeral 9307 designates flow of an electric current in a circuit element shown in FIG. 108; specifically, a total amount of 3 mA including a peak value of 1.5 mA flows into the circuit element after lapse of 2 ns from when input C has changed.

Figure 76:
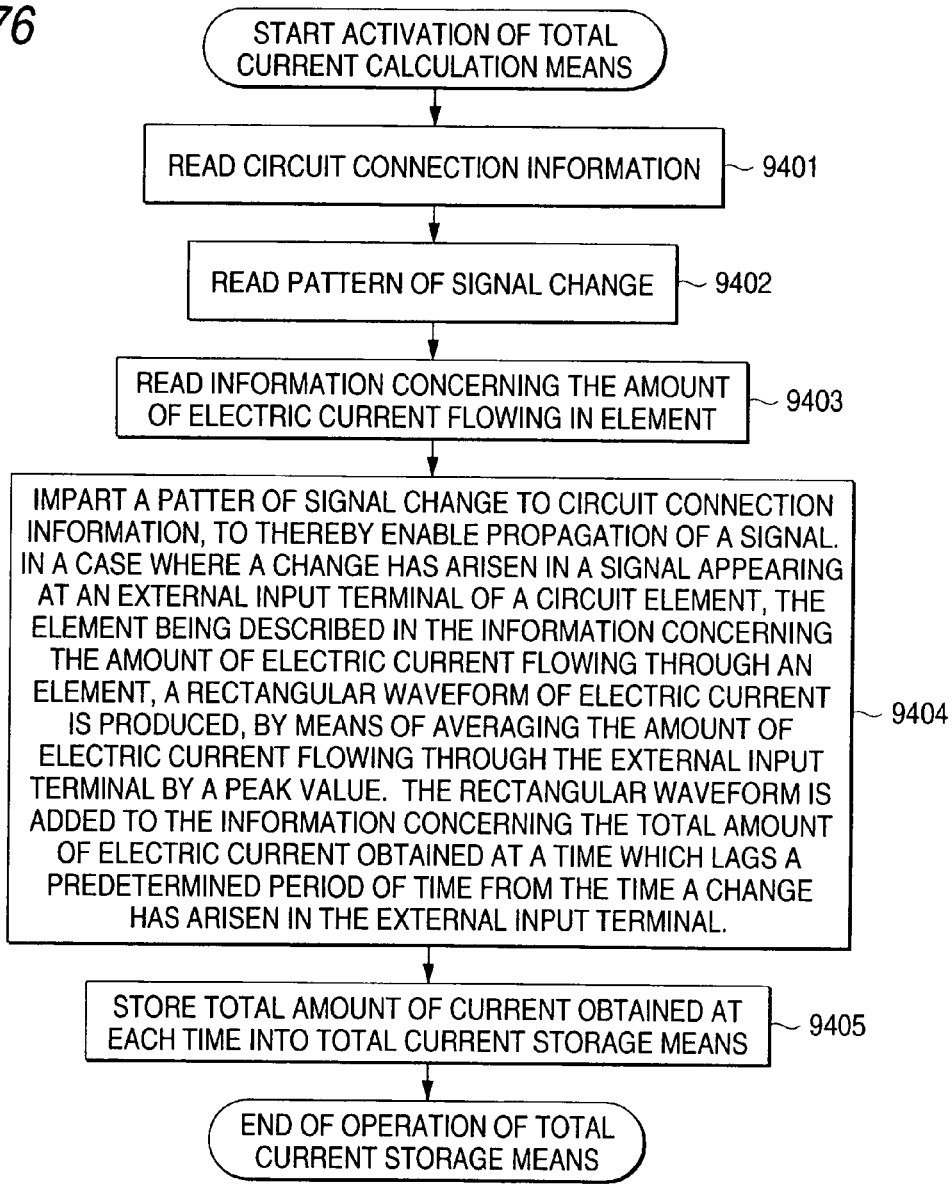
FIG. 76 is a flowchart showing processing operations of the total current calculation means according to the seventeenth embodiment.

The total current calculation means 9005 operates according to a flowchart such as that shown in FIG. 76. According to the flowchart shown in FIG. 76 concerning a method of calculating an electric current, processing pertaining to step 1504 of the conventional method of calculating an electric current is replaced by processing (pertaining to step 9404) in which an electric current is calculated while a rectangular waveform of the electric current is assumed on the basis of the total amount of electric current and a peak value with a time interval provided between information pieces concerning the amount of current of an element, the information having been stored in the element current storage means in association with a change in an input signal. In step 9401 is read circuit connection information shown in FIG. 73 stored in the circuit connection information storage means 9001. In step 9402 is read a pattern of signal change, which is shown in FIG. 69 and is stored in the pattern-of-change-in-signal storage means 9002. In step 9403 is read element current information, which is shown in FIG. 75 and is stored in the element current information storage means 9003.

Figure 73:
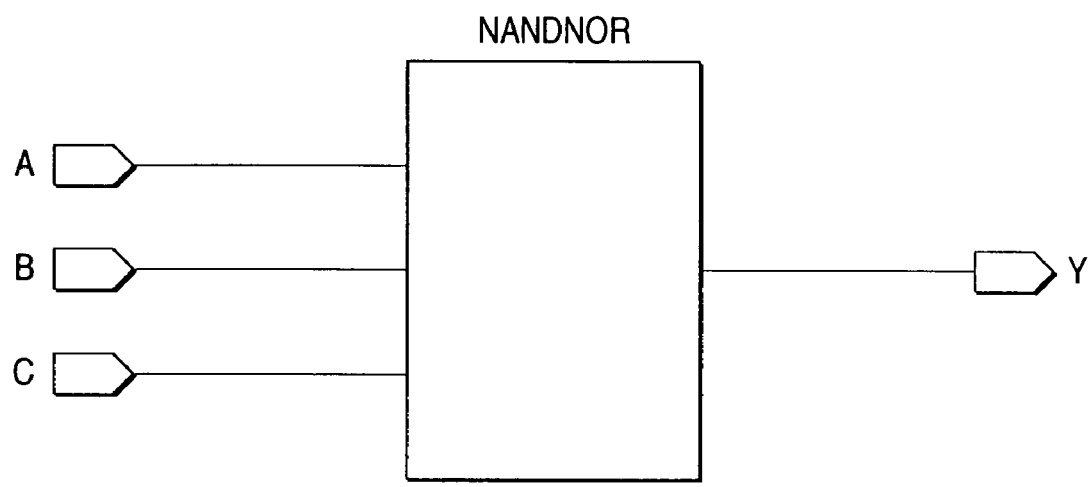
FIG. 73 is an illustration showing example data stored in circuit connection information storage means according to the seventeenth embodiment.
Figure 74:
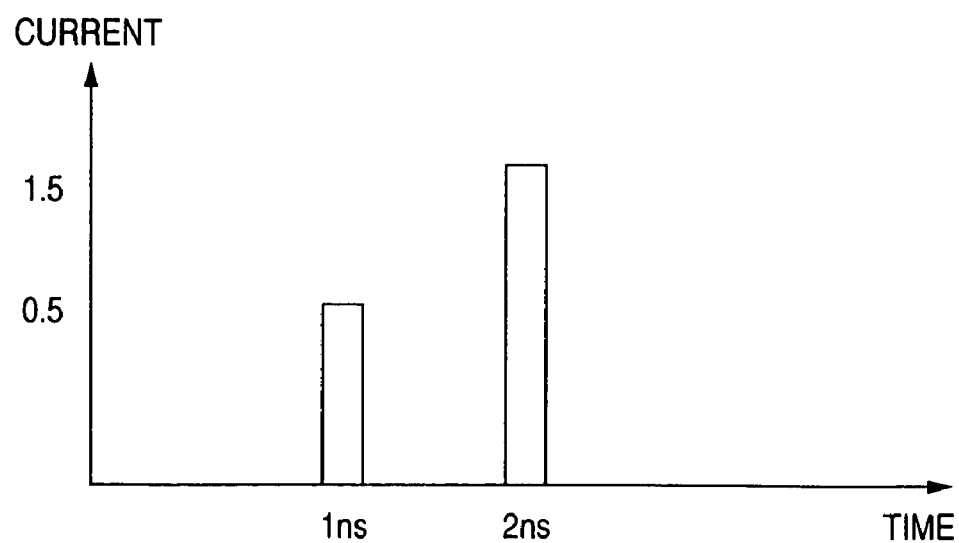
FIG. 74 is a graph showing example data stored in total current storage means according to the seventeenth embodiment.

In step 9404, a pattern of signal change shown in FIG. 69 is imparted to the circuit connection information shown in FIG. 73 in step 9404, thereby enabling propagation of a signal. In a case where a change arises in a signal appearing at an external input terminal of a circuit element, which element is described in the information concerning the amount of electric current flowing an element, a rectangular waveform of an electric current is produced, by means of averaging the amount of electric current flowing through the external input terminal by means of a peak value. The thus-produced rectangular waveform is added to the information concerning the total mount of electric current obtained at a time which lags a predetermined period of time from the time a change has arisen in the external input terminal. After completion of propagation of a signal, in step 9405 the thus-calculated information concerning the total amount of electric current obtained at each time shown in FIG. 74 is stored in the total current storage means 9004. As a result, there is produced a current waveform, such as that shown in FIG. 74, which is more realistic than that which is obtained by the conventional current calculation method and shown in FIG. 71.

Eighteenth Embodiment

An electromagnetic interference analysis method according to an eighteenth embodiment of the present invention will now be described.

Figure 79:
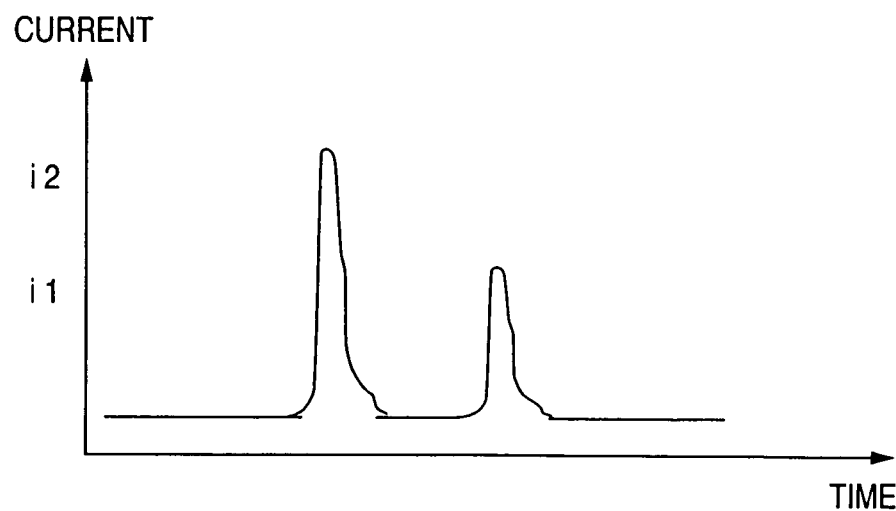
FIG. 79 is a graph showing an example current waveform arising in a real circuit according to the eighteenth embodiment.
Figure 80:
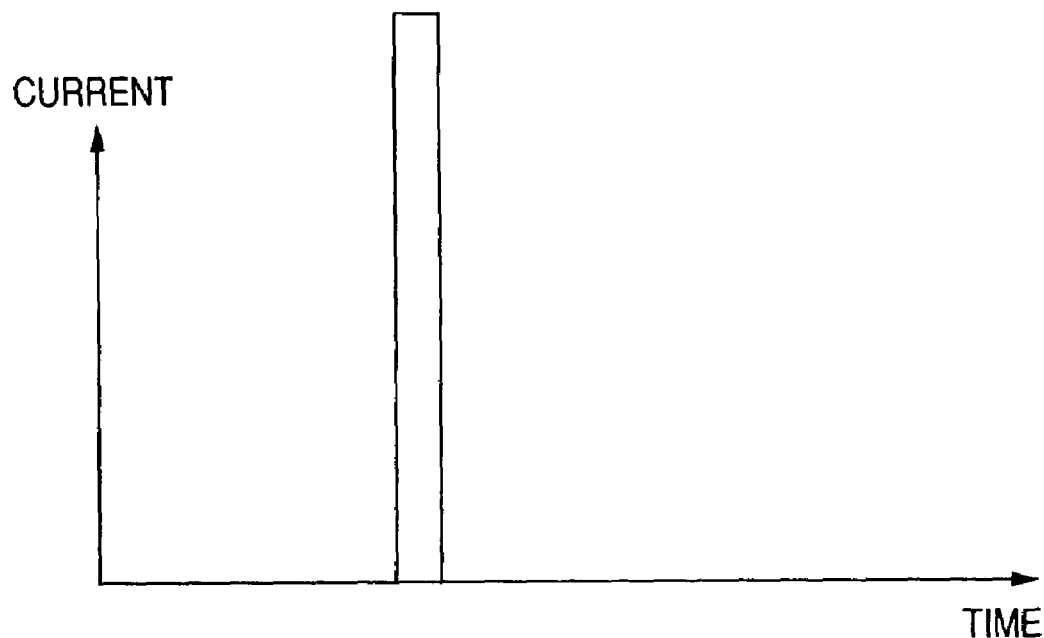
FIG. 80 is a graph showing example data stored in conventional total current storage means according to the eighteenth embodiment.

Among operations related to EMI analysis, the present embodiment describes in particular extraction of a characteristic of EMI and calculation of the amount of an electric current, in the case where a circuit element is a register (signal holding) element synchronized with a clock signal. In a register element such as a flip-flop, an electric current flows at every rise or fall of a change which arises in a signal appearing at a clock pin. For example, a pattern of signal change shown in FIG. 78 is input to a circuit shown in FIG. 77, an electric current shown in FIG. 79 flows through the circuit. As in the case of the seventeenth embodiment, an electric current flows every time each of the logic elements constituting the circuit element is activated. A conventional tool for analyzing power consumption on a gate level represents a signal change only when data are input to a flip flop; for example, at the time of a rise in a clock signal pin. For example, in a case where a pattern of signal change shown in FIG. 78 is input to the circuit shown in FIG. 77, the circuit outputs current information such as that shown in FIG. 80.

In the present embodiment, the timing at which an electric current flows through a flip-flop is determined by means of taking, as a reference, a rise and fall of a clock signal appearing at the flip-flop. Therefore, an electric current is estimated by means of taking, as a reference, a rise and fall of the clock signal. FIG. 72 shows the configuration of an EMI analysis method using the value of a peak current and the amount of electric current. A system to be used with the EMI analysis method shown in FIG. 72 comprises circuit connection information storage means 9001; pattern-of-signal-change storage means 9002; element current storage means 9003 for storing the amount of electric current flowing in a circuit element; total current storage means 9004 for storing a total amount of electric current flowing through the circuit element; and total current calculation means 9005 for calculating the total amount of electric current flowing through a circuit element.

Next will be described individual elements constituting the EMI analysis method shown in FIG. 72 and procedures for calculating the total amount of electric current shown in FIG. 82, from the circuit connection information shown in FIG. 77, the pattern of signal change shown in FIG. 78, and the amount of electric current flowing through a circuit element shown in FIG. 81.

The circuit connection information storage means 9001 stores information concerning the connection of a circuit to be analyzed, in the same manner as described in connection with the background art. Circuit connection information, such as that shown in FIG. 77, is stored in advance in the circuit connection information storage means 9001.

The pattern-of-signal-change storage 9002 stores the pattern of signal change to be applied to the circuit connection information, as in the case of a conventional pattern of signal change described in connection with the background art. As shown in FIG. 78, a pattern of change in a signal input to an input port CK and a pattern of change in a signal input to an input port D, such as those shown in FIG. 77, are stored in the pattern-of-signal-change storage 9002 beforehand.

Figure 81:
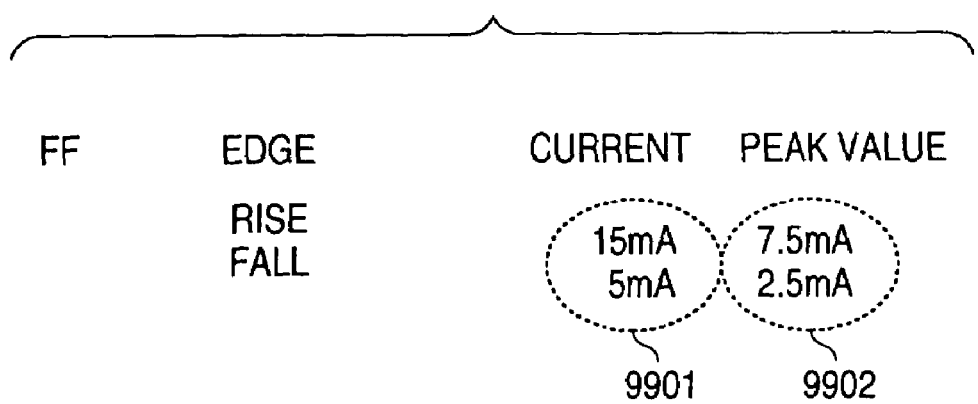
FIG. 81 is a graph showing example data stored in element current storage means according to the eighteenth embodiment.

The element current storage means 9003 stores, for each circuit element and in a form such as that shown in FIG. 81, information 9901 concerning the total amount of electric current flowing in a circuit element at a rise and fall of a clock signal and information 9902 about a peak value of the electric current flowing at a rise and fall of the clock signal.

Figure 83:
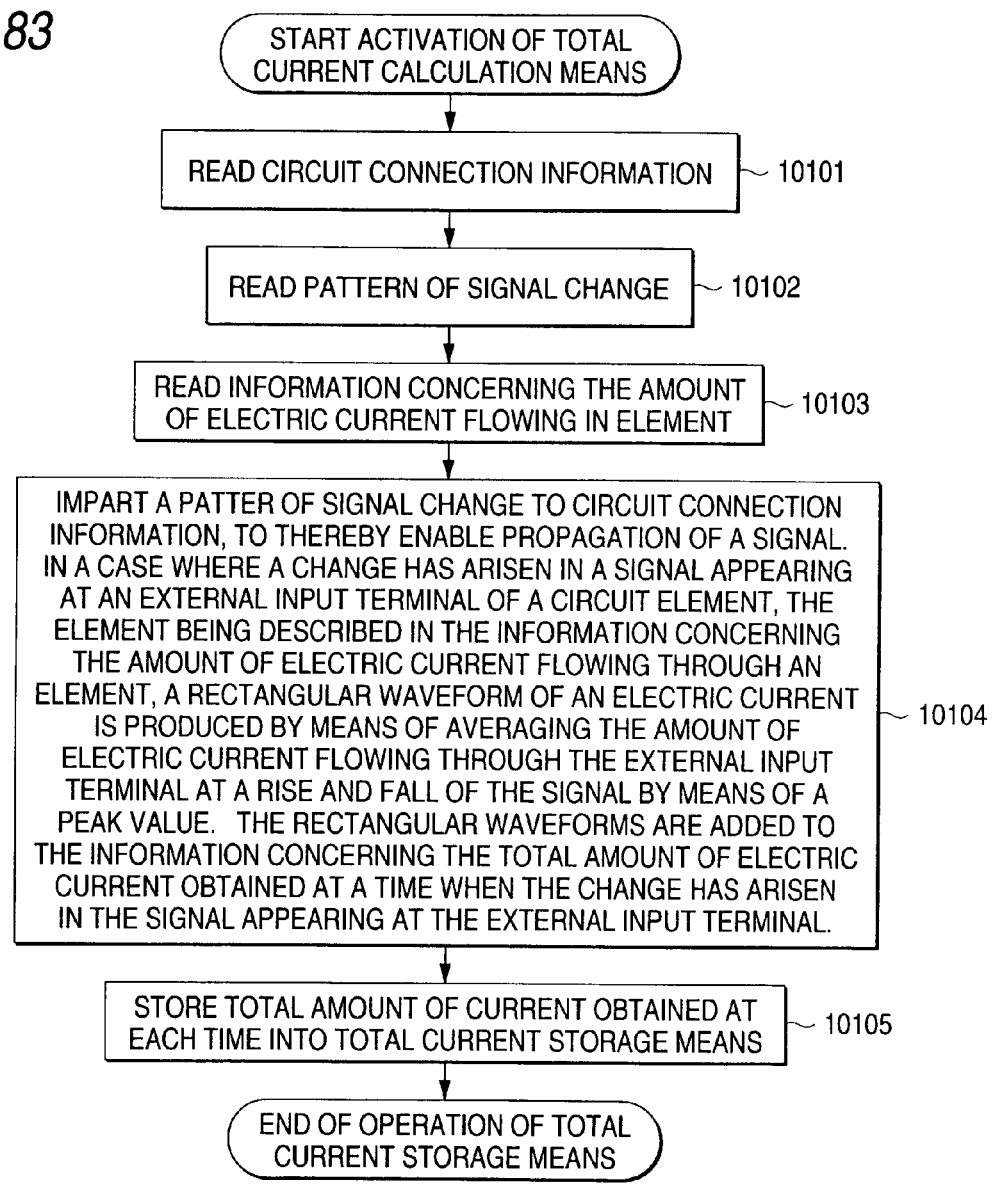
FIG. 83 is a flowchart showing processing operations of the total current calculation means according to the eighteenth embodiment.

The total current calculation means 9005 operates according to a flowchart, such as that shown in FIG. 83. According to the flowchart relating to a method of calculating an electric current shown in FIG. 83, processing pertaining to step 1504 of the conventional current calculation method is replaced by processing of calculating a rectangular waveform of the electric current from a peak value and a total amount of electric current flowing at a rise and fall of a clock signal (step 10104).

Figure 77:
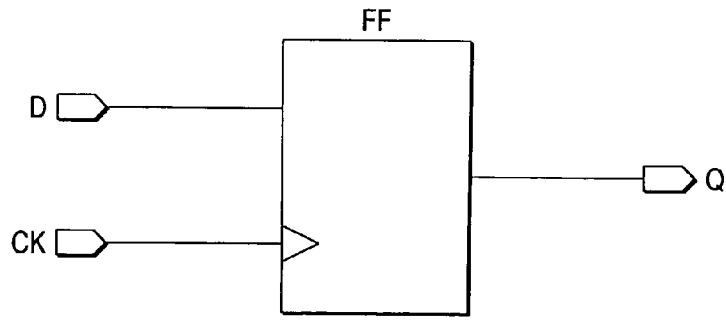
FIG. 77 is an illustration showing example data stored in circuit connection information storage means according to the eighteenth embodiment.
Figure 78:
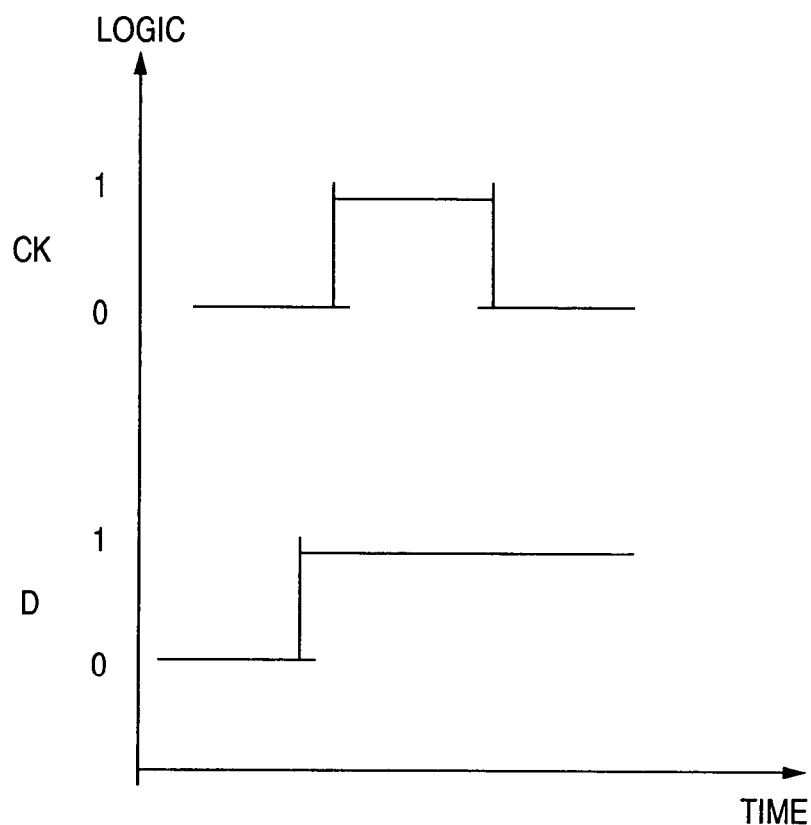
FIG. 78 is a graph showing example data stored in a pattern-of-signal-change storage means according to the eighteenth embodiment.

In step 10101, there is read the circuit connection information which is shown in FIG. 77 and stored in the circuit connection information storage means 9001. In step 10102, there is read a pattern of signal change which is shown in FIG. 78 and is stored in the pattern-of-signal-change storage 9002.

Figure 114:
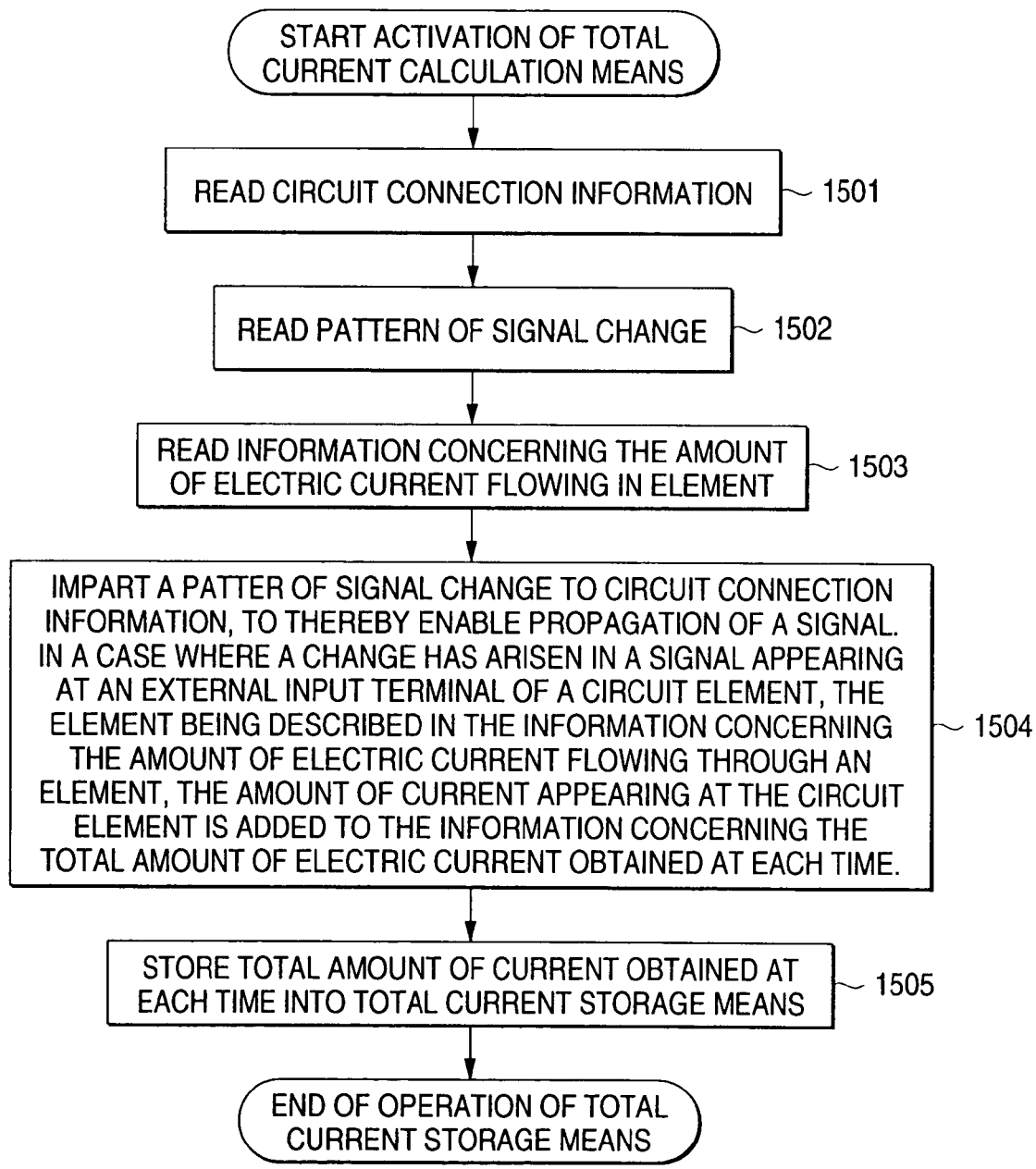
FIG. 114 is a flowchart showing processing operations of the total current calculation means employed in an example conventional EMI analysis method.
Figure 115:
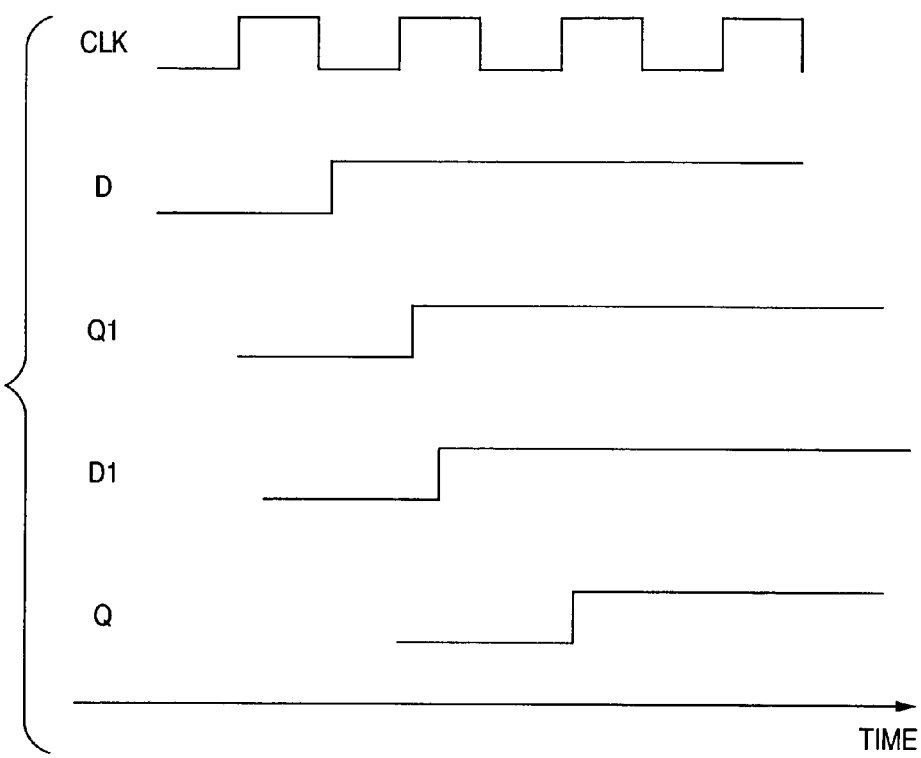
FIG. 115 is a diagram of changes in signals flowing through an internal net of a circuit, the changes being detected according to an example conventional EMI analysis method.
Figure 116:
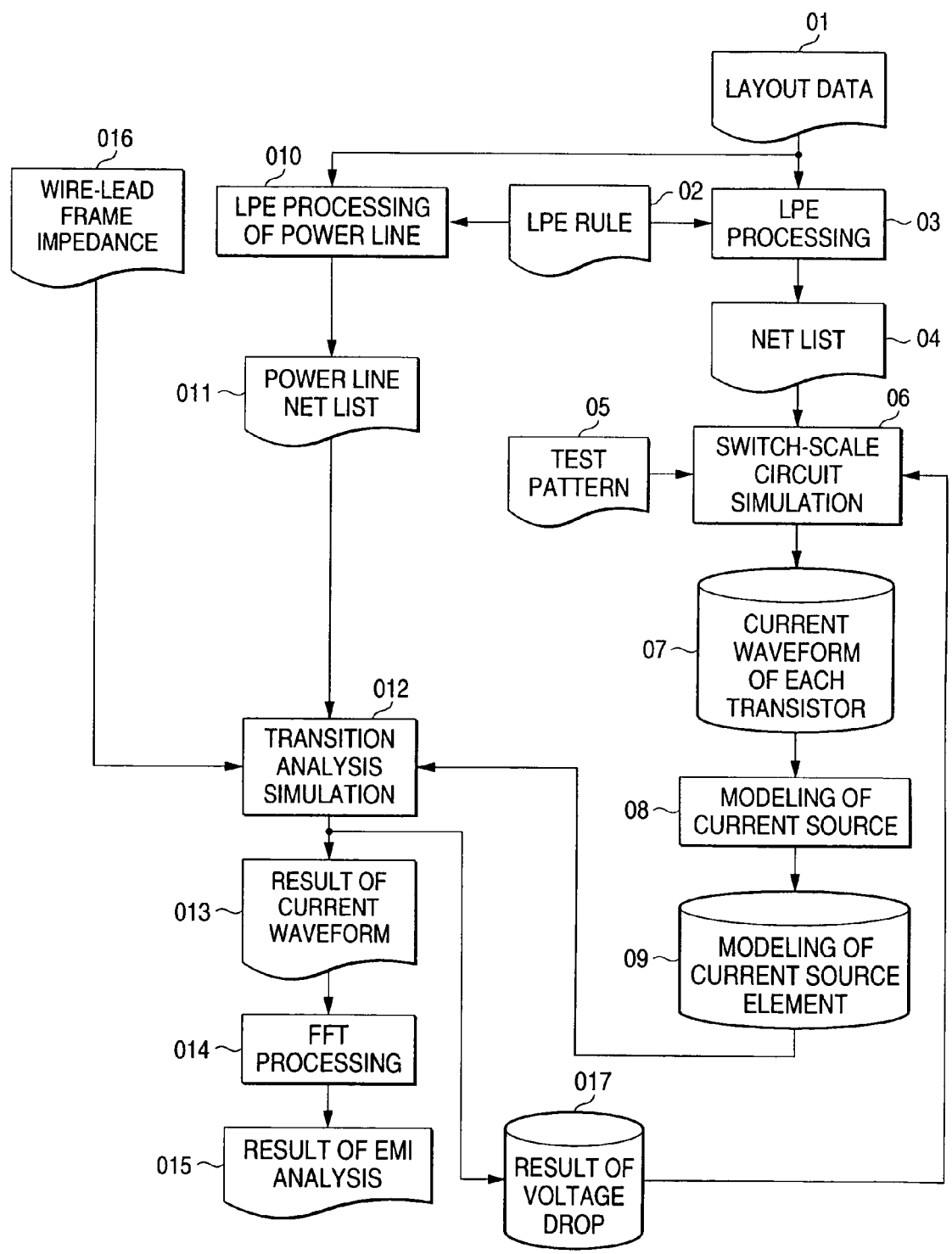
FIG. 116 is a flowchart for describing an example conventional EMI analysis method.

In step 10103, there is read the element current information which is shown in FIG. 114 and stored in the element current storage means 9003. In step 10104, the pattern of signal shown in FIG. 78 is imparted to the circuit connection information shown in FIG. 77, thereby enabling propagation of a signal. In a case where a change arises in a signal appearing at an external input terminal of a circuit element, which element is described in the information concerning the amount of electric current flowing an element, a rectangular waveform of an electric current is produced by means of averaging an electric current corresponding to the electric current flowing through the external input terminal at a rise and fall of the signal by means of a peak value. The thus-produced rectangular waveforms are added to the information concerning the total mount of electric current obtained at a time when the change has arisen in the signal appearing at the external input terminal.

Figure 82:
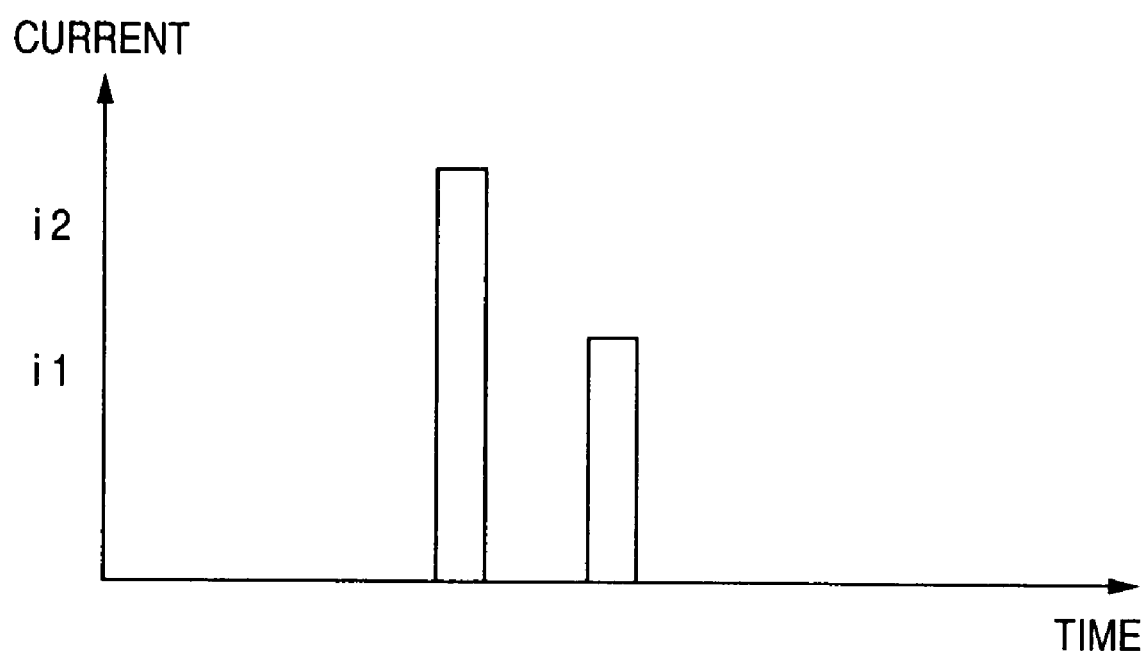
FIG. 82 is a graph showing example data stored in total current storage means according to the eighteenth embodiment.

After completion of propagation of a signal, in step 10105 the thus-calculated information concerning the total amount of electric current obtained at each time shown in FIG. 82 is stored in the total current storage means 9004. As a result, there is produced a current waveform, such as that shown in FIG. 82, which is more realistic than that obtained by the conventional current calculation method and shown in FIG. 80.

Nineteenth Embodiment

An electromagnetic interference analysis method according to a nineteenth embodiment of the present invention will now be described.

Conventional gate-level power consumption analysis means can change total electric current according to the value of a signal input to a logic element. More specifically, the conventional power consumption analysis means enables computation of so-called state-dependent power consumption. However, the conventional means cannot effect state-dependent power consumption including secular change in electric current and secular change in peak value.

Further, some conventional means determines a stationary value of another signal in the event of occurrence of a change in a certain signal. However, such means cannot determine a change in another signal. For instance, an electric current such as that shown in FIG. 86 (an electric current may change in amount according to whether a change arises in both terminals A and B simultaneously or in only terminal A), on the basis of the circuit connection information shown in FIG. 84 as well as a pattern of signal change shown in FIG. 85. In such a case, the conventional means can output only a waveform shown in FIG. 87.

In contrast, the EMI analysis method according to the present embodiment is characterized by holding secular change in electric current and a peak value in the form of a state-dependent signal which takes into consideration changes in two or more signals. FIG. 72 shows the configuration of an embodiment of the EMI analysis method using the peak current and the amount of electric current, which are calculated in the fourteenth embodiment.

A system to be used with the EMI analysis method shown in FIG. 72 comprises circuit connection information storage means 9001; pattern-of-signal-change storage 9002; element current storage means 9003 for storing the amount of electric current flowing in a circuit element; total current storage means 9004 for storing a total amount of electric current flowing through the circuit element; and total current calculation means 9005 for calculating the total amount of electric current flowing through a circuit element.

Next will be described individual elements constituting the EMI analysis method shown in FIG. 72 and procedures for calculating the total amount of electric current shown in FIG. 90, from the circuit connection information shown in FIG. 84, the pattern of signal change shown in FIG. 85, and the amount of electric current flowing through a circuit element shown in FIG. 88.

The circuit connection information storage means 9001 stores information concerning the connection of a circuit to be analyzed, in the same manner as described in connection with the background art. Circuit connection information, such as that shown in FIG. 84, is stored in advance in the circuit connection information storage means 9001.

The pattern-of-signal-change storage 9002 stores the pattern of signal change to be applied to the circuit connection information, as in the case of a conventional pattern of signal change described in connection with the background art. As shown in FIG. 85, a pattern of change in a signal input to an input port A and a pattern of change in a signal input to an input port B, such as those shown in FIG. 84, are stored in the pattern-of-signal-change storage 9002 beforehand.

The element current storage means 9003 stores, for each circuit element and in a form such as that shown in FIG. 88, a changed pin concerning an electric current which flows in a circuit element in the event of a change arising in the circuit element when a change occurs in an external terminal of the circuit element, a change arising in the logic status of another external pin under the influence of the change in the external terminal, total electric current, and information concerning a peak value.

Figure 84:
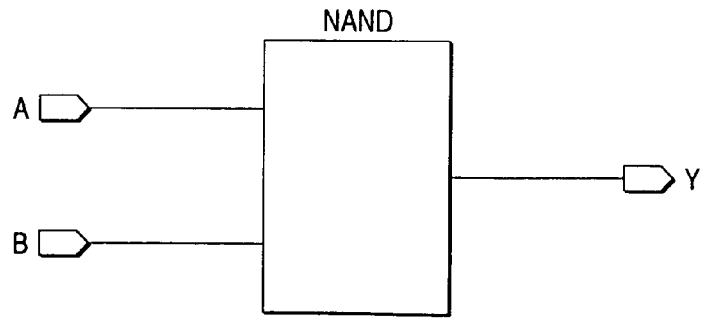
FIG. 84 is an illustration showing example data stored in circuit connection information storage means according to a nineteenth embodiment of the present invention.

For example, reference numeral 10601 designates a circuit element: that is, a NAND circuit shown in FIG. 84, in which a total amount of 3 mA including a peak current of 1 mA flows into the circuit element, provided that an input signal A assumes a logic value of 1 and the logic value of an input signal B changes from 0 to 1 when a change arises in an output Y.

The total current calculation means 9005 operates according to a flowchart, such as that shown in FIG. 89. According to the flowchart relating to a method of calculating an electric current shown in FIG. 89, processing pertaining to step 1504 of the conventional current calculation method is replaced by processing of calculating a rectangular waveform of the electric current from total electric current and a peak value at the time of occurrence of a change in consideration of the status of another terminal (step 10704).

In step 10701, there is read the circuit connection information which is shown in FIG. 84 and stored in the circuit connection information storage means 9001. In step 10702, there is read a pattern of signal change which is shown in FIG. 85 and is stored in the pattern-of-signal-change storage 9002. In step 10703, there is read the element current information which is shown in FIG. 88 and stored in the element current storage means 9003.

Figure 85:
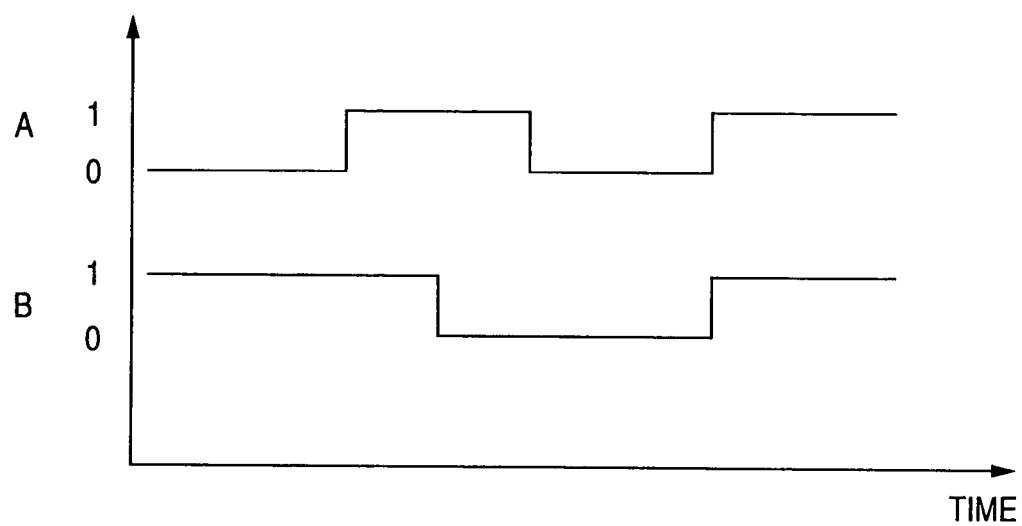
FIG. 85 is a graph showing example data stored in a pattern-of-signal-change storage means according to the nineteenth embodiment.
Figure 86:
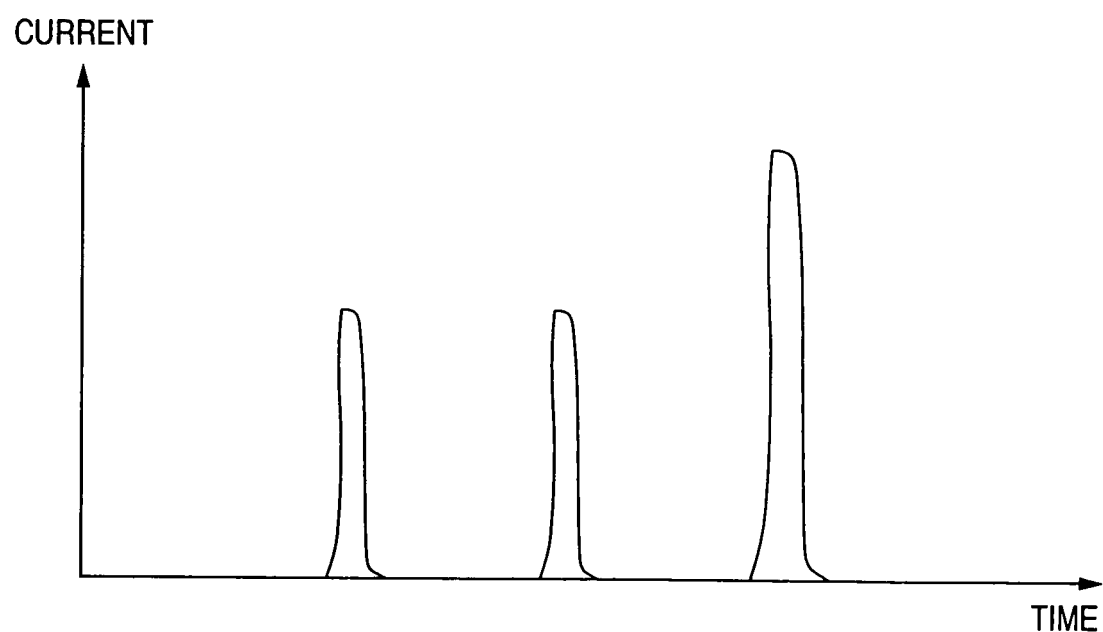
FIG. 86 is a graph showing an example current waveform arising in a real circuit according to the nineteenth embodiment.

In step 10704, the pattern of signal shown in FIG. 85 is imparted to the circuit connection information shown in FIG. 84, thereby enabling propagation of a signal. In a case where a change arises in a signal appearing at an external input terminal of a circuit element, which element is described in the information concerning the amount of electric current flowing in an element, a rectangular waveform of an electric current is produced by means of averaging the amount of electric current flowing through the external input terminal by means of a peak value in accordance with the status of another terminal. The thus-produced rectangular waveform is added to the information concerning the total mount of electric current obtained at a time when the change has arisen in the signal appearing at the external input terminal.

Figure 90:
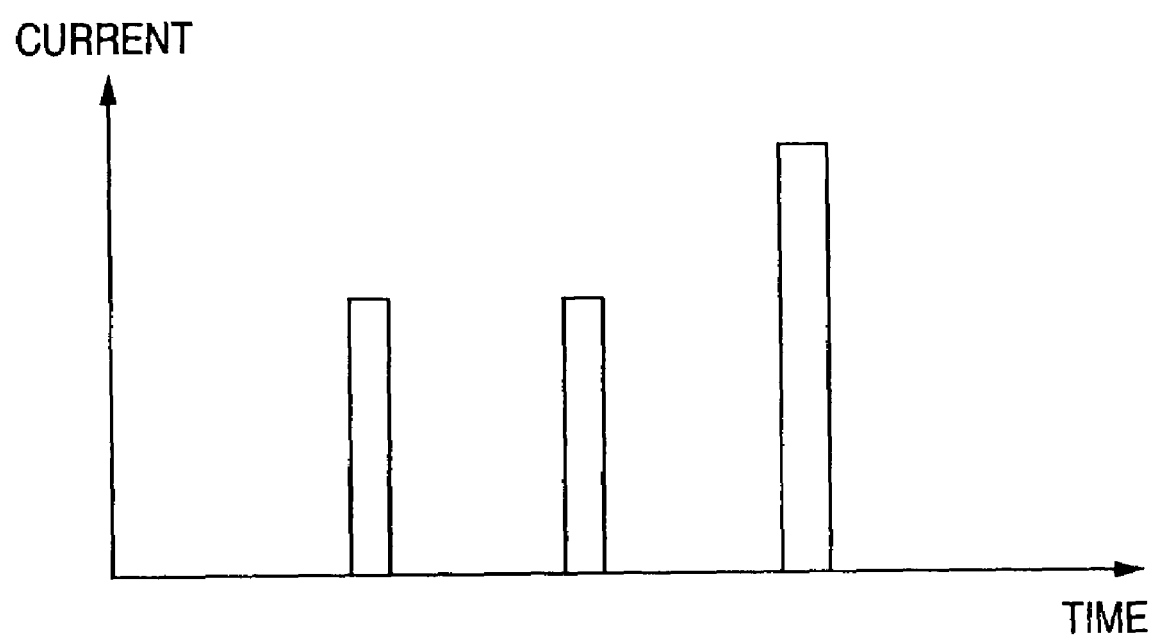
FIG. 90 is a graph showing example data stored in total current storage means according to the nineteenth embodiment.

After completion of propagation of a signal, in step 10705 the thus-calculated information concerning the total amount of electric current obtained at each time shown in FIG. 90 is stored in the total current storage means 9004. As a result, there is produced a current waveform, such as that shown in FIG. 90, which is more realistic than that which is obtained by the conventional current calculation method and shown in FIG. 87.

Twentieth Embodiment

Figure 91:
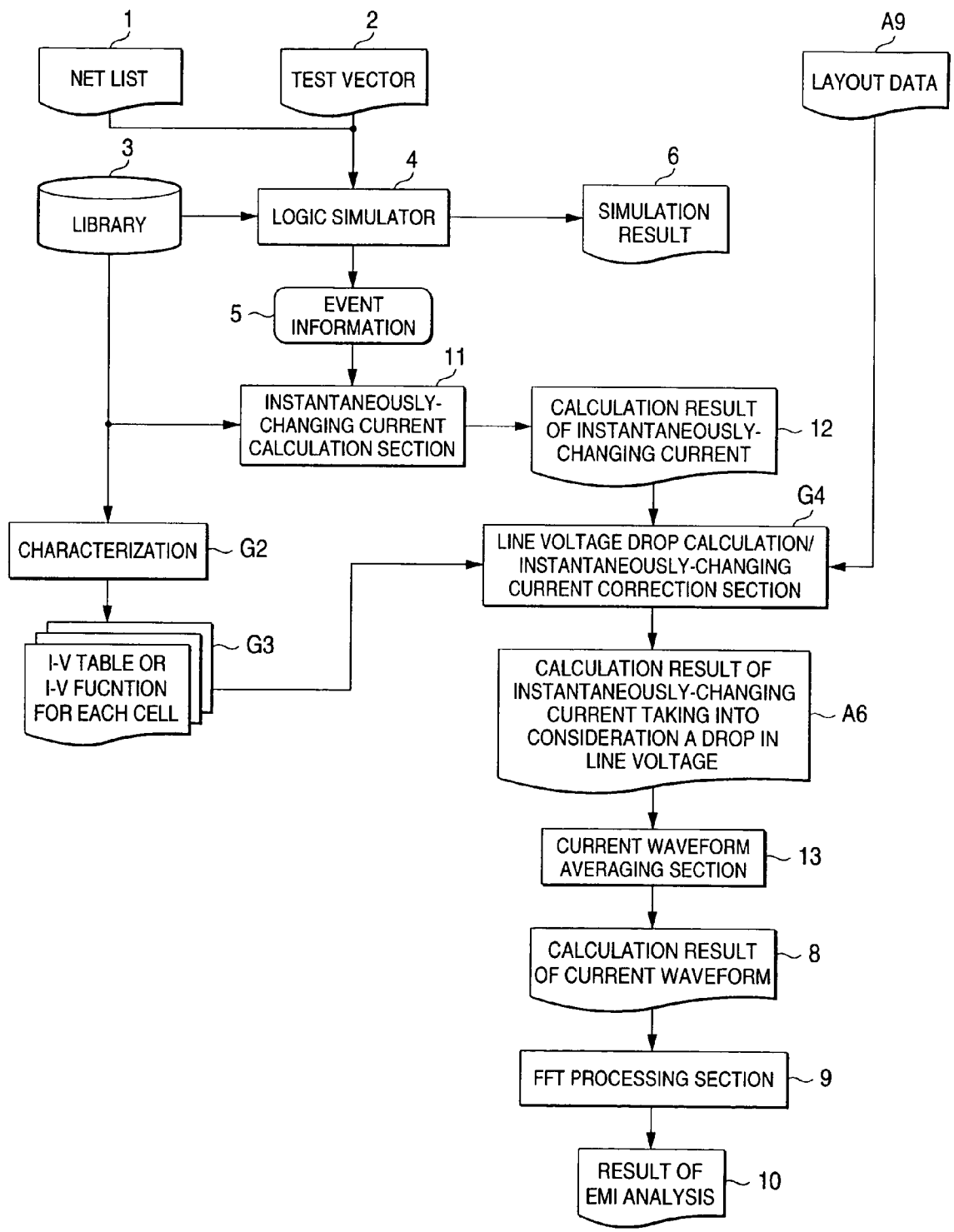
FIG. 91 is a flowchart for describing an EMI analysis method according to a twentieth embodiment of the present invention.

FIG. 91 is a block diagram showing the overall flowchart of an EMI analysis method according to the present embodiment. The EMI analysis method according to the present embodiment is identical with the EMI analysis method according to the seventh embodiment described in connection with FIG. 28, except for addition of a cell characterization section G2, replacement of the I-V table file A10 by an I-V table file (or an I-V function) G3, and replacement of the voltage drop calculation/instantaneously-changing current correction section A11 by a line voltage drop calculation/instantaneously-changing current correction section G4.

Reference symbol G2 denotes a cell characterization section for producing information unique to each cell; G3 denotes an I-V table file (or an I-V function) which represents, for each cell, the relationship between the amount of electric current and the degree of drop in line voltage; and G4 denotes a line voltage drop calculation/instantaneously-changing current correction section for calculating the degree of drop in line voltage and correcting the instantaneously-changing current calculated in step 11.

The operation of the cell characterization section G2 will now be described. The cell characterization section G2 receives a library 3 and calculates in advance the amount of electric current at the time of a change arising in a line voltage of each cell, thereby producing an I-V table file (or an I-V function) for each cell.

Figure 92:
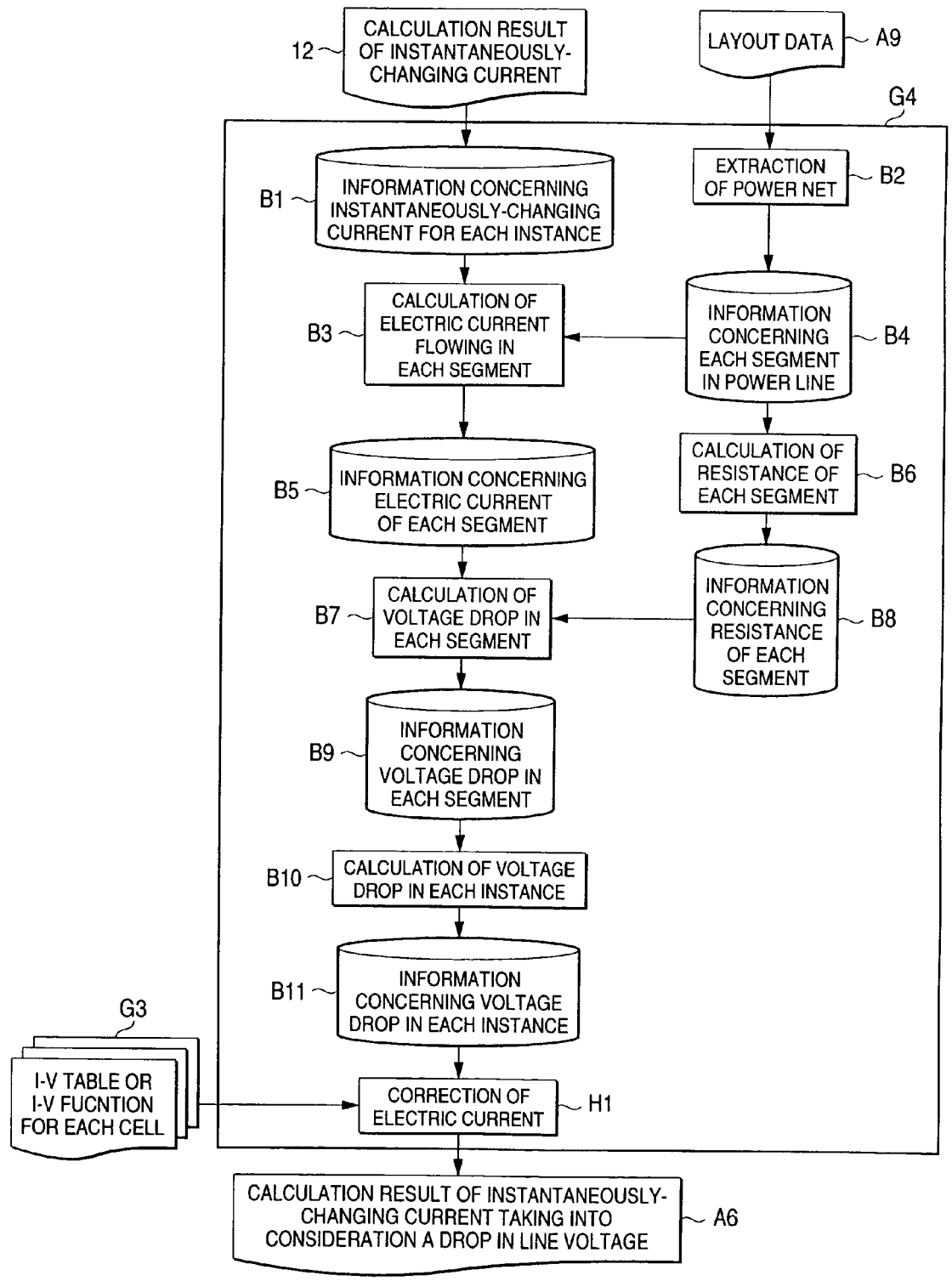
FIG. 92 is a flowchart for describing the flow of processing operations of a line voltage drop calculation/instantaneous current correction section according to the twentieth embodiment.

FIG. 92 is a block diagram showing the flow of processing of the voltage drop calculation/instantaneously-changing current correction section G4 according to the twentieth embodiment of the present invention. The function of the voltage drop calculation/instantaneously-changing current correction section G4 will now be described by reference to FIG. 92.

Those portions of the EMI analysis method according to the present embodiment which are identical with those of the EMI analysis method according to the seventh embodiment are assigned the same reference numerals, and their repeated explanations are omitted. Further, since the data 12 have already been described in detail in connection with the first embodiment, the same reference numeral is assigned to the data 12, and repeated explanation is omitted. In contrast with the voltage drop calculation/instantaneously-changing current correction section A11 employed in the seventh embodiment, the voltage drop calculation/instantaneously-changing current correction section G4 is configured such that the current value correction section B12 is replaced by step H1.

There will now be described step H1. In step H1, there are entered the voltage drop information B11 prepared for each instance in step B10 according to the seventh embodiment and the I-V table file (or I-V function) which is produced for each cell by the cell characterization section G2 and represents the relationship between the amount of electric current and the degree of drop in line voltage. On the basis of a table file unique to each cell, the instantaneously-changing current information B1, which is produced on the basis of the instantaneously-changing current result 12 produced in step 11, is corrected. An instantaneously-changing current calculation result A6 is produced for each instance in consideration of a drop in line voltage which is dependent on the resistance of a power line.

As mentioned above, under the EMI analysis method according to the twentieth embodiment of the present invention, the relationship between the amount of electric current and the degree of drop in line voltage is characterized for each cell beforehand. In the seventh embodiment, EMI of a circuit element is analyzed on the basis of a uniform relationship between the amount of electric current and the degree of drop in line voltage using the I-V table file (or I-V function). In contrast with the EMI analysis method of the seventh embodiment, the EMI analysis method of the present embodiment enables dependence of EMI on the structure (or layout) of a cell to be reflected in EMI analysis. Therefore, the EMI analysis method of the present embodiment can produce a more accurate model of a current waveform, thereby reducing undesired higher harmonic components included in the frequency characteristic of a circuit to be analyzed, the characteristic being determined by means of subjecting the current waveform to FFT processing.

Although the twentieth embodiment has described by reference to the first embodiment, the same result will be yielded even when the technical idea of the present embodiment is applied to any one of the fourteenth through nineteenth embodiments.

Twenty-First Embodiment

Figure 93:
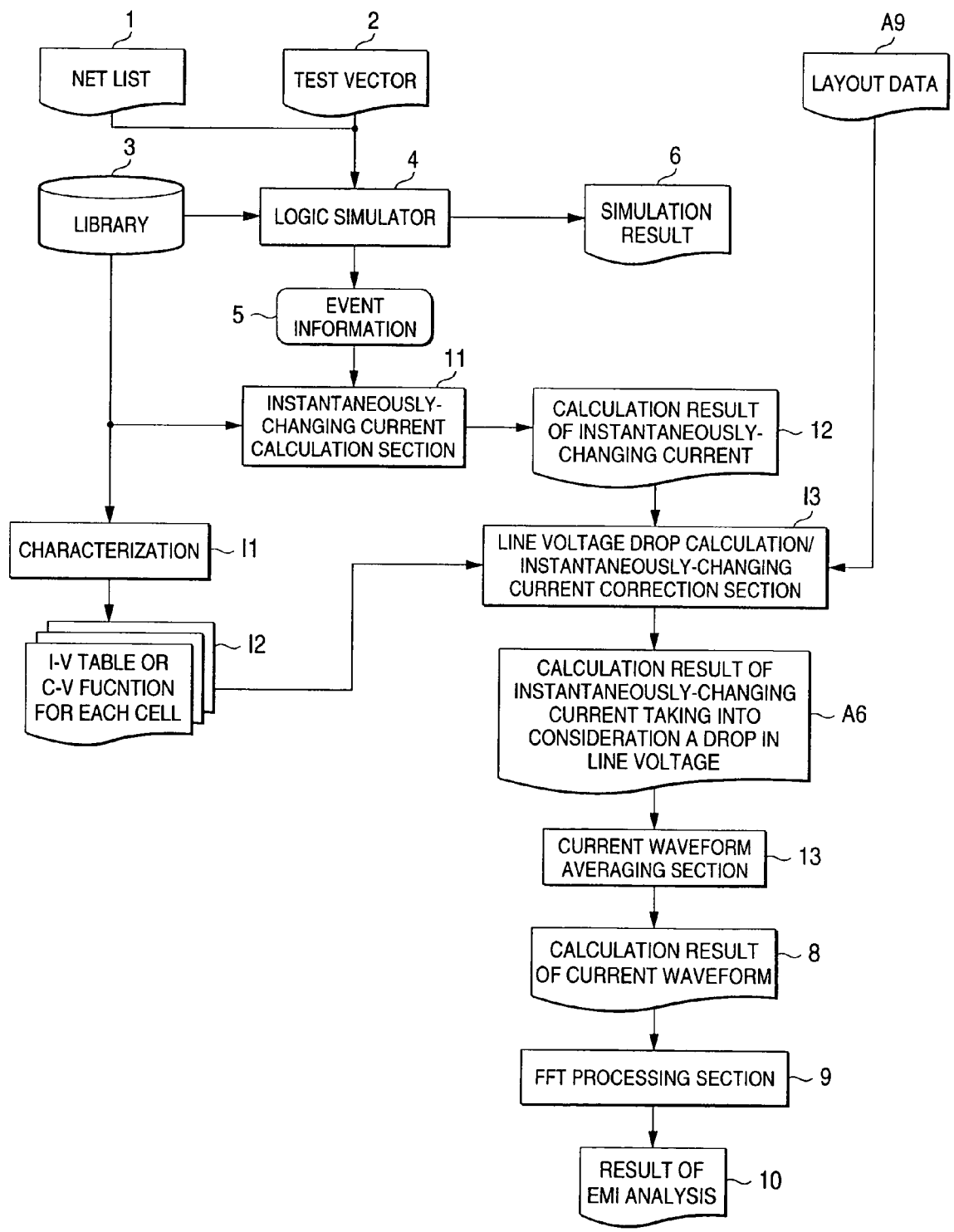
FIG. 93 is a flowchart for describing an EMI analysis method according to a twenty-first embodiment of the present invention.

FIG. 93 is a block diagram showing the overall flowchart of an EMI analysis method according to a twenty-first embodiment of the present invention. The EMI analysis method according to the present embodiment is identical with the EMI analysis method according to the eighth embodiment described in connection with FIG. 36, except for addition of a cell characterization section 11, deletion of the C-V table file (or a C-V function) C1, replacement of the I-V table file A10 by an I-C-V table file (or an I-V function) I2, and replacement of the voltage drop calculation/instantaneously-changing current correction section C2 by a line voltage drop calculation/instantaneously-changing current correction section I3.

Those portions of the EMI analysis method according to the present embodiment which are identical with those of the EMI analysis method according to the first embodiment are assigned the same reference numerals, and their repeated explanations are omitted. Reference symbol I1 denotes a cell characterization section for producing information unique to each cell; 12 denotes an I-C-V table file (or an I-C-V function) which represents, for each cell, the relationship among the amount of electric current, the degree of drop in line voltage, and decoupling capacitance existing between a power line and ground; and I3 denotes a line voltage drop calculation/instantaneously-changing current correction section for calculating the degree of drop in line voltage and correcting the instantaneously-changing current calculation result 12 produced in step 11.

The operation of the cell characterization section I1 will now be described. The cell characterization section I1 receives a library 3, changes a line voltage of each cell, and calculates in advance the amount of electric current at the time of changing of the line voltage in consideration of decoupling capacitance existing between a power and ground, thereby producing an I-C-V table file (or an I-C-V function) I2 for each cell.

Figure 94:
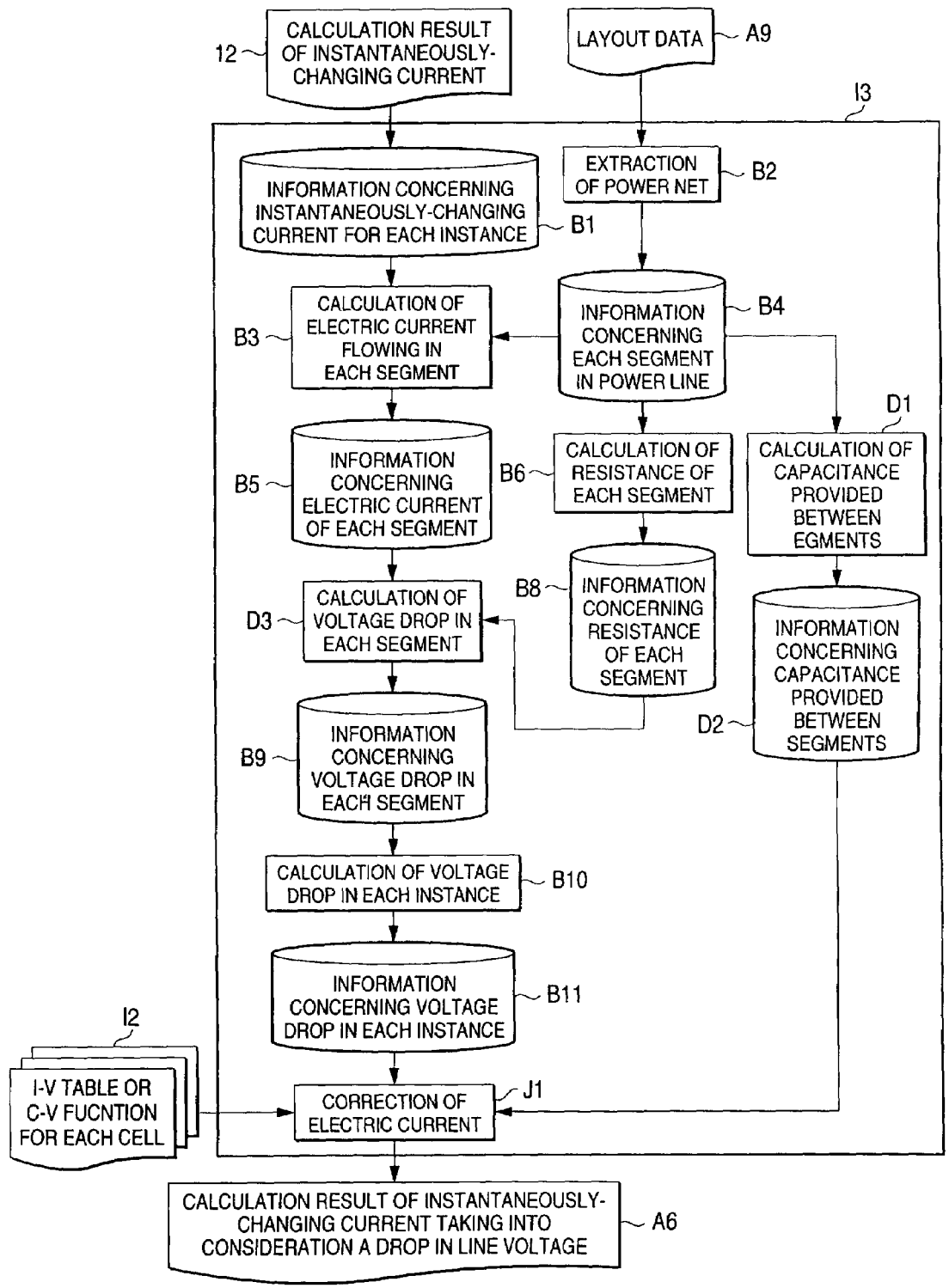
FIG. 94 is a flowchart for describing the flow of processing operations of a line voltage drop calculation/instantaneous current correction section according to the twenty-first embodiment.

FIG. 94 is a block diagram showing the flow of processing of the voltage drop calculation/instantaneously-changing current correction section I4 according to the twenty-first embodiment of the present invention. The function of the voltage drop calculation/instantaneously-changing current correction section I3 will now be described by reference to FIG. 94. Those portions of the EMI analysis method according to the present embodiment which are identical with those of the EMI analysis method according to the eighth embodiment are assigned the same reference numerals, and their repeated explanations are omitted. Further, since the data 12 have already been described in detail in connection with the first embodiment, the same reference numeral is assigned to the data 12, and repeated explanation is omitted.

In contrast with the voltage drop calculation/instantaneously-changing current correction section C2 employed in the eighth embodiment, the voltage drop calculation/instantaneously-changing current correction section I3 is configured such that the current value correction section B12 is replaced by step J1.

There will now be described step J1. In step J1, there are entered the voltage drop information B11 prepared for each instance in step B10 according to the eighth embodiment, the I-C-V table file (or I-C-V function) I2 which is produced for each cell by the cell characterization section I1 and represents the relationship between the amount of electric current and the degree of drop in line voltage, and the capacitance information D2 concerning a capacitor provided in a segment interconnecting a power and ground, the information being prepared in step D1 in the eight embodiment. On the basis of a table file unique to each cell, the instantaneously-changing current information B1, which is produced on the basis of the instantaneously-changing current result 12 produced in step 11, is corrected. An instantaneously-changing current calculation result A6 is produced for each instance, in consideration of fluctuations in line voltage which are dependent on decoupling capacitance as well as the resistance of a power line.

As mentioned above, under the EMI analysis method according to the twenty-first embodiment of the present invention, the relationship among the amount of electric current, the degree of drop in line voltage, and decoupling capacitance existing between a power and ground is characterized for each cell beforehand. In the eighth embodiment, EMI of a circuit element is analyzed on the basis of a uniform relationship between the amount of electric current, the degree of drop in line voltage, and decoupling capacitance existing between a power and ground, using the I-V table file (or I-V function) A10 and the C-V table (or C-V function) C1. In contrast with the EMI analysis method of the eighth embodiment, the EMI analysis method of the present embodiment enables dependence of EMI on the structure (or layout) of a cell to be reflected in EMI analysis. Therefore, the EMI analysis method of the present embodiment can produce a more accurate model of a current waveform, thereby reducing undesired higher harmonic components included in the frequency characteristic of a circuit to be analyzed, the characteristic being determined by means of subjecting the current waveform to FFT processing.

Although the twenty-first embodiment has described by reference to the first embodiment, the same result will be yielded even when the technical idea of the present embodiment is applied to any one of the fourteenth through nineteenth embodiments.

Twenty-Second Embodiment

Figure 95:
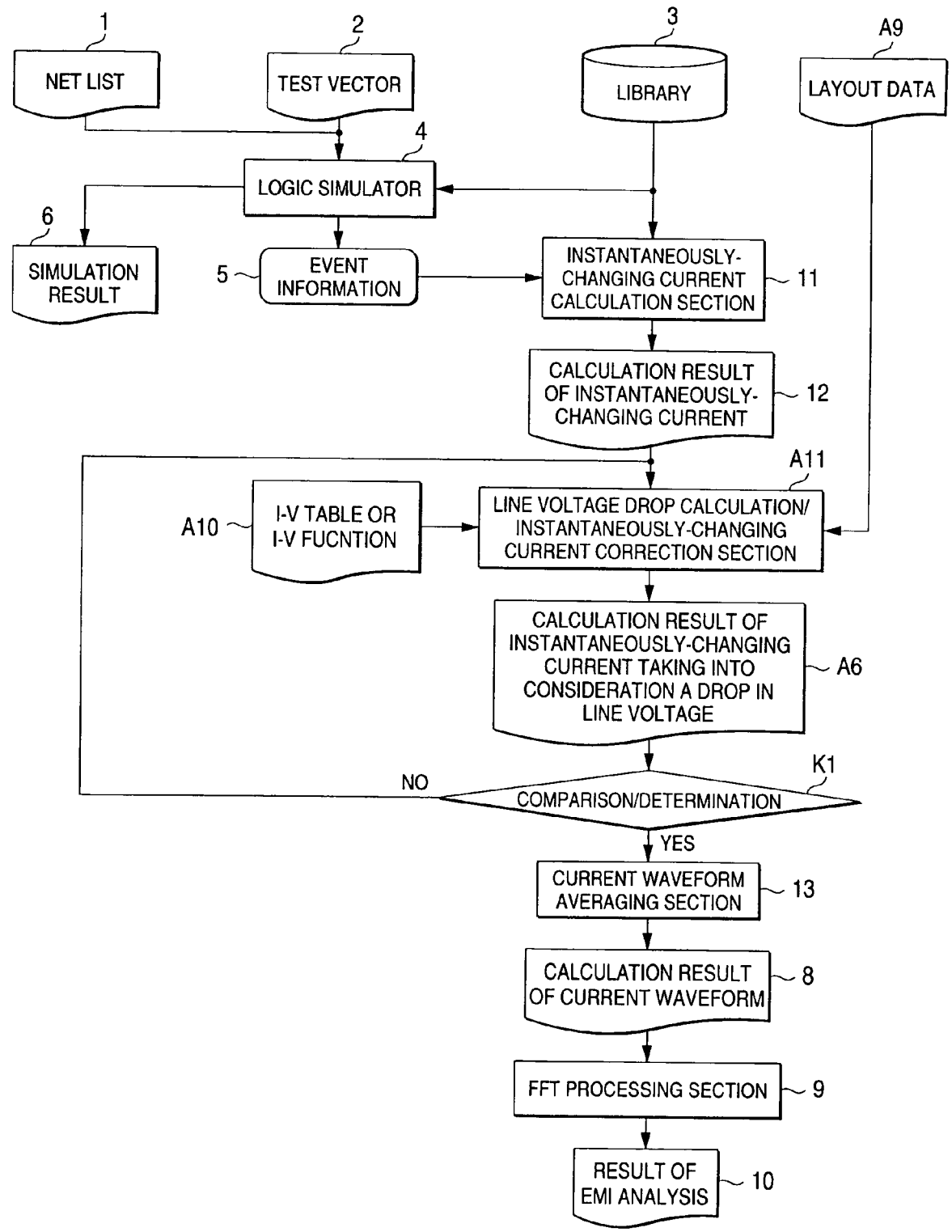
FIG. 95 is a flowchart for describing an EMI analysis method according to a twenty-second embodiment of the present invention.

FIG. 95 is a block diagram showing the overall flowchart of an EMI analysis method according to a twenty-second embodiment of the present invention. The EMI analysis method according to the present embodiment is identical with the EMI analysis method according to the seventh embodiment described in connection with FIG. 28, except for addition of a comparison-and-determination section K1. Those portions of the EMI analysis method according to the present embodiment which are identical with those of the EMI analysis method according to the first embodiment are assigned the same reference numerals, and their repeated explanations are omitted. Reference symbol K1 denotes a comparison-and-determination section for determining whether or not the instantaneously-changing current calculation result A6—which takes into consideration a drop in line voltage produced by the voltage drop calculation/instantaneously-changing current correction section A11— becomes equal to an input to the next processing step.

Next will be described the operation of the comparison-and-determination section K1. The EMI analysis method according to the present embodiment is characterized by means of iterating the following operations; that is, re-entry, into the voltage drop calculation/instantaneously-changing current correction section A11, of the instantaneously-changing current calculation result A6 which takes into consideration a drop in line voltage produced by the voltage drop calculation/instantaneously-changing current correction section A11, thereby producing another instantaneously-changing current calculation result A6 which newly takes into consideration a drop in line voltage.

The comparison-and-determination section K1 determines, through comparison, whether or not the number of times the foregoing operations has been iterated has reached a predetermined number of times. If a truth-value TRUE is yielded as a result of comparison, iteration of the operations is completed, and there is performed processing pertaining to the next step; that is, the operation of the FFT processing section 9, is performed.

As mentioned above, under the EMI analysis method according to the twenty-second embodiment of the present invention, the instantaneously-changing electric current result which has been corrected and calculated in consideration of the influence of fluctuations in line voltage is fed back, to thereby iterate voltage drop calculation/instantaneously-changing current correction operations. Accordingly, variation in the amount of electric current, which would otherwise be caused by a drop in line voltage, can be made stable. Therefore, the EMI analysis method of the present embodiment can produce a more accurate model of a current waveform, thereby reducing undesired higher harmonic components included in the frequency characteristic of a circuit to be analyzed, the characteristic being determined by means of subjecting the current waveform to FFT processing.

In the present embodiment, the comparison-and-determination section K1 controls iteration of processing operations by means of determining whether or not a predetermined number of times has been reached. Alternatively, there may be employed a storage device for temporarily storing the instantaneously-changing current calculation result A6 which takes into consideration a drop in line voltage produced by the voltage drop calculation/instantaneously-changing current correction section A11. The instantaneously-changing current calculation result A6 stored in the storage device is entered again into the voltage drop calculation/instantaneously-changing current correction section A11, to thereby newly produce another instantaneously-changing current calculation result A6. Comparison is made between the thus-produced another instantaneously-changing current calculation result A6 and the instantaneously-changing current calculation result A6 stored in the storage device. The foregoing operations are iterated until a difference falls within a predetermined range of allowance.

Although the twenty-second embodiment has been described with reference to the seventh embodiment, the same result will be yielded even when the technical idea of the present embodiment is applied to any one of the eighth, ninth, twentieth, and twenty-first embodiments.

Twenty-Third Embodiment

An EMI analysis method according to a tenth embodiment of the present invention will now be described. In the fourteenth through twenty-second embodiments, an instantaneously-changing current of each cell is calculated from event information concerning each cell, the information being output from a logic simulator, by means of characterizing a peak current of a cell according to the type of cell and the amount of instantaneously-changing current for each event. The thus-calculated instantaneously-changing current is modeled as a rectangular waveform such that a peak value becomes equal to a peak current of the cell, thereby determining change in electric current. However, so long as the waveform of an instantaneous electric current is modeled as a triangular wave, a more realistic change in electric current can be determined.

By way of example, there will now be described an EMI analysis method comprising the steps of:

modeling an instantaneously-changing electric current as a triangular wave whose height becomes equal to a characterized peak current, the width of the triangular wave being calculated such that the instantaneously-changing current becomes equal to the width of the triangular wave, to thereby calculate a more realistic change in electric current; and subjecting the result of calculation of an electric waveform to FFT processing, thereby determining the frequency characteristic of an EMI component of a circuit of interest.

Figure 96:
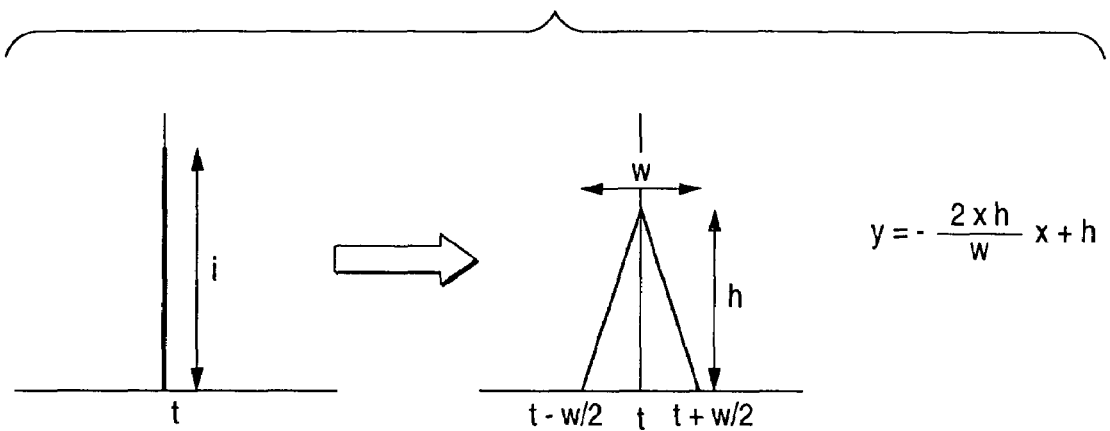
FIG. 96 shows a triangular waveform model (according to a twenty-third embodiment of the present invention)

FIG. 96 shows an instantaneous electric current and a modeled triangular wave according to the present embodiment. In the drawing, "i" denotes an instantaneously-changing current; and "t" denotes a current processing time. Further, "h" denotes the height of a triangular wave serving as a model of an instantaneously-changing current. The height of a triangular waveform is extracted from a library in which the heights of triangular waveforms of cells are characterized. Reference symbol "w" denotes the width of a triangular waveform and is calculated on the basis of "i" and "h." An electric current at time t+x is expressed by Eq.5 described previously. Further, an electric current at time t−x is also expressed by Eq.5.

The overall flow of processing of the EMI analysis method according to the present embodiment is represented by the same block diagram as that employed in the first embodiment (see FIG. 1).

Figure 97:
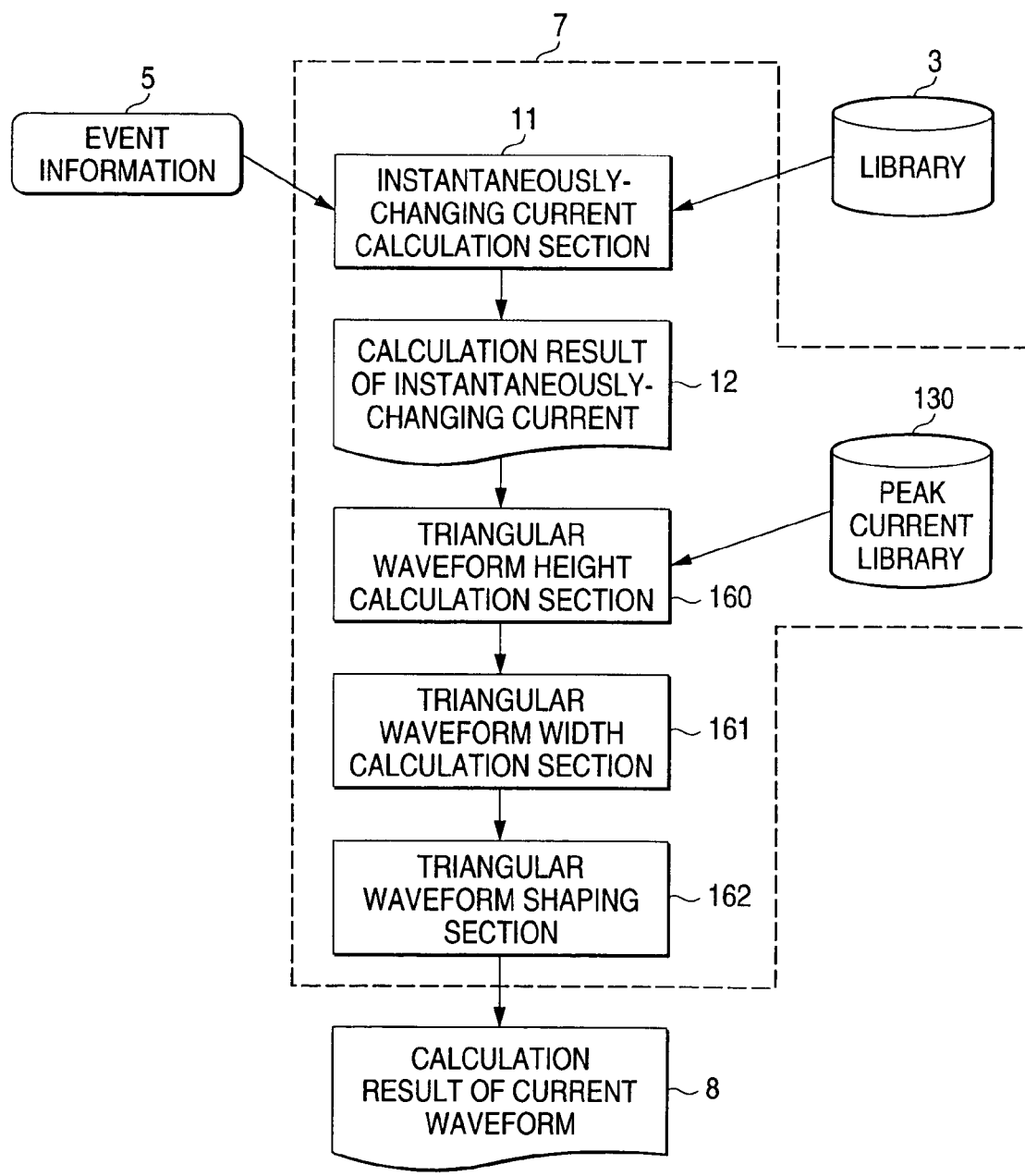
FIG. 97 is a block diagram showing a current waveform calculation section (according to the twenty-third)

FIG. 97 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment. Reference numeral 130 designates a peak current library including peak currents of cells. Reference numeral 160 denotes a triangular waveform height calculation section for calculating the height of a triangular wave from the peak current library 130. Reference numeral 161 designates a triangular waveform width calculation section for calculating the width of a triangular waveform from the height extracted by the triangular waveform height calculation section 160 and the instantaneously-changing current, such that the area of a triangular wave becomes equal to an instantaneously-changing current. Reference numeral 162 denotes a triangular-waveform-shaping section for modeling the instantaneously-changing current result 12 as a triangular wave having a constant width, the height of the triangular waveform corresponding to the peak value of the triangular waveform calculated by the rectangular waveform height calculation section 160, and the width of the rectangular waveform corresponding to the width calculated by the rectangular waveform width calculation section 161.

Figure 98:
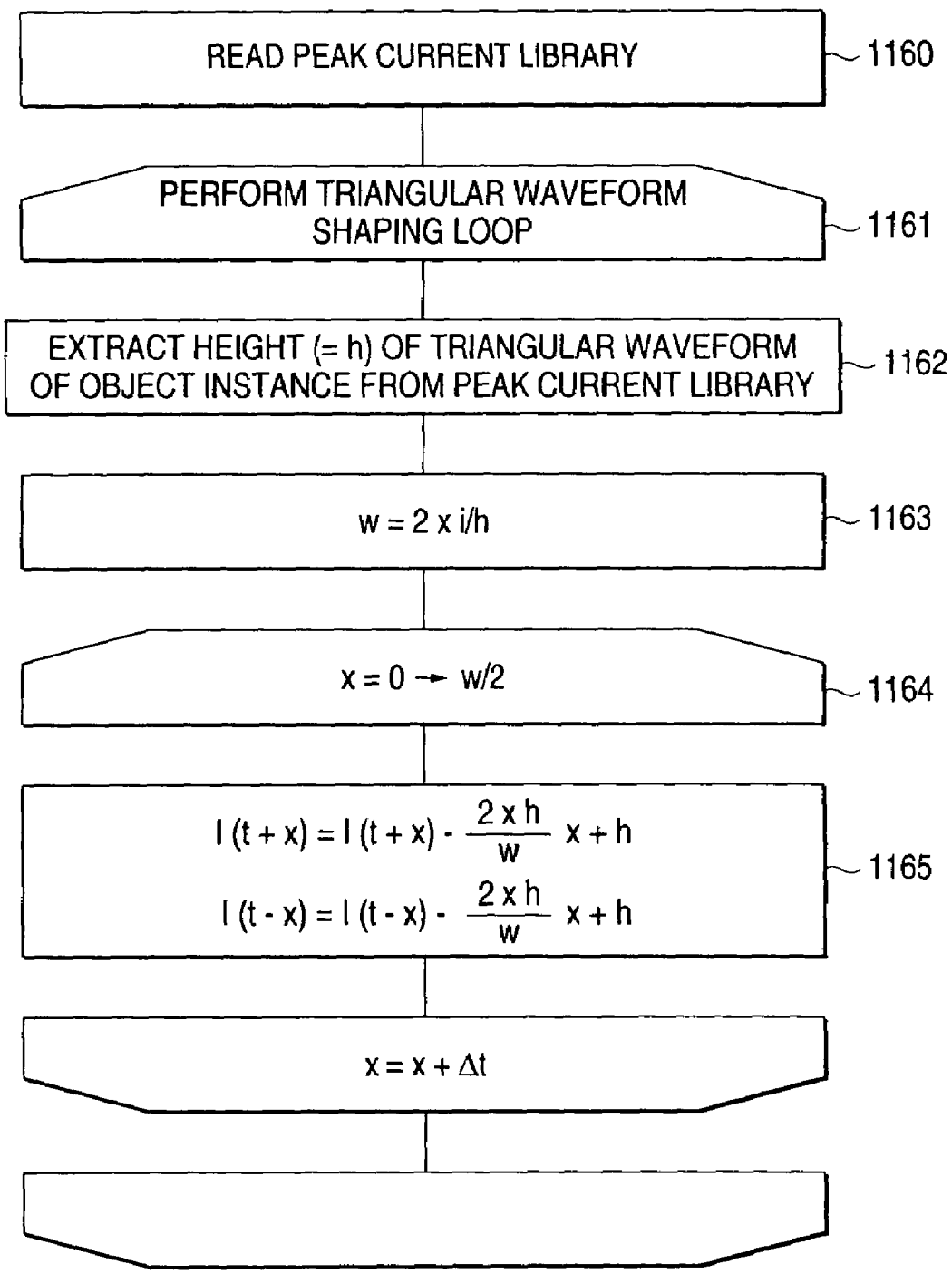
FIG. 98 is a flowchart of a triangular waveform-shaping operation.

FIG. 98 is a flowchart of processing pertaining to the triangular-waveform-shaping section 162, including processing pertaining to the triangular waveform height calculation section 160 and processing pertaining to the triangular waveform width calculation section 1161. First, the peak current library 130 is read (step 1160). The following processing is iterated on a per-event basis until calculation of a current waveform is completed (step 1161). From the peak current library 130, a peak current of an instance which is an object of EMI analysis is extracted, and the thus-extracted peak current is taken as the height "h" of a triangular waveform (step 1162). This processing corresponds to processing of the triangular waveform height calculation section 160. Provided that "w" is taken as the width of a triangular waveform, the area of a triangular wave is W×h/2 and is equal to the instantaneously-changing current of a cell of the event. Therefore, the width "w" of a triangular waveform is calculated from 2×i/h (step 1163). Reference symbol "i" denotes an instantaneously-changing current of a cell of an event, the event being an object of EMI analysis. This processing corresponds to processing pertaining to the triangular waveform width calculation section 161. Until variable "x" changes from 0 to W/2, h(c, i) expressed by Eq.5 is added to I(t+x) and I(t−x). Further, Δt is added to variable "x" (steps 1164 and 1165). Here, I(t+x) denotes total electric current flowing through all the cells at time t+x, and I(t−x) denotes total electric current flowing through all the cells at time t−x. This processing corresponds to processing pertaining to the triangular-waveform-shaping section 162.

The current wave calculation result 8 can be obtained by means of the flow of a triangular waveform height calculation operation, a triangular waveform width calculation operation, and a triangular-waveform-shaping operation. The FFT processing section 9 subjects the current waveform calculation result 8 to an FFT operation, to thereby determine the frequency characteristic of an EMI component. As a result, there can be obtained an EMI analysis result 10.

Twenty-Fourth Embodiment

An EMI analysis method according to a twenty-fourth embodiment of the present invention will now be described. In the fourteenth through twenty-second embodiments, an instantaneously-changing current of each cell is calculated from event information concerning each cell, the information being output from a logic simulator, by means of characterizing a peak current of a cell according to the type of cell and the amount of instantaneously-changing current for each event. The thus-calculated instantaneously-changing current is modeled as a rectangular waveform such that a peak value becomes equal to a peak current of the cell, thereby determining change in electric current. However, so long as the waveform of an instantaneous electric current is modeled as a Gauss function wave, a more realistic change in electric current can be determined. By way of example, there will now be described an EMI analysis method comprising the steps of:

modeling an instantaneously-changing electric current as a multi-order-function waveform whose height becomes equal to a characterized peak current, the width of the multi-order-function wave being calculated such that the instantaneously-changing current becomes equal thereto, to thereby calculate a more realistic change in electric current; and subjecting the result of calculation of an electric waveform to FFT processing, thereby determining the frequency characteristic of an EMI component of a circuit of interest.

Figure 99:
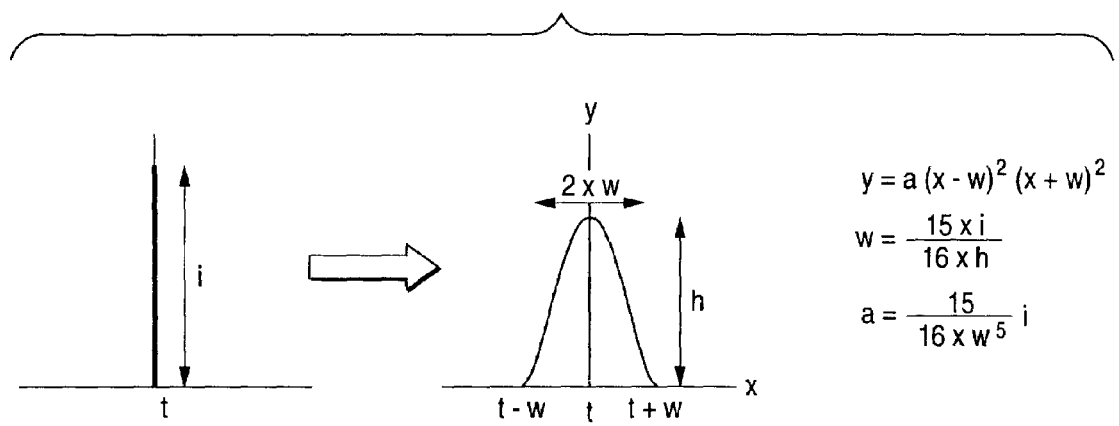
FIG. 99 is a multi-order-function model (according to a twenty-fourth embodiment of the present invention)

FIG. 99 shows an instantaneous electric current and a modeled multi-order-function according to the present embodiment. In the drawing, "i" denotes an instantaneously-changing current; and "t" denotes a current processing time. Further, "h" denotes the height of a multi-order-function wave serving as a model of an instantaneously-changing current. The height of a triangular waveform is extracted from a library in which the heights of multi-order-function waveforms of cells are characterized. Reference symbol "1" denotes the width of a multi-order-function wave and is calculated on the basis of "h," which has been calculated previously, and "i." Provided that the width of the multi-order-function waveform is taken as 2×w, an electric current at time t+x is expressed by Eq.6. The area of the multi-order-function waveform is expressed by Eq.8. The area of the multi-order-function waveform is equal to the value of "i." Here, "a" is expressed by Eq.9. Since the height "h" of a multi-order-function waveform is determined by Eq.6 when x=0, the height "h" is expressed by Eq.7. From Eq.7 and Eq.9, the width "w" is expressed by Eq.14 provided below.

$$w = \frac{15 \times i}{16 \times h} \quad (14)$$

The overall flow of processing of the EMI analysis method according to the present embodiment is represented by the same block diagram as that employed in the first embodiment (see FIG. 1).

Figure 100:
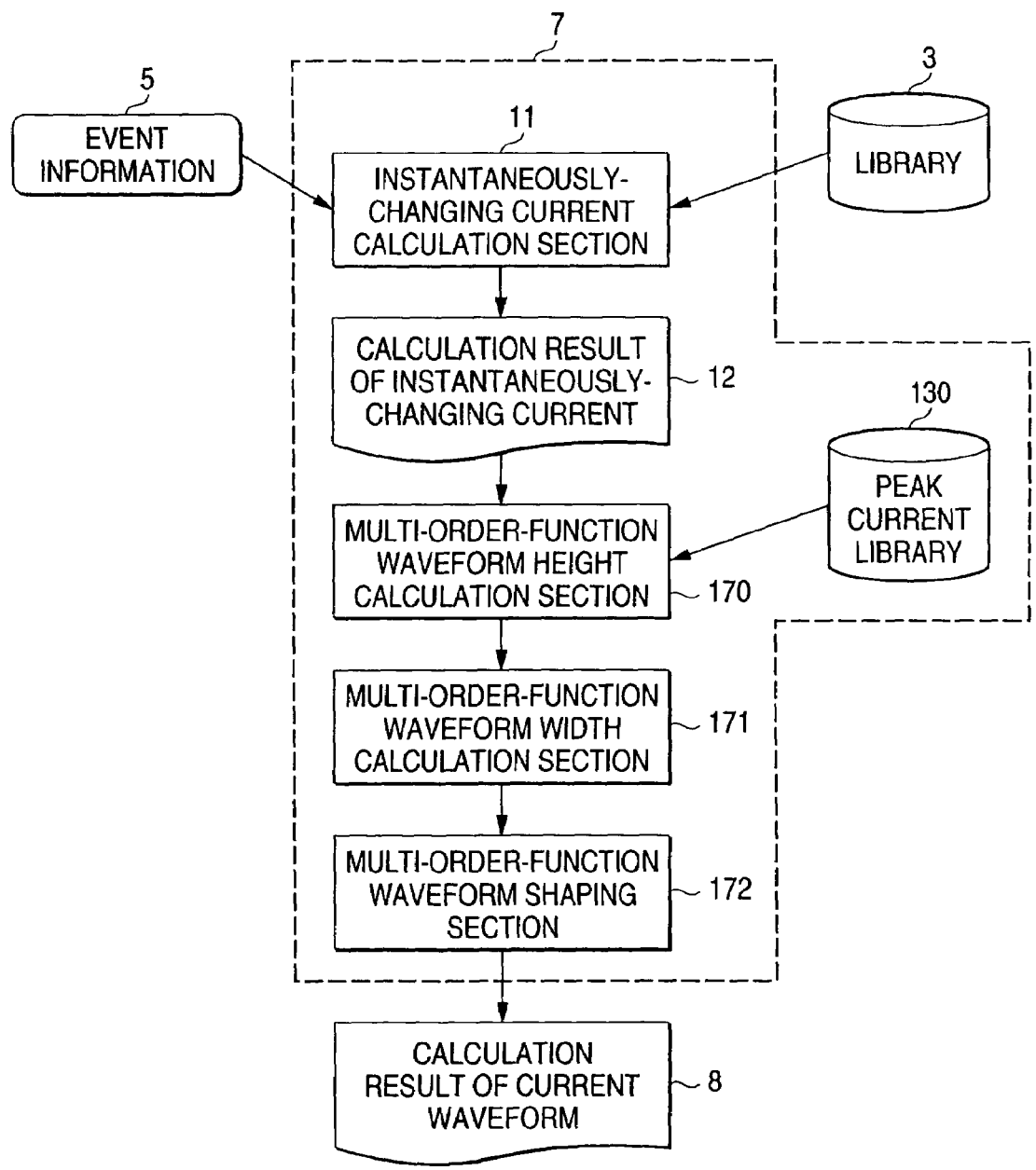
FIG. 100 is a block diagram showing a current waveform calculation section (according to the twenty-fourth embodiment)

FIG. 100 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment.

Reference numeral 130 designates a peak current library including peak currents of cells which are characterized according to the type of cell. Reference numeral 170 denotes a multi-order-function waveform height calculation section for calculating the height of a multi-order-function waveform from the peak current library 130. Reference numeral 171 designates a multi-order-function waveform width calculation section for calculating the width of a multi-order-function waveform from the height extracted by the multi-order-function waveform height calculation section 170 and the instantaneously-changing current, such that the area of a multi-order-function waveform becomes equal to an instantaneously-changing current. Reference numeral 172 denotes a multi-order-function waveform-shaping section for modeling the instantaneously-changing current result 12 into a multi-order-function waveform having a constant width, the height of the multi-order-function waveform corresponding to the peak value of the multi-order-function waveform calculated by the multi-order-function waveform height calculation section 170, and the width of the multi-order-function waveform corresponding to the width calculated by the multi-order-function waveform width calculation section 171.

Figure 101:
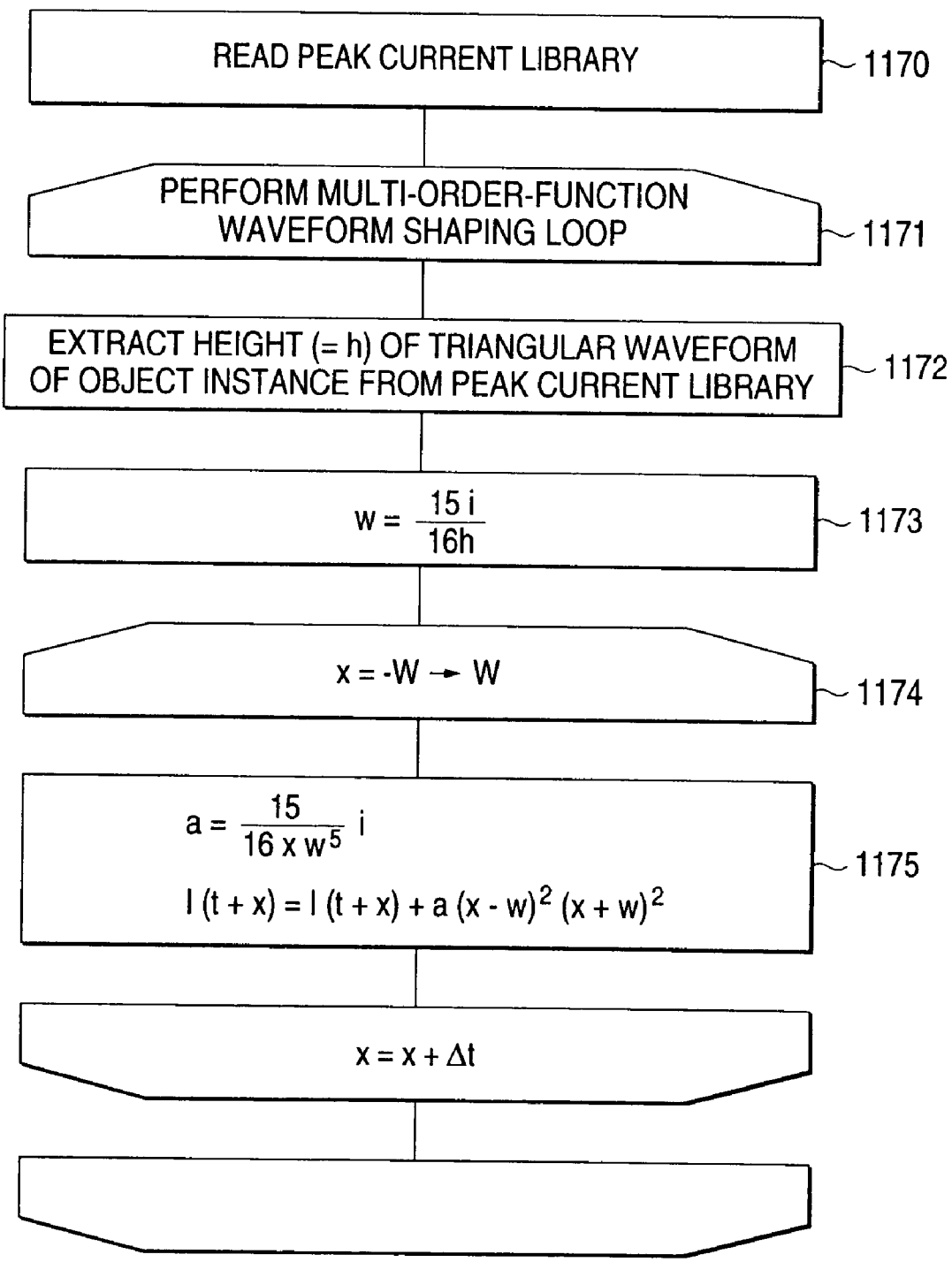
FIG. 101 is a flowchart of a multi-order-function waveform-shaping operation.

FIG. 101 is a flowchart of processing pertaining to the multi-order-function waveform-shaping section 172, including processing pertaining to the multi-order-function waveform height calculation section 170 and processing pertaining to the multi-order-function waveform width calculation section 171. First, the peak current library 130 is read (step 1170). The following processing is iterated on a per-event basis until calculation of a current waveform is completed (step 1171). From the peak current library 130, a peak current of an instance which is an object of EMI analysis is extracted, and the thus-extracted peak current is taken as the height "h" of a multi-order-function waveform (step 1172). This processing corresponds to processing of the multi-order-function waveform height calculation section 170. The width "w" of a multi-order-function waveform is calculated by Eq.14 (step 1173). Reference symbol "i" denotes an instantaneously-changing current of a cell of an event, the event being an object of EMI analysis. This processing corresponds to processing pertaining to the multi-order-function waveform width calculation section 171. Until variable "x" changes from −w to w, "y" expressed by Eq.6 is added to I(t+x) and I(t−x). Further, Δt is added to variable "x" (steps 1174 and 1175). Here, I(t+x) denotes total electric current flowing through all the cells at time t+x, and I(t−x) denotes total electric current flowing through all the cells at time t−x. This processing corresponds to processing pertaining to the multi-order-function waveform-shaping section 172.

The current wave calculation result 8 can be obtained by means of the flow of a multi-order-function waveform height calculation operation, a multi-order-function waveform width calculation operation, and a multi-order-function waveform-shaping operation. The FFT processing section 9 subjects the current waveform calculation result 8 to an FFT operation, to thereby determine the frequency characteristic of an EMI component. As a result, there can be obtained an EMI analysis result 10.

Twenty-Fifth Embodiment

An EMI analysis method according to a twenty-fifth embodiment of the present invention will now be described. In the fourteenth through twenty-second embodiments, an instantaneously-changing current of each cell is calculated from event information concerning each cell, the information being output from a logic simulator, by means of characterizing a peak current of a cell according to the type of cell and the amount of instantaneously-changing current for each event. The thus-calculated instantaneously-changing current is modeled as a rectangular waveform such that a peak value becomes equal to a peak current of the cell, thereby determining change in electric current. However, so long as the waveform of an instantaneous electric current is modeled as a Gauss function waveform, a more realistic change in electric current can be determined.

By way of example, there will now be described an EMI analysis method comprising the steps of:

modeling, for each type of cell, an instantaneously-changing electric current as a Gauss function waveform whose height and width are characterized, to thereby calculate a more realistic change in electric current; and subjecting the result of calculation of an electric waveform to FFT processing, thereby determining the frequency characteristic of an EMI component of a circuit of interest.

FIG. 50 shows an instantaneous electric current and a modeled Gauss function according to the present embodiment. In the drawing, "i" denotes an instantaneously-changing current; "t" denotes a current processing time; and "h" denotes the height of a Gauss function wave serving as a model. The height "h" is equal to a peak current characterized according to the type of cell. Reference symbol "w" denotes a width of a Gauss function serving a model, and the width "w" corresponds to a value characterized according to the type of cell. In the present embodiment, a Gauss function serving as a model is expressed as Eq.11. This function is called a Gaussian function. Let x=0, Eq.11 provides "h," which represents the height of a Gaussian function waveform. From Eq. 11, let x=3×W, there is derived a value of 0.0001×h (i.e., 0.01% of the height of a Gaussian function wave). This value is taken as a limit on the width of a Gaussian function serving as a model, and the width of the Gaussian function is taken as "6×w." The overall flow of processing of the EMI analysis method according to the present embodiment is represented by the same block diagram as that employed in the first embodiment (see FIG. 1).

Figure 102:
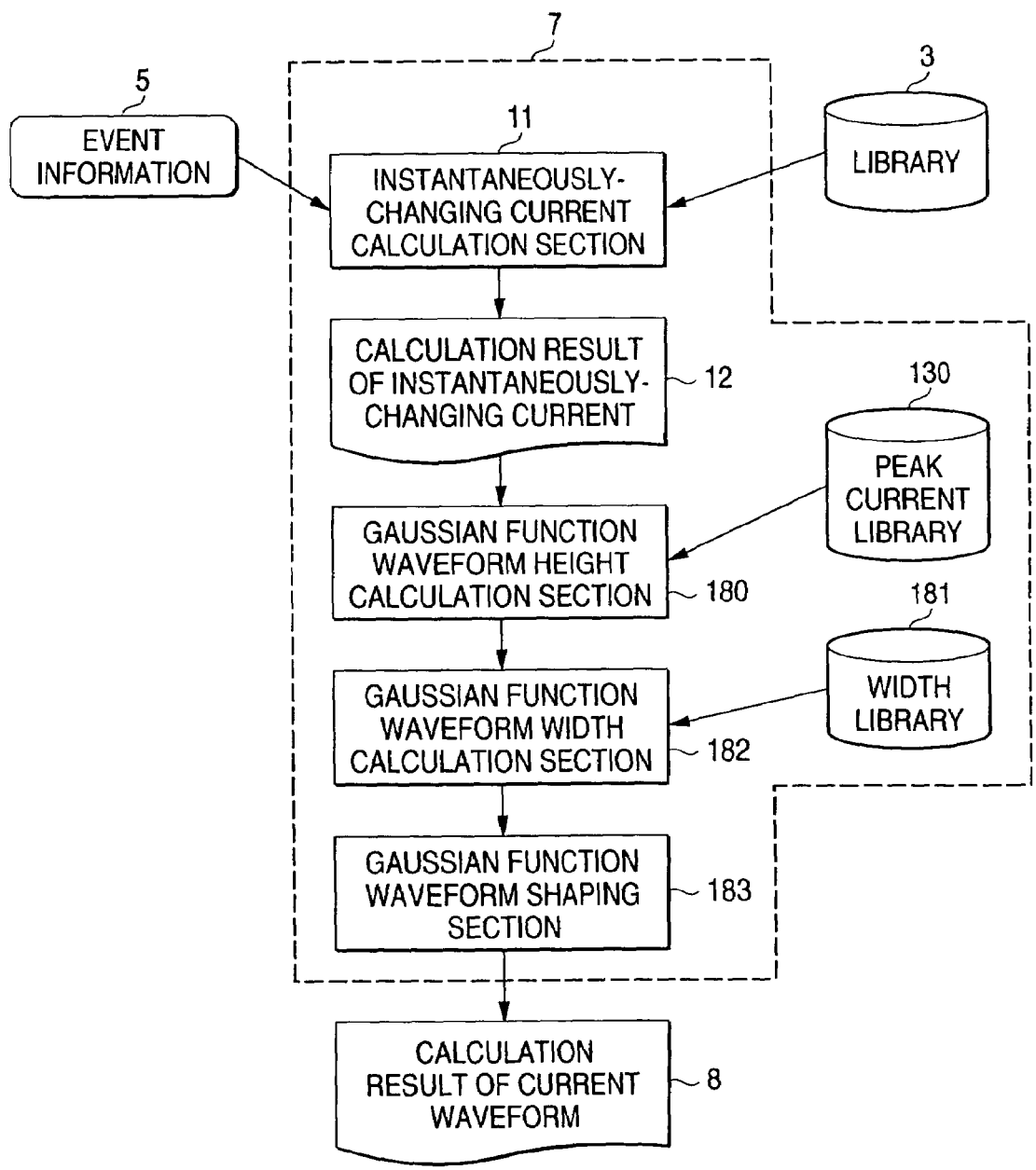
FIG. 102 is a block diagram showing a current waveform calculation section (according to a twenty-fifth embodiment of the present invention)

FIG. 102 is a detailed block diagram showing the current waveform calculation section 7 according to the present embodiment. Reference numeral 11 designates an instantaneously-changing current calculation section for calculating a momentary change in the current of each cell from the event information 5 concerning each cell, the information being output from the logic simulator 4. Calculation of momentary change in current is technically analogous to calculation of power consumption through a conventional logic simulation. Reference numeral 12 designates a calculation result of an instantaneously-changing current (hereinafter referred to as an "instantaneously-changing current calculation result 12") determined by the instantaneously-changing current calculation section 11. FIG. 3 shows an example instantaneously-changing current calculation result 12. As can be seen from FIG. 3, according to the instantaneously-changing current calculation result, the waveform of an electric current assumes a δ function. Therefore, an EMI component cannot be analyzed through an FFT operation. Thus far, the processing has been identical with the current wave calculation operation of the first embodiment. A Gaussian function waveform height calculation section 180 extracts a peak value of a Gaussian function serving as a model, from the peak current library 130 including peak currents of cells characterized according to the type of cell. Reference numeral 181 designates a wave width library includes wave widths of cells characterized according to the type of cell. Reference numeral 182 designates a Gaussian function waveform width calculation section for extracting, from the wave width library 181, the width of a Gaussian function waveform serving as a model.

Reference numeral 183 designates a Gaussian function waveform-shaping section for modeling the instantaneously-changing current result 12 as a Gaussian function wave having a peak value calculated by the Gaussian function waveform height calculation section 180 and a width calculated by the Gaussian function waveform width calculation section 182.

Figure 103:
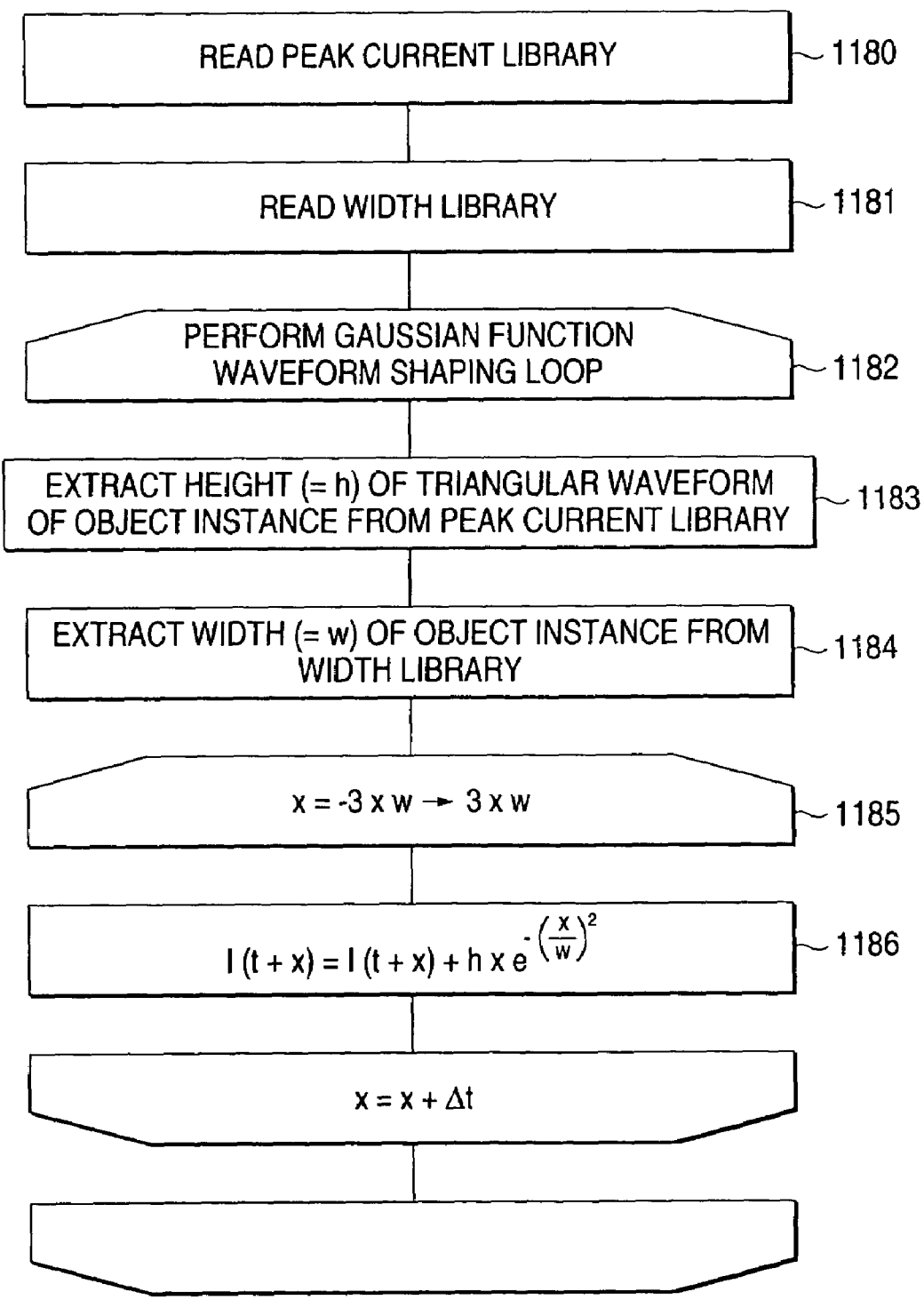
FIG. 103 is a flowchart of a Gaussian function waveform-shaping operation.

FIG. 103 shows the flowchart of processing pertaining to the Gaussian function waveform-shaping section 183, including processing pertaining to the Gaussian function waveform height calculation section 180 and processing pertaining to the Gaussian function waveform width calculation section 182. First, the peak current library 130 is read (step 1180), and the wave width library 181 is read (step 1181).

The processing provided below is iterated on a per-event basis until calculation of a current waveform is completed (step 1182). From the peak current library 130, a peak current of an instance which is an object of EMI analysis is extracted, and the thus-extracted peak current is taken as the height "h" of a Gaussian function waveform (step 1183). This processing corresponds to processing of the Gaussian function waveform height calculation section 180. The width "w" of a Gaussian function waveform which is an object of EMI analysis is extracted from the wave width library 181, and the thus-extracted width is taken as the width "w" of a Gaussian function waveform (step 1184). This processing corresponds to processing of the Gaussian function waveform width calculation section 182. Until variable "x" changes from −3×w to 3×w, "y" expressed by Eq.11 is added to I(t+x). Further, Δt is added to variable "x" (steps 1185 and 1186). Here, I(t+x) denotes total electric current flowing through all the cells at time t+x. This processing corresponds to processing pertaining to the Gaussian function waveform-shaping section 183.

The current wave calculation result 8 can be obtained by means of the flow of a Gaussian function waveform height calculation operation, a Gaussian function waveform width calculation operation, and a Gaussian function waveform-shaping operation. The FFT processing section 9 subjects the current waveform calculation result 8 to an FFT operation, to thereby determine the frequency characteristic of an EMI component. As a result, there can be obtained an EMI analysis result 10.

Twenty-Sixth Embodiment

An EMI analysis method according to a twenty-sixth embodiment of the present invention will now be described.

The EMI analysis method according to the present embodiment is characterized by modeling an instantaneously-changing current while the information concerning a current waveform of each circuit element (or cell) which is described in connection with the fourteenth through twenty-second embodiments is separated into an element dependent on a short circuit current (also called "short circuit-current-dependent element") and another element dependent on a charge current (also called "charge-current-dependent element"). In contrast with the thirteenth embodiment, the present embodiment effects modeling of each of the circuit elements (cells), thereby enabling formation of a more accurate model of electric current.

Figure 104:
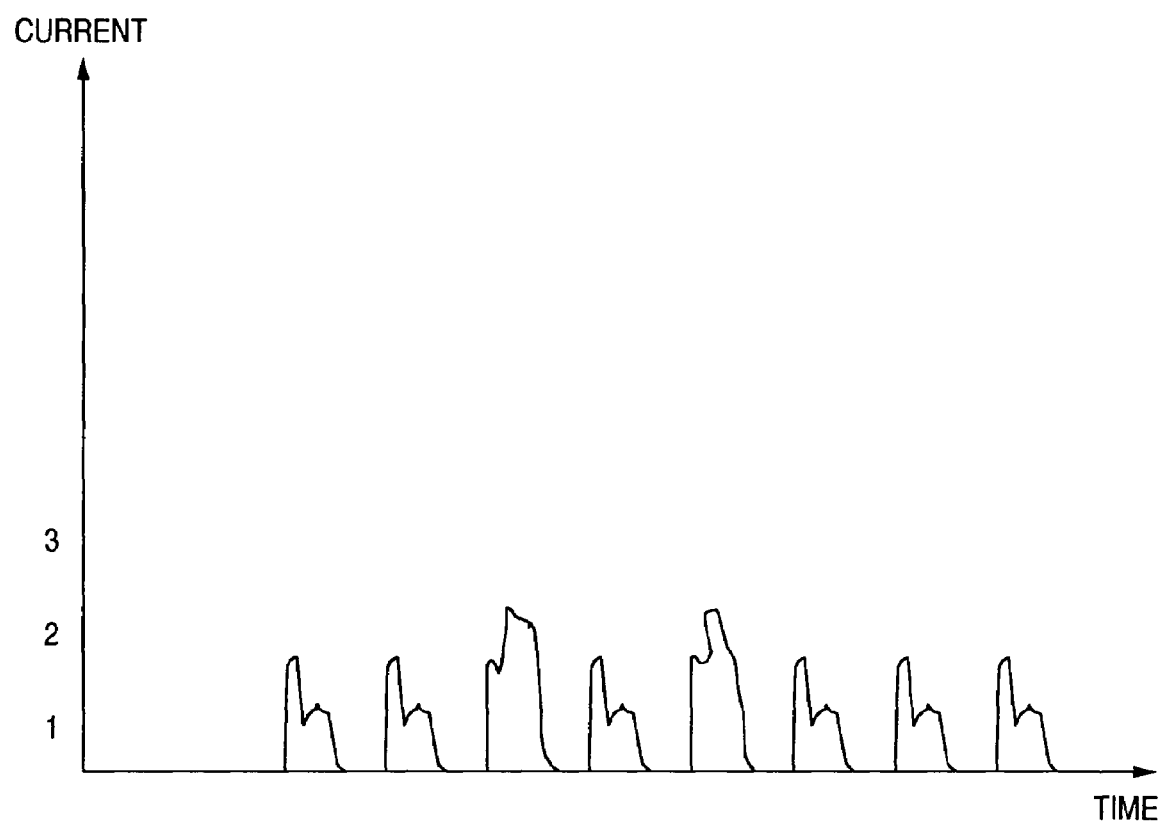
FIG. 104 is a graph showing an example current waveform arising in a real circuit according to a twenty-sixth embodiment of the present invention.

For example, in a case where the circuit connection information shown in FIG. 110 and the pattern of signal change shown in FIG. 12 are imparted to a circuit element, an electric current shown in FIG. 104 flows through the circuit element. In such a case, the conventional EMI analysis method enables formation of only a waveform such as that shown in FIG. 14. Even in the case of the thirteenth embodiment, there is produced only a waveform such as that shown in FIG. 58. In contrast, the EMI analysis method according to the present embodiment enables formation of a more correct electric current. FIG. 72 shows the configuration of an EMI analysis method according to the present embodiment, the method using the value of a peak current and the amount of electric current described in connection with the fourteenth embodiment.

A system to be used with the EMI analysis method shown in FIG. 72 comprises circuit connection information storage means 9001; pattern-of-signal-change storage 9002; element current storage means 9003 for storing the amount of electric current flowing in a circuit element; total current storage means 9004 for storing a total amount of electric current flowing through the circuit element; and total current calculation means 9005 for calculating the total amount of electric current flowing through a circuit element.

Figure 106:
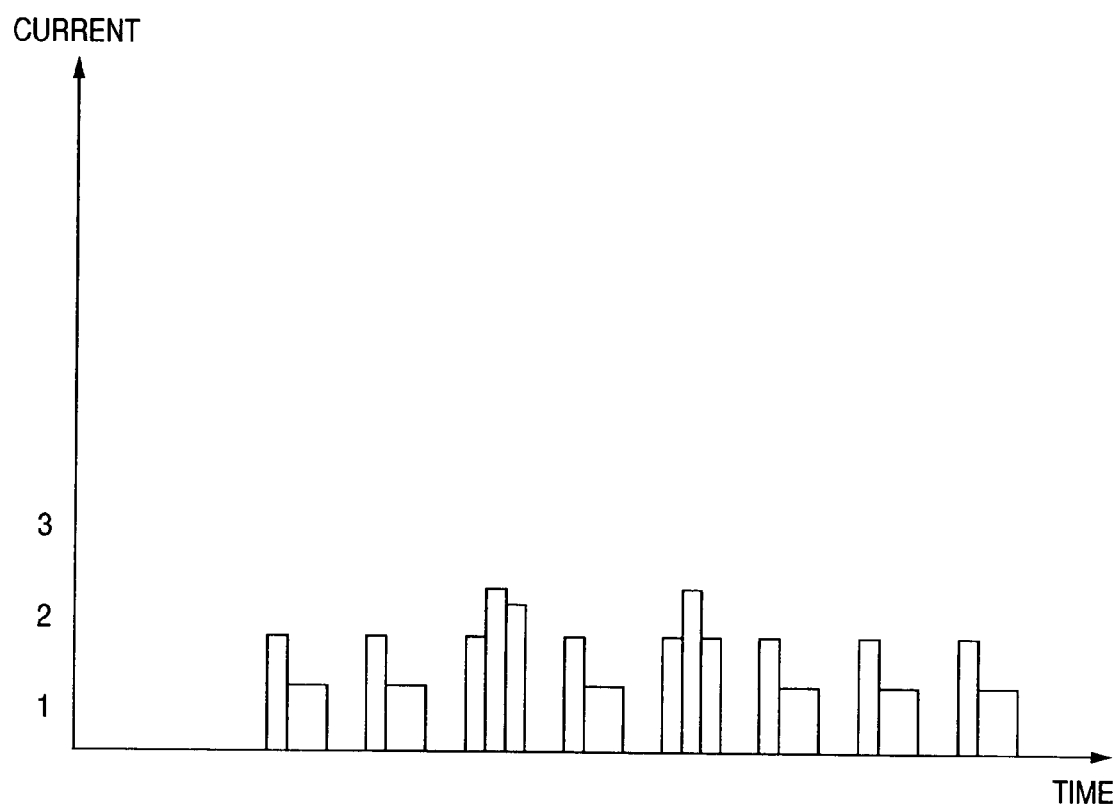
FIG. 106 is a graph showing example data stored in conventional total current storage means according to the twenty-sixth embodiment.

Next will be described individual elements constituting the EMI analysis method shown in FIG. 72 and procedures for calculating the total amount of electric current shown in FIG. 106, from the circuit connection information shown in FIG. 110, the pattern of signal change shown in FIG. 12, and the amount of electric current flowing through a circuit element shown in FIG. 105.

The circuit connection information storage means 9001 stores information concerning the connection of a circuit to be analyzed in the same manner as described in connection with the background art. Circuit connection information, such as that shown in FIG. 110, is stored in advance in the circuit connection information storage means 9001.

The pattern-of-signal-change storage 9002 stores the pattern of signal change to be applied to the circuit connection information, as in the case of a conventional pattern of signal change described in connection with the background art. As shown in FIG. 111, a pattern of change in a signal input to an input port CK and a pattern of change in a signal input to an input port D, such as those shown in FIG. 110, are stored in the pattern-of-signal-change storage 9002 beforehand.

The element current storage means 9003 stores for each circuit element and in a form such as that shown in FIG. 105, the total amount of electric current flowing in a circuit element (cell), a peak value of the electric current, the total amount of charge current, and a peak current.

Figure 107:
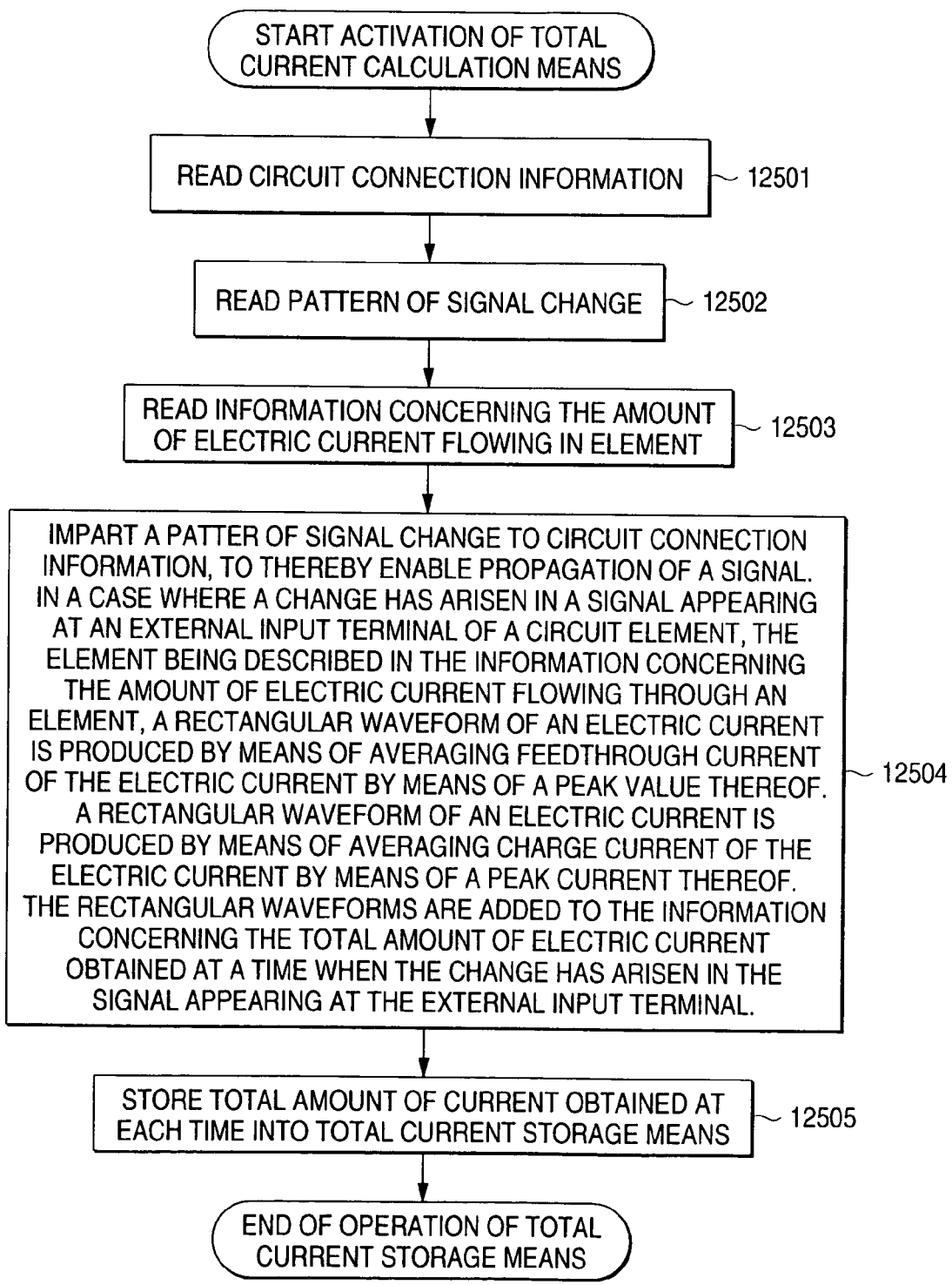
FIG. 107 is a flowchart showing processing operations of the total current calculation means according to the twenty-sixth embodiment.

The total current calculation means 9005 operates according to a flowchart, such as that shown in FIG. 107. According to the flowchart relating to a method of calculating an electric current shown in FIG. 107, processing pertaining to step 1504 of the conventional current calculation method is replaced by processing of calculating a rectangular waveform of the short circuit current from a peak value and the total amount of electric current, calculating a rectangular waveform of the charge current from a peak value and the total amount of electric current, and merging the thus-calculated rectangular waveforms into a single rectangular waveform (step 12504). In step 12501, there is read the circuit connection information which is stored in the circuit connection information storage means 9001 and shown in FIG. 110.

In step 12502, there is read a pattern of signal change which is shown in FIG. 111 and is stored in the pattern-of-signal-change storage 9002. In step 12503, there is read the element current information which is shown in FIG. 105 and stored in the element current storage means 9003. In step 12504, the pattern of signal shown in FIG. 111 is imparted to the circuit connection information shown in FIG. 110, thereby enabling propagation of a signal. In a case where a change arises in a signal appearing at an external input terminal of a circuit element, which element is described in the information concerning the amount of electric current flowing in an element, a rectangular waveform of an electric current is produced by means of averaging a short circuit current component of the electric current by a peak value of the short circuit current component, and a rectangular waveform of an electric current is produced by means of averaging a charge current component of the electric current by a peak value of the charge current component. The thus-formed rectangular waveforms are added to the information concerning the total mount of electric current obtained at a time when the change has arisen in the signal appearing at the external input terminal. After completion of propagation of a signal, in step 12505 the thus-calculated information concerning the total amount of electric current obtained at each time shown in FIG. 106 is stored in the total current storage means 9004. As a result, there is produced a current waveform, such as that shown in FIG. 106, which is more realistic than that which is obtained by the conventional current calculation method and shown in FIG. 14.

Twenty-Seventh Embodiment

Next will be described an EMI analysis method according to a twenty-seventh embodiment of the present invention. The tenth embodiment has described that a more realistic change in current can be materialized by means of calculating an instantaneously-changing current of each cell from event information concerning the cell, the information being output from a logic simulator, and modeling the thus-calculated instantaneously-changing current as a triangular wave. The EMI analysis method according to the present embodiment is characterized by calculating a current waveform in consideration of output slew information; that is, the time which elapses from the time a change arises in a signal appearing at an output terminal of a cell until the change has been canceled.

By way of example, there will now be described an EMI analysis method comprising the steps of:
  modeling an instantaneously-changing current as a triangular waveform by means of calculating the width of a triangular waveform for each event information in consideration of slew information concerning an output terminal of a cell and the height of the triangular waveform on the basis of the thus-calculated width such that the area of the triangular waveform becomes equal to the amount of current of each event;
  calculating a more realistic change in electric current by means of using an existing library in its present form; and
  subjecting the result of calculation of an electric waveform to FFT processing, thereby determining the frequency characteristic of an EMI component of a circuit of interest.

Figure 117A:
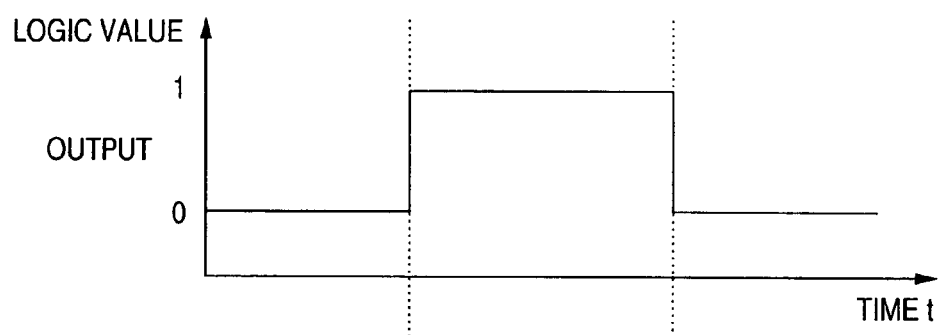
FIG. 117 is a triangular waveform model according to the present invention (a twenty-seventh embodiment)
Figure 117B:
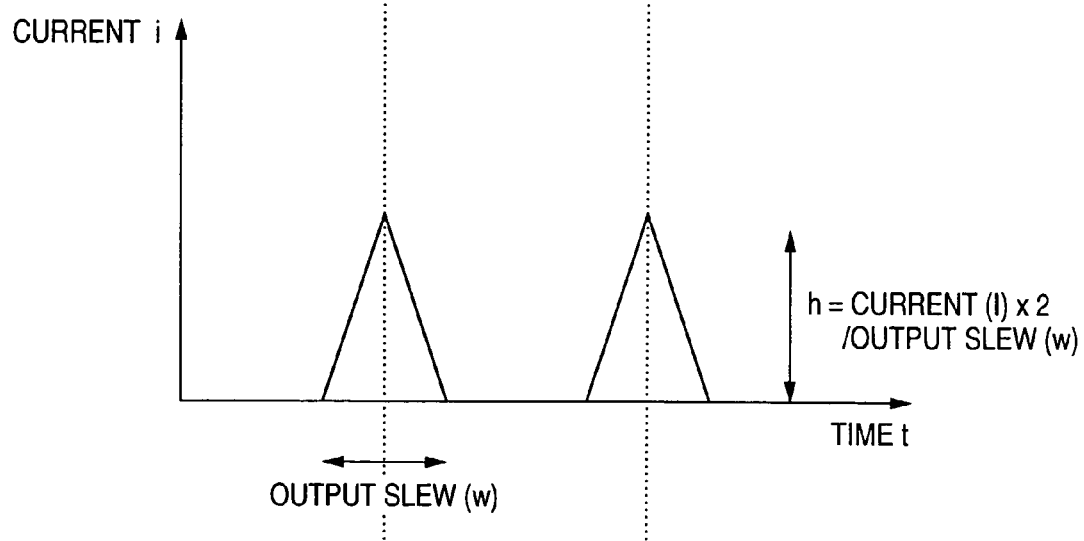

FIG. 117 shows a logic value (see FIG. 117A) and a modeled triangular waveform (see FIG. 117B), which are to be used for executing the EMI analysis method according to the present embodiment. Reference symbol "t" denotes a current processing time, and "W" denotes the width of a triangular waveform serving as a model of an instantaneously-changing current. The width "W" is determined by means of calculating an instantaneously-changing current of each cell from event information of each cell, in consideration of output slew information. Further, "h" denotes the height of a triangular waveform and is calculated from "i" and "W." Here, h=2×I/W.

Figure 118:
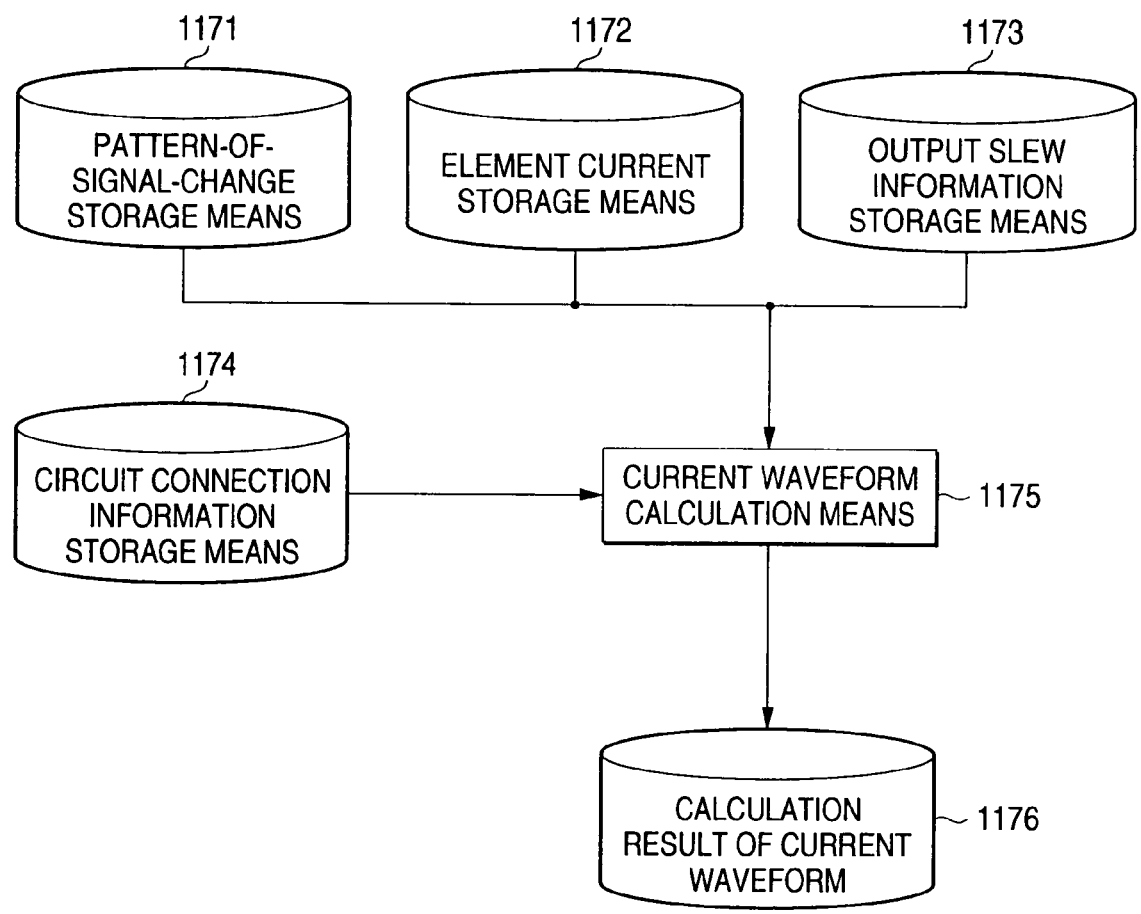
FIG. 118 is a block diagram showing calculation of a current waveform (according to the twenty-seventh embodiment)

FIG. 118 shows the configuration of a system for effecting the EMI analysis method according to the present invention. The system used for effecting the EMI analysis method shown in FIG. 118 comprises pattern-of-signal-change storage means 1171; element current storage means 1172 for storing the amount of electric current flowing in a circuit element; output slew information storage means 1173; and current waveform calculation means 1175 for calculating a current waveform on the basis of data output from the pattern-of-signal-change storage means 1171, the element current storage means 1172, the output slew information storage means 1173, and circuit connection information storage means 1174. The system outputs a calculation result of a current waveform 1176 (hereinafter referred to simply as a "current waveform calculation result 1176").

Figure 119:
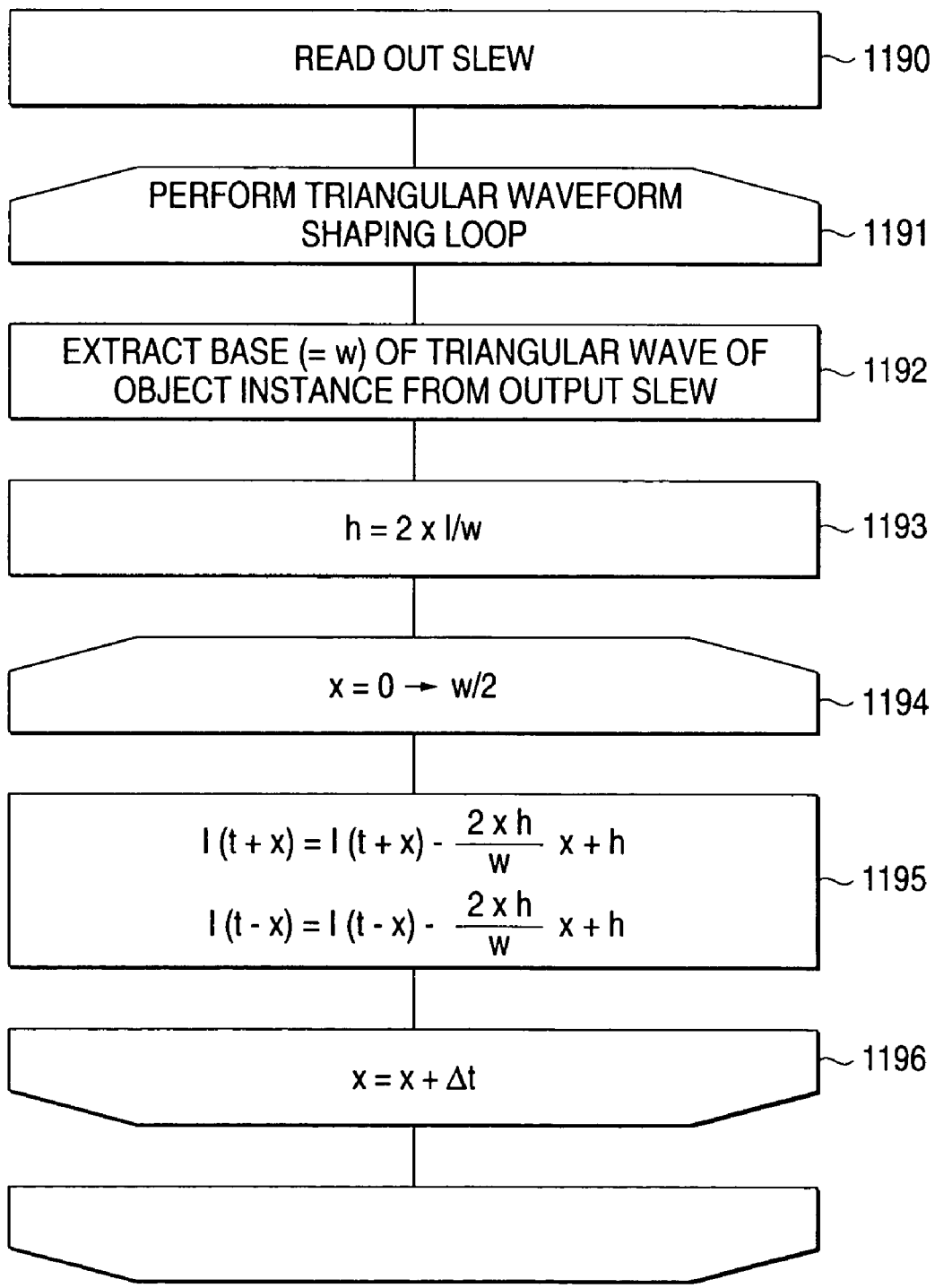
FIG. 119 is a flowchart showing shaping of a triangular waveform (according to the twenty-seventh embodiment)

FIG. 119 is a flowchart of a triangular-waveform-shaping operation, including a triangular waveform height calculation operation and a triangular waveform width calculation operation. The following processing is iterated on a per-event basis after reading of an output slew (step 1190) until calculation of a current waveform is completed (step 1191). A base of the triangular waveform is extracted as an output slew while a point at which a change arises in an event is taken as a center (step 1192). An isosceles triangle whose area is equal to the amount of electric current flowing through the event is taken as a current waveform of the event. The area of a triangular wave is W×h/2 and assumes a value "i." The height "h" of a triangular wave is calculated from 2×i/W (step 1193). Reference symbol "i" denotes an instantaneously-changing current of a cell of an event which is an object of EMI analysis. This processing corresponds to processing pertaining to the triangular waveform height calculation section 100 according to the tenth embodiment. Until variable "x" changes from 0 to W/2, (2×h/W)·x+h is added to I(t+x) and I(t−x). Further, Δt is added to variable "x" (steps 1194, 1195, and 1196). Here, I(t+x) denotes total electric current flowing through all the cells at time t+x, and I(t−x) denotes total electric current flowing through all the cells at time t−x. This processing corresponds to processing pertaining to the triangular-waveform-shaping section 101.

The current wave calculation result 76 can be obtained by means of the flow of a triangular waveform height calculation operation and a triangular-waveform-shaping operation. The FFT processing section 9 subjects the current wave calculation result 76 to an FFT operation, to thereby determine the frequency characteristic of an EMI component. As a result, there can be obtained an EMI analysis result 10.

The EMI analysis method enables estimation of an electric current with sufficient accuracy from only the information which is currently used by a power consumption analysis tool and used for verifying a delay.

Twenty-Eighth Embodiment

Figure 120A:
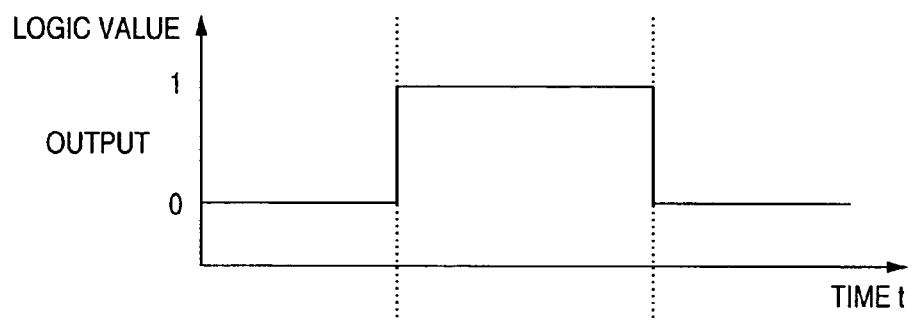
Figure 120B:
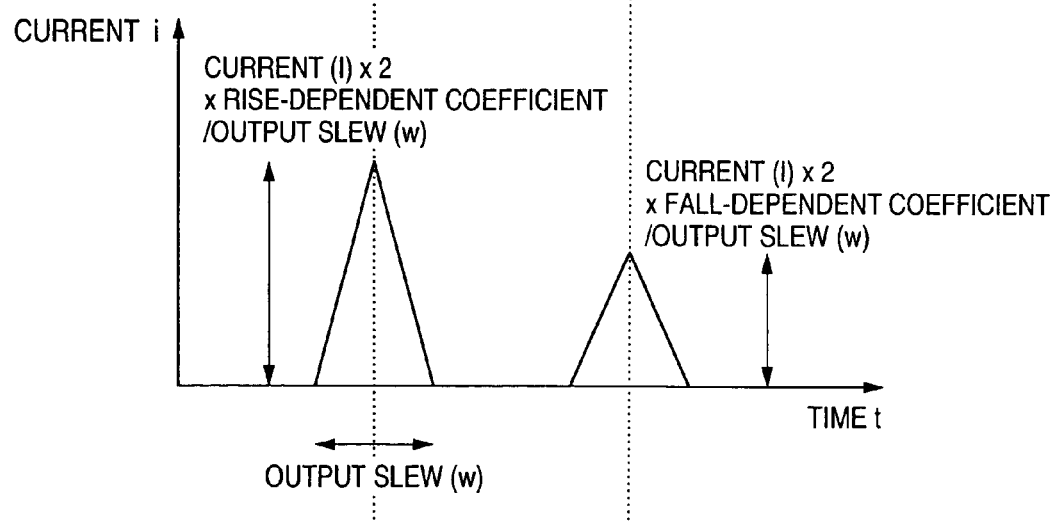

Next will be described an EMI analysis method according to a twenty-eighth embodiment of the present invention. The EMI analysis method according to the present embodiment is characterized by means of calculating a current waveform, in consideration of whether an event is a rise or a fall and in addition to the feature of the EMI analysis method according to the twenty-seventh embodiment. FIG. 120 shows a logic value (see FIG. 120A) and a modeled triangular waveform (see FIG. 120B), which are to be used for effecting an EMI analysis method according to the present embodiment. Reference symbol "t" denotes a current processing time, and "W" denotes the width of a triangular waveform serving as a model of an instantaneously-changing current. The width "W" is determined by means of calculating an instantaneously-changing current of each cell from event information of each cell, in consideration of output slew information. There is employed rise-dependent coefficient/fall-dependent coefficient storage means 1207, and current waveform calculation means 1205 calculates a current waveform in accordance with whether an event is a rise or a fall.

The overall flow of processing of the EMI analysis method according to the present embodiment is represented by the same block diagram as that employed in the first embodiment (see FIG. 1).

Figure 121:
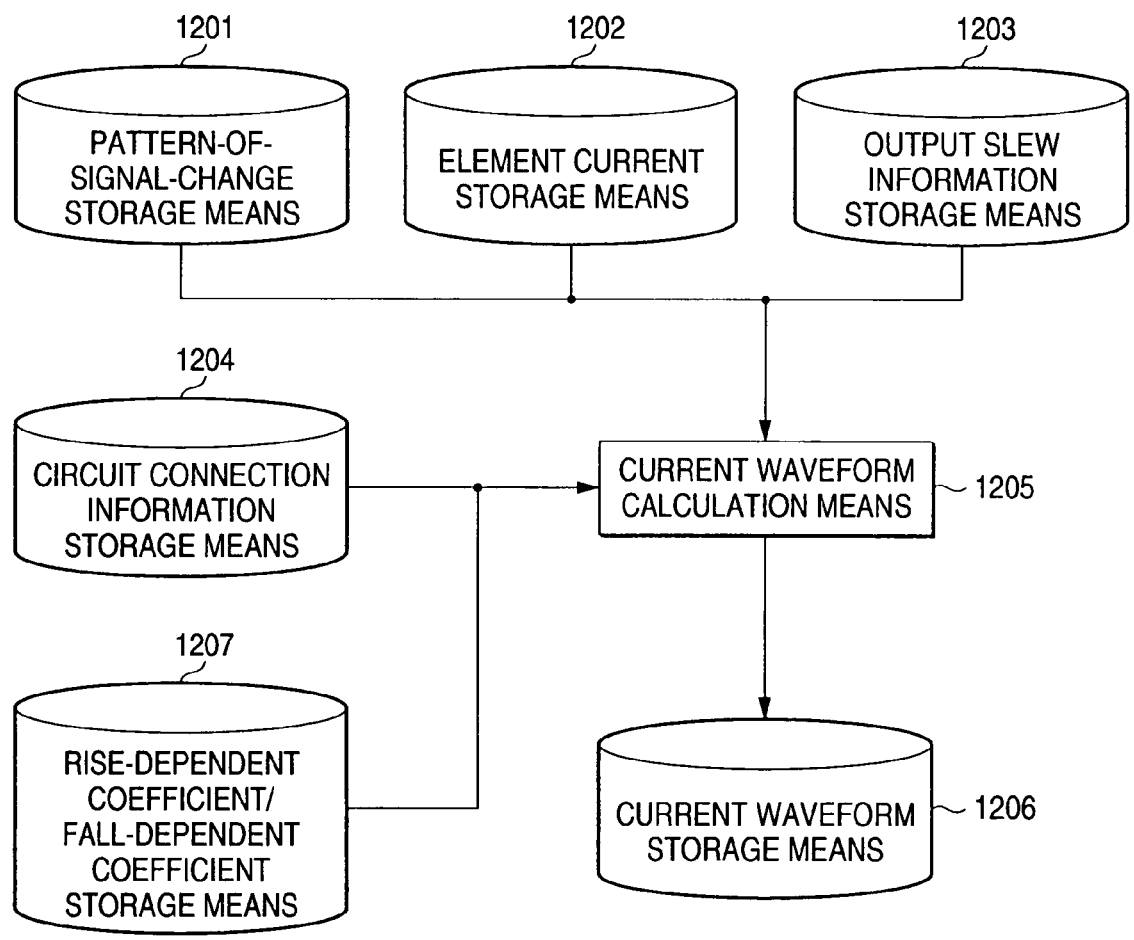

FIG. 121 shows the configuration of a system for effecting the EMI analysis method according to the present invention. The system used for effecting the EMI analysis method shown in FIG. 121 comprises pattern-of-signal-change storage means 1201; element current storage means 1202 for storing the amount of electric current flowing in a circuit element; output slew information storage means 1203; and current waveform calculation means 1205 for calculating a current waveform on the basis of data output from the pattern-of-signal-change storage means 1201, the element current storage means 1202, the output slew information storage means 1203, and circuit connection information storage means 1204. The system outputs a calculation result of a current waveform 1206 (hereinafter referred to simply as a "current waveform calculation result 1206").

In the present embodiment, a current waveform is calculated in consideration of whether an event is a rise or a fall, by reference to the rise/fall-dependent coefficient storage means 1207, in addition to the operations of the EMI analysis method described in connection with the twenty-seventh embodiment. A more realistic change in current is calculated by use of an existing library in its present form, and by subjecting a calculation result of a current wave to FFT processing, to thereby determine the frequency characteristic of an EMI component and enable EMI analysis.

Twenty-Ninth Embodiment

Figure 122A:
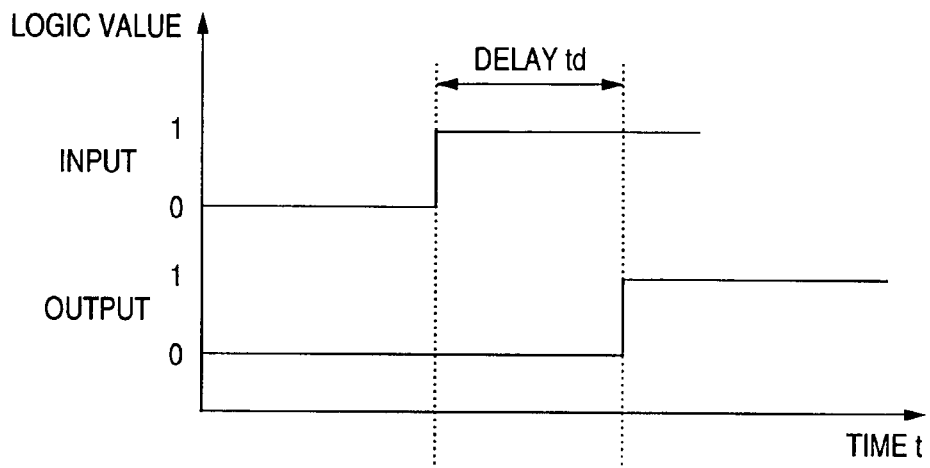
Figure 122B:
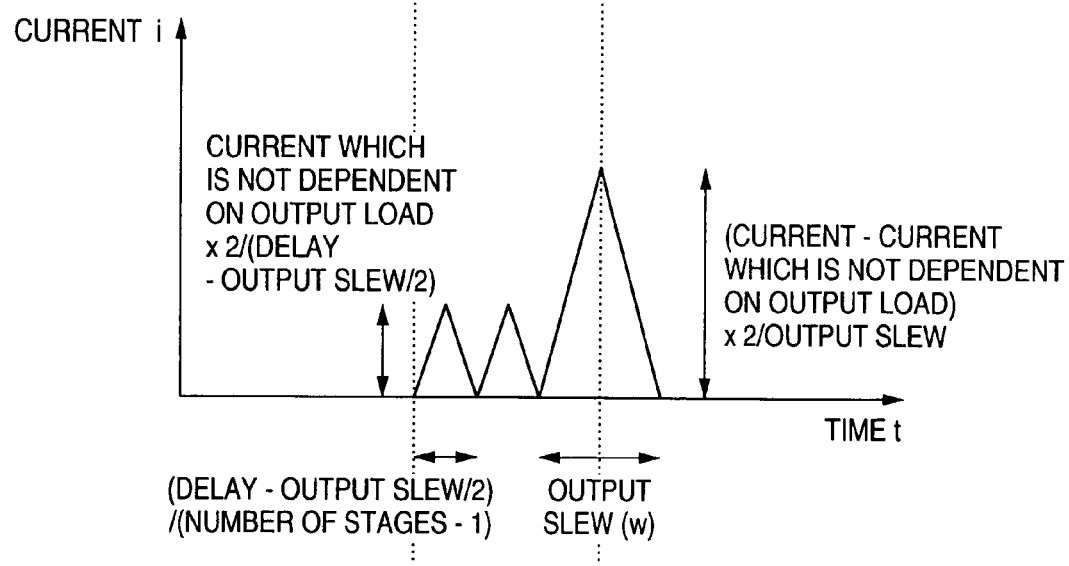
Figure 123:
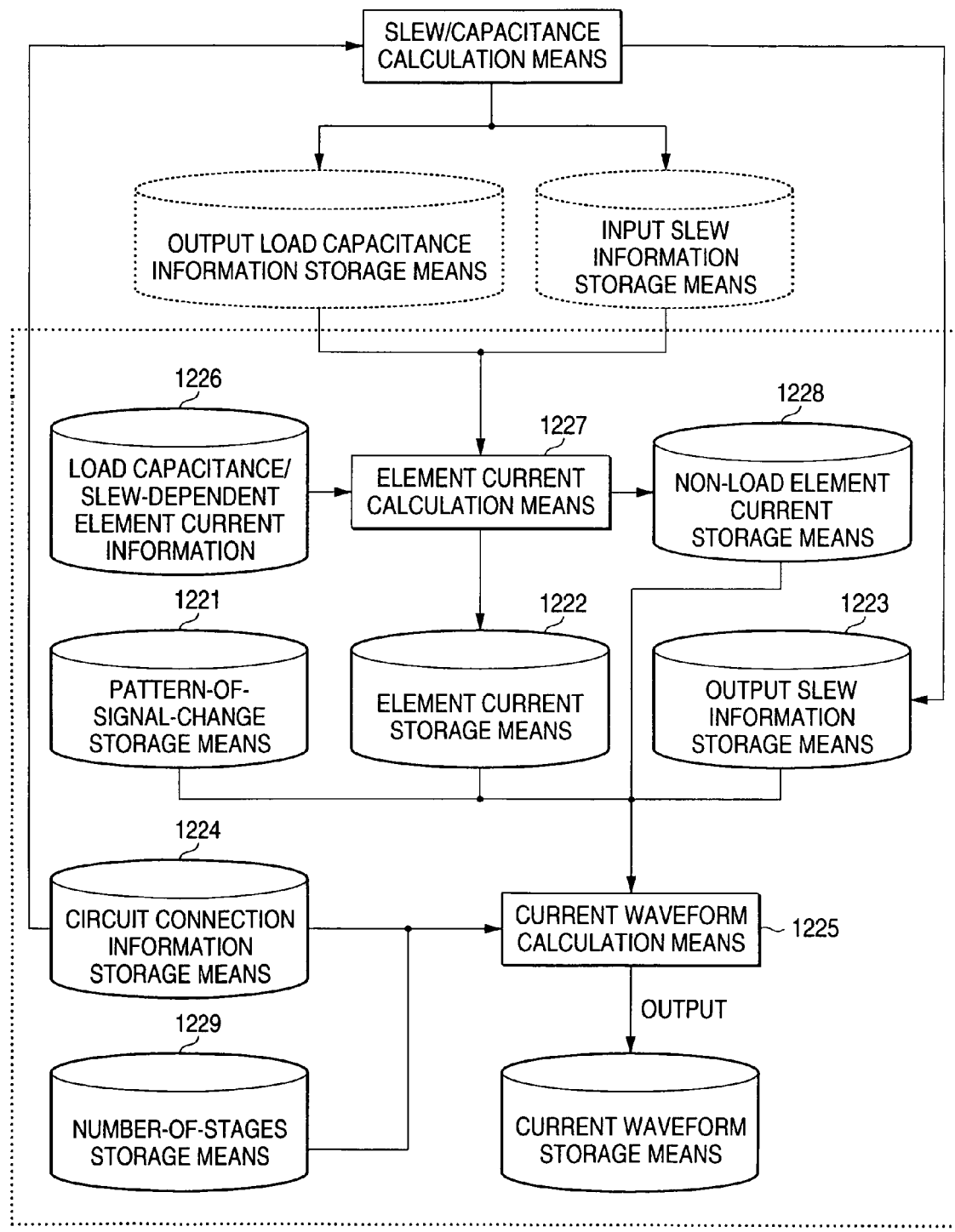

Next will be described an EMI analysis method according to a twenty-ninth embodiment of the present invention. According to the present method, there is estimated the amount of electric current on the basis of event information, the number of cells determined according to a SPICE netlist provided in a cell, an output load capacitance, input slew information, the relationship between an input slew and the amount of current, and a time at which a change has arisen in an input signal, or a delay time. Information concerning the amount of electric current which flows in a single event is calculated from an output load capacitance and a table representing the relationship between an input slew and the amount of electric current. FIG. 122 shows a logic value (see FIG. 122A) and a modeled triangular waveform (see FIG. 122B), which are to be used for effecting an EMI analysis method according to the present embodiment. Reference symbol "$t_d$" designates a delay time; "t" denotes a current processing time; and "W" denotes the width of a triangular waveform serving as a model of an instantaneously-changing current. The width "W" is determined by means of calculating an instantaneously-changing current of each cell from event information of each cell, on the basis of output slew information taking into consideration a delay time td caused by multistage connection. Here, there is calculated the amount of current independent of an output load (i.e., the amount of non-dependent current) beforehand, and the thus-calculated amount of current is stored. A base of the triangular waveform is taken as an output slew while a point at which a change arises in an output is taken as a center. Further, there are employed, as output loads, an angular waveform whose area is equal to the amount of non-dependent current or to the amount of current flowing when electric current-capacitance is 0 and a triangular waveforms equal in number to the number of cells within the delay time. As shown in FIG. 123, the EMI analysis method according to the present embodiment is provided with a load capacitance/slew-dependent element current information table 1226; element current calculation means 1227 for calculating the amount of electric current flowing through a cell from the load capacitance/slew-dependent element current information table 1226; and non-load element current storage means 1228 for storing the amount of electric current flowing through a non-load element calculated by the element current calculation means 1227. By use of these means, a current waveform is calculated. The system which is shown in FIG. 123 and used for effecting the EMI analysis method according to the present invention, comprises the load capacitance/slew-dependent element current information table 1226; the element current calculation means 1227 for calculating the amount of electric current flowing through a cell from the load capacitance/slew-dependent element current information table 1226; the non-load element current storage means 1228 for storing the amount of electric current flowing through a non-load element calculated by the element current calculation means 1227; pattern-of-signal-change storage means 1221; element current storage means 1222 for storing the amount of electric current flowing in a circuit element at the time of an event, the electric current being calculated by the element current calculation means 1227; output slew information storage means 1223; and current waveform calculation means 1225 for calculating a current waveform on the basis of data output from the pattern-of-signal-change storage means 1221, the element current storage means 1222, the output slew information storage means 1223, circuit connection information storage means 1224, number-of-stages storage means 1229 for storing the number of stages in a composite cell, and the non-load element current storage means 1228. The system outputs a calculation result of a current waveform 1206 (hereinafter referred to simply as a "current waveform calculation result 1206").

In the twenty-ninth embodiment, there are stored a plurality of triangular waveforms which are equal in number to cells, such that the total area of a triangular waveform becomes equal to the amount of electric current obtained when a capacitance assumes a value of 0, during a period of time from the time when a change has arisen in an input signal until a change arises in an event. A more realistic change in current is calculated from an existing library in its present form, and the calculation result of current waveform is subjected to FFT processing, thereby determining the frequency characteristic of an EMI component arising in a circuit to be analyzed and enabling EMI analysis.

The present invention evaluates electromagnetic interference arising in an LSI through a simulation, by means of accurately analyzing a change in a power current, which change can be said to primarily account for electromagnetic interference. In order to solve the problem, a highly-accurate power current analysis function is added to a gate-level simulation, thereby preventing consumption of much time, which would otherwise be required by the conventional EMI analysis method using transistor-level current analysis.

What is claimed is:

1. An electromagnetic interference analysis method for analyzing the amount of electromagnetic interference arising in an LSI by means of performing a gate level logic simulation, the method comprising:
- an instantaneous current amount calculation step of calculating the amount of instantaneous electric current from event information, the information being produced when a change arises in a signal and including the instance name of each cell in which the change has arisen, the name of the signal, a time at which the change has arisen, and transition information;
- a triangular waveform modeling step of modeling the instantaneous current as a triangular waveform whose width is calculated from each event information in consideration of output slew information for an output terminal of a cell for each event information such that the area of the triangular waveform becomes equal to the amount of electric current of each event, the height of the triangular waveform being calculated on the basis of the width, and,
- an FFT processing step further including a step of subjecting to FFT processing information concerning a change in current, the information being calculated in the triangular waveform modeling step.

2. The electromagnetic interference analysis method as defined in claim 1, wherein the triangular waveform is an isosceles triangle, wherein an event occurs at the center of the width of the isosceles triangle, and wherein the width is the base of the isosceles triangle.

* * * * *